US011539007B2

(12) United States Patent
Lee et al.

(10) Patent No.: US 11,539,007 B2
(45) **Date of Patent: *Dec. 27, 2022**

(54) ORGANOMETALLIC COMPOUND, ORGANIC LIGHT-EMITTING DEVICE INCLUDING THE SAME, AND DIAGNOSTIC COMPOSITION INCLUDING THE ORGANOMETALLIC COMPOUND

(71) Applicant: SAMSUNG ELECTRONICS CO., LTD., Suwon-si (KR)

(72) Inventors: Jungin Lee, Hwaseong-si (KR); Kyuyoung Hwang, Anyang-si (KR); Soyeon Kim, Seoul (KR); Aram Jeon, Suwon-si (KR); Hyeonho Choi, Seoul (KR); Hyun Koo, Seoul (KR); Sangdong Kim, Seoul (KR); Yoonhyun Kwak, Seoul (KR); Ohyun Kwon, Seoul (KR); Byoungki Choi, Hwaseong-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/166,385

(22) Filed: Feb. 3, 2021

(65) Prior Publication Data

US 2021/0159431 A1 May 27, 2021

Related U.S. Application Data

(63) Continuation of application No. 17/128,400, filed on Dec. 21, 2020, which is a continuation of application No. 15/641,299, filed on Jul. 4, 2017, now Pat. No. 10,937,973.

(30) Foreign Application Priority Data

Jul. 5, 2016 (KR) ........................ 10-2016-0085069

(51) Int. Cl.

| | |
|---|---|
| ***H01L 51/00*** | (2006.01) |
| ***C07F 15/00*** | (2006.01) |
| ***C09K 11/06*** | (2006.01) |
| ***H01L 51/50*** | (2006.01) |

(52) U.S. Cl.

CPC ...... *H01L 51/0087* (2013.01); *C07F 15/0086* (2013.01); *C09K 11/06* (2013.01); *H01L 51/0094* (2013.01); *C09K 2211/1044* (2013.01); *C09K 2211/185* (2013.01); *H01L 51/5016* (2013.01)

(58) Field of Classification Search

CPC ................................................... H01L 51/0087

See application file for complete search history.

(56) References Cited

U.S. PATENT DOCUMENTS

| | | | | |
|---|---|---|---|---|
| 10,811,622 | B2 * | 10/2020 | Yoon | C09K 11/06 |
| 10,930,863 | B2 * | 2/2021 | Kim | C07F 15/0086 |
| 10,937,973 | B2 * | 3/2021 | Lee | H01L 51/0094 |
| 2007/0103060 | A1 | 5/2007 | Itoh et al. | |
| 2011/0227058 | A1 | 9/2011 | Masui et al. | |
| 2012/0018711 | A1 | 1/2012 | Che et al. | |
| 2012/0215001 | A1 | 8/2012 | Li et al. | |
| 2013/0082245 | A1 | 4/2013 | Kottas et al. | |
| 2013/0274473 | A1 | 10/2013 | Che et al. | |
| 2016/0005979 | A1 | 1/2016 | Kim et al. | |
| 2016/0013431 | A1 | 1/2016 | Choi et al. | |
| 2016/0240800 | A1 | 8/2016 | Ma et al. | |
| 2019/0006608 | A1 | 1/2019 | Koo et al. | |

FOREIGN PATENT DOCUMENTS

| | | | |
|---|---|---|---|
| CN | 1875026 | A | 12/2006 |
| CN | 102292840 | A | 12/2011 |
| CN | 103097395 | A | 5/2013 |
| CN | 104447878 | A | 3/2015 |
| CN | 109216570 | A | 1/2019 |
| JP | 2014507444 | A | 3/2014 |

(Continued)

OTHER PUBLICATIONS

English Summary of Office Action issued inTW Patent Application No. 106122492, dated Jan. 21, 2021.

Office Action issued inTW Patent Application No. 106122492, dated Jan. 21, 2021.

Bin Wang, et al., "Stongly phosphorescent platinum(ii) complexes supported by tetradentate benzazole-containing ligands", J. Mater. Chem. C, 2015, 3, 8212.

Bin Wang, et al., "Strongly phosphorescent platinum (ii) complexes supported by tetradentate benzazole-containing ligands", J. Mater. Chem. C, 2015, 3, 8212.

(Continued)

*Primary Examiner* — Peter F Godenschwager

(74) *Attorney, Agent, or Firm* — Cantor Colburn LLP

(57) ABSTRACT

An organometallic compound represented by Formula 1A:

Formula 1A

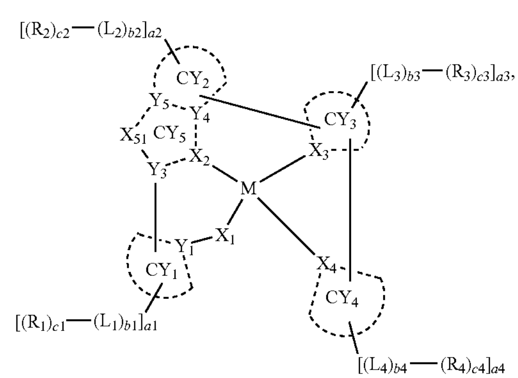

wherein, in Formula 1A, groups and variables are the same as described in the specification.

21 Claims, 1 Drawing Sheet

(56) References Cited

FOREIGN PATENT DOCUMENTS

| | | | |
|---|---|---|---|
| TW | 201245211 | A1 | 11/2012 |
| TW | 201319218 | A1 | 5/2013 |
| WO | 2012116231 | A2 | 8/2012 |

OTHER PUBLICATIONS

English Translation of Office Action issued by the Chinese Patent Office dated Oct. 28, 2020 in the examination of the Chinese Patent Application No. 201710541197.3.

Extended Search Report issued by the European Patent Office dated Nov. 3, 2017.

Office Action issued by the Chinese Patent Office dated Oct. 28, 2020 in the examination of the Chinese Patent Application No. 201710541197.3.

English translation of Office Action issued in corresponding JP Patent Application No. 2017-131798 dated May 25, 2021.

Office Action issued in corresponding JP Patent Application No. 2017-131798 dated May 25, 2021.

* cited by examiner

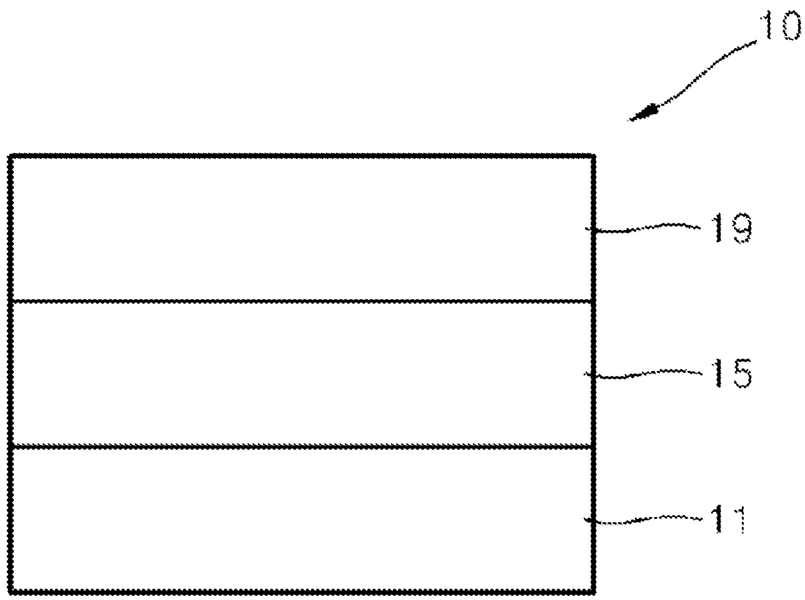
10
19
15
11

ORGANOMETALLIC COMPOUND, ORGANIC LIGHT-EMITTING DEVICE INCLUDING THE SAME, AND DIAGNOSTIC COMPOSITION INCLUDING THE ORGANOMETALLIC COMPOUND

CROSS-REFERENCE TO RELATED APPLICATIONS

This is a continuation application to U.S. application Ser. No. 17/128,400 filed on Dec. 21, 2020, a continuation application which claims priority to U.S. application Ser. No. 15/641,299, filed on Jul. 4, 2017, which claims priority to Korean Patent Application No. 10-2016-0085069, filed on Jul. 5, 2016, in the Korean Intellectual Property Office, and all the benefits accruing therefrom under 35 U.S.C. § 119, the contents of which are incorporated herein in their entirety by reference.

BACKGROUND

1. Field

One or more embodiments relate to an organometallic compound, an organic light-emitting device including the organometallic compound, and a diagnostic composition including the organometallic compound.

2. Description of the Related Art

Organic light-emitting devices (OLEDs) are self-emission devices, which have better characteristics including wide viewing angles, high contrast ratios, short response times, and excellent brightness, driving voltage, and response speed, and produce full-color images.

In an example, an organic light-emitting device includes an anode, a cathode, and an organic layer disposed between the anode and the cathode, wherein the organic layer includes an emission layer. A hole transport region may be disposed between the anode and the emission layer, and an electron transport region may be disposed between the emission layer and the cathode. Holes provided from the anode may move toward the emission layer through the hole transport region, and electrons provided from the cathode may move toward the emission layer through the electron transport region. The holes and the electrons recombine in the emission layer to produce excitons. These excitons transit from an excited state to a ground state, thereby generating light.

Meanwhile, luminescent compounds may be used to monitor, sense, or detect a variety of biological materials including cells and proteins. An example of the luminescent compounds includes a phosphorescent luminescent compound.

Various types of organic light emitting devices are known. However, there still remains a need in OLEDs having low driving voltage, high efficiency, high brightness, and long lifespan.

SUMMARY

One or more embodiments include a novel organometallic compound, an organic light-emitting device including the organometallic compound, and a diagnostic composition including the organometallic compound.

Additional aspects will be set forth in part in the description which follows and, in part, will be apparent from the description, or may be learned by practice of the presented embodiments.

According to one or more embodiments, an organometallic compound is represented by Formula 1A:

Formula 1A

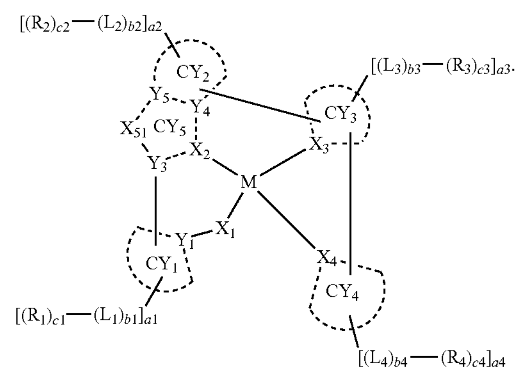

In Formula 1A,

M may be beryllium (Be), magnesium (Mg), aluminum (Al), calcium (Ca), titanium (Ti), manganese (Mn), cobalt (Co), copper (Cu), zinc (Zn), gallium (Ga), germanium (Ge), zirconium (Zr), ruthenium (Ru), rhodium (Rh), palladium (Pd), silver (Ag), rhenium (Re), platinum (Pt), or gold (Au), $X_1$ may be O or S, a bond between $X_1$ and M may be a covalent bond, $X_2$ and $X_3$ may each independently be C or N, $X_4$ may be N, one bond selected from a bond between $X_2$ and M, a bond between $X_3$ and M, and a bond between $X_4$ and M may be a covalent bond, and the others thereof may each be a coordinate bond, $Y_1$ and $Y_3$ to $Y_5$ may each independently be C or N, a bond between $X_2$ and $Y_3$, a bond between $X_2$ and $Y_4$, a bond between $Y_4$ and $Y_5$, a bond between $Y_5$ and $X_{51}$, a bond between $X_{51}$ and $Y_3$ may each be a chemical bond, $CY_1$ to $CY_5$ may each independently be selected from a $C_5$-$C_{30}$ carbocyclic group and a $C_1$-$C_{30}$ heterocyclic group, wherein $CY_4$ is not a benzimidazole group, a cyclometallated ring formed by $CY_5$, $CY_2$, $CY_3$, and M may be a 6-membered ring, $X_{51}$ may be selected from O, S, N-[$(L_7)_{b7}$-$(R_7)_{c7}$], C($R_7$)($R_8$), Si($R_7$)($R_8$), Ge($R_7$)($R_8$), C(═O), N, C($R_7$), Si($R_7$), and Ge($R_7$), $R_7$ and $R_8$ may be optionally linked via a first linking group to form a substituted or unsubstituted $C_5$-$C_{30}$ carbocyclic group or a substituted or unsubstituted $C_1$-$C_{30}$ heterocyclic group, $L_1$ to $L_4$ and $L_7$ may each independently be selected from a substituted or unsubstituted $C_5$-$C_{30}$ carbocyclic group and a substituted or unsubstituted $C_1$-$C_{30}$ heterocyclic group, b1 to b4 and b7 may each independently be an integer from 0 to 5, $R_1$ to $R_4$, $R_7$, and $R_8$ may each independently be selected from hydrogen, deuterium, —F, —Cl, —Br, —I, —$SF_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_2$-$C_{60}$ heteroaryloxy group, a substituted or unsubstituted $C_2$-$C_{60}$ heteroarylthio group, a substituted or unsubstituted $C_3$-$C_{60}$ heteroarylalkyl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —B($Q_6$)($Q_7$), and —P(═O)($Q_8$)($Q_9$), c1 to c4 may each independently be an integer from 1 to 5, a1 to a4 may each independently be 0, 1, 2, 3, 4, or 5, two of a plurality of neighboring groups $R_1$ may optionally be linked to form a substituted or unsubstituted $C_5$-$C_{30}$ carbocyclic group or a substituted or unsubstituted $C_1$-$C_{30}$ heterocyclic group, two of a plurality of neighboring groups $R_2$ may optionally be linked to form a substituted or unsubstituted $C_5$-$C_{30}$ carbocyclic group or a substituted or unsubstituted $C_1$-$C_{30}$ heterocyclic group, two of a plurality of neighboring groups $R_3$ may optionally be linked to form a substituted or unsubstituted $C_5$-$C_{30}$ carbocyclic group or a substituted or unsubstituted $C_1$-$C_{30}$ heterocyclic group, two of a plurality of neighboring groups $R_4$ may optionally be linked to form a substituted or unsubstituted $C_5$-$C_{30}$ carbocyclic group or a substituted or unsubstituted $C_1$-$C_{30}$ heterocyclic group, two or more neighboring groups selected from $R_1$ to $R_4$ may optionally be linked to form a substituted or unsubstituted $C_5$-$C_{30}$ carbocyclic group or a substituted or unsubstituted $C_1$-$C_{30}$ heterocyclic group, a1 to a4 may each independently be 1, 2, 3, 4, or 5, and at least one selected from $R_1$ to $R_4$ may be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, in the cases where i) M is Pt, ii) $X_1$ is O, iii) $X_2$ and $X_4$ are each N, $X_3$ is C, a bond between $X_2$ and M and a bond between $X_4$ and M are each a coordinate bond, and a bond between $X_3$ and M is a covalent bond, iv) $Y_1$ to $Y_5$ are each C, v) a bond between $Y_5$ and $X_{51}$ and a bond between $Y_3$ and $X_{51}$ are each a single bond, vi) $CY_1$, $CY_2$, and $CY_3$ are each a benzene group, and $CY_4$ is a pyridine group, vii) $X_{51}$ is O, S, or N-[$(L_7)_{b7}$-$(R_7)_{c7}$], and viii) b7 is 0, c7 is 1, and $R_7$ is a substituted or unsubstituted $C_1$-$C_{60}$ alkyl group, at least one substituent of the substituted $C_5$-$C_{30}$ carbocyclic group, the substituted $C_1$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_7$-$C_{60}$ arylalkyl group, the substituted $C_1$-$C_{60}$ heteroaryl group, the substituted $C_2$-$C_{60}$ heteroaryloxy group, the substituted $C_2$-$C_{60}$ heteroarylthio group, the substituted $C_3$-$C_{60}$ heteroarylalkyl group, the substituted monovalent non-aromatic condensed polycyclic group, and the substituted monovalent non-aromatic condensed heteropolycyclic group may be selected from:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_2$-$C_{60}$ heteroaryloxy group, a $C_2$-$C_{60}$ heteroarylthio group, a $C_3$-$C_{60}$ heteroarylalkyl group, a monovalent non-aromatic condensed polycyclic group, a monovalent non-aromatic condensed heteropolycyclic group, —N($Q_{11}$)($Q_{12}$), —S($Q_{13}$)($Q_{14}$)($Q_{15}$), —B($Q_{16}$)($Q_{17}$), and —P(═O)($Q_{18}$)($Q_{19}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_2$-$C_{60}$ heteroaryloxy group, a $C_2$-$C_{60}$ heteroarylthio group, a $C_3$-$C_{60}$ heteroarylalkyl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_2$-$C_{60}$ heteroaryloxy group, a $C_2$-$C_{60}$ heteroarylthio group, a $C_3$-$C_{60}$ heteroarylalkyl group, a monovalent non-aromatic condensed polycyclic group, and a monovalent non-aromatic condensed heteropolycyclic group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_2$-$C_{60}$ heteroaryloxy group, a $C_2$-$C_{60}$ heteroarylthio group, a $C_3$-$C_{60}$ heteroarylalkyl group, a monovalent non-aromatic condensed polycyclic group, a monovalent non-aromatic condensed heteropolycyclic group, —$N(Q_{21})(Q_{22})$, —$Si(Q_{23})(Q_{24})(Q_{25})$, —$B(Q_{26})(Q_{27})$, and —$P(=O)(Q_{28})(Q_{29})$; and —$N(Q_{31})(Q_{32})$, —$Si(Q_{33})(Q_{34})(Q_{35})$, —$B(Q_{36})(Q_{37})$, and —$P(=O)(Q_{38})(Q_{39})$, and $Q_1$ to $Q_9$, $Q_{11}$ to $Q_{19}$, $Q_{21}$ to $Q_{29}$, and $Q_{31}$ to $Q_{39}$ may each independently be selected from hydrogen, deuterium, —F, —Cl, —Br, —I, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_1$-$C_{60}$ alkyl group substituted with at least one selected from deuterium, a $C_1$-$C_{60}$ alkyl group, and a $C_6$-$C_{60}$ aryl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_3$-$C_{60}$ aryl group substituted with at least one selected from deuterium, a $C_1$-$C_{60}$ alkyl group, and a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_2$-$C_{60}$ heteroaryloxy group, a $C_2$-$C_{60}$ heteroarylthio group, a $C_3$-$C_{60}$ heteroarylalkyl group, a monovalent non-aromatic condensed polycyclic group, and a monovalent non-aromatic condensed heteropolycyclic group.

According to one or more embodiments, an organic light-emitting device includes:

a first electrode;

a second electrode; and an organic layer disposed between the first electrode and the second electrode, wherein the organic layer includes an emission layer and at least one organometallic compound.

The organometallic compound may act as a dopant in the organic layer.

According to one or more embodiments, a diagnostic composition includes at least one of the organometallic compound represented by Formula 1A.

BRIEF DESCRIPTION OF THE DRAWING

These and/or other aspects will become apparent and more readily appreciated from the following description of the embodiments, taken in conjunction with the FIGURE which is a schematic view of an organic light-emitting device according to an embodiment.

DETAILED DESCRIPTION

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "on" another element, it can be directly in contact with the other element or intervening elements may be present therebetween. In contrast, when an element is referred to as being "directly on" another element, there are no intervening elements present.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present embodiments.

The terminology used herein is for the purpose of describing particular embodiments only and is not intended to be limiting. As used herein, the singular forms "a," "an," and "the" are intended to include the plural forms as well, unless the context clearly indicates otherwise.

The term "or" means "and/or." It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this general inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

In an embodiment, an organometallic compound is provided.

An organometallic compound according to an embodiment may be represented by Formula 1A:

Formula 1A

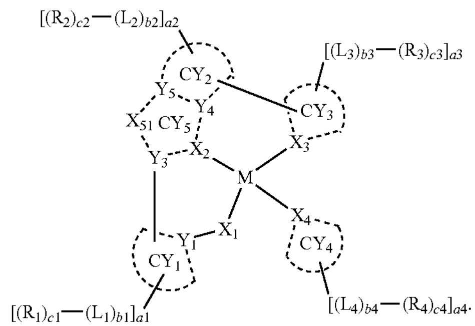

In Formula 1A, M may be beryllium (Be), magnesium (Mg), aluminum (Al), calcium (Ca), titanium (Ti), manganese (Mn), cobalt (Co), copper (Cu), zinc (Zn), gallium (Ga), germanium (Ge), zirconium (Zr), ruthenium (Ru), rhodium (Rh), palladium (Pd), silver (Ag), rhenium (Re), platinum (Pt), or gold (Au).

For example, M in Formula 1A may be platinum (Pt), but embodiments of the present disclosure are not limited thereto.

The organometallic compound represented by Formula 1A may be a neutral compound which does not consist of an ion pair of an anion and a cation.

In Formula 1A, $X_1$ may be O or S, and a bond between $X_1$ and M may be a covalent bond.

For example, in Formula 1A, $X_1$ may be O, but embodiments of the present disclosure are not limited thereto.

In Formula 1A, $X_2$ and $X_3$ may each independently be C or N, and $X_4$ may be N.

In an embodiment, in Formula 1A, $X_3$ may be C, and $X_2$ and $X_4$ may each be N.

In Formula 1A, one bond selected from a bond between $X_2$ and M, a bond between $X_3$ and M, and a bond between $X_4$ and M may be a covalent bond, and the others thereof may each be a coordinate bond.

In an embodiment, a bond between $X_2$ and M and a bond between $X_4$ and M may each be a coordinate bond, and a bond between $X_3$ and M may be a covalent bond.

For example, in Formula 1A, i) $X_2$ and $X_4$ may each be N, $X_3$ may be C, a bond between $X_2$ and M and a bond between $X_4$ and M may each be a coordinate bond, and a bond between $X_3$ and M may be a covalent bond; or ii) $X_3$ and $X_4$ may each be N, $X_2$ may be C, a bond between $X_3$ and M and a bond between $X_4$ and M may each be a coordinate bond, and a bond between $X_2$ and M may be a covalent bond.

In Formula 1A, $Y_1$ and $Y_3$ to $Y_5$ may each independently be C or N.

For example, in Formula 1A, $Y_1$ and $Y_3$ may each be C, but embodiments of the present disclosure are not limited thereto.

In Formula 1A, a bond between $X_2$ and $Y_3$, a bond between $X_2$ and $Y_4$, bond between $Y_4$ and $Y_5$, a bond between $Y_5$ and $X_{51}$, and a bond between $X_{51}$ and $Y_3$ may each be a chemical bond (for example, a single bond, a double bond, a covalent bond or the like).

In Formula 1A, $CY_1$ to $CY_5$ may each independently be selected from a $C_5$-$C_{30}$ carbocyclic group and a $C_1$-$C_{30}$ heterocyclic group. Here, $CY_4$ is not a benzimidazole group.

For example, in Formula 1A, $CY_1$ to $CY_4$ may each independently be selected from a) a 6-membered ring, b) a condensed ring having two or more 6-membered rings that are condensed to each other, and c) a condensed ring having two or more 6-membered rings and one 5-membered ring that are condensed to each other, wherein the 6-membered ring may be selected from a cyclohexane group, a cyclohexene group, an adamantane group, a norbornane group, a norbornene group, a benzene group, a pyridine group, a pyrimidine group, a pyrazine group, a pyridazine group, and a triazine group, and the 5-membered ring may be selected from a cyclopentane group, a cyclopentene group, a cyclopentadiene group, a furan group, a thiophene group, a silole group, a pyrrole group, a pyrazole group, an imidazole group, a triazole group, an oxazole group, an isoxazole group, a thiazole group, an isothiazole group, an oxadiazole group, and a thiadiazole group.

In an embodiment, $CY_1$ to $CY_4$ may each independently be selected from a benzene group, a naphthalene group, an anthracene group, a phenanthrene group, a triphenylene group, a pyrene group, a chrysene group, a cyclopentadiene group, a 1,2,3,4-tetrahydronaphthalene group, a furan group, a thiophene group, silole group, an indene group, a fluorene group, an indole group, a carbazole group, a benzofuran group, a dibenzofuran group, a benzothiophene group, a dibenzothiophene group, a benzosilole group, a dibenzosilole group, an azafluorene group, an azacarbazole group, an azadibenzofuran group, an azadibenzothiophene group, azadibenzosilole group, a pyridine group, a pyrimidine group, a pyrazine group, a pyridazine group, a triazine group, a quinoline group, an isoquinoline group, a quinoxaline group, a quinazoline group, phenanthroline group, a cinnoline group, a phthalazine group, a pyrrole group, a pyrazole group, an imidazole group, a triazole group, an oxazole group, an iso-oxazole group, a thiazole group, an isothiazole group, an oxadiazole group, a thiadiazole group, a benzopyrazole group, a benzimidazole group, a benzoxazole group, a benzothiazole group, a benzooxadiazole group, a benzothiadiazole group, a 5,6,7,8-tetrahydroisoquinoline group, a 5,6,7,8-tetrahydroquinoline group, a 5,6,7,8-tetrahydrophthalazine group, and a 5,6,7,8-tetrahydrocinnoline group.

In one or more embodiments, $CY_1$ to $CY_4$ may each independently be selected from a benzene group, a naphthalene group, an anthracene group, a phenanthrene group, a triphenylene group, a pyrene group, a chrysene group, a cyclopentadiene group, a 1,2,3,4-tetrahydronaphthalene group, a fluorene group, a carbazole group, a dibenzofuran group, a dibenzothiophene group, a dibenzosilole group, an azafluorene group, an azacarbazole group, an azadibenzofuran group, an azadibenzothiophene group, an azadibenzosilole group, a pyridine group, a pyrimidine group, a pyrazine group, a pyridazine group, a triazine group, a quinoline group, an isoquinoline group, a quinoxaline group, a quinazoline group, a phenanthroline group, a cinnoline group, a phthalazine group, a 5,6,7,8-tetrahydroisoquinoline group, a 5,6,7,8-tetrahydroquinoline group, a 5,6,7,8-tetrahydrophthalazine group, and a 5,6,7,8-tetrahydrocinnoline group, but embodiments of the present disclosure are not limited thereto.

In Formula 1A, $CY_5$ may be a 5-membered ring.

In Formula 1A, a cyclometallated ring formed by $CY_5$, $CY_2$, $CY_3$, and M may be a 6-membered ring.

In Formula 1A, $X_{51}$ may be selected from O, S, N-[$(L_7)_{b7}$-$(R_7)_{c7}$], $C(R_7)(R_8)$, $Si(R_7)(R_8)$, $Ge(R_7)(R_8)$, C(=O), N, $C(R_7)$, $Si(R_7)$, and $Ge(R_7)$, $R_7$ and $R_8$ may be optionally linked via a first linking group to form a substituted or unsubstituted $C_5$-$C_{30}$ carbocyclic group or a substituted or unsubstituted $C_1$-$C_{30}$ heterocyclic group (for example, a $C_5$-$C_6$-membered to 7-membered cyclic group, or a $C_5$-$C_6$-membered to 7-membered cyclic group substituted with at least one of deuterium, a cyano group, —F, a $C_1$-$C_{10}$ alkyl group, and a $C_6$-$C_{14}$ aryl group). Here, $L_7$, b7, $R_7$, c7, and $R_8$ are each independently the same as described below.

The first linking group may be selected from a single bond, *—O—*', *—S—*', *—$C(R_5)(R_6)$—*', *—$C(R_5)$=*', *=$C(R_5)$—*', *—$C(R_5)$=$C(R_6)$—*', *—C(=O)—*', *—C(=S)—*', *—C≡C—*', *—$N(R_5)$—*', *—$Si(R_5)(R_6)$—*', and *—$P(R_5)(R_6)$—*', $R_5$ and $R_6$ are each independently the same as described in connection with $R_1$, and * and *' each indicate a binding site to a neighboring atom.

In Formula 1A, $L_1$ to $L_4$ and $L_7$ may each independently be selected from a substituted or unsubstituted $C_5$-$C_{30}$ carbocyclic group and a substituted or unsubstituted $C_1$-$C_{30}$ heterocyclic group.

For example, in Formula 1A, $L_1$ to $L_4$ and $L_7$ may each independently be selected from:

a benzene group, a naphthalene group, an anthracene group, a phenanthrene group, a triphenylene group, a pyrene group, a chrysene group, a cyclopentadiene group, a furan group, a thiophene group, silole group, an indene group, a fluorene group, an indole group, a carbazole group, a benzofuran group, a dibenzofuran group, a benzothiophene group, a dibenzothiophene group, a benzosilole group, a dibenzosilole group, an azafluorene group, an azacarbazole group, an azadibenzofuran group, an azadibenzothiophene group, azadibenzosilole group, a pyridine group, a pyrimidine group, a pyrazine group, a pyridazine group, a triazine group, a quinoline group, an isoquinoline group, a quinoxaline group, a quinazoline group, phenanthroline group, a pyrrole group, a pyrazole group, an imidazole group, a triazole group, an oxazole group, an iso-oxazole group, a thiazole group, an isothiazole group, an oxadiazole group, a thiadiazole group, a benzopyrazole group, a benzimidazole group, a benzoxazole group, a benzothiazole group, a benzooxadiazole group, and a benzothiadiazole group; and a benzene group, a naphthalene group, an anthracene group, a phenanthrene group, a triphenylene group, a pyrene group, a chrysene group, a cyclopentadiene group, a furan group, a thiophene group, silole group, an indene group, a fluorene group, an indole group, a carbazole group, a benzofuran group, a dibenzofuran group, a benzothiophene group, a dibenzothiophene group, a benzosilole group, a dibenzosilole group, an azafluorene group, an azacarbazole group, an azadibenzofuran group, an azadibenzothiophene group, azadibenzosilole group, a pyridine group, a pyrimidine group, a pyrazine group, a pyridazine group, a triazine group, a quinoline group, an isoquinoline group, a quinoxaline group, a quinazoline group, phenanthroline group, a pyrrole group, a pyrazole group, an imidazole group, a triazole group, an oxazole group, an iso-oxazole group, a thiazole group, an isothiazole group, an oxadiazole group, a thiadiazole group, a benzopyrazole group, a benzimidazole group, a benzoxazole group, a benzothiazole group, a benzooxadiazole group, and a benzothiadiazole group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a pyridinyl group, a pyrimidinyl group, a triazinyl group, a fluorenyl group, a dimethylfluorenyl group, a diphenylfluorenyl group, a carbazolyl group, a phenylcarbazolyl group, a dibenzofuranyl group, a dibenzothiophenyl group, a dibenzosilolyl group, a dimethyldibenzosilolyl group, a diphenyldibenzosilolyl group, —$N(Q_{31})(Q_{32})$, —$Si(Q_{33})(Q_{34})(Q_{35})$, —$B(Q_{36})(Q_{37})$, and —$P(=O)(Q_{38})(Q_{39})$, $Q_{31}$ to $Q_{39}$ may each independently be selected from:

—$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, and —$CD_2CDH_2$;

an n-propyl group, an iso-propyl group, an n-butyl group, an isobutyl group, a sec-butyl group, a tert-butyl group, an n-pentyl group, an isopentyl group, a sec-pentyl group, a tert-pentyl group, a phenyl group, and a naphthyl group; and an n-propyl group, an iso-propyl group, an n-butyl group, an isobutyl group, a sec-butyl group, a tert-butyl group, an n-pentyl group, an isopentyl group, a sec-pentyl group, a tert-pentyl group, a phenyl group, and a naphthyl group, each substituted with at least one selected from deuterium, a $C_1$-$C_{10}$ alkyl group, and a phenyl group, but embodiments of the present disclosure are not limited thereto.

In an embodiment, in Formula 1A, $L_1$ to $L_4$ and $L_7$ may each independently be selected from:

a benzene group, a pyridine group, and a pyrimidine group; and a benzene group, a pyridine group, and a pyrimidine group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a pyridinyl group, and a pyrimidinyl group, —$N(Q_{31})(Q_{32})$, —$S(Q_{33})(Q_{34})(Q_{35})$, —$B(Q_{36})(Q_{37})$, and —$P(=O)(Q_{38})(Q_{39})$ (wherein $Q_{31}$ to $Q_{39}$ are each independently the same as described herein), but embodiments of the present disclosure are not limited thereto.

In Formula 1A, b1 to b4 and b7 respectively indicate the number of $L_1$ to $L_4$ and $L_7$, and may each independently be an integer from 0 to 5. When b1 is 0, *-$(L_1)_{b1}$-*' may be a single bond. When b1 is two or more, two or more groups $L_1$ may be identical to or different from each other. b2 to b4 and b7 are each independently the same as described in connection with b1.

In an embodiment, in Formula 1A, b1 to b4 and b7 may be each independently 0 or 1, but embodiments of the present disclosure are not limited thereto.

In Formula 1A, $R_1$ to $R_4$, $R_7$, and $R_8$ may each independently be selected from hydrogen, deuterium, —F, —C, —Br, —I, —$SF_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_2$-$C_{60}$ heteroaryloxy group, a substituted or unsubstituted $C_2$-$C_{60}$ heteroarylthio group, a substituted or unsubstituted $C_3$-$C_{60}$ heteroarylalkyl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —B($Q_6$)($Q_7$), and —P(═O)($Q_8$)($Q_9$).

For example, $R_1$ to $R_4$, $R_7$, and $R_8$ may each independently be selected from:

hydrogen, deuterium, —F, —C, —Br, —I, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, —$SF_5$, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —C, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cyclooctyl group, an adamantanyl (adamantyl) group, a norbornanyl (norbornyl) group, a norbornenyl group, a cyclopentenyl group, a cyclohexenyl group, a cycloheptenyl group, a phenyl group, a naphthyl group, a pyridinyl group, and a pyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, and an imidazopyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, and an imidazopyrimidinyl group, each substituted with at least one selected from deuterium, —F, —C, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, an imidazopyrimidinyl group and —Si($Q_{33}$)($Q_{34}$)($Q_{35}$); and —N($Q_1$)($Q_2$), —Si($Q_3$)($Q_4$)($Q_5$), —B($Q_6$)($Q_7$), and —P(═O)($Q_8$)($Q_9$), and $Q_1$ to $Q_9$ and $Q_{33}$ to $Q_{35}$ are each independently the same as described in connection with $Q_{31}$.

In an embodiment, $R_1$ to $R_4$, $R_7$, and $R_8$ may each independently be selected from:

hydrogen, deuterium, —F, a cyano group, a nitro group, —$SF_5$, a methyl group, an ethyl group, an n-propyl group, an iso-propyl group, an n-butyl group, an isobutyl group, a sec-butyl group, a tert-butyl group, an n-pentyl group, an isopentyl group, a sec-pentyl group, a tert-pentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group, a tert-decyl group, a methoxy group, an ethoxy group, a propoxy group, a butoxy group, a pentoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, a pyrimidinyl group, a fluorenyl group, a carbazolyl group, a dibenzofuranyl group, a dibenzothiophenyl group, and a dibenzosilolyl group;

a methyl group, an ethyl group, an n-propyl group, an iso-propyl group, an n-butyl group, an isobutyl group, a sec-butyl group, a tert-butyl group, an n-pentyl group, an isopentyl group, a sec-pentyl group, a tert-pentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group, a tert-decyl group, a methoxy group, an ethoxy group, a propoxy group, a butoxy group, a pentoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, a pyrimidinyl group, a fluorenyl group, a carbazolyl group, a dibenzofuranyl group, a dibenzothiophenyl group, and a dibenzosilolyl group, each substituted with at least one selected from deuterium, —F, $—CD_3$, $—CD_2H$, $—CDH_2$, $—CF_3$, $—CF_2H$, $—CFH_2$, a cyano group, a nitro group, a $C_1$-$C_{10}$ alkyl group, a $C_1$-$C_{10}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, a pyrimidinyl group, a fluorenyl group, a carbazolyl group, a dibenzofuranyl group, a dibenzothiophenyl group, a dibenzosilolyl group and $—Si(Q_{33})(Q_{34})(Q_{35})$; and $—N(Q_1)(Q_2)$, $—Si(Q_3)(Q_4)(Q_5)$, $—B(Q_6)(Q_7)$, and $—P(=O)(Q_8)(Q_9)$, and $Q_1$ to $Q_9$ and $Q_{33}$ to $Q_{35}$ are each independently the same as described herein, but embodiments of the present disclosure are not limited thereto.

In one or more embodiments, $R_1$ to $R_4$, $R_7$, and $R_8$ may each independently be selected from hydrogen, deuterium, —F, a cyano group, a nitro group, $—SF_5$, $—CH_3$, $—CD_3$, $—CD_2H$, $—CDH_2$, $—CF_3$, $—CF_2H$, $—CFH_2$, $—C_2F_5$, $—C_2F_4H$, $—C_2F_3H_2$, $—C_2F_2H_3$, $—C_2FH_4$, groups represented by Formulae 9-1 to 9-19, groups represented by Formulae 10-1 to 10-167, $—N(Q_1)(Q_2)$, $—Si(Q_3)(Q_4)(Q_5)$, $—B(Q_6)(Q_7)$, and $—P(=O)(Q_8)(Q_9)$ (wherein $Q_1$ to $Q_9$ are each independently the same as described herein), but embodiments of the present disclosure are not limited thereto:

Formula 9-1

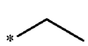

Formula 9-2

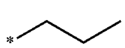

Formula 9-3

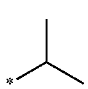

Formula 9-4

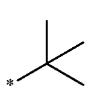

-continued

Formula9-5

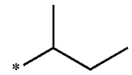

Formula 9-6

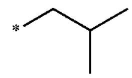

Formula 9-7

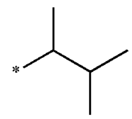

Formula 9-8

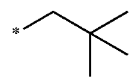

Formula 9-9

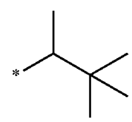

Formula 9-10

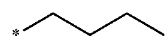

Formula 9-11

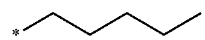

Formula 9-12

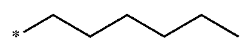

Formula 9-13

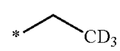

Formula 9-14

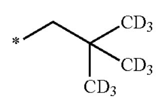

Formula 9-15

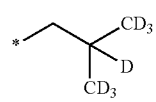

Formula 9-16

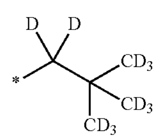

Formula 9-17

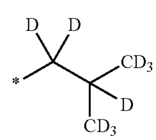

Formula 9-18

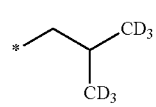

Formula 9-19

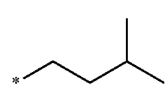

Formula 10-1

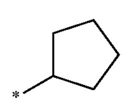

Formula 10-2

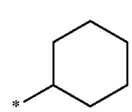

-continued
Formula 10-3
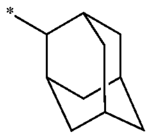
Formula 10-4
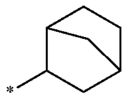
Formula 10-5
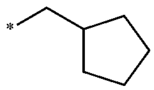
Formula 10-6
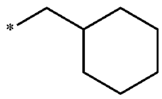
Formula 10-7
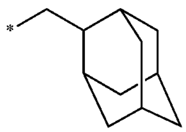
Formula 10-8
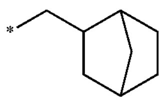
Formula 10-9
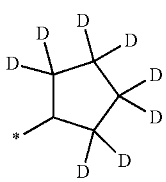
Formula 10-10
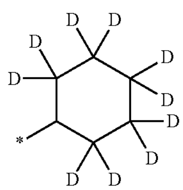
Formula 10-11
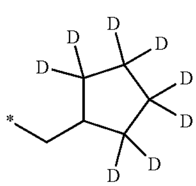
Formula 10-12
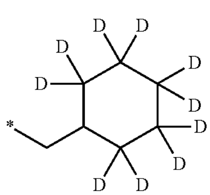
Formula 10-13
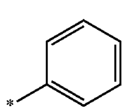
-continued
Formula 10-14
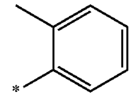
Formula 10-15
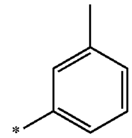
Formula 10-16
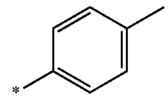
Formula 10-17
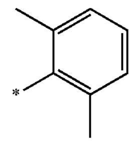
Formula 10-18
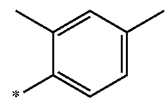
Formula 10-19
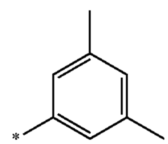
Formula 10-20
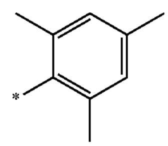
Formula 10-21
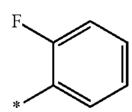
Formula 10-22
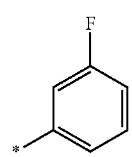
Formula 10-23
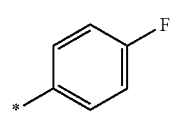
Formula 10-24
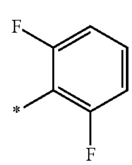
Formula 10-25
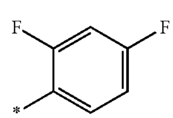

-continued
Formula 10-26
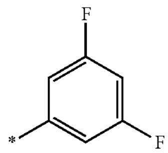
Formula 10-27
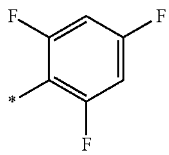
Formula 10-28
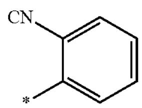
Formula 10-29
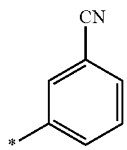
Formula 10-30
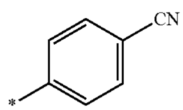
Formula 10-31
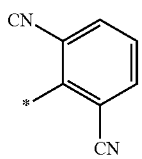
Formula 10-32
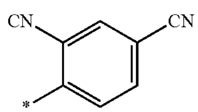
Formula 10-33
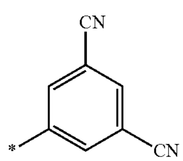
Formula 10-34
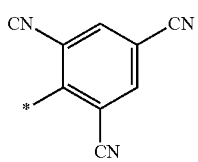
Formula 10-35
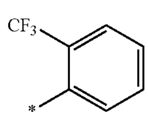
Formula 10-36
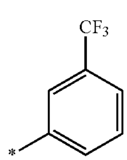
-continued
Formula 10-37
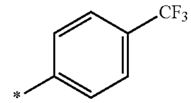
Formula 10-38
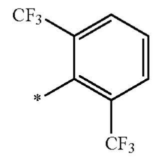
Formula 10-39
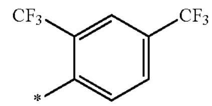
Formula 10-40
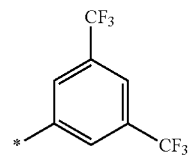
Formula 10-41
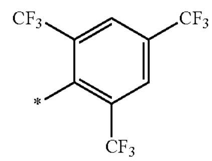
Formula 10-42
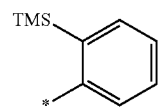
Formula 10-43
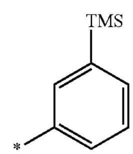
Formula 10-44
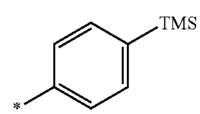
Formula 10-45
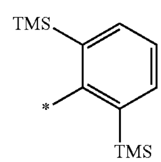
Formula 10-46
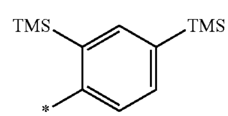
Formula 10-47
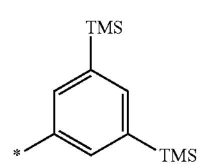

-continued
Formula 10-48
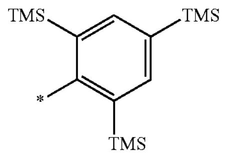
Formula 10-49
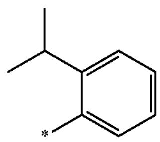
Formula 10-50
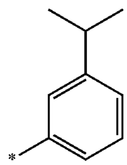
Formula 10-51
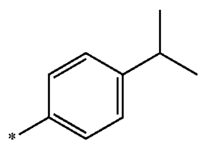
Formula 10-52
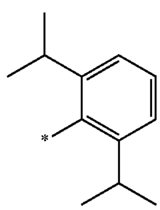
Formula 10-53
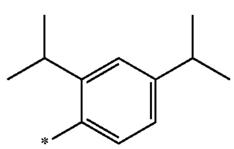
Formula 10-54
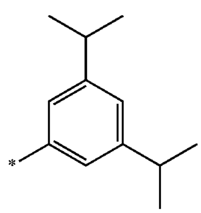
Formula 10-55
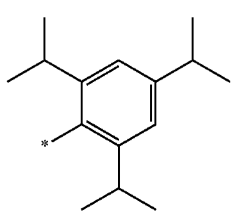
Formula 10-56
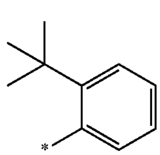
-continued
Formula 10-57
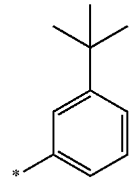
Formula 10-58
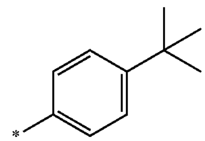
Formula 10-59
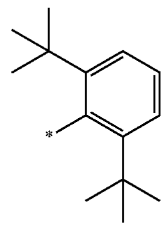
Formula 10-60
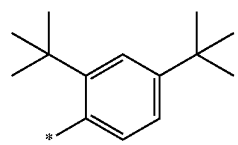
Formula 10-61
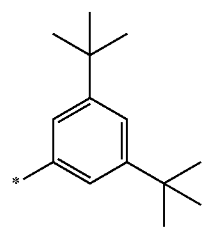
Formula 10-62
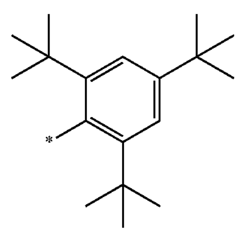
Formula 10-63
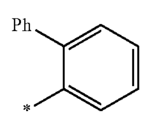
Formula 10-64
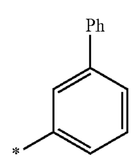
Formula 10-65
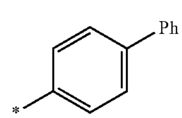

-continued
Formula 10-66
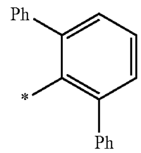
Formula 10-67
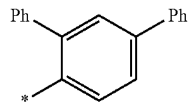
Formula 10-68
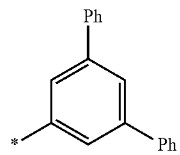
Formula 10-69
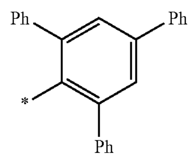
Formula 10-70
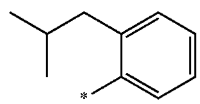
Formula 10-71
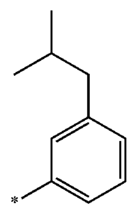
Formula 10-72
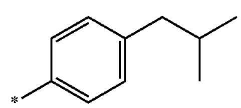
Formula 10-73
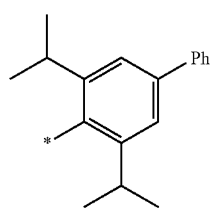
Formula 10-74
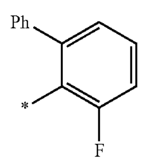
Formula 10-75
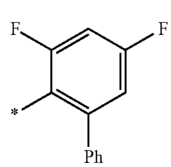
-continued
Formula 10-76
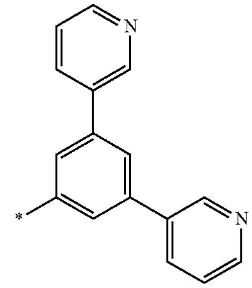
Formula 10-77
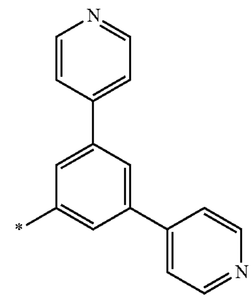
Formula 10-78
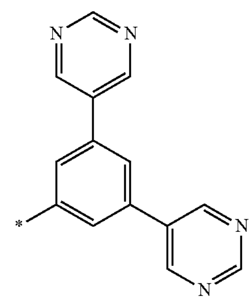
Formula 10-79
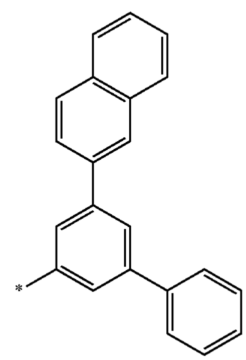
Formula 10-80
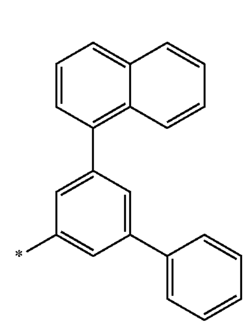

-continued
Formula 10-81
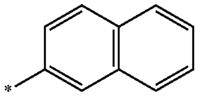
Formula 10-82
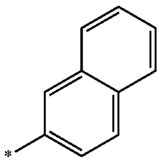
Formula 10-83
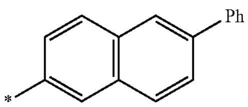
Formula 10-84
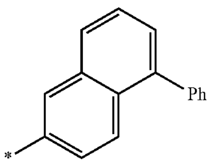
Formula 10-85
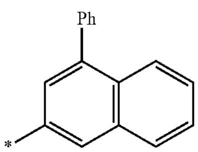
Formula 10-86
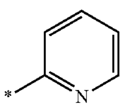
Formula 10-87
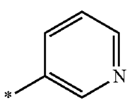
Formula 10-88
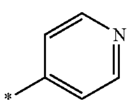
Formula 10-89
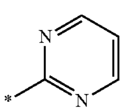
Formula 10-90
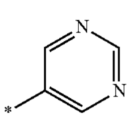
Formula 10-91
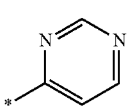
Formula 10-92
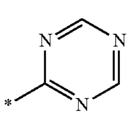
-continued
Formula 10-93
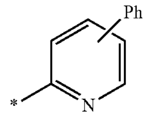
Formula 10-94
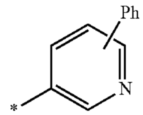
Formula 10-95
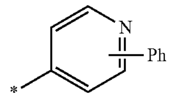
Formula 10-96
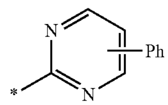
Formula 10-97
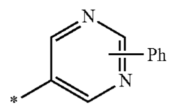
Formula 10-98
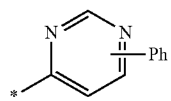
Formula 10-99
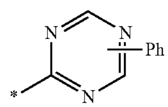
Formula 10-100
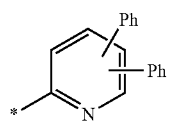
Formula 10-101
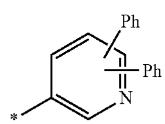
Formula 10-102
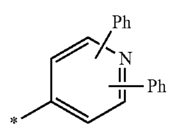
Formula 10-103
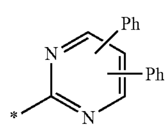
Formula 10-104
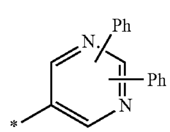
Formula 10-105
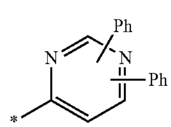

-continued
Formula 10-106
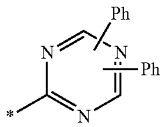
Formula 10-107
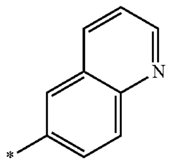
Formula 10-108
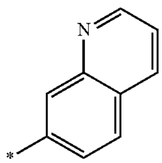
Formula 10-109
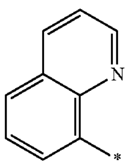
Formula 10-110
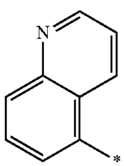
Formula 10-111
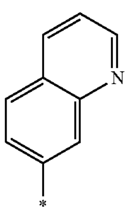
Formula 10-112
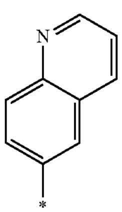
Formula 10-113
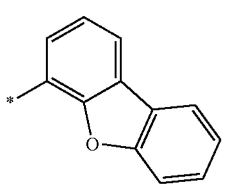
Formula 10-114
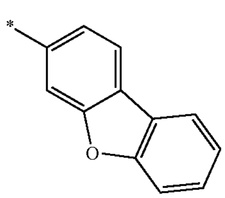
-continued
Formula 10-115
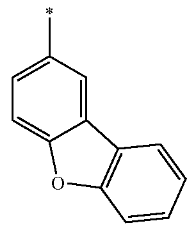
Formula 10-116
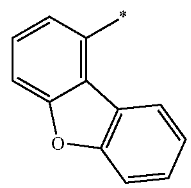
Formula 10-117
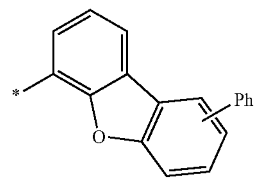
Formula 10-118
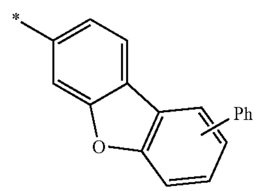
Formula 10-119
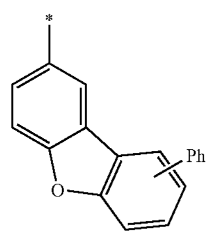
Formula 10-120
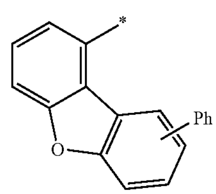
Formula 10-121
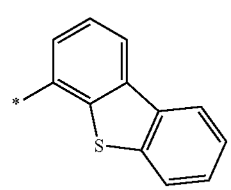
Formula 10-122
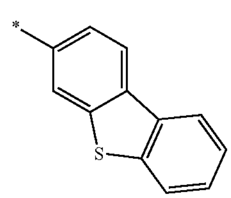

-continued
Formula 10-123
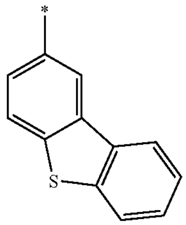
Formula 10-124
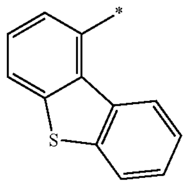
Formula 10-125
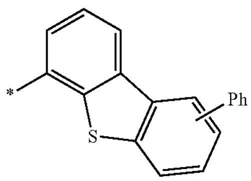
Formula 10-126
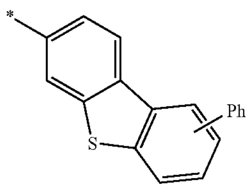
Formula 10-127
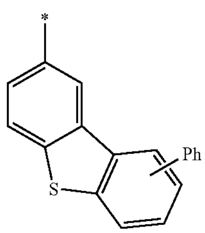
Formula 10-128
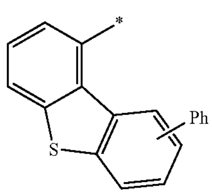
Formula 10-129
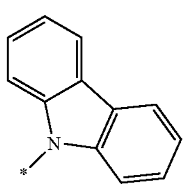
Formula 10-130
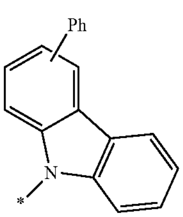
-continued
Formula 10-131
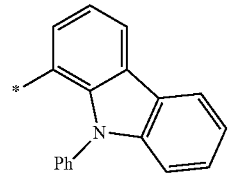
Formula 10-132
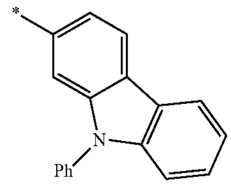
Formula 10-133
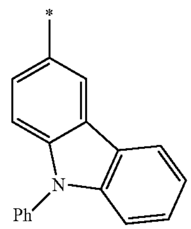
Formula 10-134
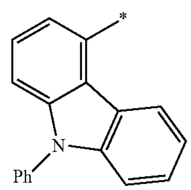
Formula 10-135
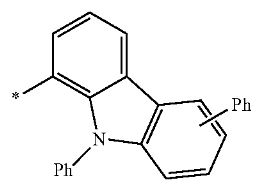
Formula 10-136
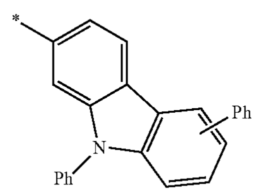
Formula 10-137
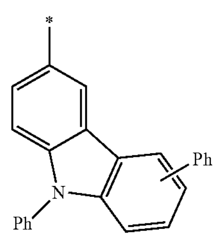
Formula 10-138
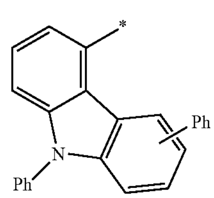

-continued
Formula 10-139
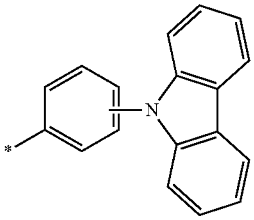
Formula 10-140
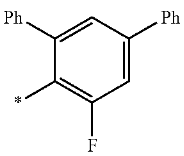
Formula 10-141
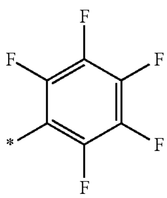
Formula 10-142
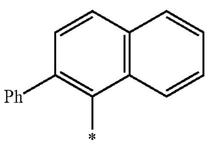
Formula 10-143
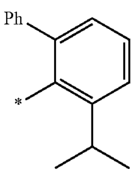
Formula 10-144
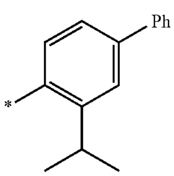
Formula 10-145
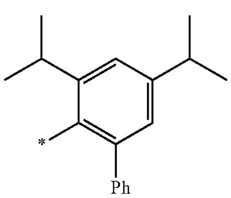
Formula 10-146
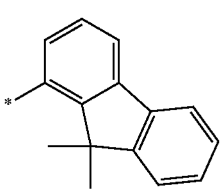
-continued
Formula 10-147
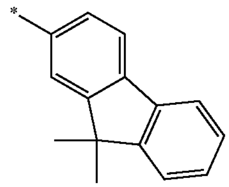
Formula 10-148
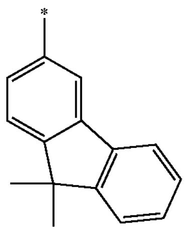
Formula 10-149
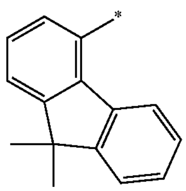
Formula 10-150
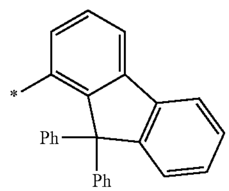
Formula 10-151
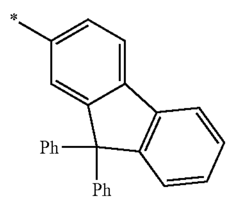
Formula 10-152
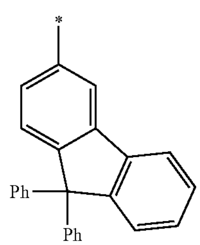
Formula 10-153
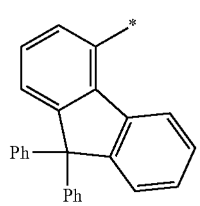
Formula 10-154
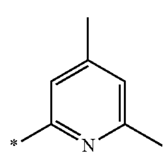

-continued

Formula 10-155

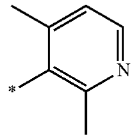

Formula 10-156

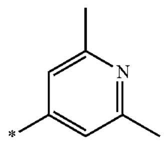

Formula 10-157

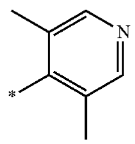

Formula 10-158

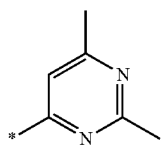

Formula 10-159

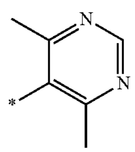

Formula 10-160

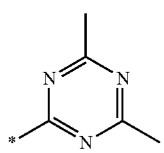

Formula 10-161

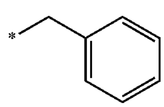

Formula 10-162

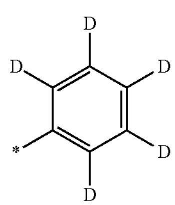

Formula 10-163

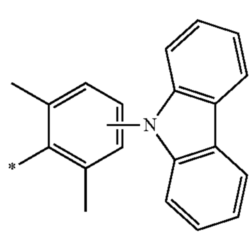

Formula 10-164

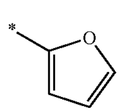

-continued

Formula 10-165

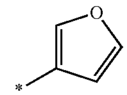

Formula 10-166

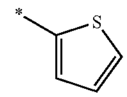

Formula 10-167

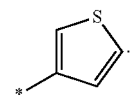

In groups represented by Formulae 9-1 to 9-19 and Formulae 10-1 to 10-167, * indicate a binding site to a neighboring group, "Ph" indicates a phenyl group, and "TMS" indicates a trimethylsilyl group.

In Formula 1A, c1 to c4 respectively indicate the number of $R_1$ to $R_4$, and may each independently be an integer from 1 to 5. When c1 is two or more, two or more groups $R_1$ may be identical to or different from each other. c2 to c4 are each independently the same as described in connection with c1.

In an embodiment, in Formula 1A, c1 to c4 may each independently be 1 or 2, but embodiments of the present disclosure are not limited thereto.

In Formula 1A, a1 to a4 respectively indicate the number of $*—[(L_1)_{b1}-(R_1)_{c1}]$, $*—[(L_2)_{b2}-(R_2)_{c2}]$, $*—[(L_3)_{b3}-(R_3)_{c3}]$, and $*—[(L_4)_{b4}-(R_4)_{c4}]$, and may each independently be 0, 1, 2, 3, 4, or 5. When a1 is two or more, two or more groups $*—[(L_1)_{b1}-(R_1)_{c1}]$ may be identical to or different from each other. When a2 is two or more, two or more groups $*—[(L_2)_{b2}-(R_2)_{c2}]$ may be identical to or different from each other. When a3 is two or more, two or more groups $*—[(L_3)_{b3}-(R_3)_{c3}]$ may be identical to or different from each other. When a4 is two or more, two or more groups $*—[(L_4)_{b4}-(R_4)_{c4}]$ may be identical to or different from each other. However, embodiments of the present disclosure are not limited thereto.

For example, in Formula 1A, a1 to a4 may each independently be 1, 2, 3, 4, or 5, and i) at least one selected from $R_1$ to $R_4$ may not be hydrogen, ii) at least one selected from $R_1$, $R_2$, and $R_4$ may not be hydrogen, iii) at least one selected from $R_1$ to $R_3$ may not be hydrogen, or iv) at least one selected from $R_1$ and $R_2$ may not be hydrogen, but embodiments of the present disclosure are not limited thereto.

In Formula 1A, i) two of a plurality of neighboring groups $R_1$ may optionally be linked to form a substituted or unsubstituted $C_5$-$C_{30}$ carbocyclic group or a substituted or unsubstituted $C_1$-$C_{30}$ heterocyclic group, ii) two of a plurality of neighboring groups $R_2$ may optionally be linked to form a substituted or unsubstituted $C_5$-$C_{30}$ carbocyclic group or a substituted or unsubstituted $C_1$-$C_{30}$ heterocyclic group, iii) two of a plurality of neighboring groups $R_3$ may optionally be linked to form a substituted or unsubstituted $C_5$-$C_{30}$ carbocyclic group or a substituted or unsubstituted $C_1$-$C_{30}$ heterocyclic group, iv) two of a plurality of neighboring groups $R_4$ may optionally be linked to form a substituted or unsubstituted $C_5$-$C_{30}$ carbocyclic group or a substituted or unsubstituted $C_1$-$C_{30}$ heterocyclic group, and v) two or more neighboring groups selected from $R_1$ to $R_4$ may optionally be linked to form a substituted or unsubstituted $C_5$-$C_{30}$ carbocyclic group or a substituted or unsubstituted $C_1$-$C_{30}$ heterocyclic group.

For example, in Formula 1A, i) a substituted or unsubstituted $C_5$-$C_{30}$ carbocyclic group or a substituted or unsubstituted $C_1$-$C_{30}$ heterocyclic group, formed by linking two of a plurality of neighboring groups $R_1$, ii) a substituted or unsubstituted $C_5$-$C_{30}$ carbocyclic group or a substituted or unsubstituted $C_1$-$C_{30}$ heterocyclic group, formed by linking two of a plurality of neighboring groups $R_2$, iii) a substituted or unsubstituted $C_5$-$C_{30}$ carbocyclic group or a substituted or unsubstituted $C_1$-$C_{30}$ heterocyclic group, formed by linking two of a plurality of neighboring groups $R_3$, iv) a substituted or unsubstituted $C_5$-$C_{30}$ carbocyclic group or a substituted or unsubstituted $C_1$-$C_{30}$ heterocyclic group, formed by linking two of a plurality of neighboring groups $R_4$, and v) a substituted or unsubstituted $C_5$-$C_{30}$ carbocyclic group or a substituted or unsubstituted $C_1$-$C_{30}$ heterocyclic group, formed by linking two or more neighboring groups selected from $R_1$ to $R_4$ may each independently be selected from:

a cyclopentadiene group, a cyclohexane group, a cycloheptane group, an adamantane group, a norbornane group, a norbornene group, a bicycle-heptane group, a bicyclo-octane group, a benzene group, a pyridine group, a pyrimidine group, a pyrazine group, a pyridazine group, a triazine group, a naphthalene group, an anthracene group, a tetracene group, a phenanthrene group, a dihydronaphthalene group, a phenalene group, a benzothiophene group, a benzofuran group, an indene group, an indole group, a benzosilole group, an azabenzothiophene group, an azabenzofuran group, an azaindene group, an azaindole group, and an azabenzosilole group; and a cyclopentadiene group, a cyclohexane group, a cycloheptane group, an adamantane group, a norbornane group, a norbornene group, a bicycle-heptane group, a bicyclo-octane group, a benzene group, a pyridine group, a pyrimidine group, a pyrazine group, a pyridazine group, a triazine group, a naphthalene group, an anthracene group, a tetracene group, a phenanthrene group, a dihydronaphthalene group, a phenalene group, a benzothiophene group, a benzofuran group, an indene group, an indole group, a benzosilole group, an azabenzothiophene group, an azabenzofuran group, an azaindene group, an azaindole group, and an azabenzosilole group, each substituted with at least one $R_{1a}$, but embodiments of the present disclosure are not limited thereto.

$R_{1a}$ may be the same as described in connection with $R_1$.

"An azabenzothiophene group, an azabenzofuran group, an azaindene group, an azaindole group, an azabenzosilole group, an azadibenzothiophene group, an azadibenzofuran group, an azafluorene group, an azacarbazole group, and an azadibenzosilole group" as used herein mean hetero-rings that respectively have the same backbones as "a benzothiophene group, a benzofuran group, an indene group, an indole group, a benzosilole group, a dibenzothiophene group, a dibenzofuran group, a fluorene group, a carbazole group, and a dibenzosilole group', wherein at least one of carbons forming rings thereof is substituted with nitrogen.

In an embodiment, in Formula 1A, i) a bond between $Y_3$ and $X_{51}$ and a bond between $Y_5$ and $X_{51}$ may each be a single bond, and $X_{51}$ may be $C(R_7)(R_8)$, $Si(R_7)(R_8)$, or C(═O), ii) a bond between $Y_3$ and $X_{51}$ and a bond between $Y_5$ and $X_{51}$ may each be a single bond, $X_{51}$ may be N-[$(L_7)_{b7}$-$(R_7)_{c7}$], and $R_7$ may be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_5$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_2$-$C_{60}$ heteroaryloxy group, a substituted or unsubstituted $C_2$-$C_{60}$ heteroarylthio group, a substituted or unsubstituted $C_3$-$C_{60}$ heteroarylalkyl group, a substituted or unsubstituted monovalent non-aromatic condensed polycyclic group, and a substituted or unsubstituted monovalent non-aromatic condensed heteropolycyclic group, or iii) one bond selected from a bond between $Y_3$ and $X_{51}$ and a bond between $Y_5$ and $X_{51}$ may be a single bond, and the others thereof may each be a double bond, and $X_{51}$ may be N, $C(R_7)$, or $Si(R_7)$.

In one or more embodiments, in Formula 1A, $X_{51}$ may be N-[$(L_7)_{b7}$-$(R_7)_{c7}$], and $R_7$ may be selected from:

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, and an imidazopyrimidinyl group; and a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, and an imidazopyrimidinyl group, each substituted with at least one selected from deuterium, —F, —C, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzosilolyl group, a dibenzocarbazolyl group, an imidazopyridinyl group, an imidazopyrimidinyl group, and —$Si(Q_{33})(Q_{34})(Q_{35})$, and $Q_{33}$ to $Q_{35}$ are each independently the same as described herein.

In one or more embodiments, in Formula 1A, $X_{51}$ may be N-$[(L_7)_{b7}$-$(R_7)_{c7}]$, and $R_7$ may be selected from groups represented by Formulae 10-1 to 10-128 and groups represented by Formulae 10-131 to 10-167, but embodiments of the present disclosure are not limited thereto.

In one or more embodiments, in Formula 1A, in cases where i) M is Pt, ii) $X_1$ is O, iii) $X_2$ and $X_4$ are each N, $X_3$ is C, a bond between $X_2$ and M and a bond between $X_4$ and M are each a coordinate bond, and a bond between $X_3$ and M is a covalent bond, iv) $Y_1$ to $Y_5$ are each C, v) a bond between $Y_5$ and $X_{51}$ and a bond between $Y_3$ and $X_{51}$ are each a single bond, vi) $CY_1$, $CY_2$, and $CY_3$ are each a benzene group, and $CY_4$ is a pyridine group, vii) $X_{51}$ is O, S, or N-$[(L_7)_{b7}$-$(R_7)_{c7}]$, and viii) b7 is 0, c7 is 1, and $R_7$ is a substituted or unsubstituted $C_1$-$C_{60}$ alkyl group, a1 to a4 may each independently be 1, 2, 3, 4, or 5, and at least one selected from $R_1$ to $R_4$ may be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group.

In one or more embodiments, Formula 1A, in which $X_{51}$ may be O, S, or N-$[(L_7)_{b7}$-$(R_7)_{c7}]$, b7 may be 0, c7 may be 1, and $R_7$ may be a substituted or unsubstituted $C_1$-$C_{60}$ alkyl group may be satisfied with at least one selected from "Condition 1" to "Condition 6":

Condition 1

M may be beryllium (Be), magnesium (Mg), aluminum (Al), calcium (Ca), titanium (Ti), manganese (Mn), cobalt (Co), copper (Cu), zinc (Zn), gallium (Ga), germanium (Ge), zirconium (Zr), ruthenium (Ru), rhodium (Rh), palladium (Pd), silver (Ag), rhenium (Re), or gold (Au);

Condition 2

$X_1$ may be S

Condition 3

$X_3$ and $X_4$ may each be N, $X_2$ may be C, a bond between $X_3$ and M and a bond between $X_4$ and M may each be a coordinate bond, and a bond between $X_2$ and M may be a covalent bond;

Condition 4 at least one selected from $Y_1$ to $Y_5$ may not be C;

Condition 5 at least one selected from $CY_1$, $CY_2$, and $CY_3$ may not be a benzene group; and Condition 6

$CY_4$ may not be a pyridine group

In one or more embodiments, the organometallic compound may be represented by Formula 1A, wherein M may be Pt, $X_1$ may be O, $X_2$ and $X_4$ may each be N, $X_3$ may be C, a bond between $X_2$ and M and a bond between $X_4$ and M may each be a coordinate bond, a bond between $X_3$ and M may be a covalent bond, $Y_1$ to $Y_5$ may each be C, a bond between $Y_5$ and $X_{51}$, a bond between $Y_3$ and $X_{51}$ may each be a single bond, $CY_1$, $CY_2$, and $CY_3$ may each be a benzene group, $CY_4$ may be a pyridine group, $X_{51}$ may be O, S, or N-$[(L_7)_{b7}$-$(R_7)_{c7}]$, b7 may be 0, c7 may be 1, $R_7$ may be a substituted or unsubstituted $C_1$-$C_{60}$ alkyl group, a1 to a4 may each independently be 1, 2, 3, or 4, and at least one selected from $R_1$ to $R_4$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group.

In one or more embodiments, the organometallic compound may be represented by Formula 1A, wherein M may be Pt, $X_1$ may be O, $X_2$ and $X_4$ may each be N, $X_3$ may be C, a bond between $X_2$ and M and a bond between $X_4$ and M may each be a coordinate bond, a bond between $X_3$ and M may be a covalent bond, $Y_1$ to $Y_5$ may each be C, a bond between $Y_5$ and $X_{51}$, a bond between $Y_3$ and $X_{51}$ may each be a single bond, $CY_1$, $CY_2$, and $CY_3$ may each be a benzene group, $CY_4$ may be a pyridine group, $X_{51}$ may be O, S, or N-$[(L_7)_{b7}$-$(R_7)_{c7}]$, b7 may be 0, c7 may be 1, $R_7$ may be selected from:

a $C_1$-$C_{30}$ alkyl group; and a $C_1$-$C_{30}$ alkyl group substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, $C_1$-$C_{10}$ alkyl group, a $C_1$-$C_{10}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, and a pyrimidinyl group, a1 to a4 may each independently be 1, 2, 3, or 4, and at least one selected from $R_1$ to $R_4$ may each independently be selected from:

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzosilolyl group, a dibenzocarbazolyl group, an imidazopyridinyl group, and an imidazopyrimidinyl group; and a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, and an imidazopyrimidinyl group, each substituted with at least one selected from deuterium, —F, —C, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, an imidazopyrimidinyl group, and $—Si(Q_{33})(Q_{34})(Q_{35})$ (wherein $Q_{33}$ to $Q_{35}$ are each independently the same as described herein), but embodiments of the present disclosure are not limited thereto.

In one or more embodiments, in Formula 1A, $X_{51}$ may be O, S, or N-$[(L_7)_{b7}$-$(R_7)_{c7}]$, b7 may be 0, c7 may be 1, $R_7$ may be selected from:

a $C_1$-$C_{30}$ alkyl group, and a $C_1$-$C_{30}$ alkyl group substituted with at least one selected from deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, $C_1$-$C_{10}$ alkyl group, a $C_1$-$C_{10}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, and a pyrimidinyl group, a1 to a4 may each independently be 1, 2, 3, or 4, and at least one selected from $R_1$ to $R_4$ may each independently be selected from:

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, and an imidazopyrimidinyl group; and a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, and an imidazopyrimidinyl group, each substituted with at least one selected from deuterium, —F, —C, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, an imidazopyrimidinyl group, and $—Si(Q_{33})(Q_{34})(Q_{35})$ (wherein $Q_{33}$ to $Q_{35}$ are each independently the same as described herein).

In an embodiment, in Formula 1A, a moiety represented by

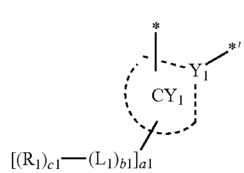

may be represented by one selected from Formulae CY1-1 to CY1-16:

Formula CY1-1

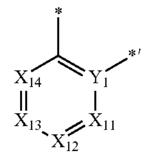

Formula CY1-2

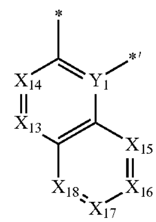

Formula CY1-3

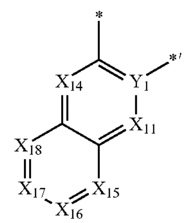

Formula CY1-4

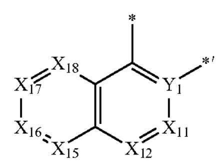

Formula CY1-5

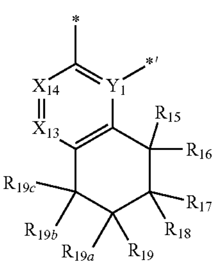

Formula CY1-6

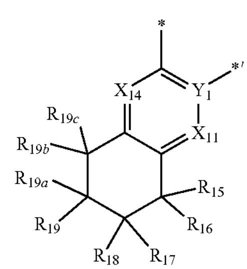

Formula CY1-7

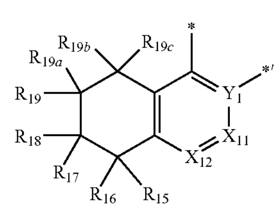

-continued

Formula CY1-8

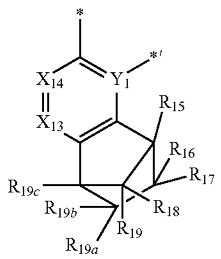

Formula CY1-9

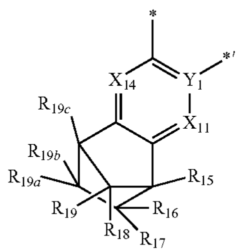

Formula CY1-10

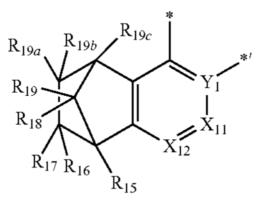

Formula CY1-11

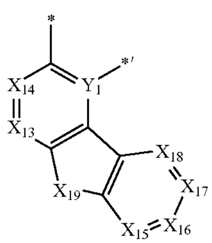

Formula CY1-12

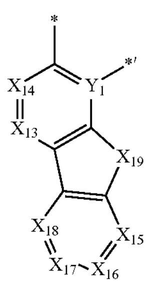

Formula CY1-13

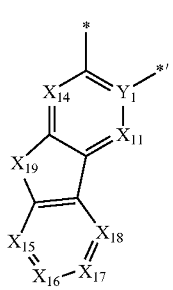

-continued

Formula CY1-14

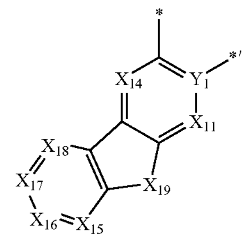

Formula CY1-15

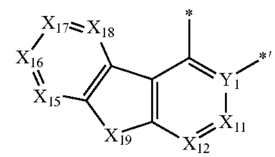

Formula CY1-16

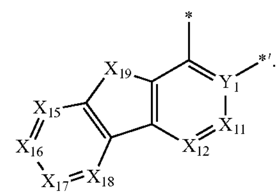

In Formulae CY1-1 to CY1-16, $Y_1$ may be the same as described herein, $X_{11}$ may be N or C-[$(L_{11})_{b11}$-$(R_{11})_{c11}$], $X_{12}$ may be N or C-[$(L_{12})_{b12}$-$(R_{12})_{c12}$], $X_{13}$ may be N or C-[$(L_{13})_{b13}$-$(R_{13})_{c13}$], $X_{14}$ may be N or C-[$(L_{14})_{b14}$-$(R_{14})_{c14}$], $X_{15}$ may be N or C-[$(L_{15})_{b15}$-$(R_{15})_{c15}$], $X_{16}$ may be N or C-[$(L_{16})_{b16}$-$(R_{16})_{c16}$], $X_{17}$ may be N or C-[$(L_{17})_{b17}$-$(R_{17})_{c17}$], $X_{18}$ may be N or C-[$(L_{18})_{b18}$-$(R_{18})_{c18}$], $X_{19}$ may be C($R_{19a}$)($R_{19b}$), N-[$(L_{19})_{b19}$-$(R_{19})_{c19}$], O, S, or Si($R_{19a}$)($R_{19b}$), $L_{11}$ to $L_{19}$ may each independently be the same as described in connection with $L_1$, b11 to b19 may each independently be the same as described in connection with b1, $R_{11}$ to $R_{19}$ and $R_{19a}$ to $R_{19c}$ may each independently be the same as described in connection with $R_1$, c11 to c19 may each independently be the same as described in connection with c1,

*' indicates a binding site to M of Formula 1A, and

* indicates a binding site to CY5 of Formula 1A.

In one or more embodiments, in Formula 1A, a moiety represented by

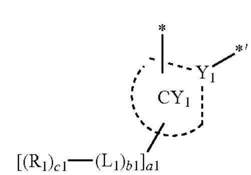

may be represented by one selected from Formulae A1(1) to A1(30):
Formula A1(1)
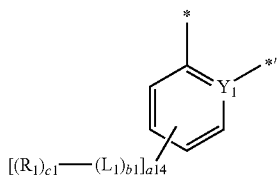
Formula A1(2)
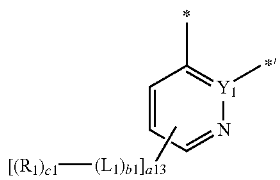
Formula A1(3)
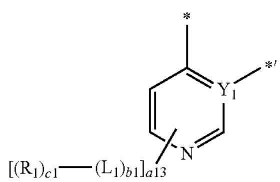
Formula A1(4)
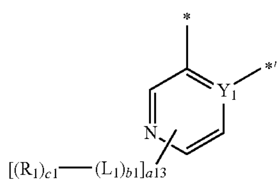
Formula A1(5)
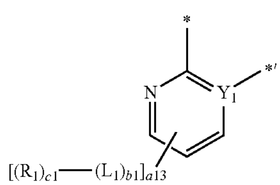
Formula A1(6)
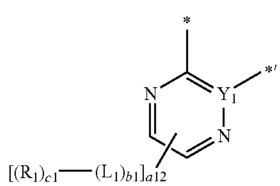
Formula A1(7)
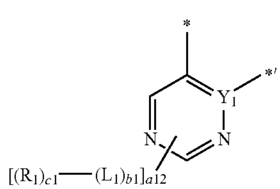
Formula A1(8)
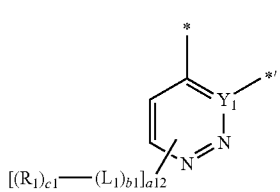
-continued
Formula A1(9)
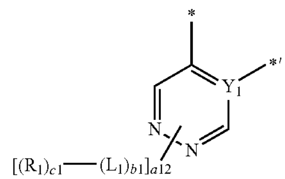
Formula A1(10)
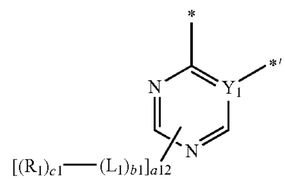
Formula A1(11)
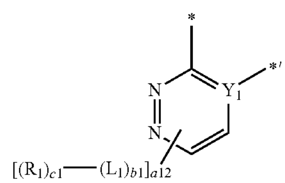
Formula A1(12)
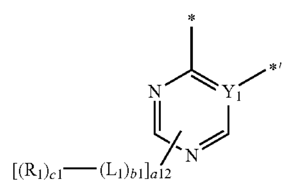
Formula A1(13)
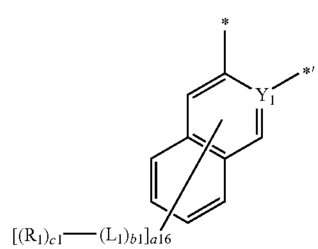
Formula A1(14)
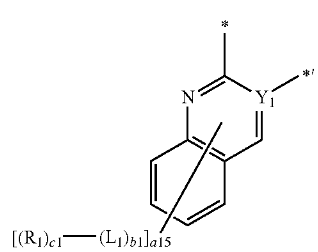
Formula A1(15)
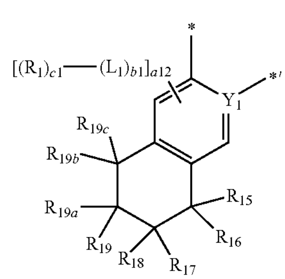

Formula A1(16)
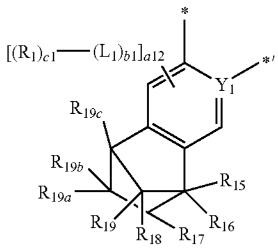
Formula A1(17)
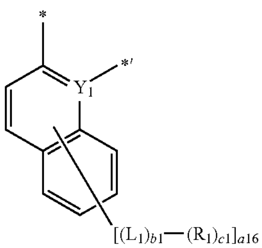
Formula A1(18)
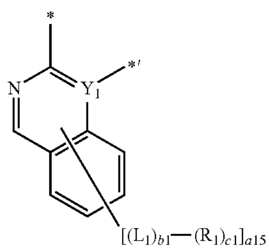
Formula A1(19)
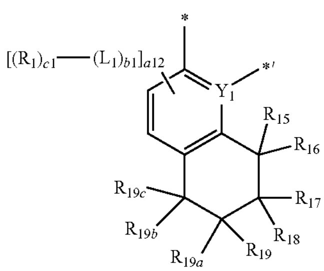
Formula A1(20)
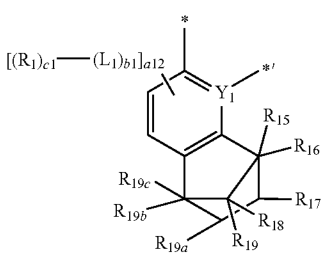
Formula A1(21)
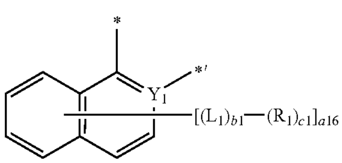
Formula A1(22)
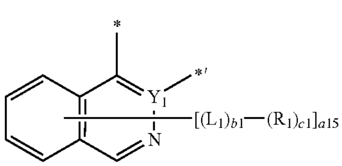
Formula A1(23)
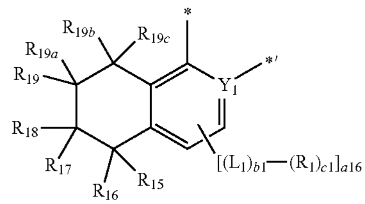
Formula A1(24)
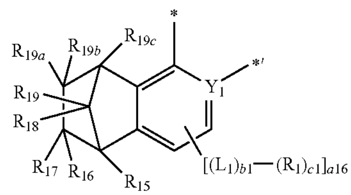
Formula A1(25)
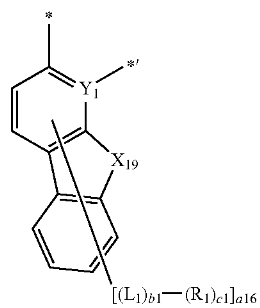
Formula A1(26)
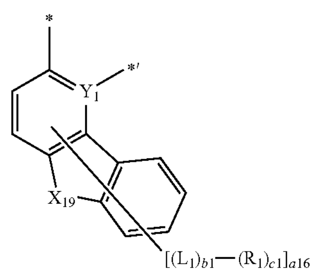
Formula A1(27)
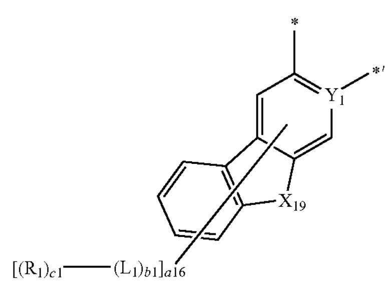
Formula A1(28)
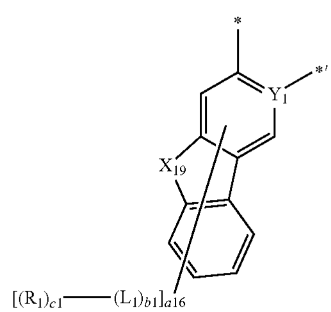

-continued

Formula A1(29)

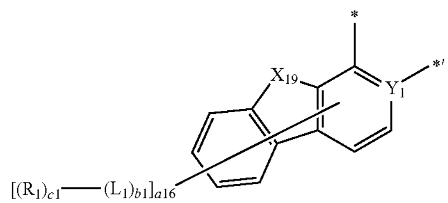

Formula A1(30)

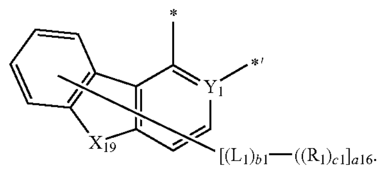

In Formulae A1(1) to A1(30), $Y_1$, $L_1$, b1, $R_1$, and c1 may each independently be the same as described herein, $X_{19}$ may be $C(R_{19a})(R_{19b})$, $N-[(L_{19})_{b19}-(R_{19})_{c19}]$, O, S, or $Si(R_{19a})(R_{19b})$, $L_{19}$, b19, and c19 may each independently be the same as described in connection with $L_1$, b1, and c1, $R_{15}$ to $R_{19}$ and $R_{19a}$ to $R_{19c}$ may each independently be the same as described in connection with $R_1$, a16 may be an integer from 0 to 6, a15 may be an integer from 0 to 5, a14 may be an integer from 0 to 4, a13 may be an integer from 0 to 3, a12 may be an integer from 0 to 2,

*' indicates a binding site to M of Formula 1A, and

* indicates a binding site to CY5 of Formula 1A.

In one or more embodiments, in Formula 1A, a moiety represented by

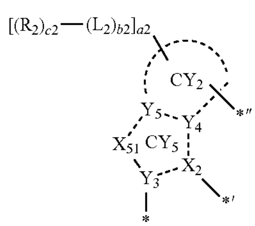

may be represented by one selected from Formulae CY2-1 to CY2-4:

Formula CY2-1

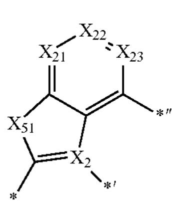

-continued

Formula CY2-2

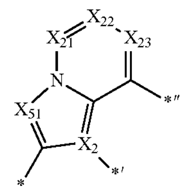

Formula CY2-3

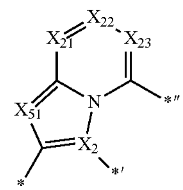

Formula CY2-4

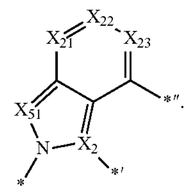

$X_{51}$ in Formula CY2-1 may be O, S, $N-[(L_7)_{b7}-(R_7)_{c7}]$, $C(R_7)(R_8)$, $Si(R_7)(R_8)$, $Ge(R_7)(R_8)$, or C(=O), $X_{51}$ in Formulae CY2-2 to CY2-4 may be N, $C(R_7)$, $Si(R_7)$, or $Ge(R_7)$, $L_7$, b7, $R_7$, $R_6$, c7, and c8 may each independently be the same as described herein, in Formulae CY2-1 to CY2-4, $X_2$ may be the same as described herein, $X_{21}$ may be N or $C-[(L_{21})_{b21}-(R_{21})_{c21}]$, $X_{22}$ may be N or $C-[(L_{22})_{b22}-(R_{22})_{c22}]$, $X_{23}$ may be N or $C-[(L_{23})_{b23}-(R_{23})_{c23}]$, $L_{21}$ to $L_{23}$ may each independently be the same as described in connection with $L_2$, b21 to b23 may each independently be the same as described in connection with b2, $R_{21}$ to $R_{23}$ may each independently be the same as described in connection with $R_2$, c21 to c23 may each independently be the same as described in connection with c2,

*' indicates a binding site to M of Formula 1A,

* indicates a binding site to $CY_1$ of Formula 1A, and

*" indicates a binding site to $CY_3$ of Formula 1A.

In one or more embodiments, in Formula 1A, a moiety represented by

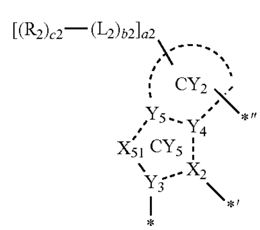

may be represented by one selected from Formulae A2(1) to A2(16):
Formula A2(1)
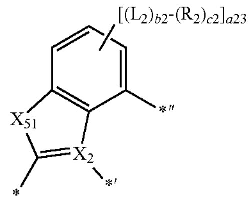
Formula A2(2)
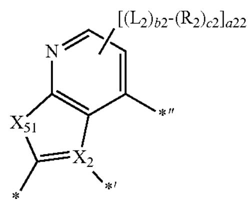
Formula A2(3)
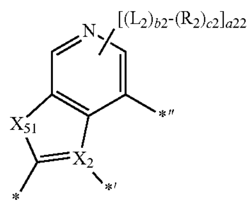
Formula A2(4)
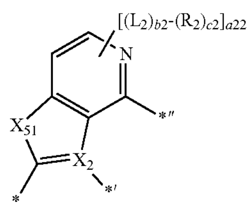
Formula A2(5)
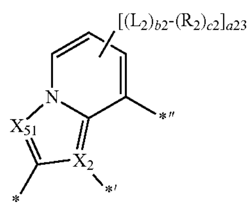
Formula A2(6)
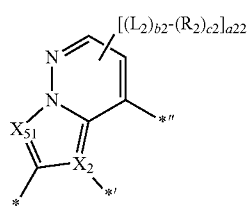
Formula A2(7)
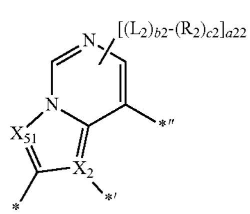
-continued
Formula A2(8)
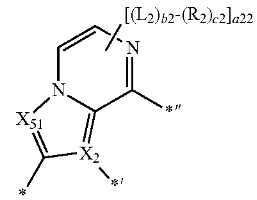
Formula A2(9)
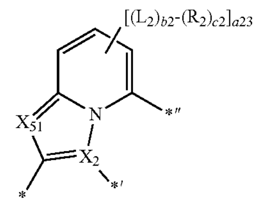
Formula A2(10)
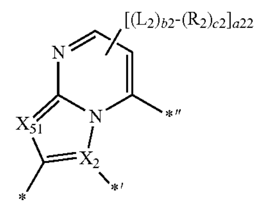
Formula A2(11)
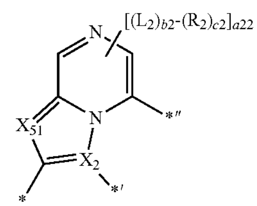
Formula A2(12)
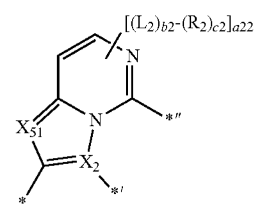
Formula A2(13)
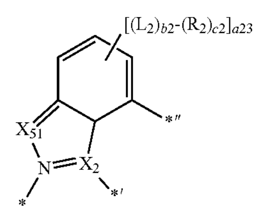
Formula A2(14)
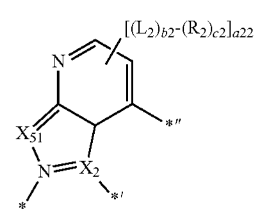

-continued

Formula A2(15)

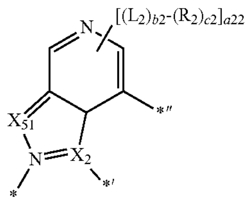

Formula A2(16)

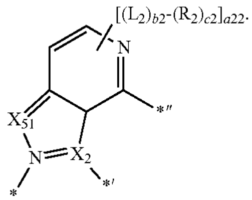

$X_{51}$ in Formulae A2(1) to A2(4) may be O, S, N-[$(L_7)_{b7}$-$(R_7)_{c7}$], $C(R_7)(R_8)$, $Si(R_7)(R_8)$, $Ge(R_7)(R_8)$, or C(=O), $X_{51}$ in Formulae A2(5) to A2(16) may be N, $C(R_7)$, $Si(R_7)$, or $Ge(R_7)$, $L_7$, b7, $R_7$, $R_8$, c7, and c8 may each independently be the same as described herein, in Formulae A2(1) to A2(16), $X_2$, $L_2$, b2, $R_2$, and c2 may each independently be the same as described herein, a23 may be an integer from 0 to 3, a22 may be an integer from 0 to 2,

*' indicates a binding site to M of Formula 1A,

* indicates a binding site to $CY_1$ of Formula 1A, and

*" indicates a binding site to $CY_3$ of Formula 1A.

In one or more embodiments, in Formula 1A, a moiety represented by

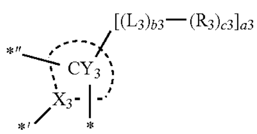

may be represented by one selected from Formulae CY3-1 to CY3-11:

Formula CY3-1

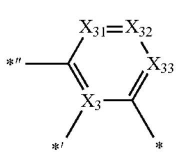

Formula CY3-2

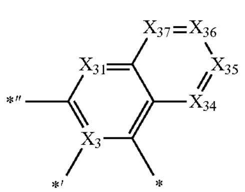

-continued

Formula CY3-3

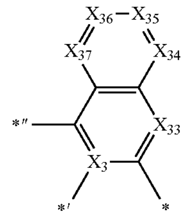

Formula CY3-4

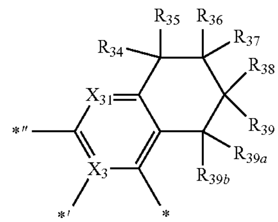

Formula CY3-5

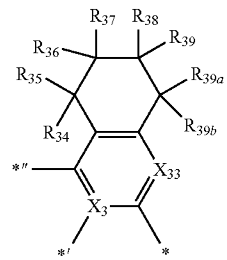

Formula CY3-6

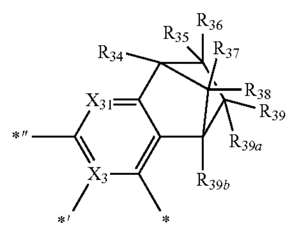

Formula CY3-7

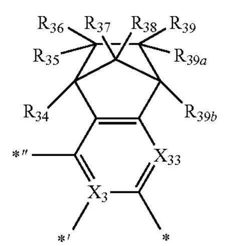

Formula CY3-8

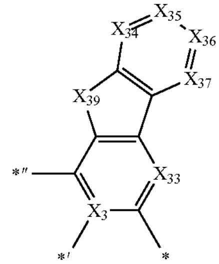

-continued

Formula CY3-9

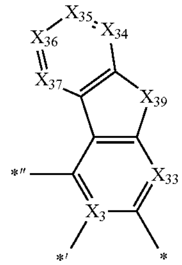

Formula CY3-10

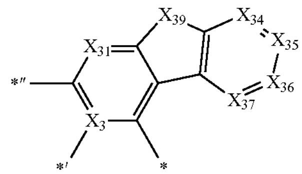

Formula CY3-11

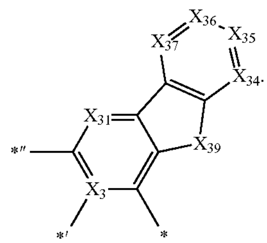

In Formulae CY3-1 to CY3-11, $X_3$ may be the same as described herein, $X_{31}$ may be N or C-[$(L_{31})_{b31}$-$(R_{31})_{c31}$], $X_{32}$ may be N or C-[$(L_{32})_{b32}$-$(R_{32})_{c32}$], $X_{33}$ may be N or C-[$(L_{33})_{b33}$-$(R_{33})_{c33}$], $X_{34}$ may be N or C-[$(L_{34})_{b34}$-$(R_{34})_{c34}$], $X_{35}$ may be N or C-[$(L_{35})_{b35}$-$(R_{35})_{c35}$], $X_{36}$ may be N or C-[$(L_{36})_{b36}$-$(R_{36})_{c36}$], $X_{37}$ may be N or C-[$(L_{37})_{b37}$-$(R_{37})_{c37}$], $X_{39}$ may be C($R_{39a}$)($R_{39b}$), N-[$(L_{39})_{b39}$-$(R_{39})_{c39}$], O, S, or Si($R_{39a}$)($R_{39b}$), $L_{31}$ to $L_{37}$ and $L_{39}$ may each independently be the same as described in connection with $L_3$, b31 to b37 and b39 may each independently be the same as described in connection with b3, $R_{31}$ to $R_{39}$ and $R_{39a}$ to $R_{39b}$ may each independently be the same as described in connection with $R_3$, c31 to c37 and c39 may each independently be the same as described in connection with c3,

*' indicates a binding site to M of Formula 1A,

* indicates a binding site to CY4 of Formula 1A, and

*" indicates a binding site to CY2 of Formula 1A.

In one or more embodiments, in Formula 1A, a moiety represented by

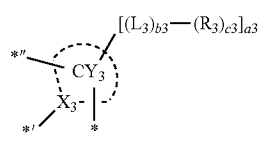

may be represented by one selected from Formulae A3(1) to A3(17):

Formula A3(1)

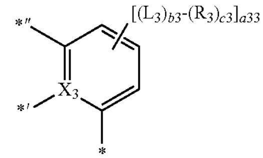

Formula A3(2)

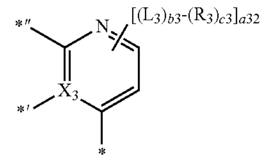

Formula A3(3)

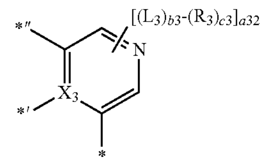

Formula A3(4)

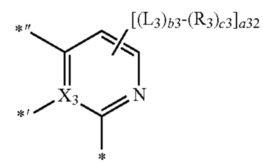

Formula A3(5)

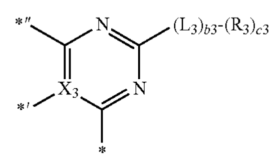

Formula A3(6)

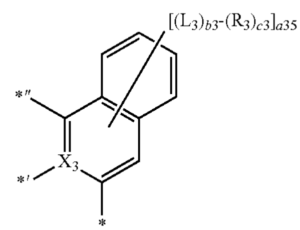

Formula A3(7)

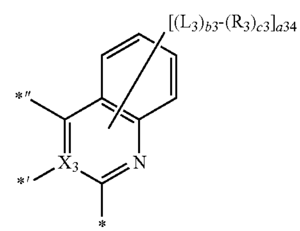

Formula A3(8)

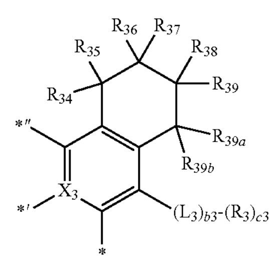

-continued

Formula A3(9)

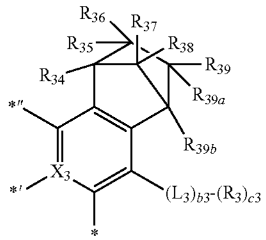

Formula A3(10)

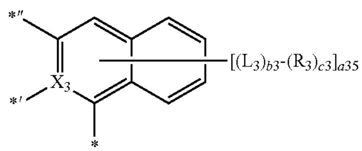

Formula A3(11)

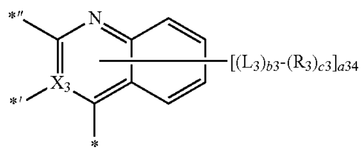

Formula A3(12)

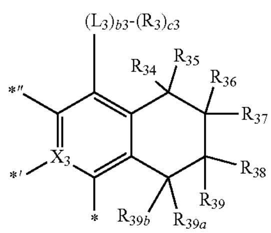

Formula A3(13)

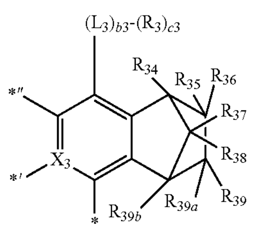

Formula A3(14)

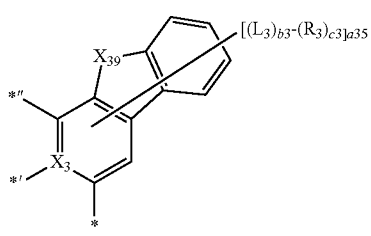

Formula A3(15)

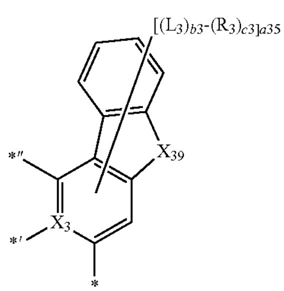

-continued

Formula A3(16)

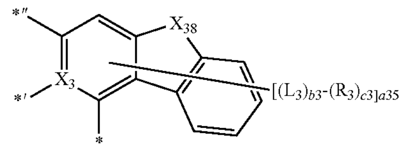

Formula A3(17)

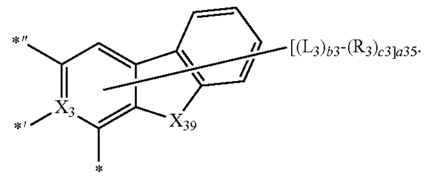

In Formulae A3(1) to A3(17), $X_3$, $L_3$, b3, $R_3$, and c3 may each independently be the same as described herein, $X_{39}$ may be $C(R_{39a})(R_{39b})$, $N$-$[(L_{39})_{b39}$-$(R_{39})_{c39}]$, O, S, or $Si(R_{39a})(R_{39b})$, $L_{39}$, b39, and c39 may each independently be the same as described in connection with $L_3$, b3, and c3, $R_{31}$ to $R_{39}$ and $R_{39a}$ to $R_{39b}$ may each independently be the same as described in connection with $R_3$, a35 may be an integer from 0 to 5, a34 may be an integer from 0 to 4, a33 may be an integer from 0 to 3, a32 may be an integer from 0 to 2,

*' indicates a binding site to M of Formula 1A,

* indicates a binding site to $CY_4$ of Formula 1A, and

*" indicates a binding site to $CY_2$ of Formula 1A.

In one or more embodiments, in Formula 1A, a moiety represented by

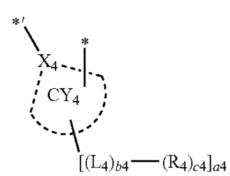

may be represented by one selected from Formulae CY4-1 to CY4-16:

Formula CY4-1

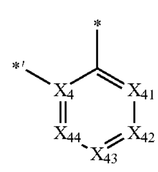

Formula CY4-2

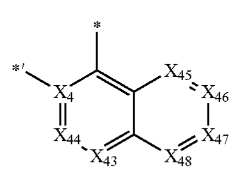

-continued
Formula CY4-3
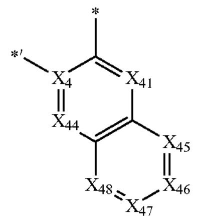
Formula CY4-4
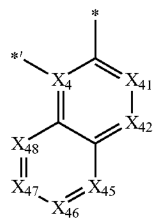
Formula CY4-5
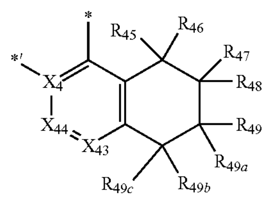
Formula CY4-6
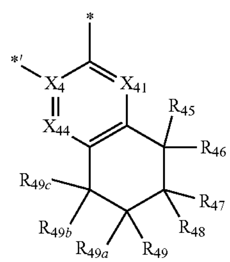
Formula CY4-7
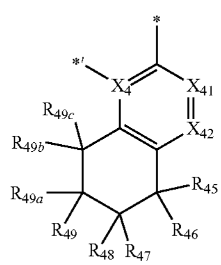
Formula CY4-8
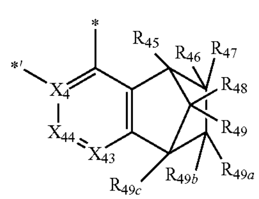
Formula CY4-9
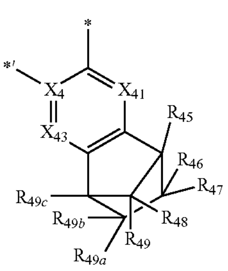
-continued
Formula CY4-10
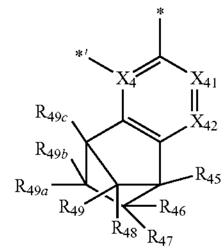
Formula CY4-11
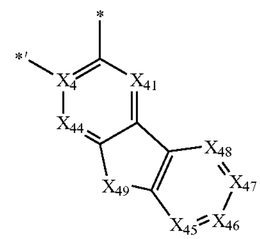
Formula CY4-12
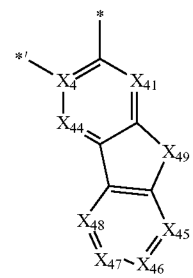
Formula CY4-13
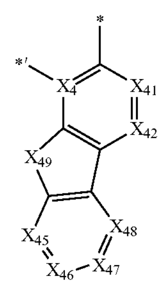
Formula CY4-14
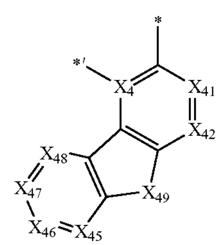
Formula CY4-15
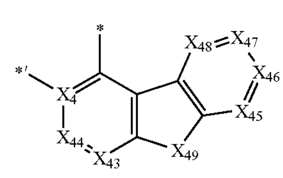

-continued

Formula CY4-16

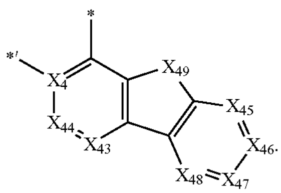

In Formulae CY4-1 to CY4-16, $X_4$ may be the same as described herein, $X_{41}$ may be N or C-[$(L_{41})_{b41}$-$(R_{41})_{c41}$], $X_{42}$ may be N or C-[$(L_{42})_{b42}$-$(R_{42})_{c42}$], $X_{43}$ may be N or C-[$(L_{43})_{b43}$-$(R_{43})_{c43}$], $X_{44}$ may be N or C-[$(L_{44})_{b44}$-$(R_{44})_{c44}$], $X_{45}$ may be N or C-[$(L_{45})_{b45}$-$(R_{45})_{c45}$], $X_{46}$ may be N or C-[$(L_{46})_{b46}$-$(R_{46})_{c46}$], $X_{47}$ may be N or C-[$(L_{47})_{b47}$-$(R_{47})_{c47}$], $X_{48}$ may be N or C-[$(L_{48})_{b48}$-$(R_{48})_{c48}$], $X_{49}$ may be $C(R_{49a})(R_{49b})$, N-[$(L_{49})_{b49}$-$(R_{49})_{c49}$], O, S, or $Si(R_{49a})(R_{49b})$, L41 to L49 may each independently be the same as described in connection with $L_4$, b41 to b49 may each independently be the same as described in connection with b4, $R_{41}$ to $R_{49}$ and $R_{49a}$ to $R_{49c}$ may each independently be the same as described in connection with $R_4$, c41 to c49 may each independently be the same as described in connection with c4,

*' indicates a binding site to M of Formula 1A, and

* indicates a binding site to $CY_3$ of Formula 1A.

In one or more embodiments, in Formula 1A, a moiety represented by

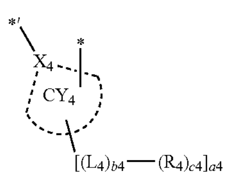

may be represented by one selected from Formulae A4(1) to A4(45):

Formula A4(1)

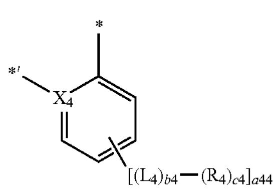

Formula A4(2)

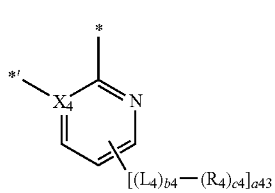

-continued

Formula A4(3)

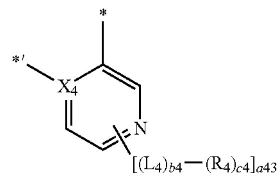

Formula A4(4)

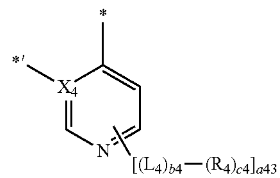

Formula A4(5)

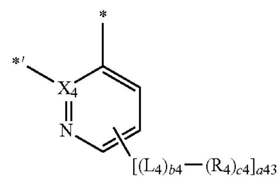

Formula A4(6)

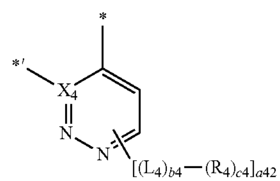

Formula A4(7)

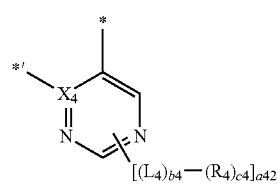

Formula A4(8)

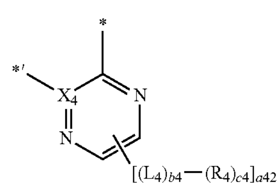

Formula A4(9)

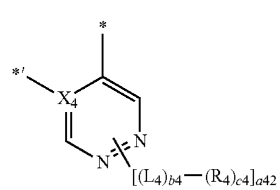

Formula A4(10)

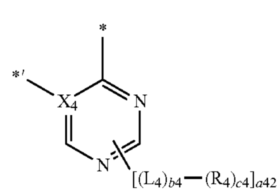

-continued
Formula A4(11)
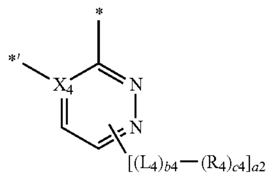
Formula A4(12)
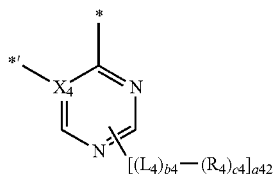
Formula A4(13)
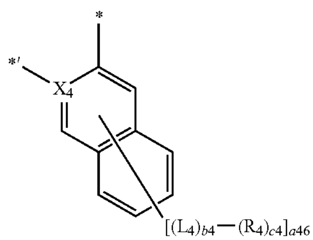
Formula A4(14)
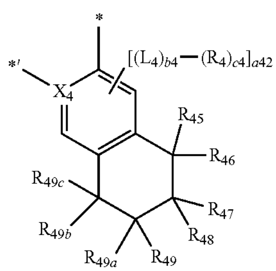
Formula A4(15)
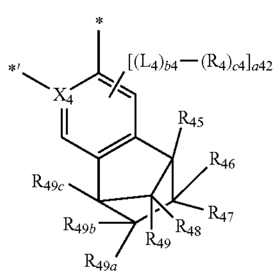
Formula A4(16)
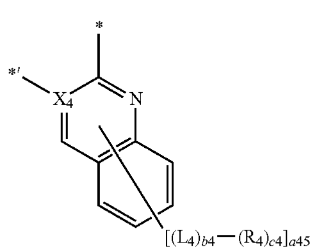
-continued
Formula A4(17)
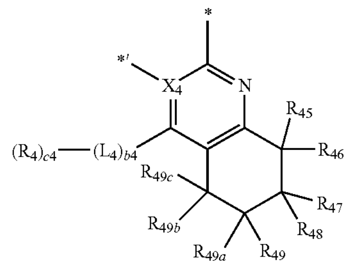
Formula A4(18)
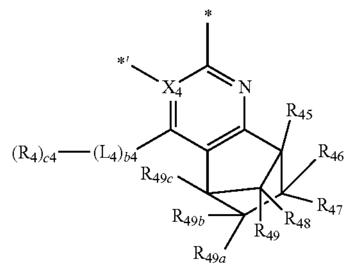
Formula A4(19)
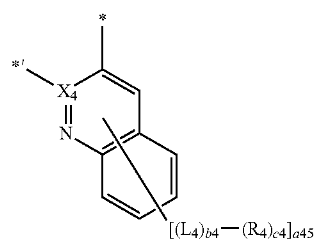
Formula A4(20)
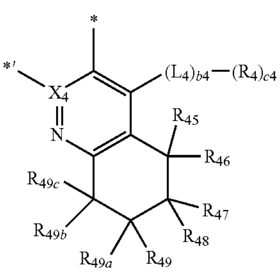
Formula A4(21)
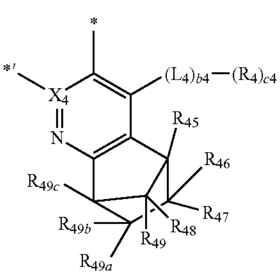
Formula A4(22)
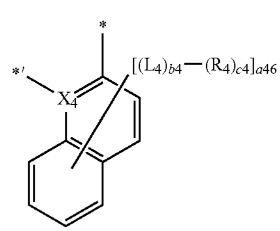

-continued
Formula A4(23)
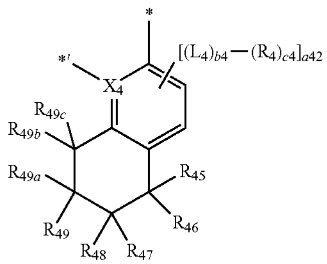
Formula A4(24)
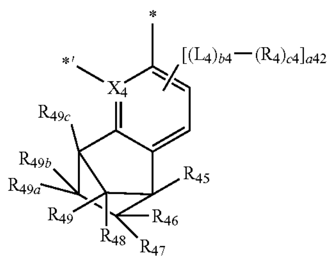
Formula A4(25)
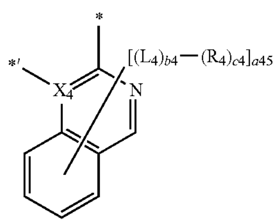
Formula A4(26)
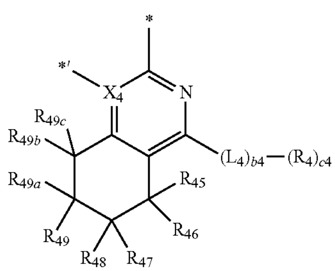
Formula A4(27)
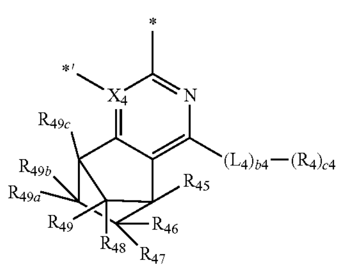
Formula A4(28)
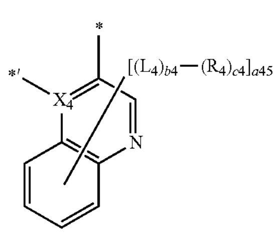
-continued
Formula A4(29)
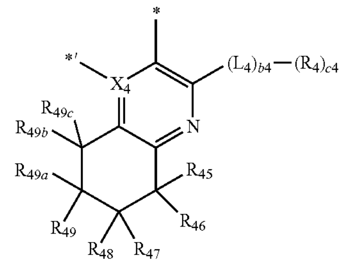
Formula A4(30)
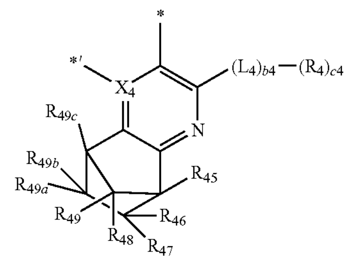
Formula A4(31)
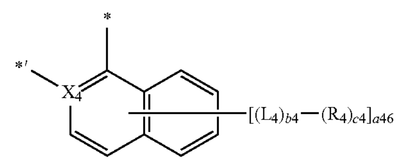
Formula A4(32)
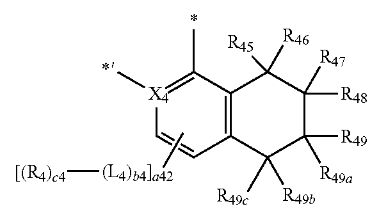
Formula A4(33)
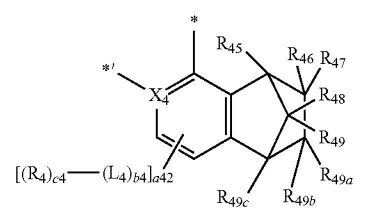
Formula A4(34)
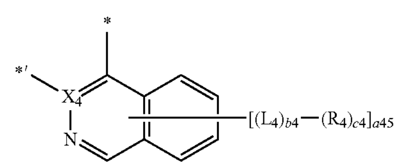
Formula A4(35)
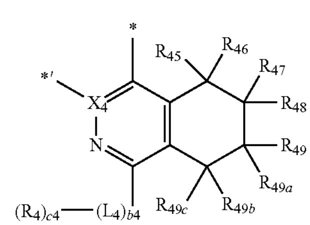

-continued

Formula A4(36)

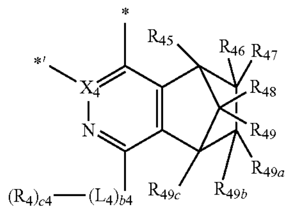

Formula A4(37)

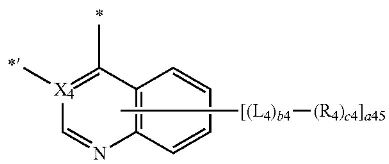

Formula A4(38)

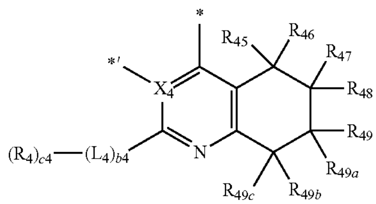

Formula A4(39)

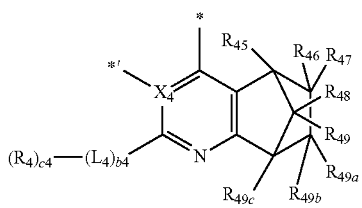

Formula A4(40)

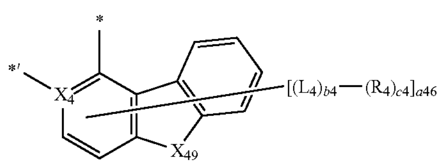

Formula A4(41)

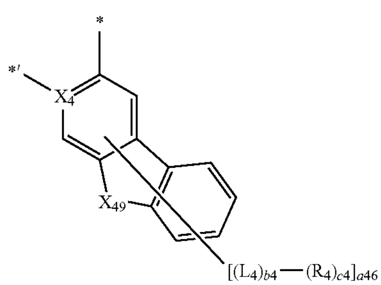

Formula A4(42)

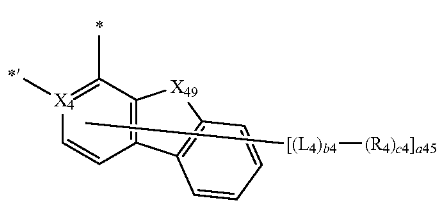

-continued

Formula A4(43)

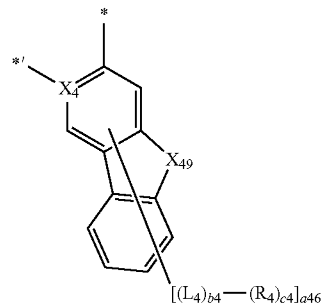

Formula A4(44)

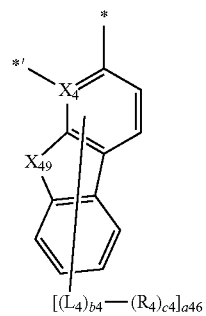

Formula A4(45)

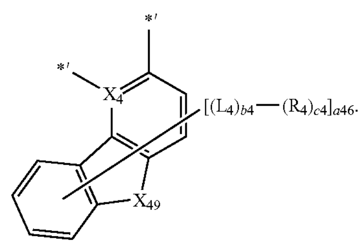

In Formulae A4(1) to A4(45), $X_4$, $L_4$, b4, $R_4$, and c4 may each independently be the same as described herein, $X_{49}$ may be $C(R_{49a})(R_{49b})$, $N-[(L_{49})_{b49}-(R_{49})_{c49}]$, O, S, or $Si(R_{49a})(R_{49b})$, $L_{49}$, b49, and c49 may each independently be the same as described in connection $L_4$, b4, and c4, $R_{45}$ to $R_{49}$ and $R_{49a}$ to $R_{49c}$ may each independently be the same as described in connection $R_4$, a46 may be an integer from 0 to 6, a45 may be an integer from 0 to 5, a44 may be an integer from 0 to 4, a43 may be an integer from 0 to 3, a42 may be an integer from 0 to 2,

*' indicates a binding site to M of Formula 1A, and

* indicates a binding site to $CY_3$ of Formula 1A.

In one or more embodiments, in Formula 1A, a moiety represented by

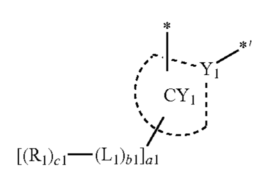

may be represented by one selected from Formulae CY1(1) to CY1(8), and/or a moiety represented by

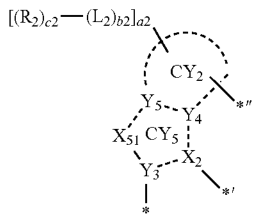

may be represented by one selected from Formulae CY2(1) to CY2(4), and/or a moiety represented by

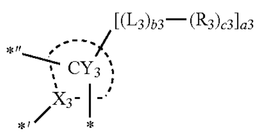

may be represented by one selected from Formulae CY3(1) to CY3(24), and/or a moiety represented by

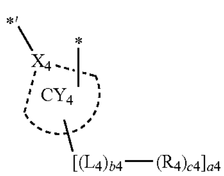

may be represented by one selected from Formulae CY4(1) to CY4(67):

Formula CY1(1)

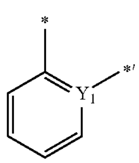

Formula CY1(2)

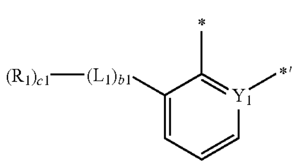

Formula CY1(3)

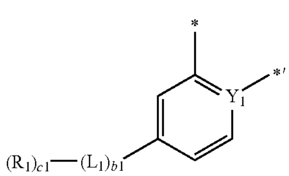

Formula CY1(4)

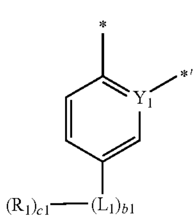

-continued

Formula CY1(5)

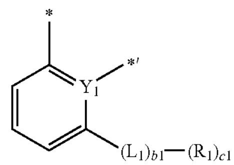

Formula CY1(6)

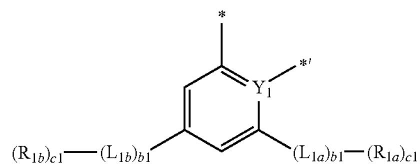

Formula CY1(7)

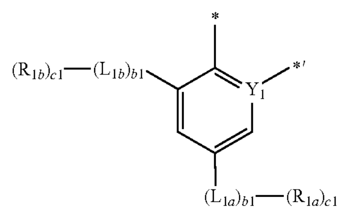

Formula CY1(8)

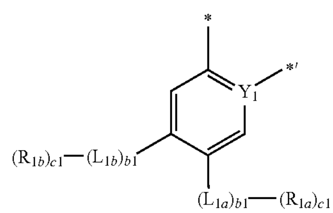

Formula CY2(1)

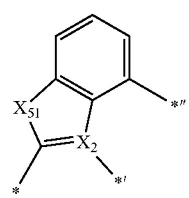

Formula CY2(2)

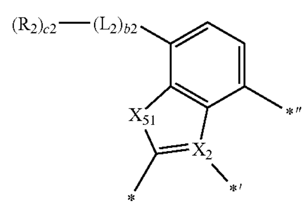

Formula CY2(3)

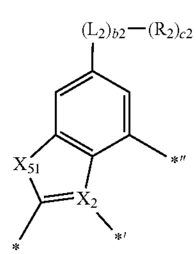

-continued
Formula CY2(4)
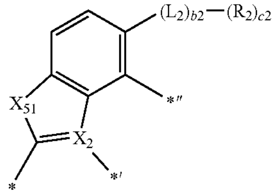
Formula CY3(1)
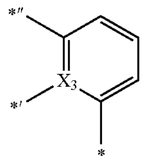
Formula CY3(2)
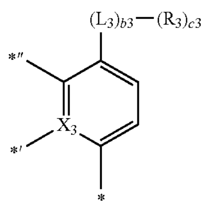
Formula CY3(3)
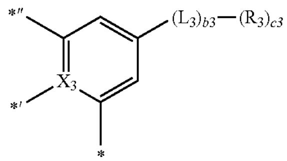
Formula CY3(4)
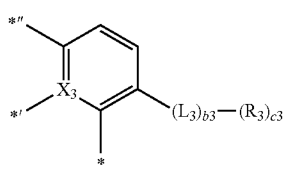
Formula CY3(5)
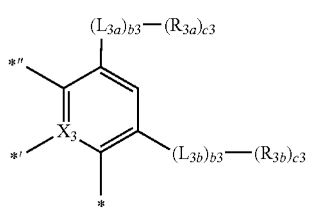
Formula CY3(6)
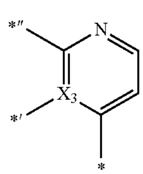
Formula CY3(7)
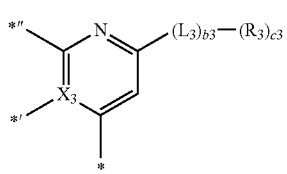
-continued
Formula CY3(8)
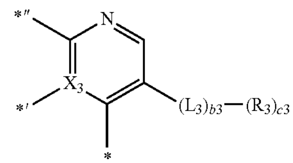
Formula CY3(9)
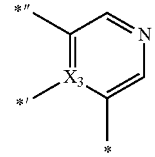
Formula CY3(10)
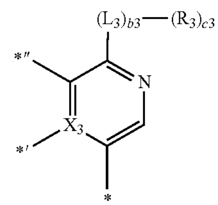
Formula CY3(11)
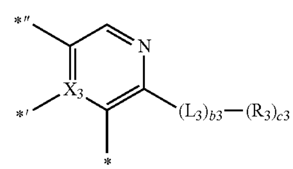
Formula CY3(12)
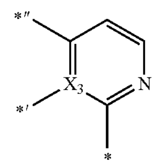
Formula CY3(13)
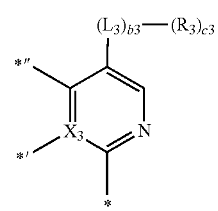
Formula CY3(14)
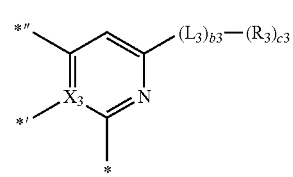
Formula CY3(15)
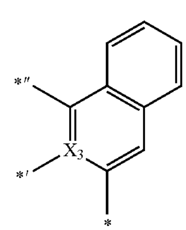

Formula CY3(16)
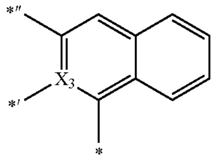
Formula CY3(17)
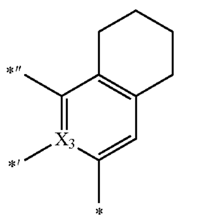
Formula CY3(18)
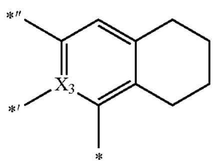
Formula CY3(19)
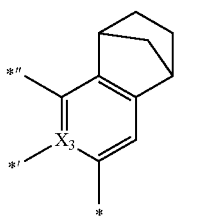
Formula CY3(20)
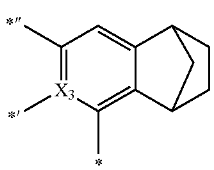
Formula CY3(21)
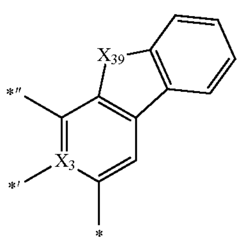
Formula CY3(22)
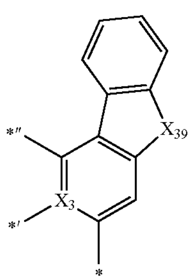
Formula CY3(23)
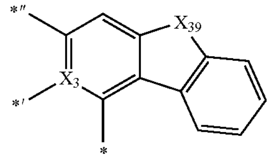
Formula CY3(24)
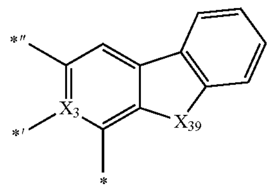
Formula CY4(1)
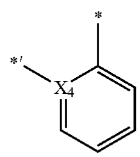
Formula CY4(2)
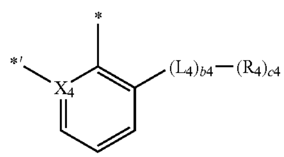
Formula CY4(3)
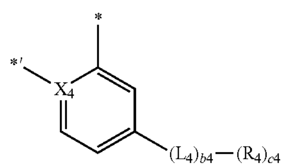
Formula CY4(4)
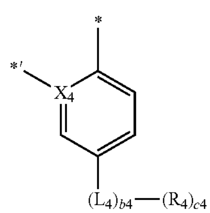
Formula CY4(5)
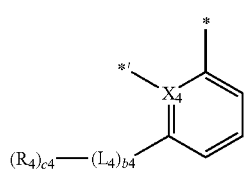
Formula CY4(6)
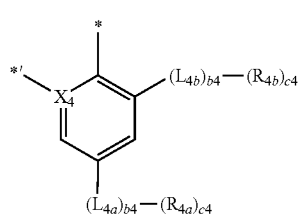

Formula CY4(7)
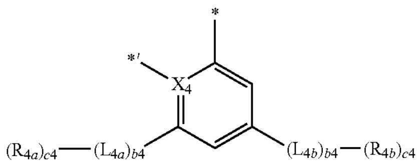
Formula CY4(8)
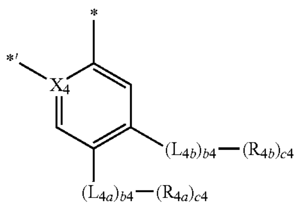
Formula CY4(9)
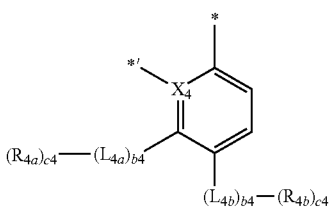
Formula CY4(10)
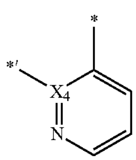
Formula CY4(11)
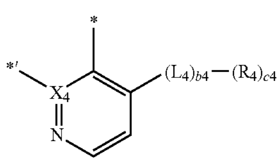
Formula CY4(12)
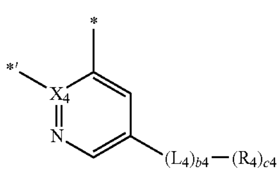
Formula CY4(13)
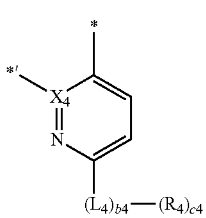
Formula CY4(14)
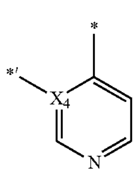
Formula CY4(15)
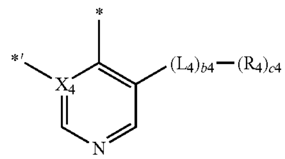
Formula CY4(16)
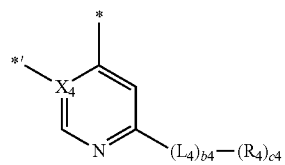
Formula CY4(17)
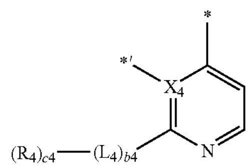
Formula CY4(18)
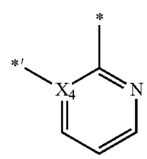
Formula CY4(19)
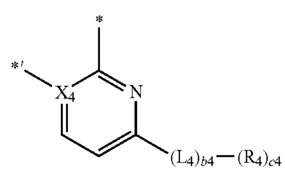
Formula CY4(20)
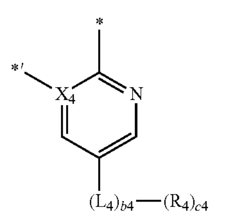
Formula CY4(21)
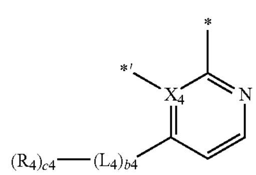
Formula CY4(22)
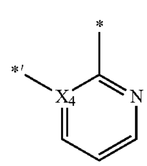
Formula CY4(23)
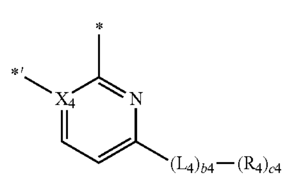

Formula CY4(24)
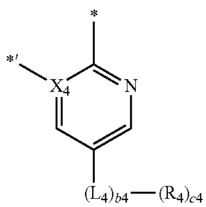
Formula CY4(25)
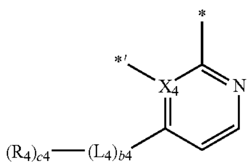
Formula CY4(26)
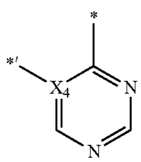
Formula CY4(27)
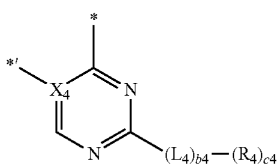
Formula CY4(28)
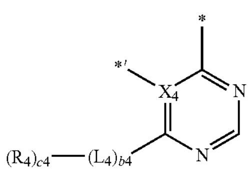
Formula CY4(29)
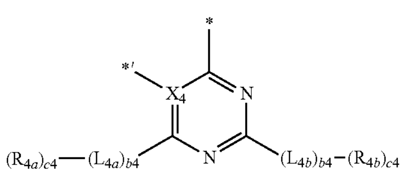
Formula CY4(30)
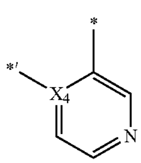
Formula CY4(31)
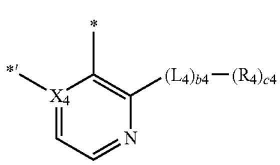
Formula CY4(32)
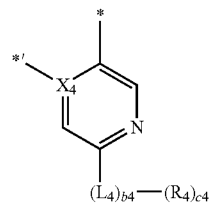
Formula CY4(33)
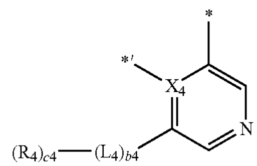
Formula CY4(34)
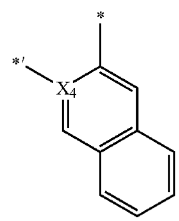
Formula CY4(35)
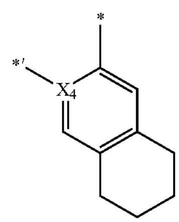
Formula CY4(36)
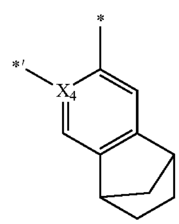
Formula CY4(37)
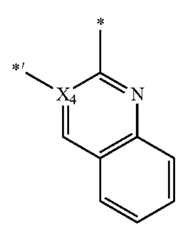
Formula CY4(38)
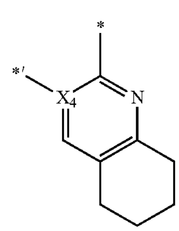

-continued
Formula CY4(39)
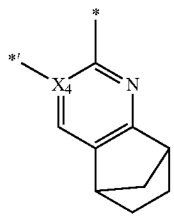
Formula CY4(40)
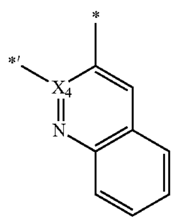
Formula CY4(41)
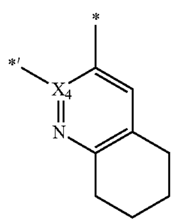
Formula CY4(42)
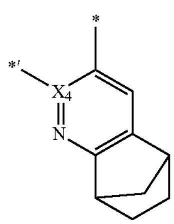
Formula CY4(43)
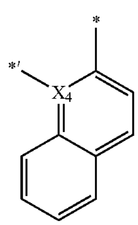
Formula CY4(44)
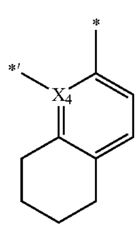
Formula CY4(45)
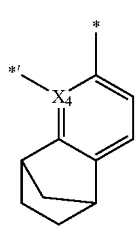
-continued
Formula CY4(46)
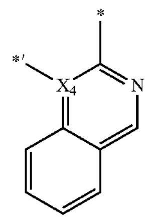
Formula CY4(47)
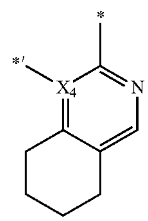
Formula CY4(48)
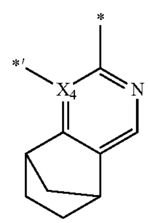
Formula CY4(49)
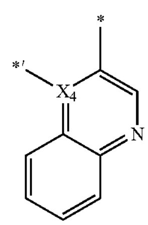
Formula CY4(50)
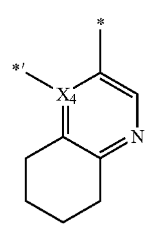
Formula CY4(51)
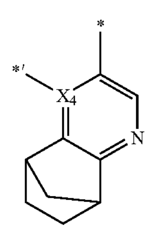
Formula CY4(52)
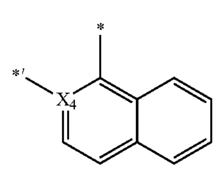

-continued

Formula CY4(53)

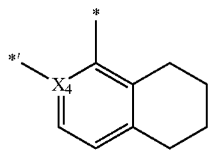

Formula CY4(54)

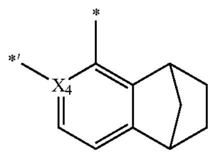

Formula CY4(55)

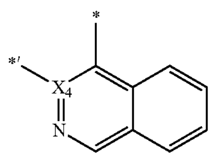

Formula CY4(56)

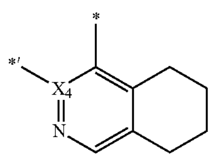

Formula CY4(57)

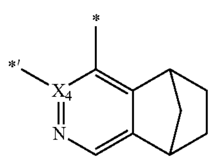

Formula CY4(58)

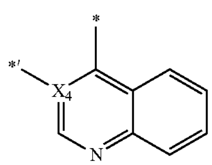

Formula CY4(59)

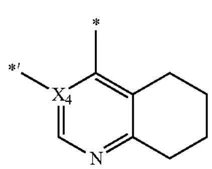

Formula CY4(60)

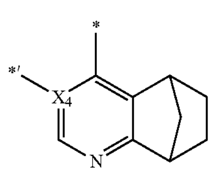

Formula CY4(61)

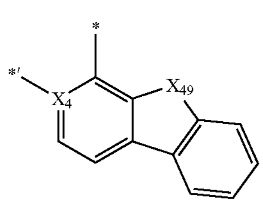

-continued

Formula CY4(62)

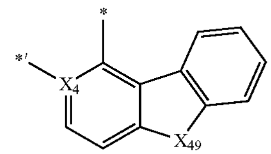

Formula CY4(63)

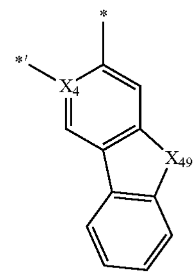

Formula CY4(64)

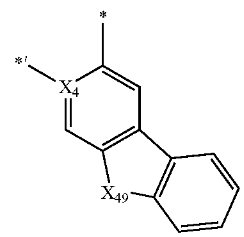

Formula CY4(65)

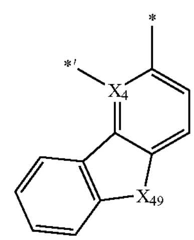

Formula CY4(66)

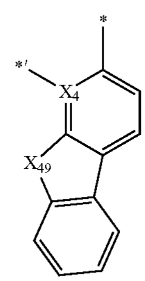

Formula CY4(67)

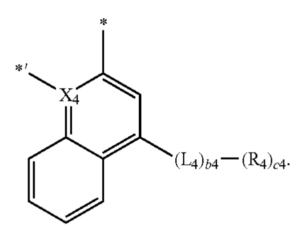

$X_{51}$ in Formulae CY2(1) to CY2(4) may be O, S, N-[$(L_7)_{b7}$-$(R_7)_{c7}$], C($R_7$)($R_8$), Si($R_7$)($R_8$), Ge($R_7$)($R_8$), or C(=O), $L_7$, b7, $R_7$, $R_8$, c7, and c8 may each independently be the same as described herein, in Formulae CY1(1) to CY1(8), Formulae CY2(1) to CY2(4), Formulae CY3(1) to CY3(24), and Formulae CY4 (1) to CY4(67), $X_2$ to $X_4$, $Y_1$, $L_1$ to $L_4$, b1 to b4, $R_1$ to $R_4$, and c1 to c4 may each independently be the same as described herein, $X_{39}$ may be $C(R_{39a})(R_{39b})$, $N\text{-}[(L_{39})_{b39}\text{-}(R_{39})_{c39}]$, O, S, or $Si(R_{39a})(R_{39b})$, $X_{49}$ may be $C(R_{49a})(R_{49b})$, $N\text{-}[(L_{49})_{b49}\text{-}(R_{49})_{c49}]$, O, S, or $Si(R_{49a})(R_{49b})$, $L_{1a}$ and $L_{1b}$ may each independently be the same as described in connection with $L_1$, $R_{1a}$ and $R_{1b}$ may each independently be the same as described in connection with $R_1$, $L_{3a}$, $L_{3b}$, and $L_{39}$ may each independently be the same as described in connection with $L_3$, $R_{3a}$, $R_{3b}$, $R_{39}$, $R_{39a}$, and $R_{39b}$ may each independently be the same as described in connection with $R_3$, b39 and c39 may each independently be the same as described in connection with b3 and c3, $L_4$a, $L_{4b}$, and $L_{49}$ may each independently be the same as described in connection with $L_4$, $R_{4a}$, $R_{4b}$, $R_{49}$, $R_{49a}$, and $R_{49b}$ may each independently be the same as described in connection with $R_4$, b49 and c49 may each independently be the same as described in connection with b4 and c4, $*\text{-}(L_1)_{b1}\text{-}(R_1)_{c1}$, $*\text{-}(L_{1a})_{b1}\text{-}(R_{1a})_{c1}$, $*\text{-}(L_{1b})_{b1}\text{-}(R_{1b})_{c1}$, $*\text{-}(L_2)_{b2}\text{-}(R_2)_{c2}$, $*\text{-}(L_3)_{b3}\text{-}(R_3)_{c3}$, $*\text{-}(L_{3a})_{b3}\text{-}(R_{3a})_{c3}$, $*\text{-}(L_{3b})_{b3}\text{-}(R_{3b})_{c3}$, $*\text{-}(L_4)_{b4}\text{-}(R_4)_{c4}$, $*\text{-}(L_{4a})_{b4}\text{-}(R_{4a})_{c4}$, and $*\text{-}(L_{4b})_{b4}\text{-}(R_{4b})_{c4}$ may each not be hydrogen, wherein * indicates a bonding site to a neighboring atom, in Formulae CY1(1) to CY1(8), Formulae CY2(1) to CY2(4), Formulae CY3(1) to CY3(24), and Formulae CY4 (1) to CY4(67), *' indicates a binding site to M of Formula 1A, in Formulae CY1(1) to CY1(8), * indicates a binding site to $CY_5$ of Formula 1A, in Formulae CY2(1) to CY2(4), * indicates a binding site to $CY_1$ of Formula 1A and indicates a binding site to $CY_3$ of Formula 1A, in Formulae CY3(1) to CY3(24), *" indicates a binding site to $CY_2$ of Formula 1A and * indicates a binding site to $CY_4$ of Formula 1A, and in Formulae CY4(1) to CY4(67), * indicates a binding site to $CY_3$ of Formula 1A.

In one or more embodiments, the organometallic compound may be represented by Formula 1:

Formula 1

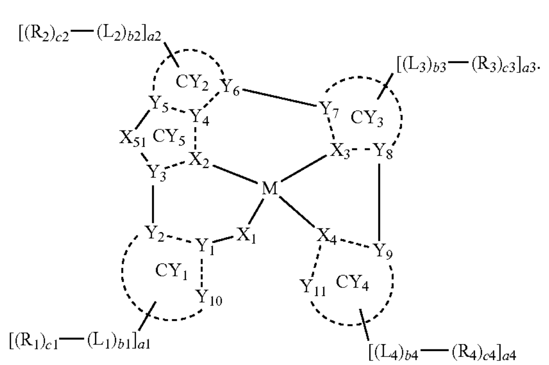

In Formula 1,

M, $X_1$ to $X_4$, $Y_1$, $Y_3$ to $Y_5$, $CY_1$ to $CY_5$, $X_{51}$ (wherein $X_{51}$ in Formula 1 is not N, $C(R_7)$, $Si(R_7)$, or $Ge(R_7)$), 1 to $L_4$, $L_7$, b1 to b4, b7, $R_1$ to $R_4$, c1 to c4, and a1 to a4 may each independently be the same as described herein, $Y_2$, $Y_6$ to $Y_9$ may each independently be N or C, $Y_{10}$ and $Y_{11}$ may each independently be C, N, O, or S, and a bond between $Y_1$ and $Y_{10}$, a bond between $Y_1$ and $Y_2$, a bond between $X_2$ and $Y_3$, a bond between $X_2$ and $Y_4$, a bond between $Y_4$ and $Y_5$, a bond between $Y_4$ and $Y_6$, a bond between $X_3$ and $Y_7$, a bond between $X_3$ and $Y_8$, a bond between $X_4$ and $Y_9$, and a bond between $X_4$ and $Y_{11}$ may each independently be a single bond or a double bond, and a bond between $Y_2$ and $Y_3$, a bond between $Y_6$ and $Y_7$, and a bond between $Y_8$ and $Y_9$ may each be a single bond.

In one or more embodiments, the organometallic compound may be represented by Formula 1-1:

Formula 1-1

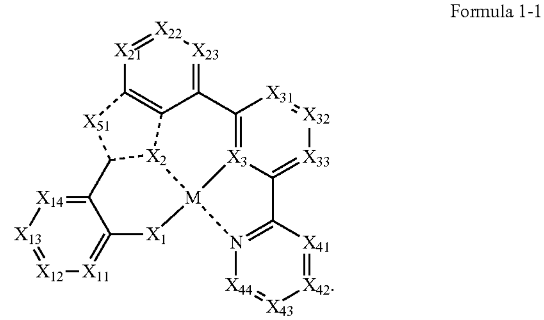

In Formula 1-1,

M, $X_1$ to $X_3$, and $X_{51}$ may each independently be the same as described herein, $X_{11}$ may be N or $C\text{-}[(L_{11})_{b11}\text{-}(R_{11})_{c11}]$, $X_{12}$ may be N or $C\text{-}[(L_{12})_{b12}\text{-}(R_{12})_{c12}]$, $X_{13}$ may be N or $C\text{-}[(L_{13})_{b13}\text{-}(R_{13})_{c13}]$, $X_{14}$ may be N or $C\text{-}[(L_{14})_{b14}\text{-}(R_{14})_{c14}]$, $L_{11}$ to $L_{14}$, b11 to b14, $R_{11}$ to $R_{14}$ and c11 to c14 may each independently be the same as described in connection with $L_1$, b1, $R_1$, and c1, $X_{21}$ may be N or $C\text{-}[(L_{21})_{b21}\text{-}(R_{21})_{c21}]$, $X_{22}$ may be N or $C\text{-}[(L_{22})_{b22}\text{-}(R_{22})_{c22}]$, $X_{23}$ may be N or $C\text{-}[(L_{23})_{b23}\text{-}(R_{23})_{c23}]$, $L_{21}$ to $L_{23}$, b21 to b23, $R_{21}$ to $R_{23}$ and c21 to c23 may each independently be the same as described in connection with $L_2$, b2, $R_2$, and c2, $X_{31}$ may be N or $C\text{-}[(L_{31})_{b31}\text{-}(R_{31})_{c31}]$, $X_{32}$ may be N or $C\text{-}[(L_{32})_{b32}\text{-}(R_{32})_{c32}]$, $X_{33}$ may be N or $C\text{-}[(L_{33})_{b33}\text{-}(R_{33})_{c33}]$, $L_{31}$ to $L_{33}$, b31 to b33, $R_{31}$ to $R_{33}$ and c31 to c33 may each independently be the same as described in connection with $L_3$, b3, $R_3$, and c3, $X_{41}$ may be N or $C\text{-}[(L_{41})_{b41}\text{-}(R_{41})_{c41}]$, $X_{42}$ may be N or $C\text{-}[(L_{42})_{b42}\text{-}(R_{42})_{c42}]$, $X_{43}$ may be N or $C\text{-}[(L_{43})_{b43}\text{-}(R_{43})_{c43}]$, $X_{44}$ may be N or $C\text{-}[(L_{44})_{b44}\text{-}(R_{44})_{c44}]$, $L_{41}$ to $L_{44}$, b41 to b44, $R_{41}$ to $R_{44}$ and c41 to c44 may each independently be the same as described in connection with $L_4$, b4, $R_4$, and c4, two of $R_{11}$ to $R_{14}$ may optionally be linked to form a substituted or unsubstituted $C_5$-$C_{30}$ carbocyclic group or a substituted or unsubstituted $C_1$-$C_{30}$ heterocyclic group, two of $R_{21}$ to $R_{23}$ may optionally be linked to form a substituted or unsubstituted $C_5$-$C_{30}$ carbocyclic group or a substituted or unsubstituted $C_1$-$C_{30}$ heterocyclic group, two of $R_{31}$ to $R_{33}$ may optionally be linked to form a substituted or unsubstituted $C_5$-$C_{30}$ carbocyclic group or a substituted or unsubstituted $C_1$-$C_{30}$ heterocyclic group, and two of $R_{41}$ to $R_{44}$ may optionally be linked to form a substituted or unsubstituted $C_5$-$C_{30}$ carbocyclic group or a substituted or unsubstituted $C_1$-$C_{30}$ heterocyclic group.

For example, in Formula 1-1, i) a substituted or unsubstituted $C_5$-$C_{30}$ carbocyclic group or a substituted or unsubstituted $C_1$-$C_{30}$ heterocyclic group, formed by linking two of $R_{11}$ to $R_{14}$, ii) a substituted or unsubstituted $C_5$-$C_{30}$ carbocyclic group or a substituted or unsubstituted $C_1$-$C_{30}$ heterocyclic group, formed by linking two of $R_{21}$ to $R_{23}$, iii) a substituted or unsubstituted $C_5$-$C_{30}$ carbocyclic group or a substituted or unsubstituted $C_1$-$C_{30}$ heterocyclic group, formed by linking two of $R_{31}$ to $R_{32}$, iv) a substituted or unsubstituted $C_5$-$C_{30}$ carbocyclic group or a substituted or unsubstituted $C_1$-$C_{30}$ heterocyclic group, formed by linking two of $R_{41}$ to $R_{44}$, and v) a substituted or unsubstituted $C_5$-$C_{30}$ carbocyclic group or a substituted or unsubstituted $C_1$-$C_{30}$ heterocyclic group, formed by linking two or more neighboring groups selected from $R_{11}$ to $R_{14}$, $R_{21}$ to $R_{23}$, $R_{31}$ to $R_{33}$, and $R_{41}$ to $R_{44}$ may each independently be selected from:

a cyclopentadiene group, a cyclohexane group, a cycloheptane group, an adamantane group, a norbornane group, a norbornene group, a bicycle-heptane group, a bicyclo-octane group, a benzene group, a pyridine group, a pyrimidine group, a pyrazine group, a pyridazine group, a triazine group, a naphthalene group, an anthracene group, a tetracene group, a phenanthrene group, a dihydronaphthalene group, a phenalene group, a benzothiophene group, a benzofuran group, an indene group, an indole group, a benzosilole group, an azabenzothiophene group, an azabenzofuran group, an azaindene group, an azaindole group, and an azabenzosilole group; and a cyclopentadiene group, a cyclohexane group, a cycloheptane group, an adamantane group, a norbornane group, a norbornene group, a bicycle-heptane group, a bicyclo-octane group, a benzene group, a pyridine group, a pyrimidine group, a pyrazine group, a pyridazine group, a triazine group, a naphthalene group, an anthracene group, a tetracene group, a phenanthrene group, a dihydronaphthalene group, a phenalene group, a benzothiophene group, a benzofuran group, an indene group, an indole group, a benzosilole group, an azabenzothiophene group, an azabenzofuran group, an azaindene group, an azaindole group, and an azabenzosilole group, each substituted with at least one $R_{1a}$, but embodiments of the present disclosure are not limited thereto.

$R_{1a}$ may be the same as described in connection with $R_1$.

For example, the organometallic compound may be represented by Formula 1-1, and in Formula 1-1, $X_{11}$ may be C-[$(L_{11})_{b11}$-$(R_{11})_{c11}$], $X_{12}$ may be C-[$(L_{12})_{b12}$-$(R_{12})_{c12}$], $X_{13}$ may be C-[$(L_{13})_{b13}$-$(R_{13})_{c13}$], $X_{14}$ may be C-[$(L_{14})_{b14}$-$(R_{14})_{c14}$], $X_{21}$ may be C-[$(L_{21})_{b21}$-$(R_{21})_{c21}$], $X_{22}$ may be C-[$(L_{22})_{b22}$-$(R_{22})_{c22}$], $X_{23}$ may be C-[$(L_{23})_{b23}$-$(R_{23})_{c23}$], $X_{31}$ may be C-[$(L_{31})_{b31}$-$(R_{31})_{c31}$], $X_{32}$ may be C-[$(L_{32})_{b32}$-$(R_{32})_{c32}$], $X_{33}$ may be C-[$(L_{33})_{b33}$-$(R_{33})_{c33}$], $X_{41}$ may be C-[$(L_{41})_{b41}$-$(R_{41})_{c41}$], $X_{42}$ may be C-[$(L_{42})_{b42}$-$(R_{42})_{c42}$], $X_{43}$ may be C-[$(L_{43})_{b43}$-$(R_{43})_{c43}$], $X_{44}$ may be C-[$(L_{44})_{b44}$-$(R_{44})_{c44}$], $X_{51}$ may be O, S, or N-[$(L_7)_{b7}$-$(R_7)_{c7}$], b7 may be 0, c7 may be 1, $R_7$ may be selected from:

a $C_1$-$C_{30}$ alkyl group; and a $C_1$-$C_{30}$ alkyl group substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, $C_1$-$C_{10}$ alkyl group, a $C_1$-$C_{10}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, and a pyrimidinyl group, and at least one selected from $R_{11}$ to $R_{14}$, $R_{21}$ to $R_{23}$, $R_{31}$ to $R_{33}$, and $R_{41}$ to $R_{44}$ may be selected from:

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, and an imidazopyrimidinyl group; and a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, and an imidazopyrimidinyl group, each substituted with at least one selected from deuterium, —F, —C, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, an imidazopyrimidinyl group, and —Si($Q_{33}$)($Q_{34}$)($Q_{35}$) (wherein $Q_{33}$ to $Q_{35}$ are each independently the same as described herein), but embodiments of the present disclosure are not limited thereto.

In one or more embodiments the organometallic compound may be represented by Formula 1-1, and in Formula 1-1, $X_{11}$ may be C-[$(L_{11})_{b11}$-$(R_{11})_{c11}$], $X_{12}$ may be C-[$(L_{12})_{b12}$-$(R_{12})_{c12}$], $X_{13}$ may be C-[$(L_{13})_{b13}$-$(R_{13})_{c13}$], $X_{14}$ may be C-[$(L_{14})_{b14}$-$(R_{14})_{c14}$], $X_{21}$ may be C-[$(L_{21})_{b21}$-$(R_{21})_{c21}$], $X_{22}$ may be C-[$(L_{22})_{b22}$-$(R_{22})_{c22}$], $X_{23}$ may be C-[$(L_{23})_{b23}$-$(R_{23})_{c23}$], $X_{31}$ may be C-[$(L_{31})_{b31}$-$(R_{31})_{c31}$], $X_{32}$ may be C-[$(L_{32})_{b32}$-$(R_{32})_{c32}$], $X_{33}$ may be C-[$(L_{33})_{b33}$-$(R_{33})_{c33}$], $X_{41}$ may be C-[$(L_{41})_{b41}$-$(R_{41})_{c41}$], $X_{42}$ may be C-[$(L_{42})_{b42}$-$(R_{42})_{c42}$], $X_{43}$ may be C-[$(L_{43})_{b43}$-$(R_{43})_{c43}$], $X_{44}$ may be C-[$(L_{44})_{b44}$-$(R_{44})_{c44}$], $X_{51}$ may be O, S, or N-[$(L_7)_{b7}$-$(R_7)_{c7}$], b7 may be 0, c7 may be 1, $R_7$ may be selected from:

a $C_1$-$C_{30}$ alkyl group; and a $C_1$-$C_{30}$ alkyl group substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, $C_1$-$C_{10}$ alkyl group, a $C_1$-$C_{10}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, and a pyrimidinyl group, $R_{11}$ to $R_{14}$, $R_{21}$ to $R_{23}$, $R_{31}$ to $R_{33}$, and $R_{41}$ to $R_{44}$ may each independently be selected from hydrogen, deuterium, —F, a cyano group, a nitro group, —$SF_5$, —$CH_3$, —$CD_3$, —$CD_2H$, —$CDH_2$, —$CF_3$, —$CF_2H$, —$CFH_2$, groups represented by Formulae 9-1 to 9-19, groups represented by Formulae 10-1 to 10-167, —N($Q_1$)($Q_2$), —Si($Q_3$)($Q_4$)($Q_5$), —B($Q_6$)($Q_7$), and —P(=O)($Q_8$)($Q_9$) (wherein $Q_1$ to $Q_9$ are each independently the same as described herein), and in Formula 1-1, at least one selected from $R_{11}$ to $R_{14}$, $R_{21}$ to $R_{23}$, $R_{31}$ to $R_{33}$, and $R_{41}$ to $R_{44}$ may each independently be selected from groups represented by Formulae 10-1 to 10-167, but embodiments of the present disclosure are not limited thereto.

For example, the organometallic compound may be one selected from Compounds 1-1 to 1-88, Compounds 2-1 to 2-47, and Compounds 3-1 to 3-582, but embodiments of the present disclosure are not limited thereto:

1-1

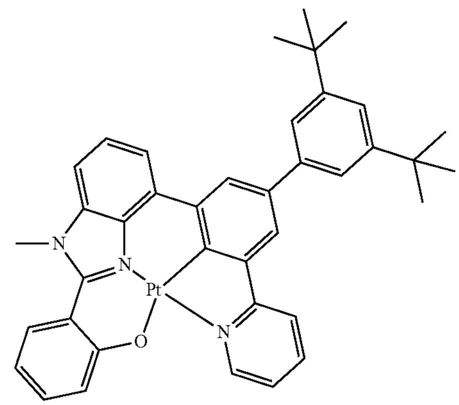

1-2

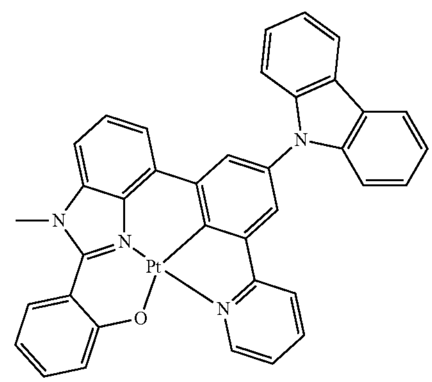

1-3

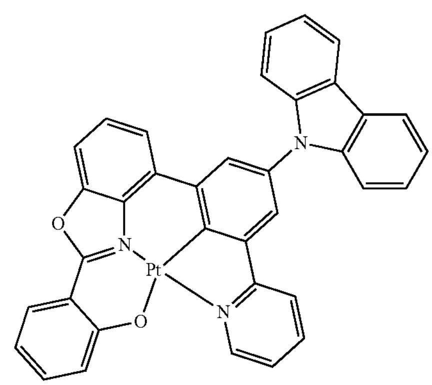

1-4

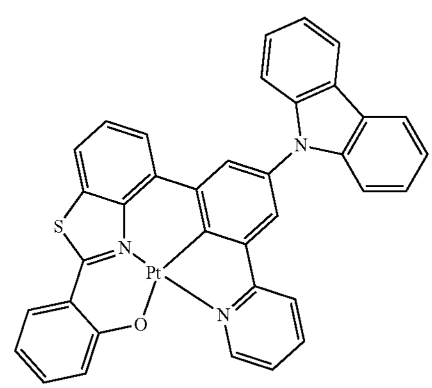

1-5
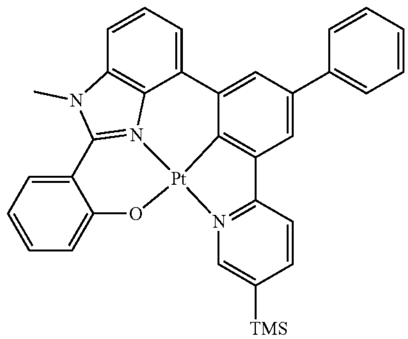
1-6
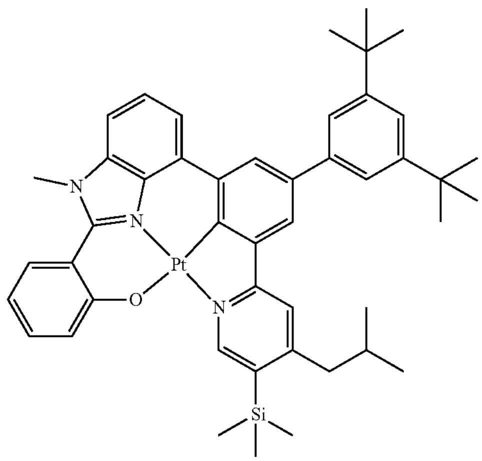
1-7
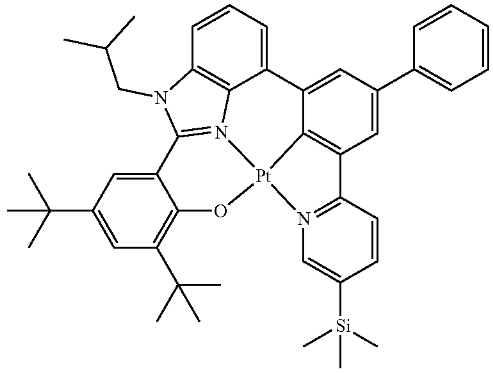
1-8
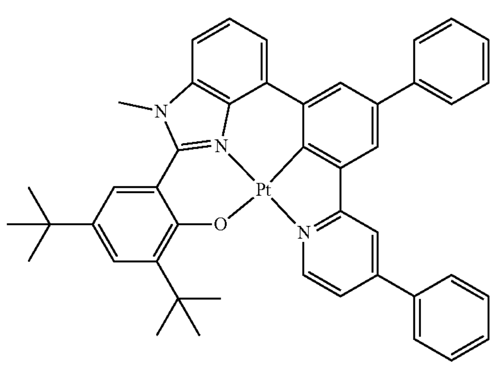
1-9
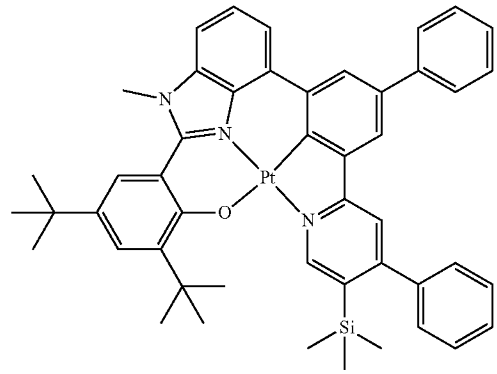
1-10
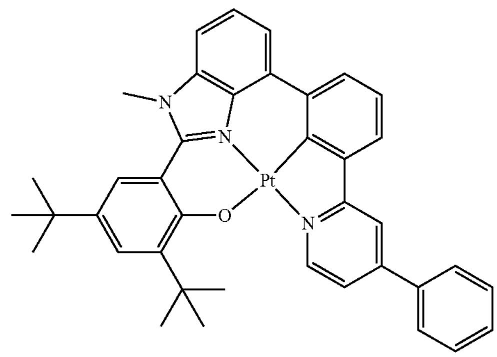
1-11
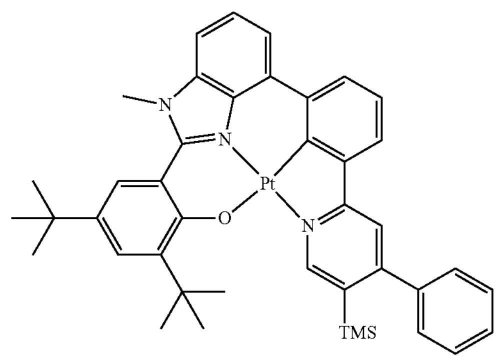
1-12
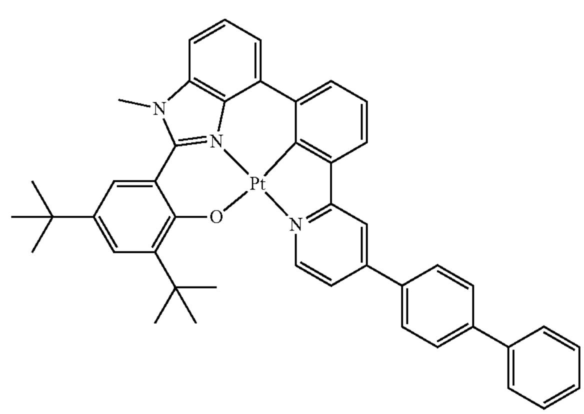

-continued
1-13
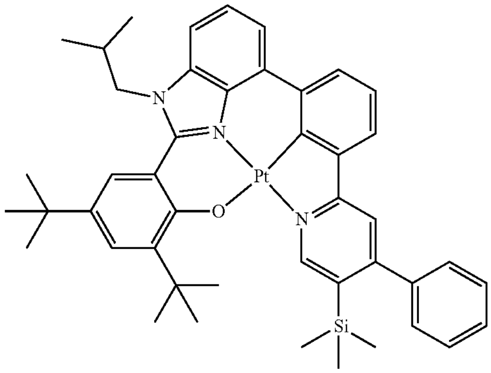
1-14
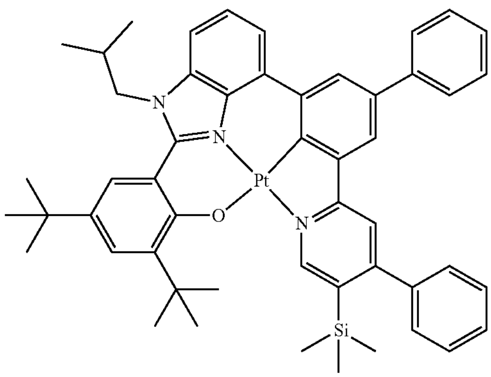
1-15
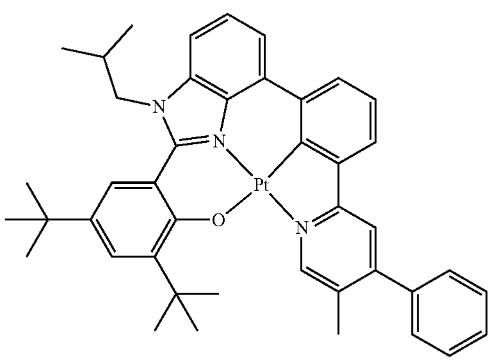
1-16
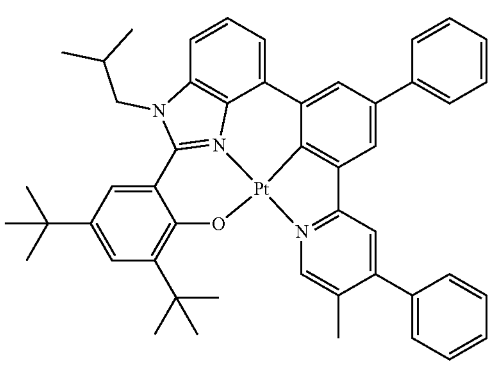
-continued
1-17
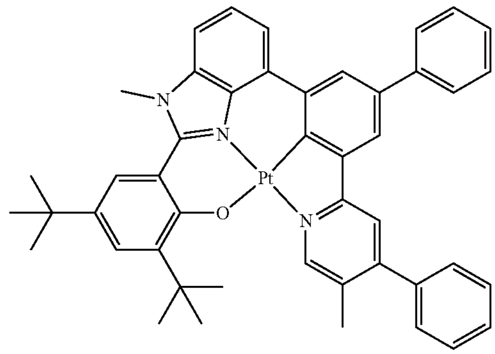
1-18
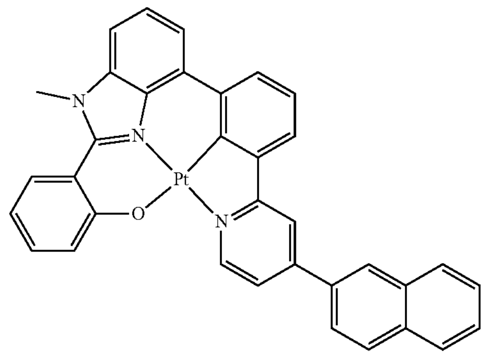
1-19
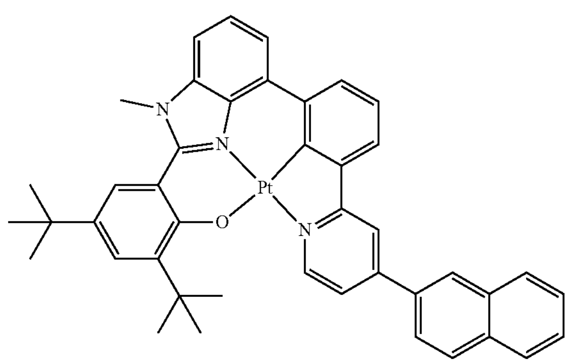
1-20
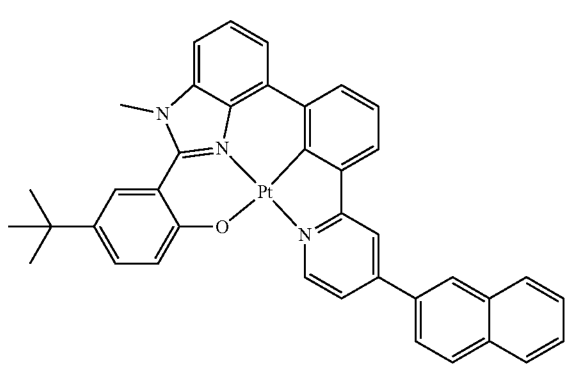

-continued
1-21
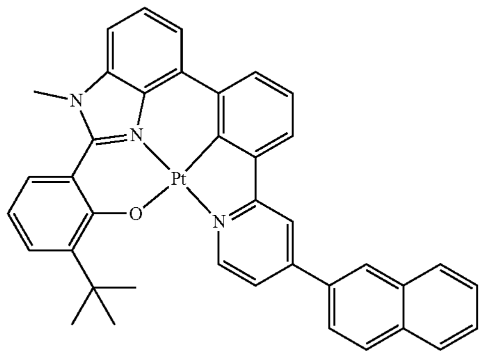
1-22
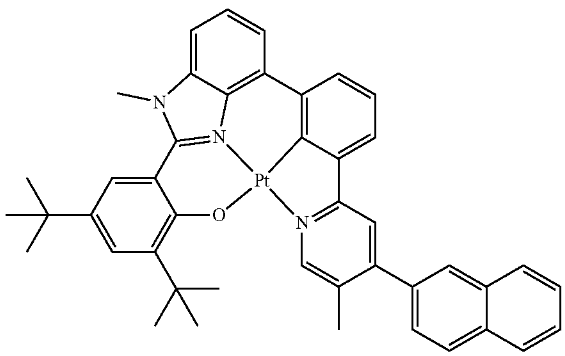
1-23
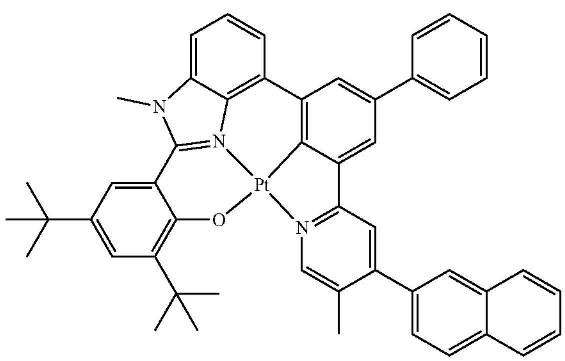
1-24
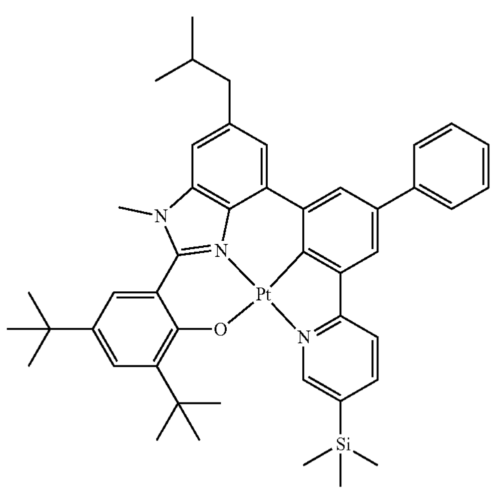
-continued
1-25
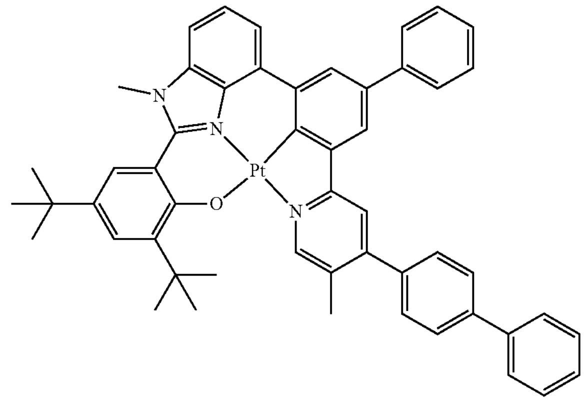
1-26
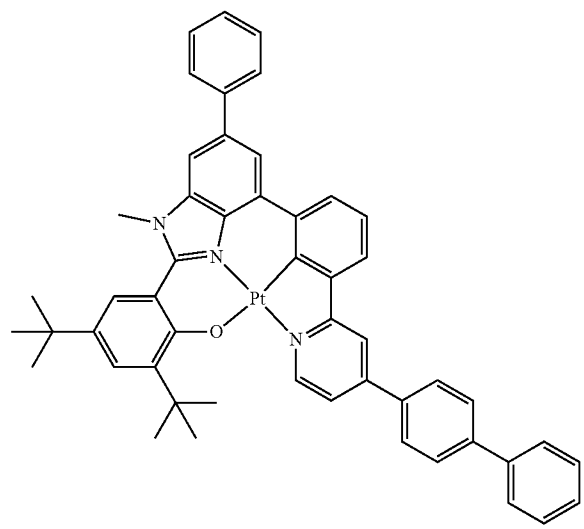
1-27
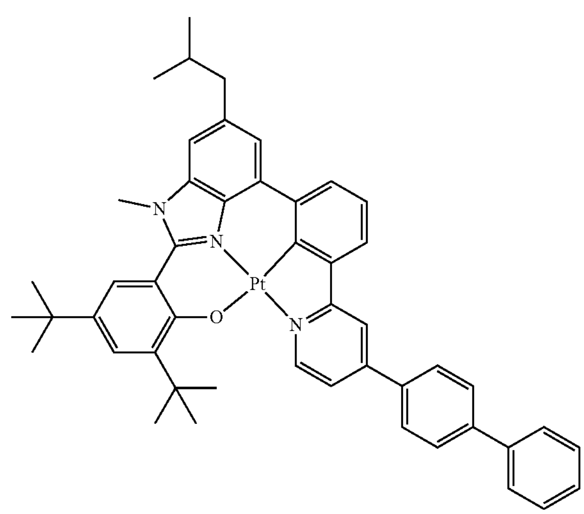

-continued
1-28
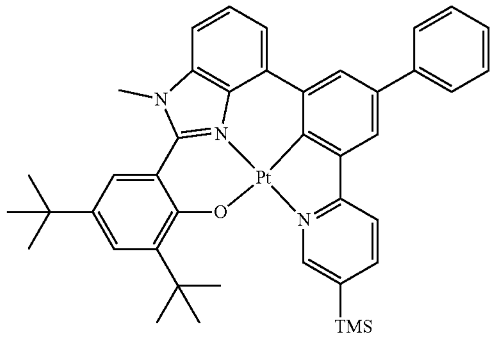
1-29
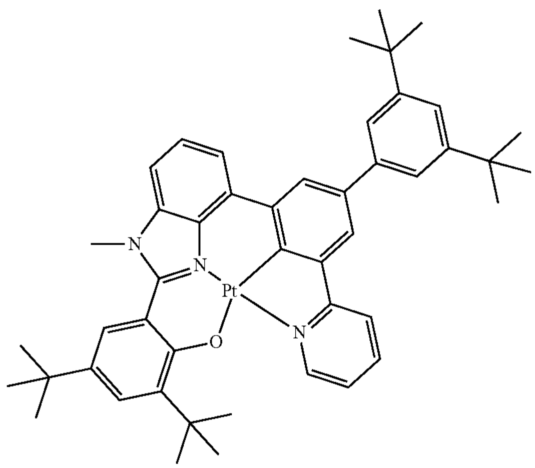
1-30
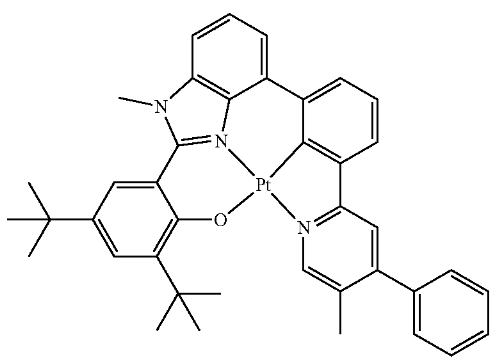
1-31
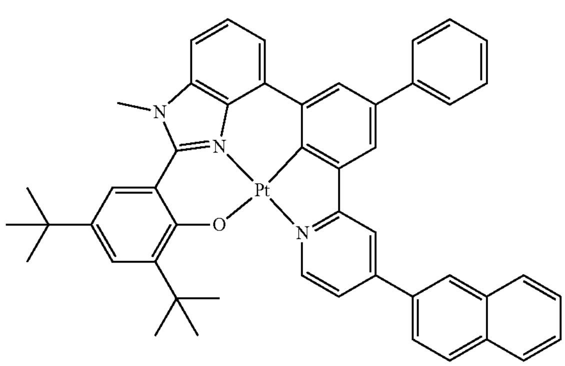
-continued
1-32
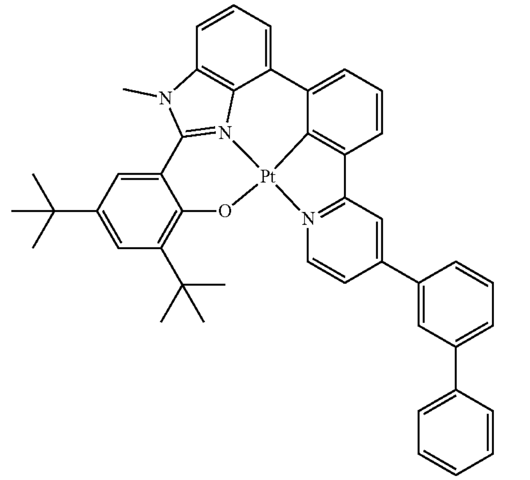
1-33
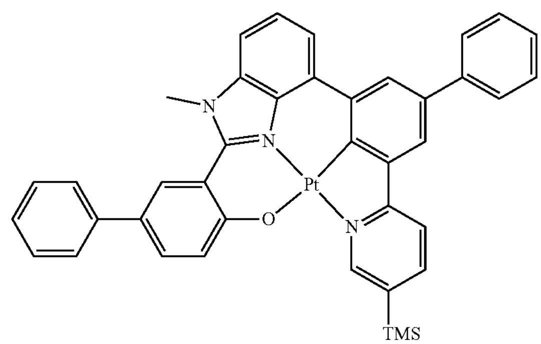
1-34
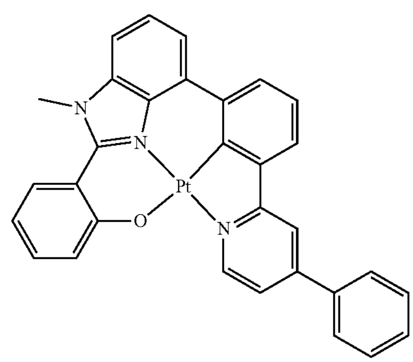
1-35
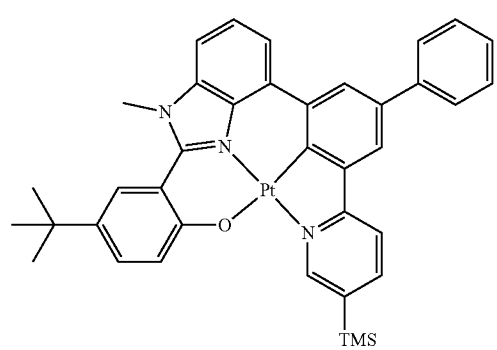

-continued
1-36
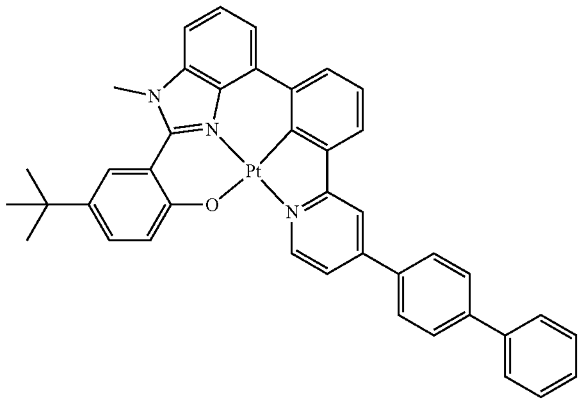
1-37
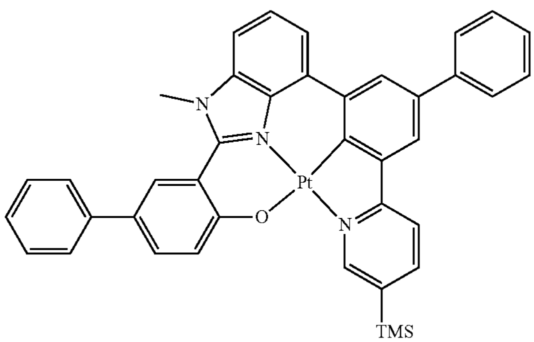
1-38
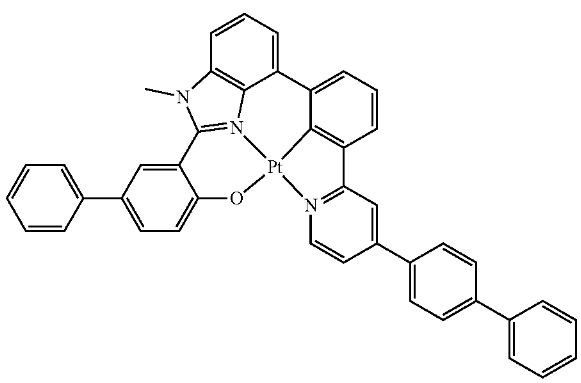
1-39
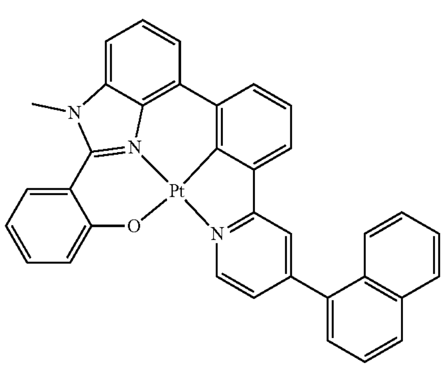
-continued
1-40
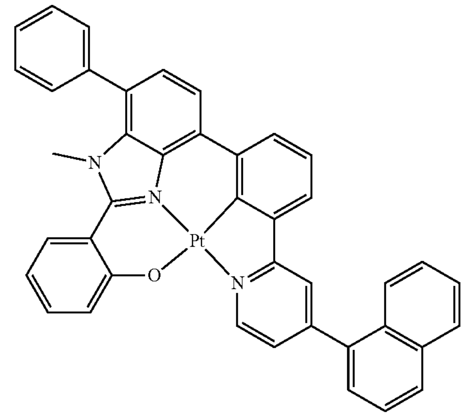
1-41
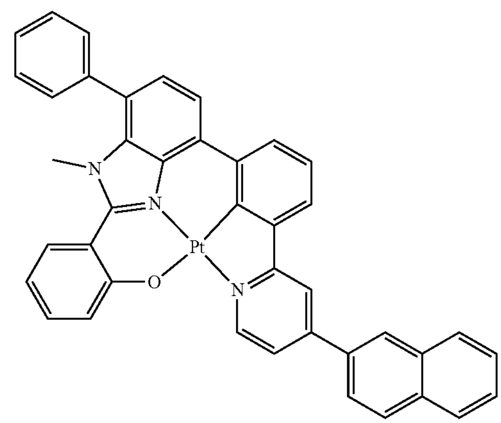
1-42
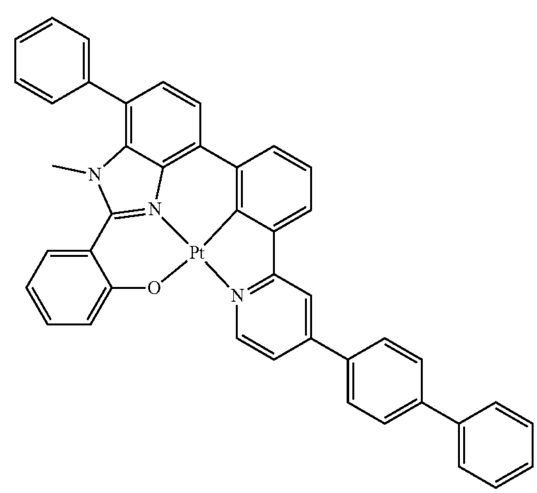

-continued
1-43
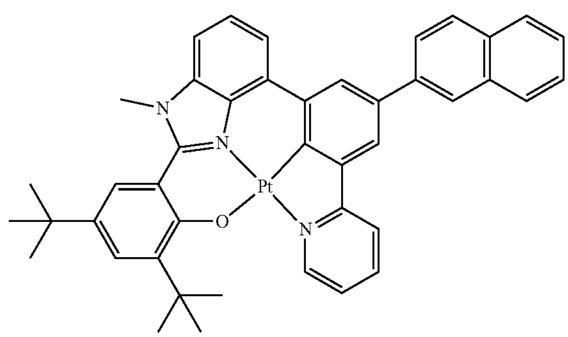
1-44
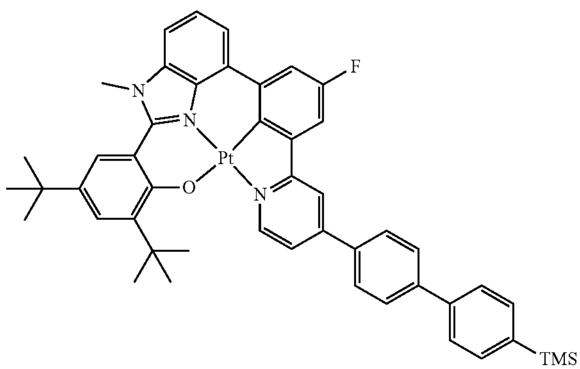
1-45
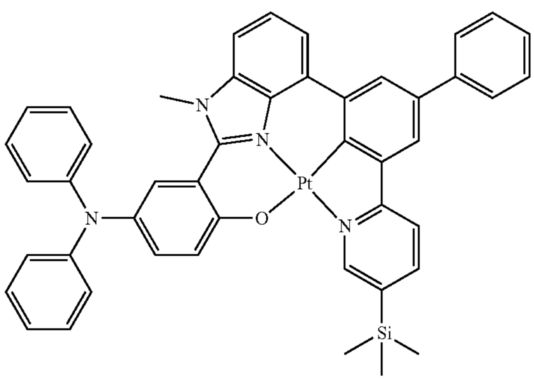
1-46
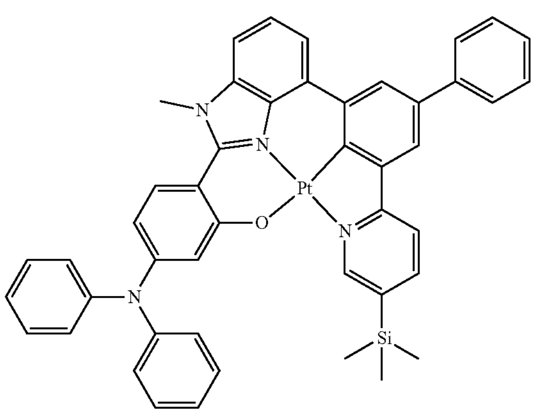
-continued
1-47
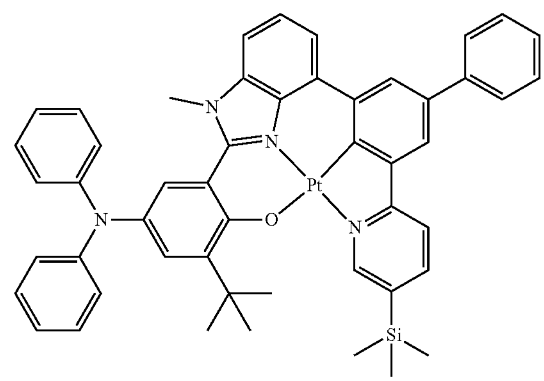
1-48
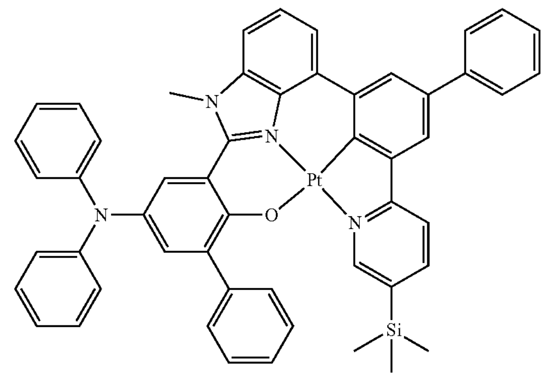
1-49
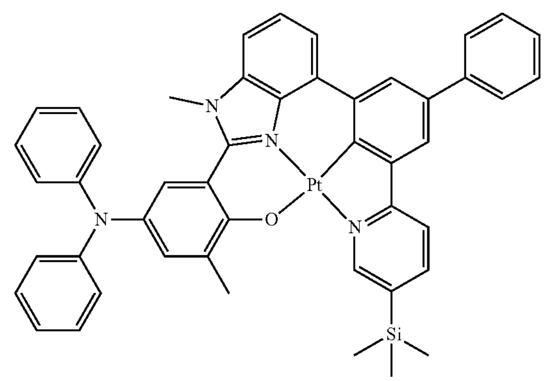
1-50
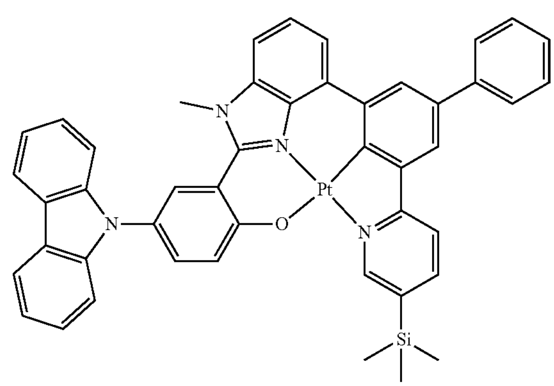

-continued
1-51
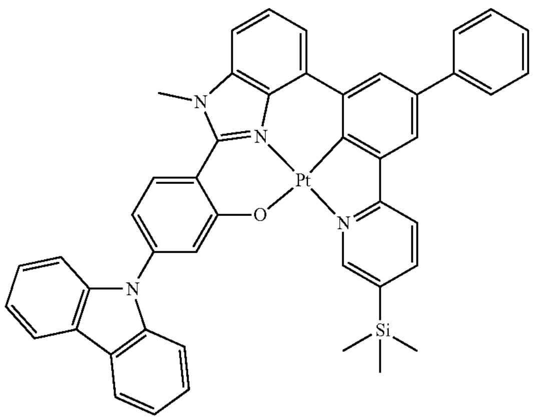
1-52
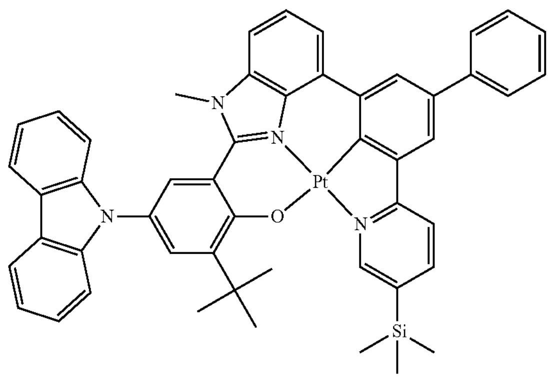
1-53
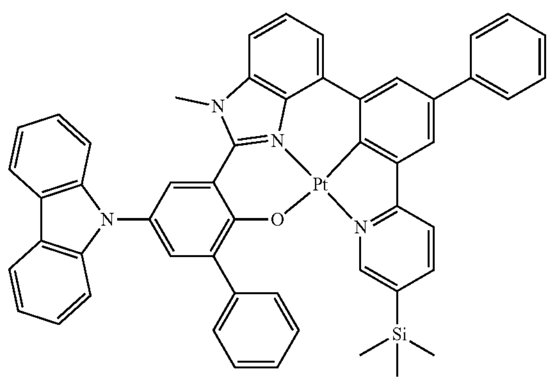
1-54
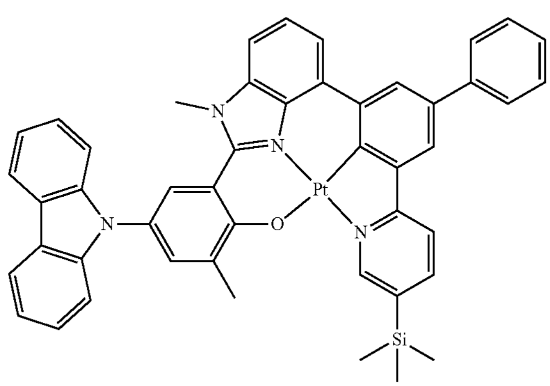
-continued
1-55
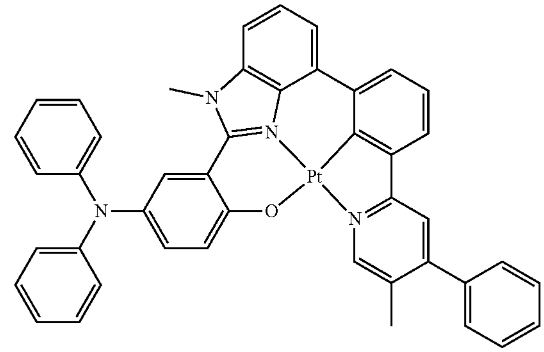
1-56
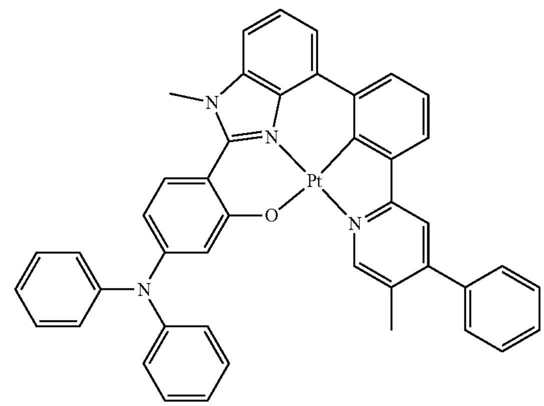
1-57
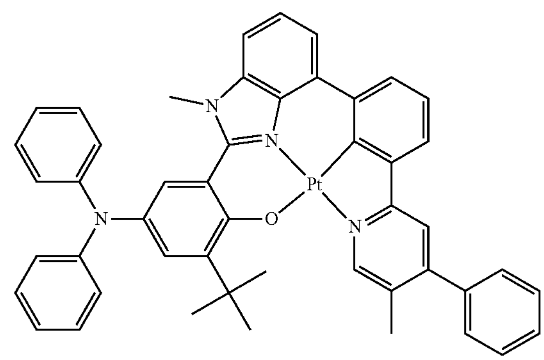
1-58
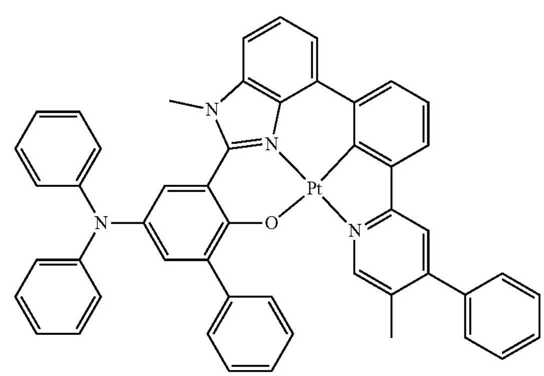

1-59
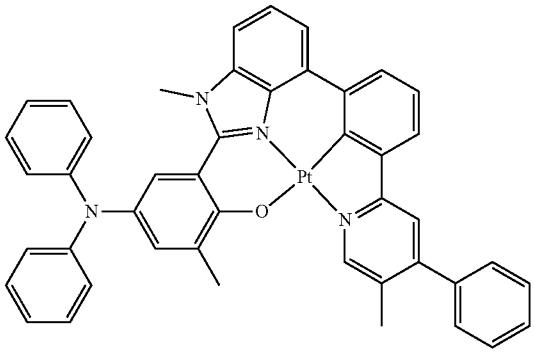
1-60
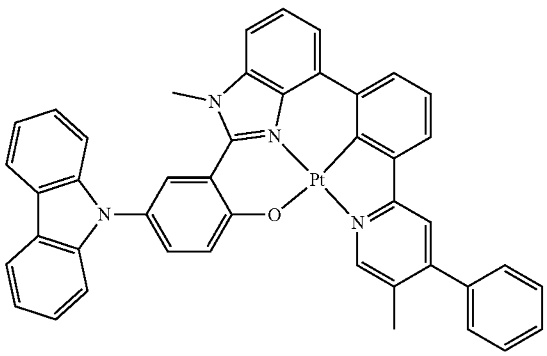
1-61
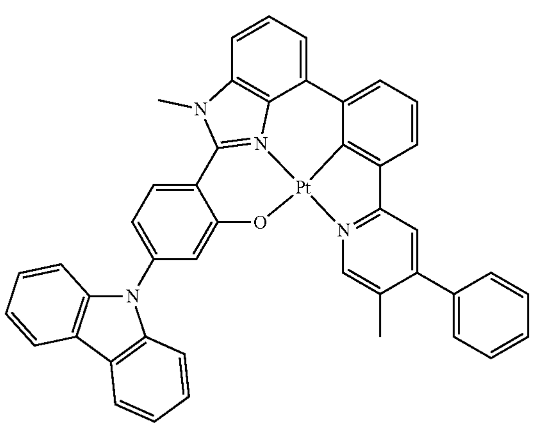
1-62
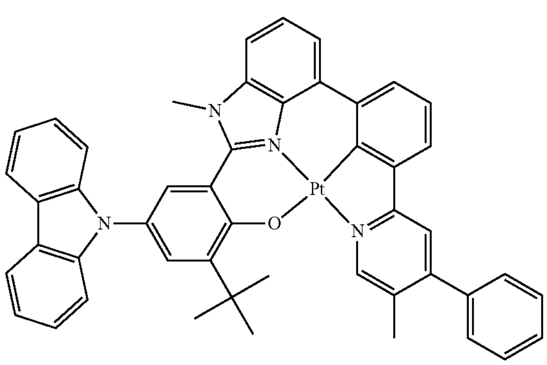
1-63
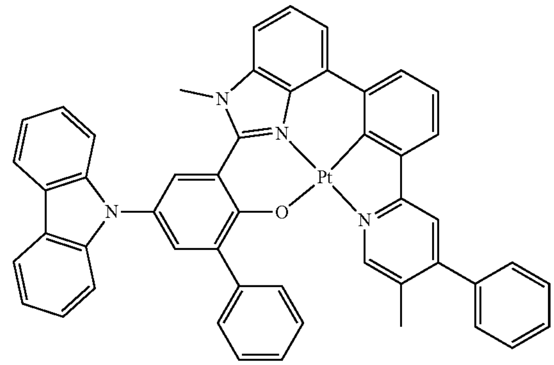
1-64
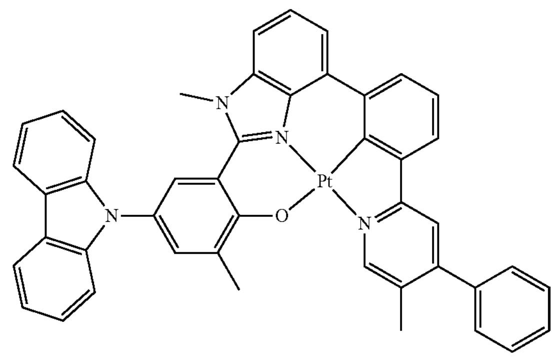
1-65
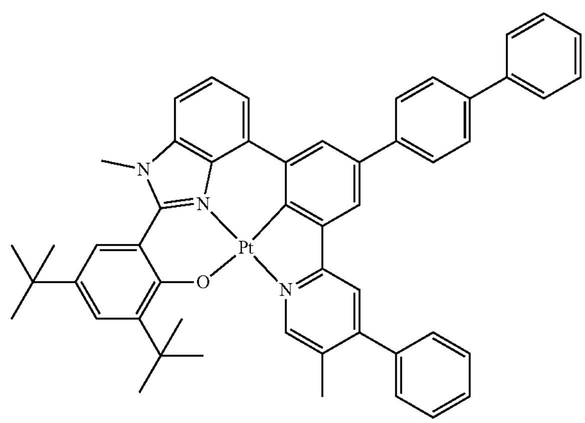
1-66
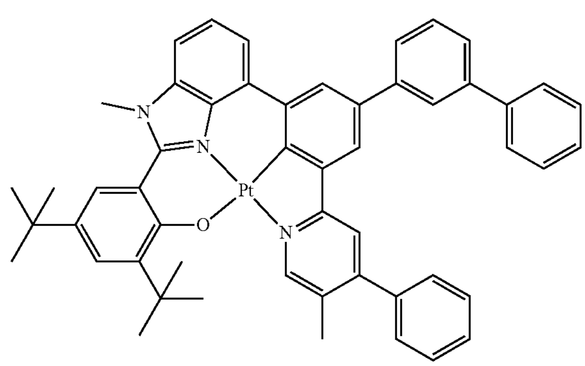

1-67
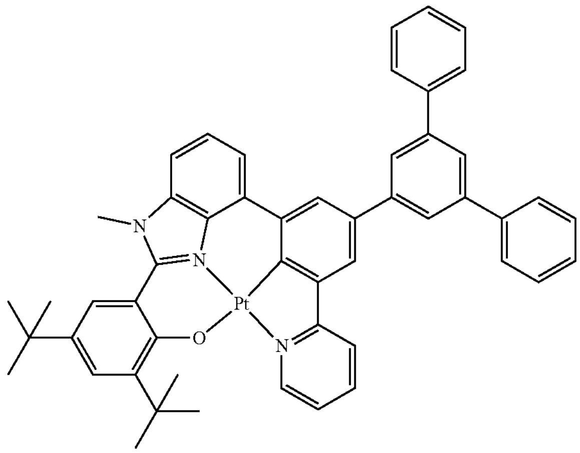
1-68
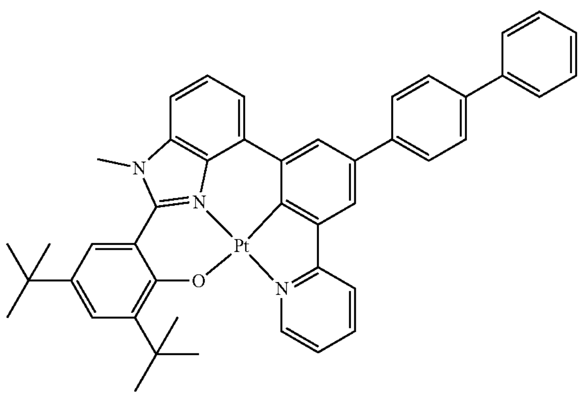
1-69
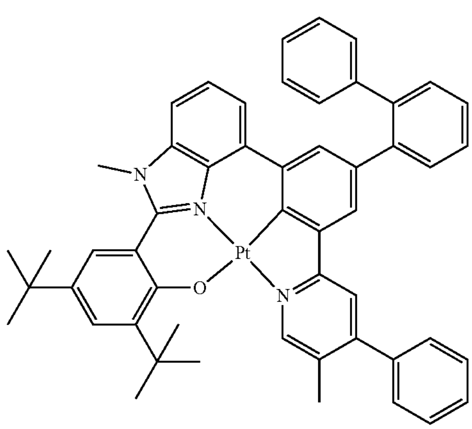
1-70
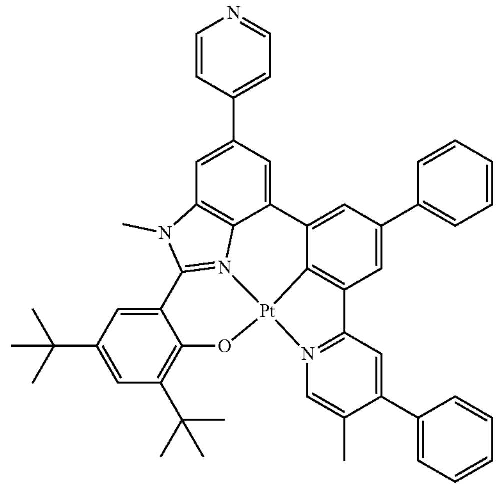
1-71
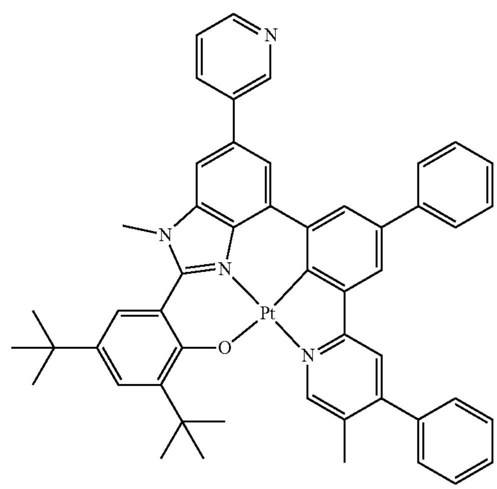
1-72
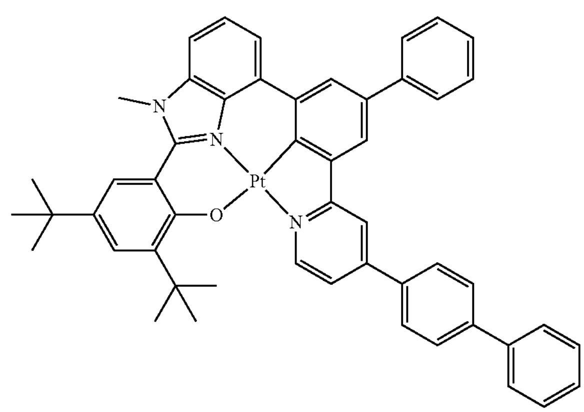

-continued
1-73
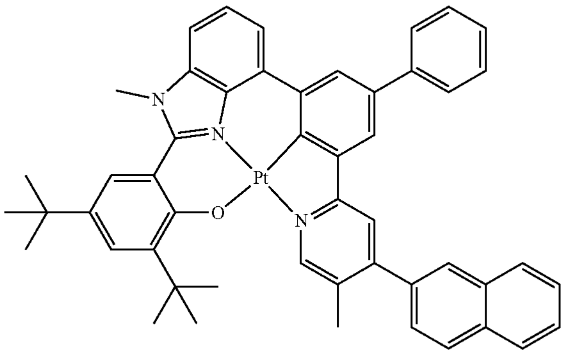
1-74
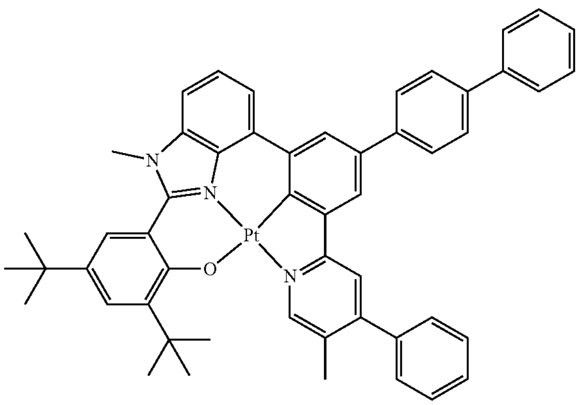
1-75
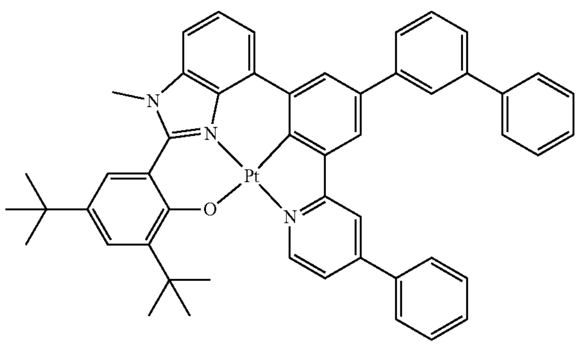
1-76
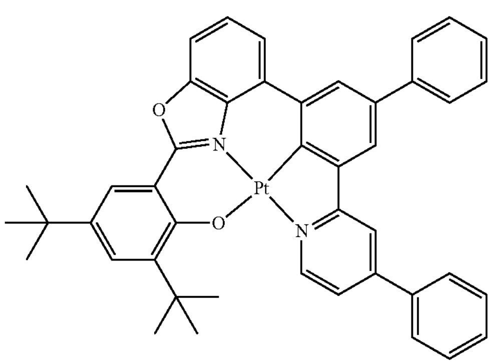
-continued
1-77
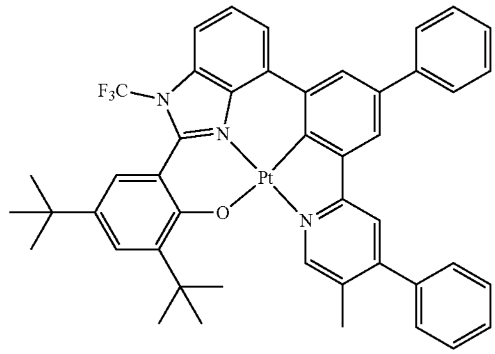
1-78
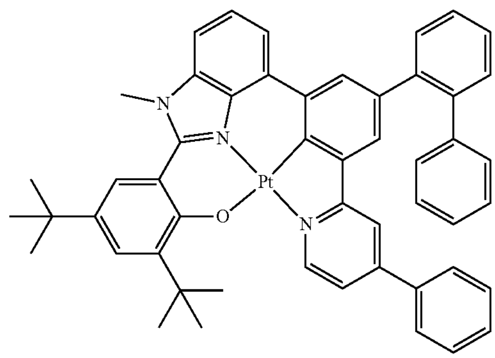
1-79
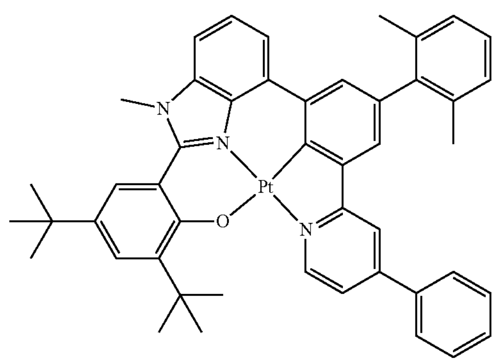
1-80
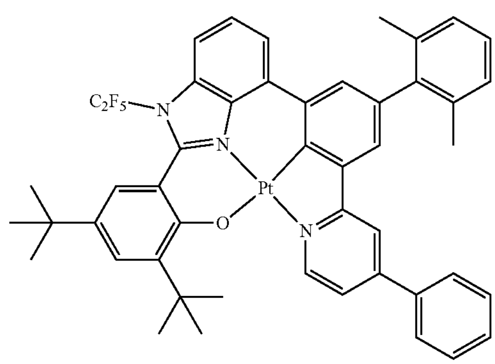

-continued
1-81
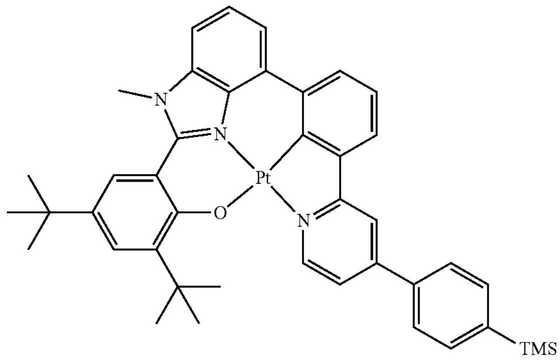
1-82
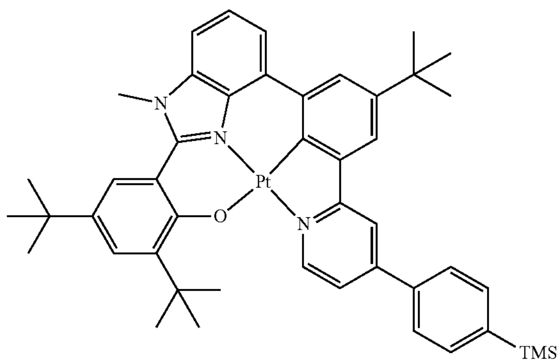
1-83
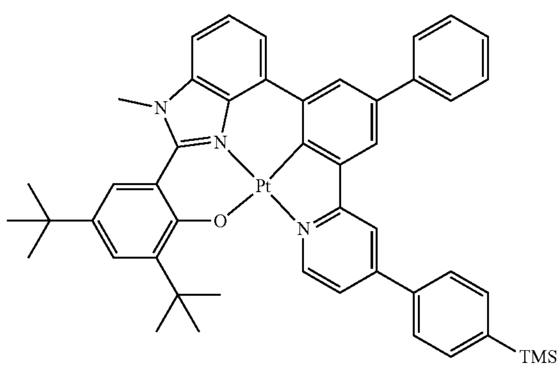
1-84
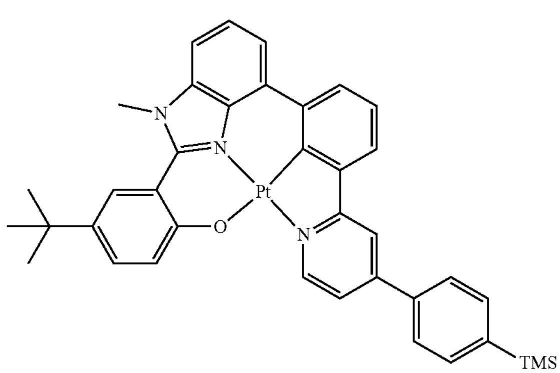
-continued
1-85
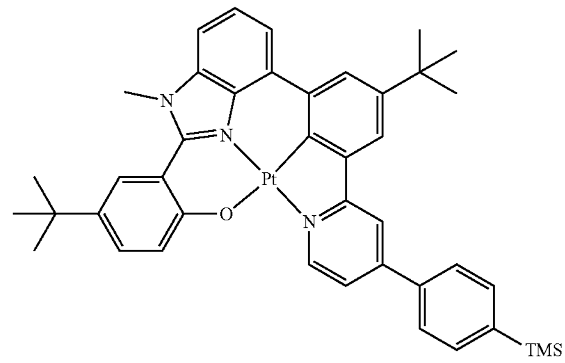
1-86
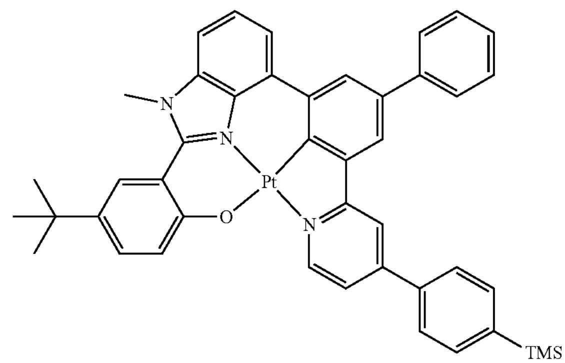
1-87
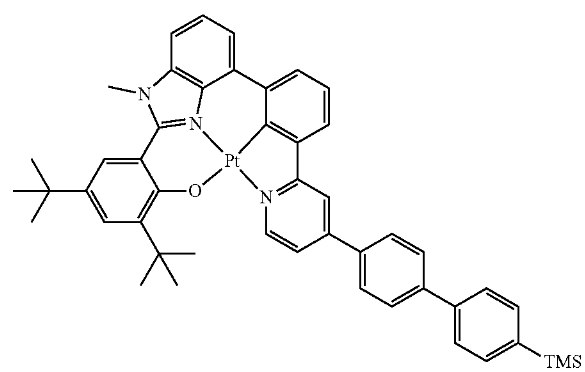
1-88
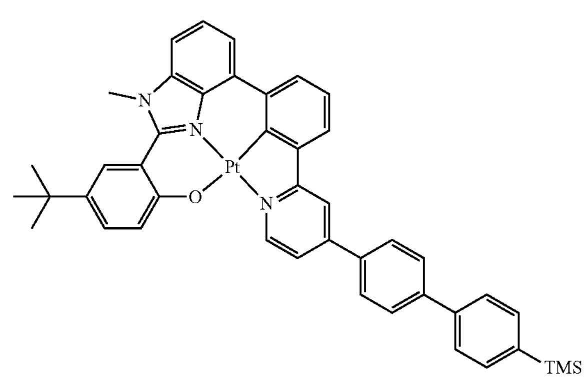

-continued
2-1
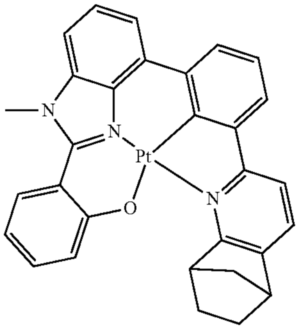
2-2
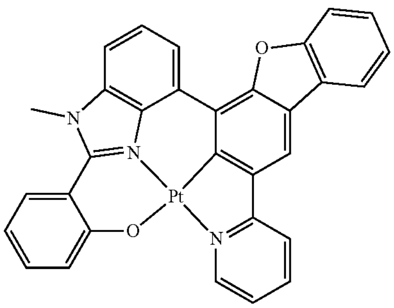
2-3
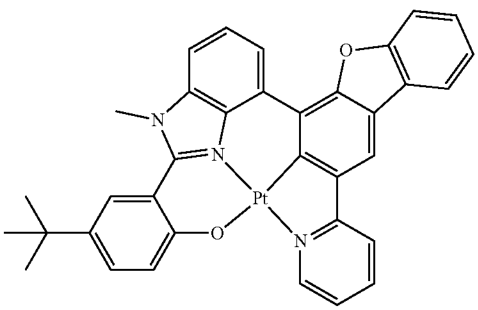
2-4
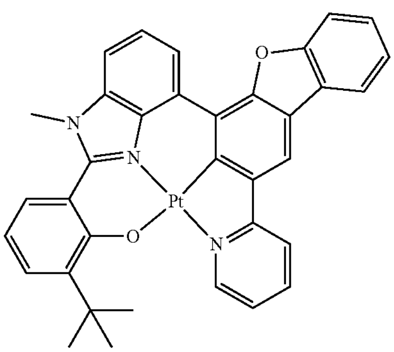
2-5
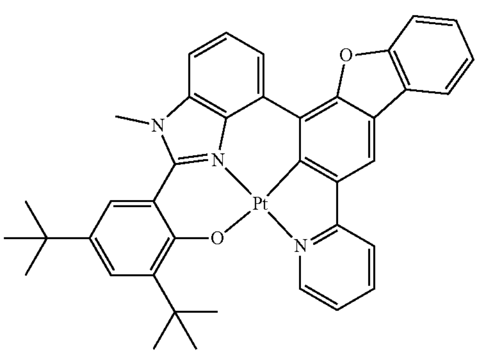
-continued
2-6
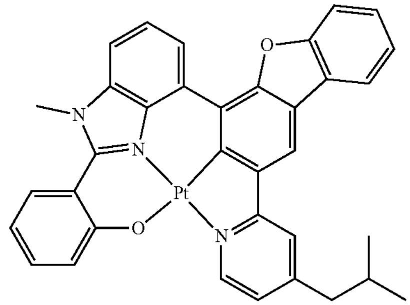
2-7
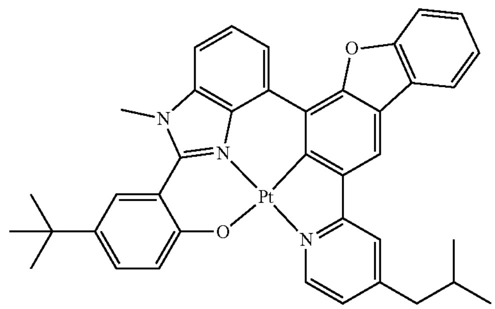
2-8
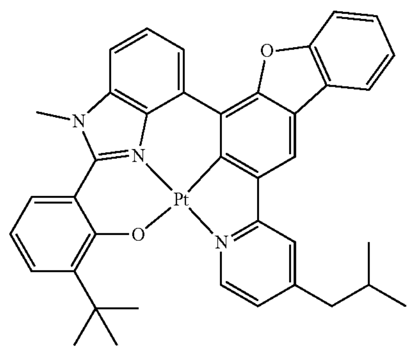
2-9
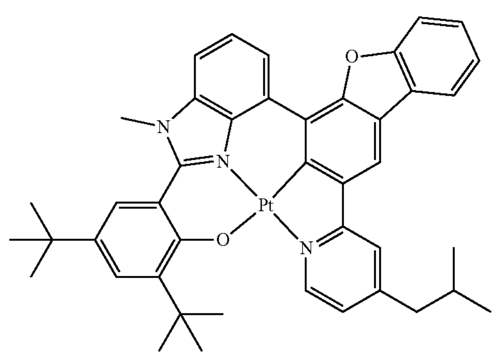

-continued
2-10
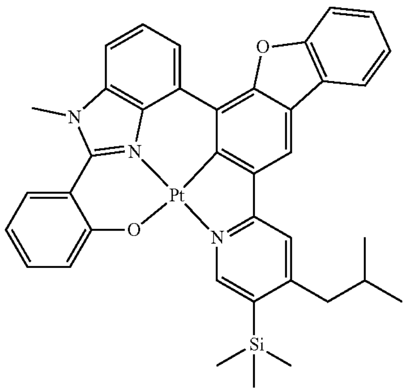
2-11
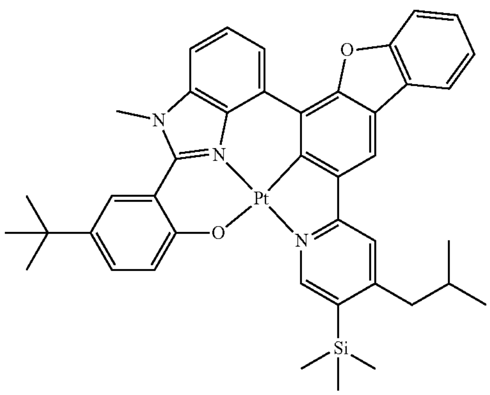
2-12
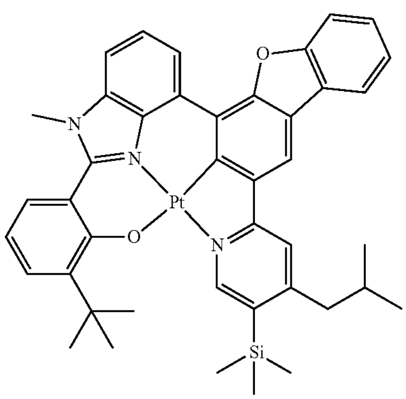
2-13
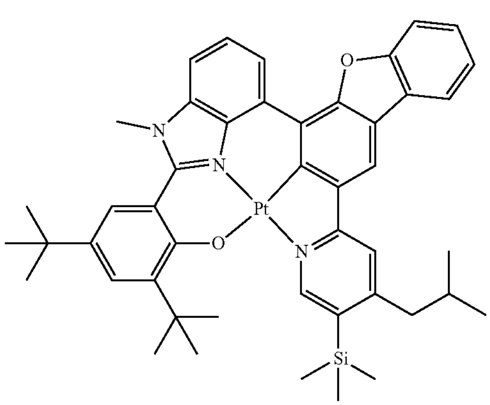
-continued
2-14
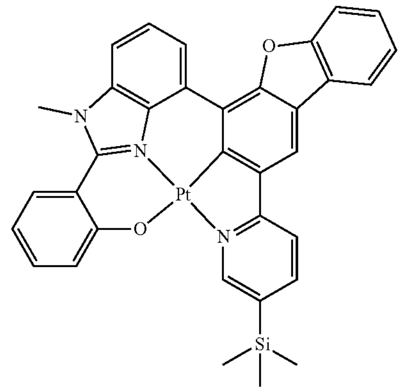
2-15
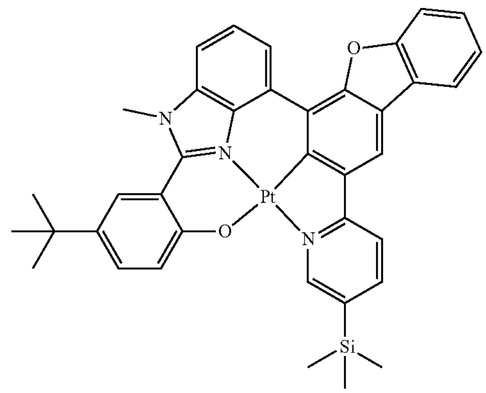
2-16
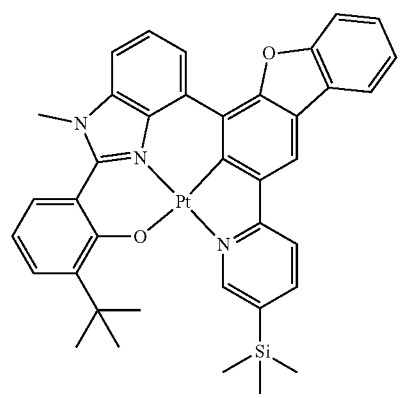
2-17
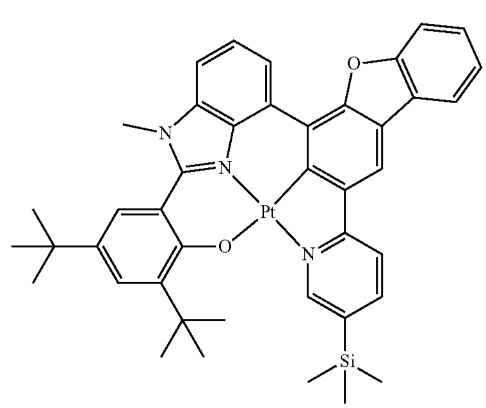

-continued
2-18
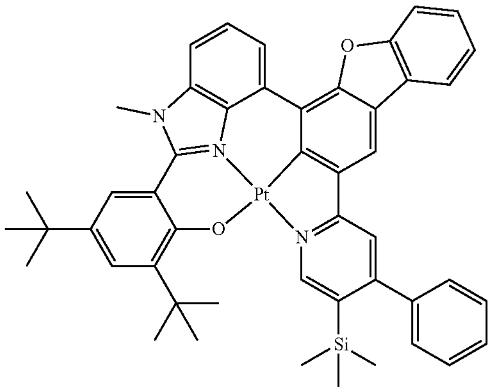
2-19
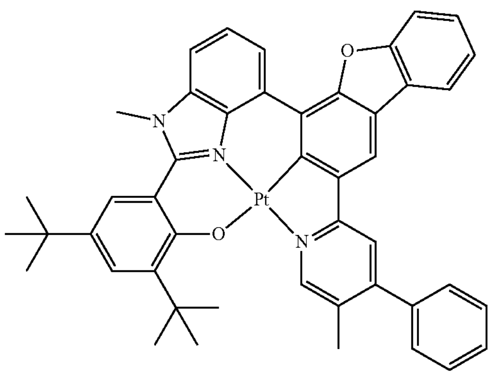
2-20
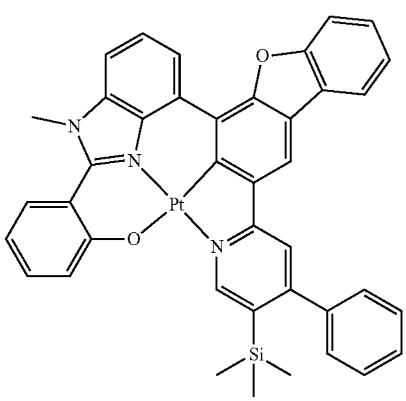
2-21
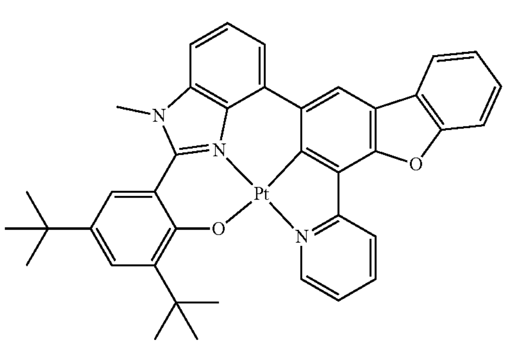
-continued
2-22
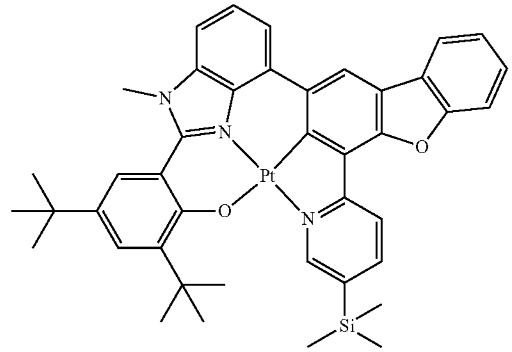
2-23
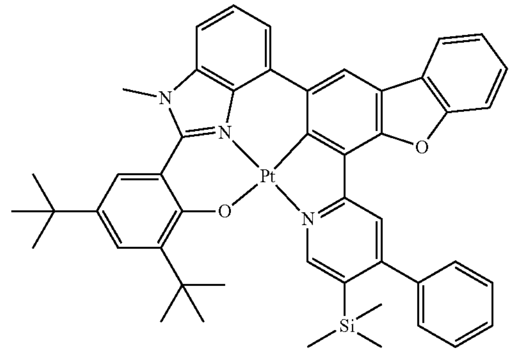
2-24
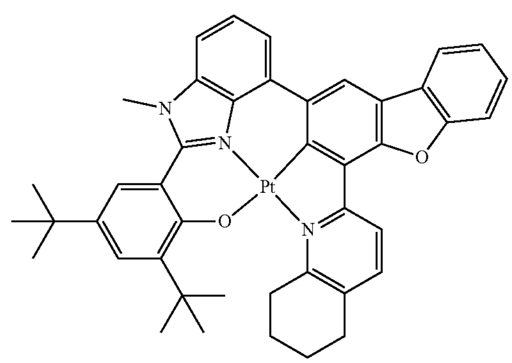
2-25
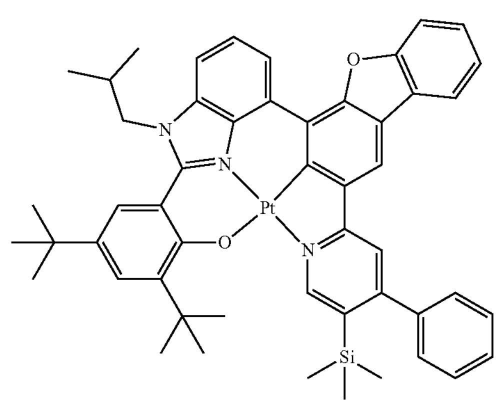

-continued
2-26
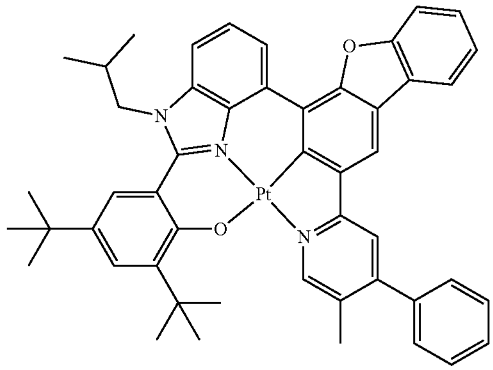
2-27
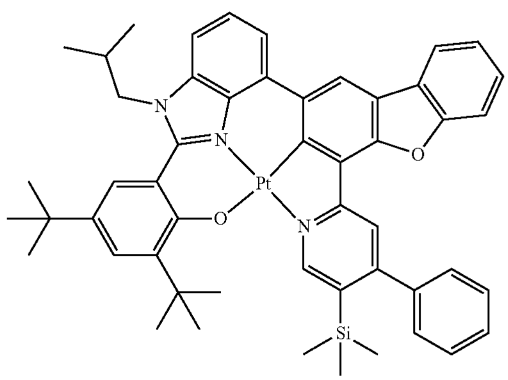
2-28
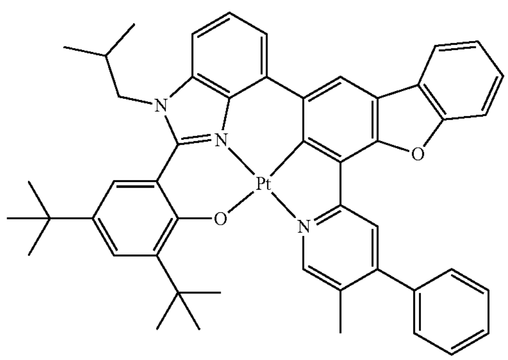
2-29
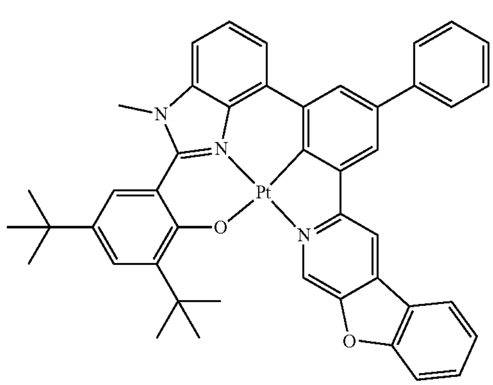
-continued
2-30
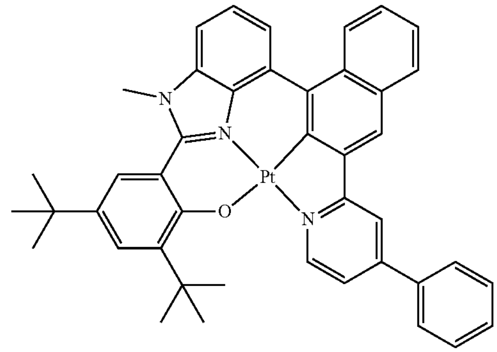
2-31
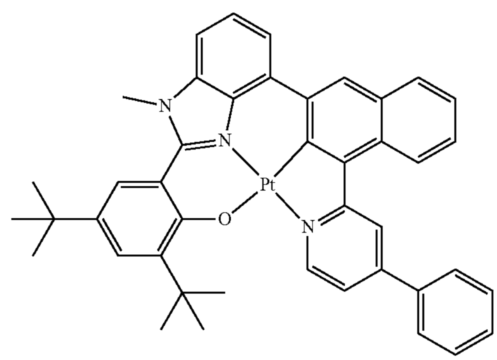
2-32
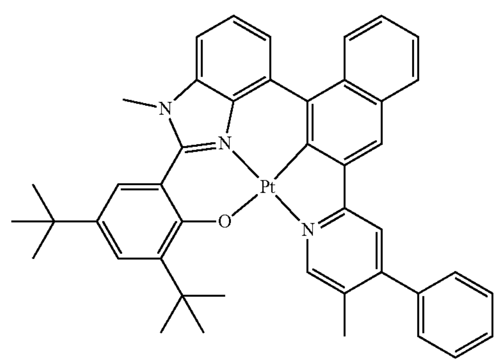
2-33
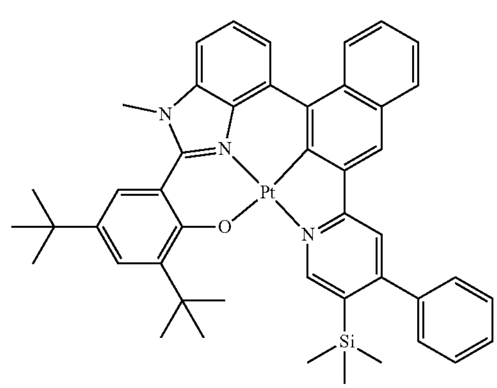

-continued
2-34
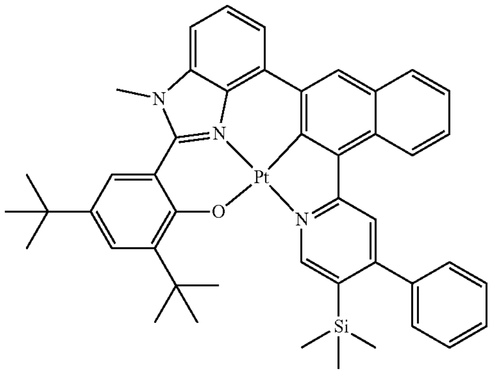
2-35
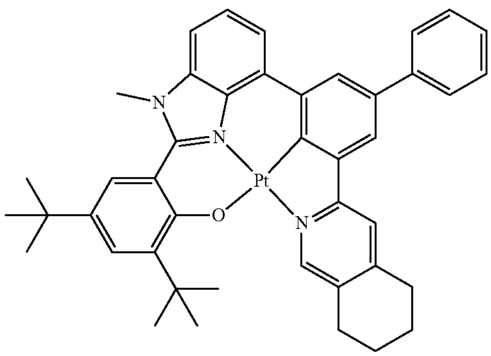
2-36
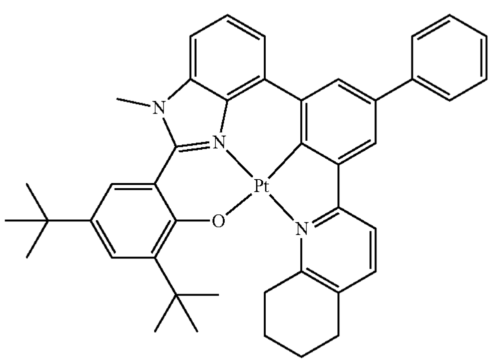
2-37
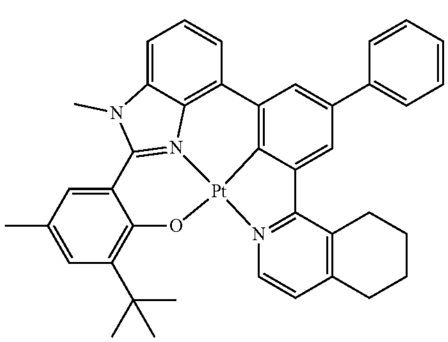
-continued
2-38
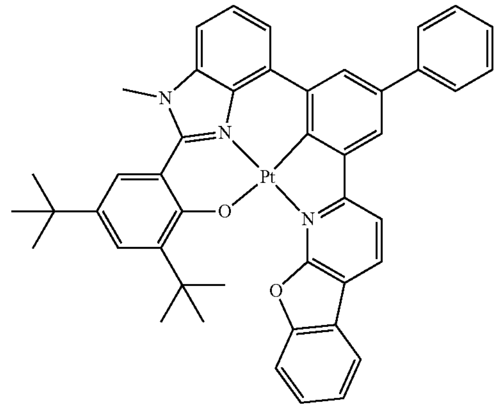
2-39
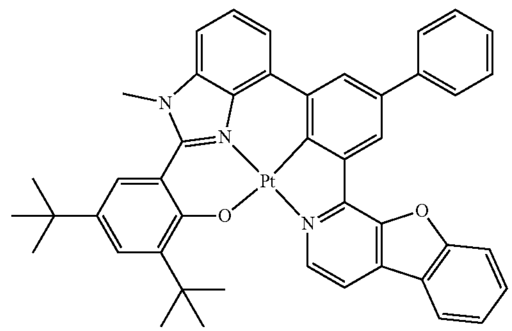
2-40
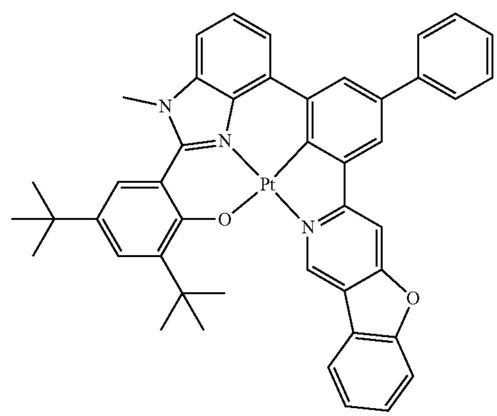
2-41
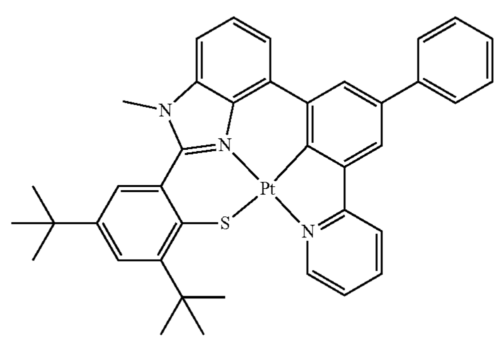

2-42
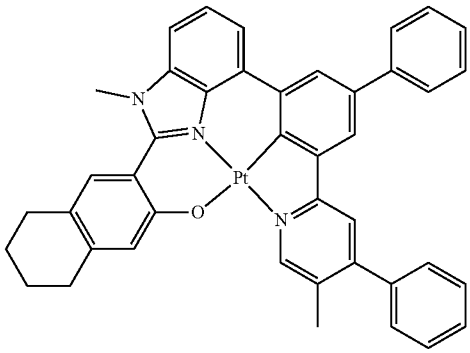
2-43
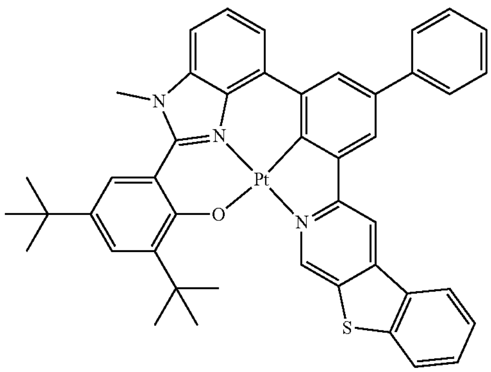
2-44
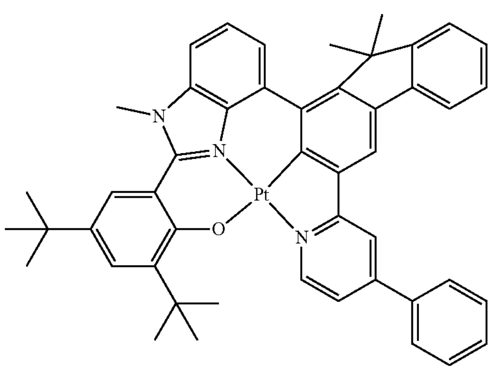
2-45
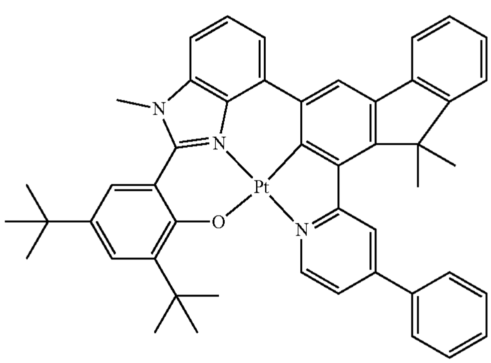
2-46
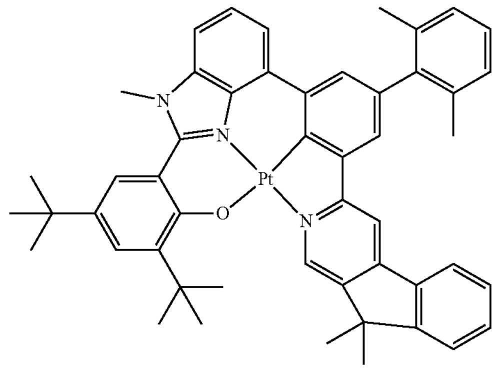
2-47
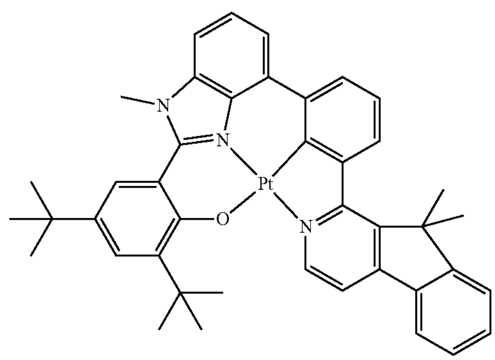
3-1
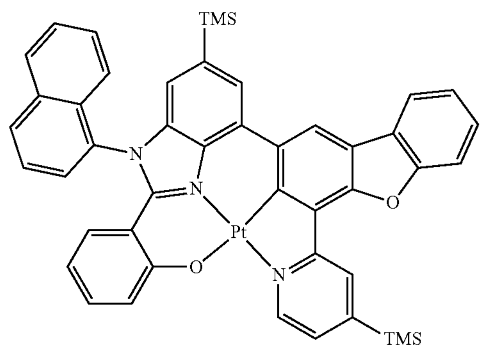
3-2
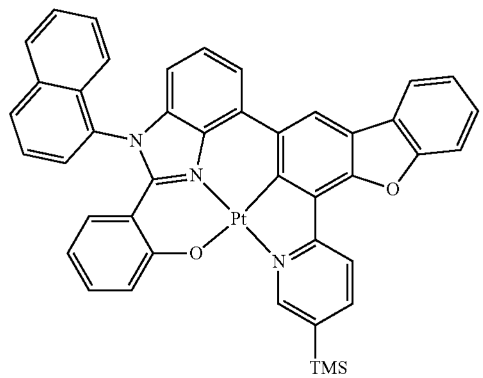

-continued
3-3
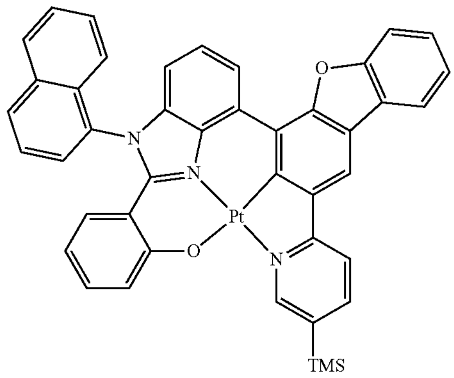
3-4
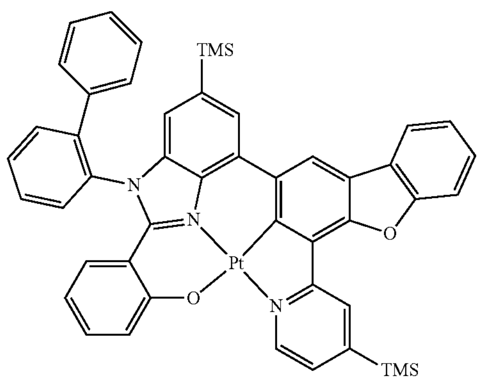
3-5
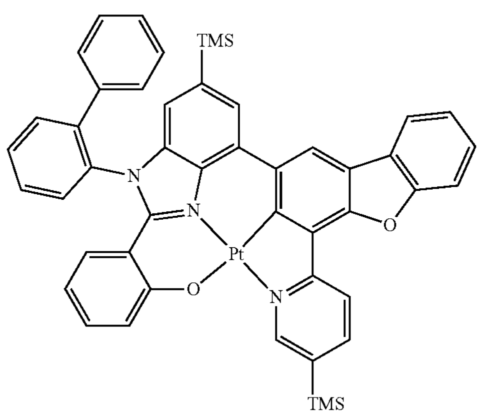
3-6
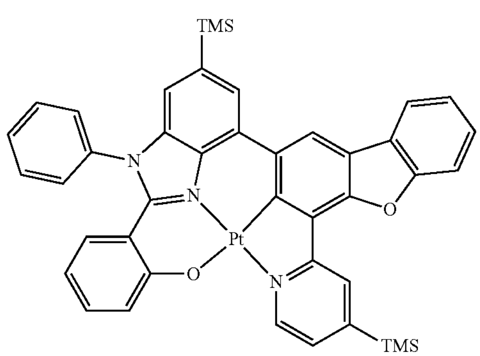
3-7
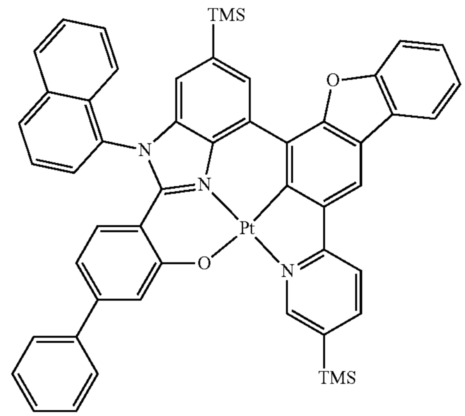
3-8
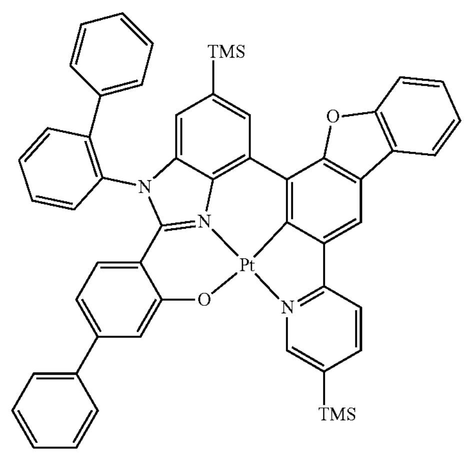
3-9
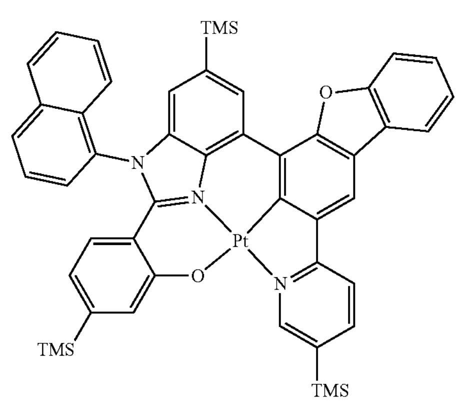

-continued
3-10
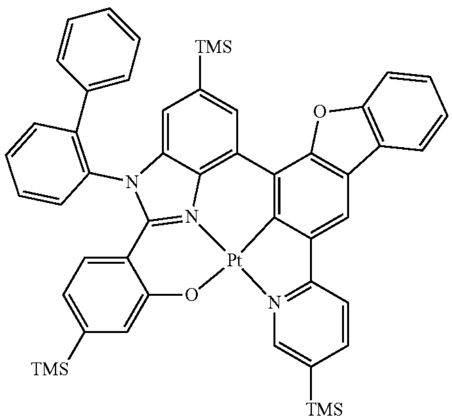
3-11
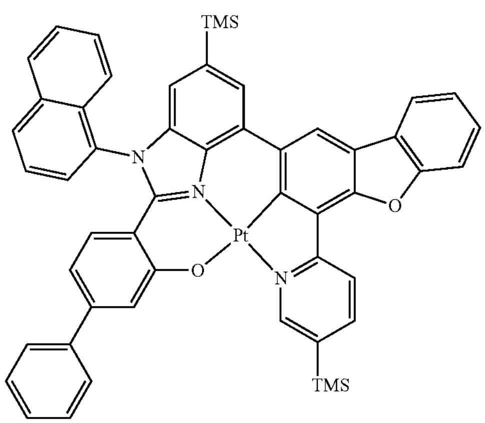
3-12
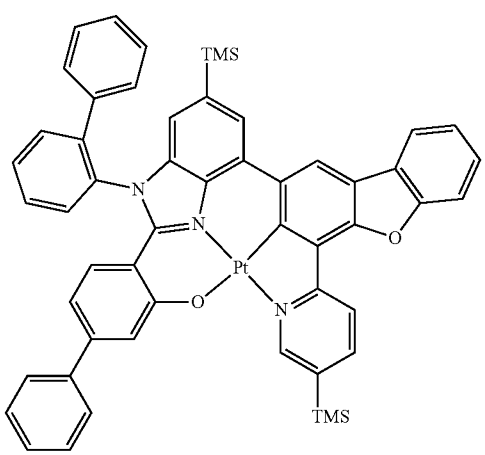
-continued
3-13
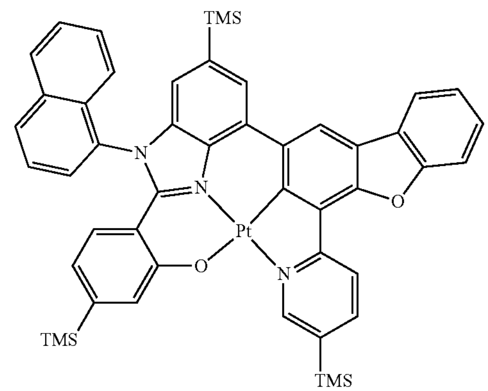
3-14
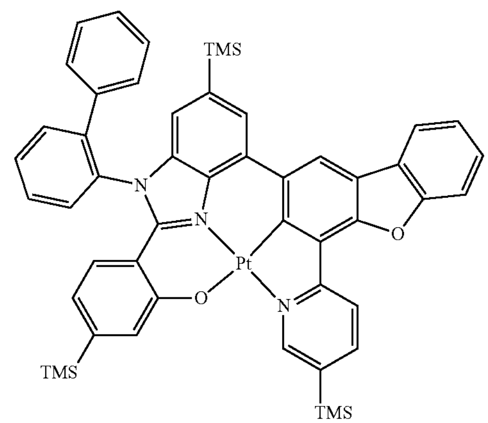
3-15
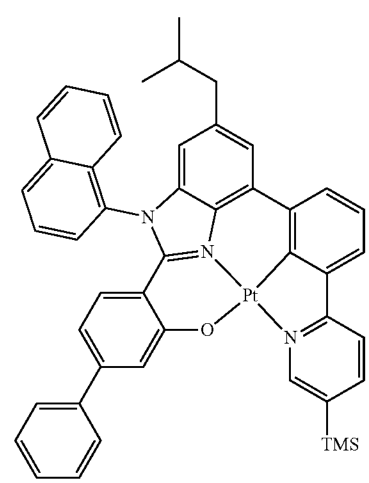

-continued
3-16
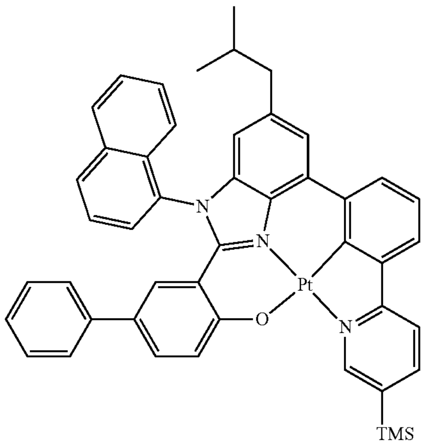
3-17
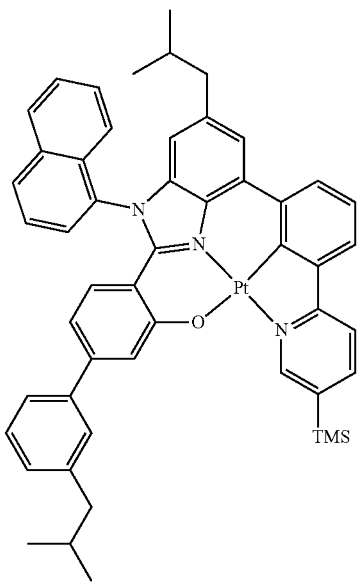
3-18
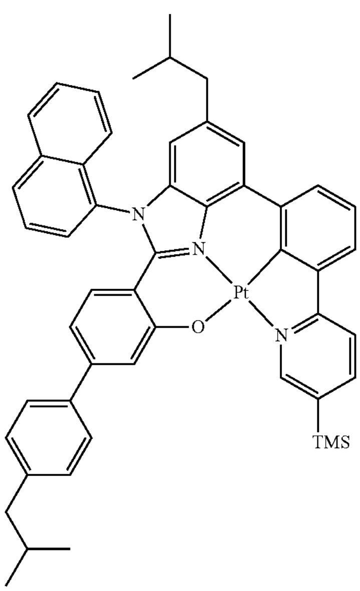
-continued
3-19
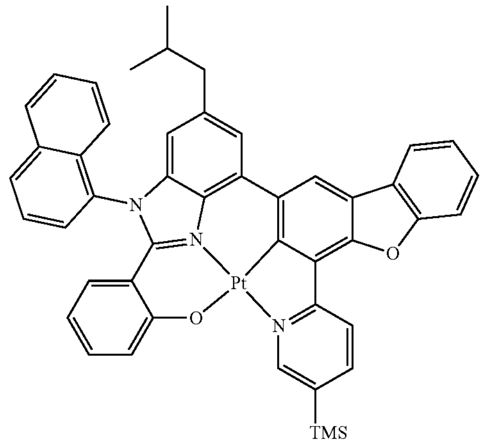
3-20
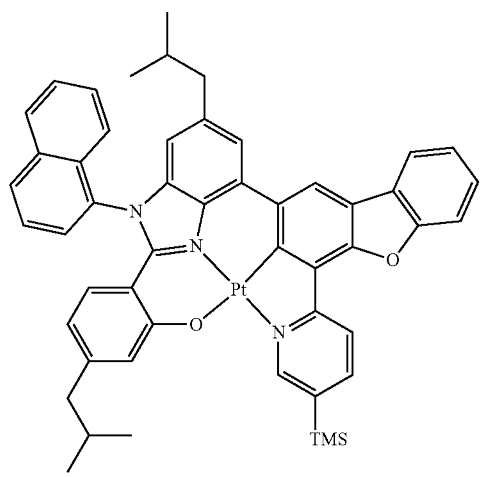
3-21
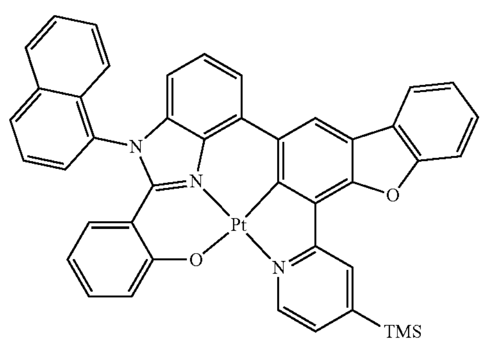

-continued
3-22
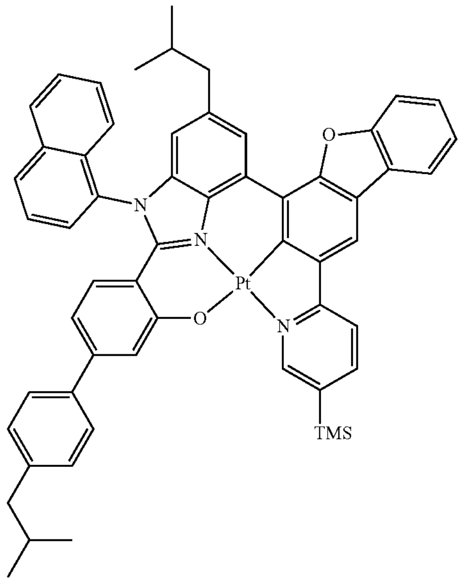
3-23
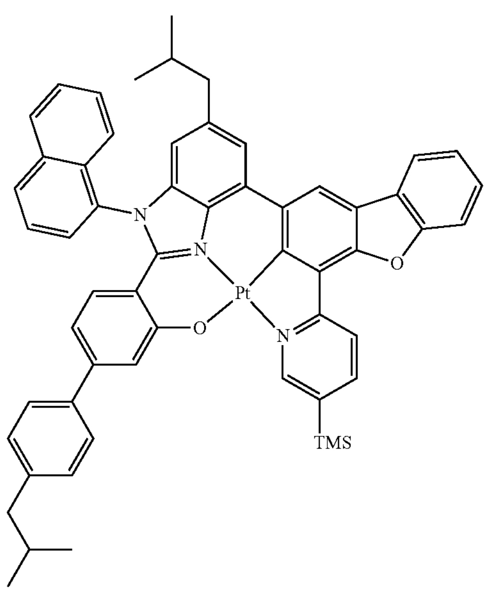
-continued
3-24
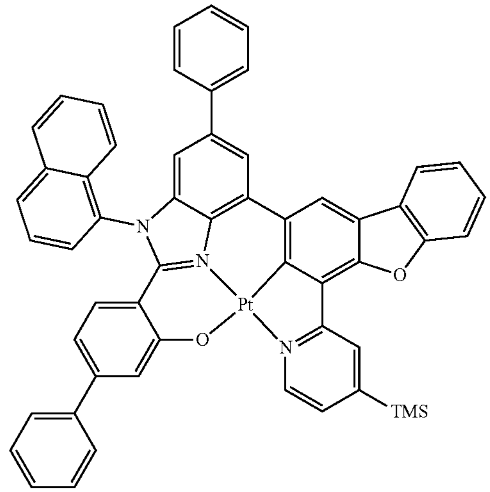
3-25
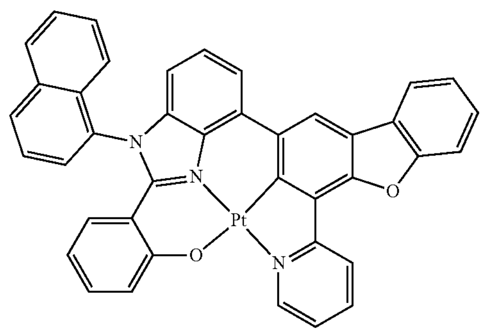
3-26
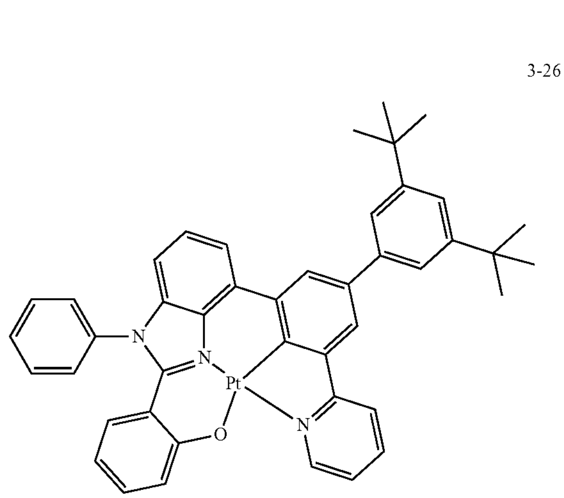

-continued
3-27
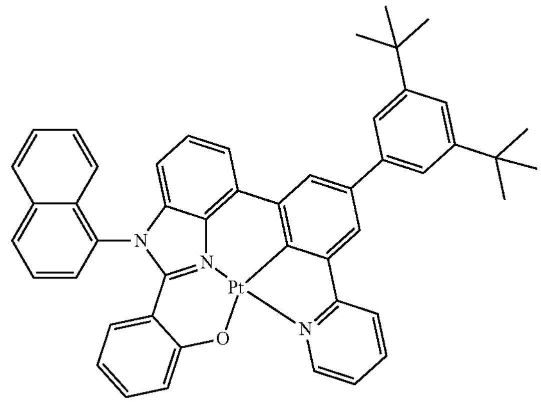
3-28
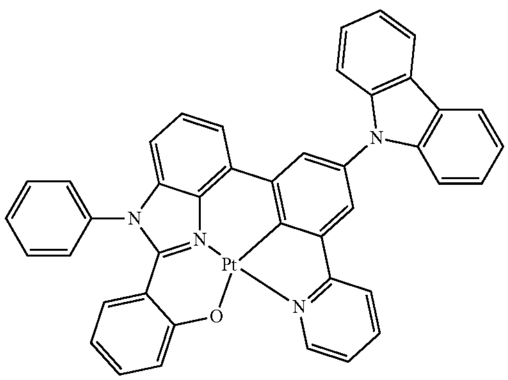
3-29
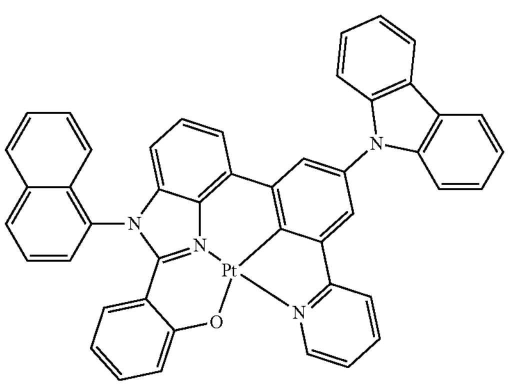
-continued
3-30
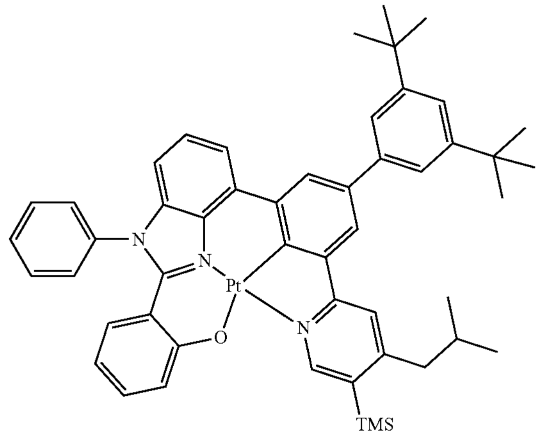
3-31
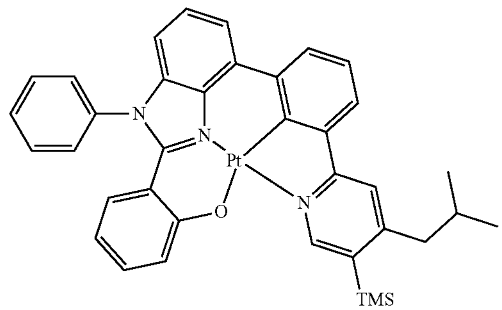
3-32
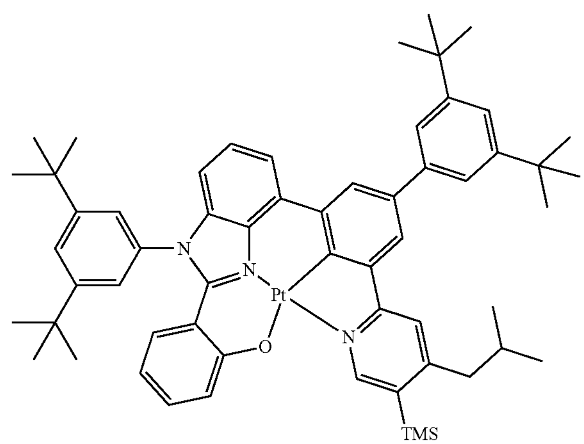
3-33
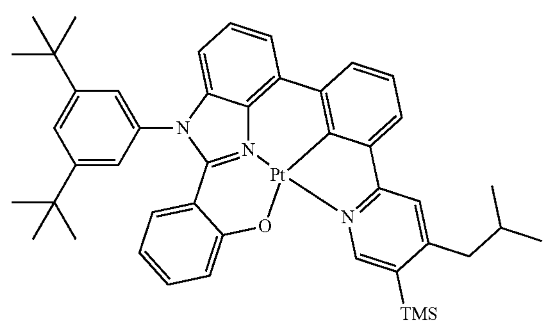

3-34
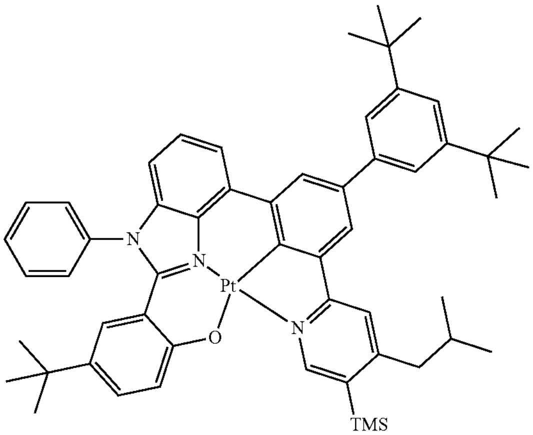
3-35
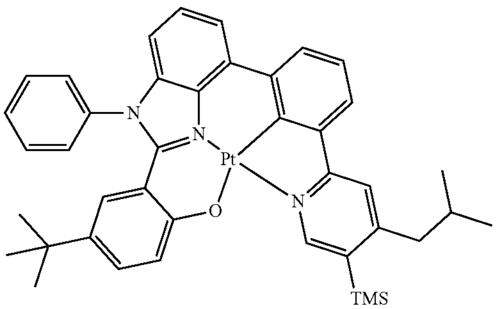
3-36
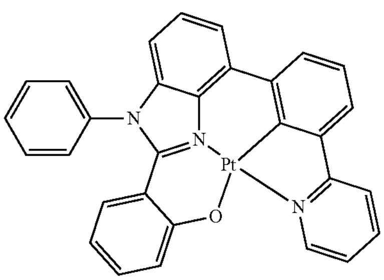
3-37
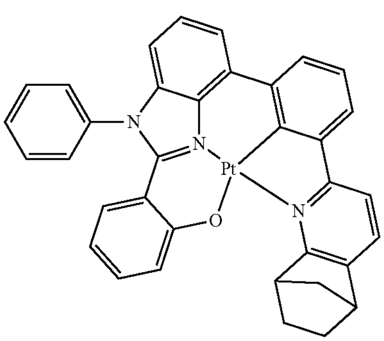
3-38
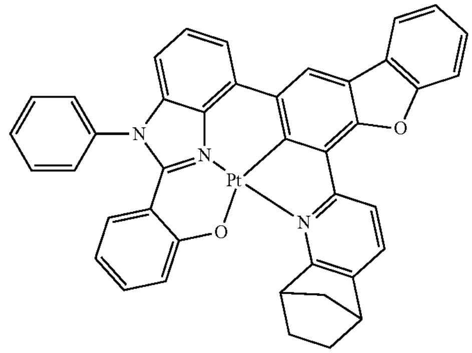
3-39
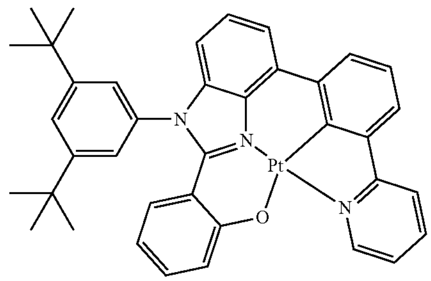
3-40
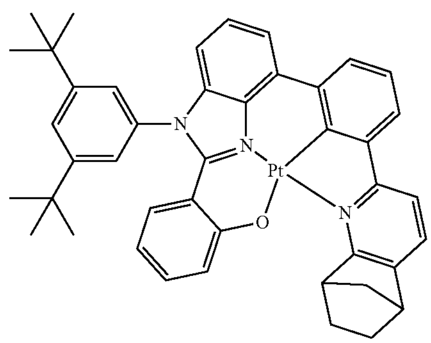
3-41
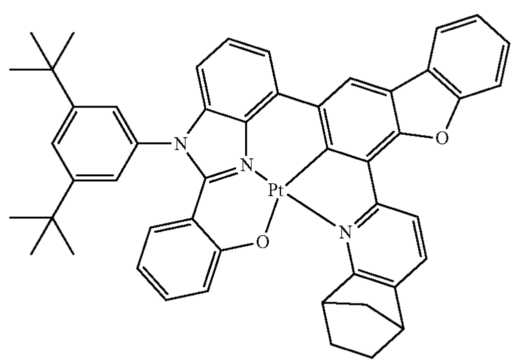

-continued
3-42
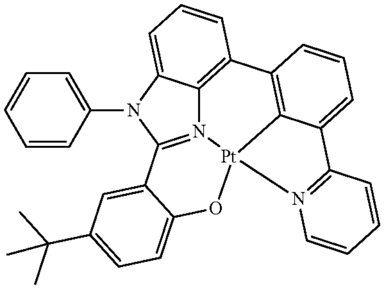
3-43
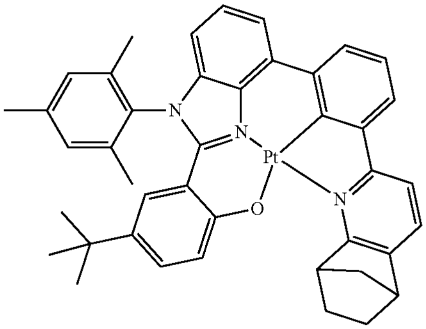
3-44
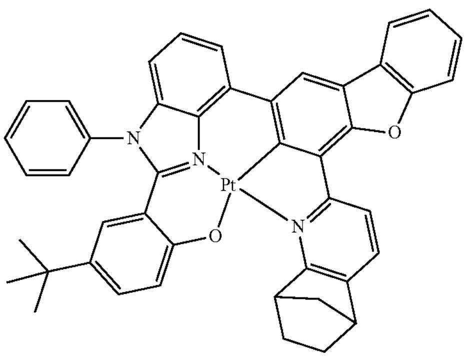
3-45
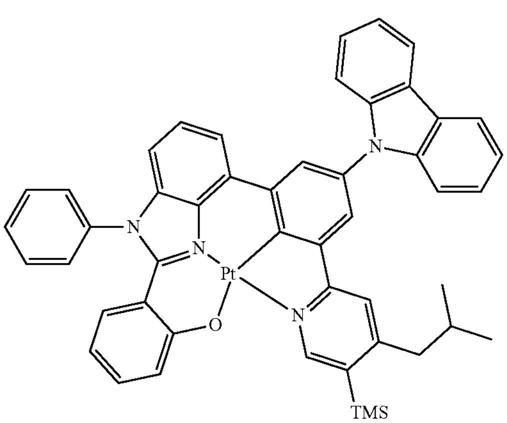
-continued
3-46
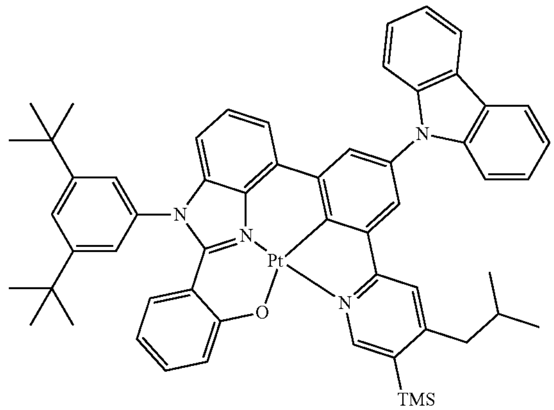
3-47
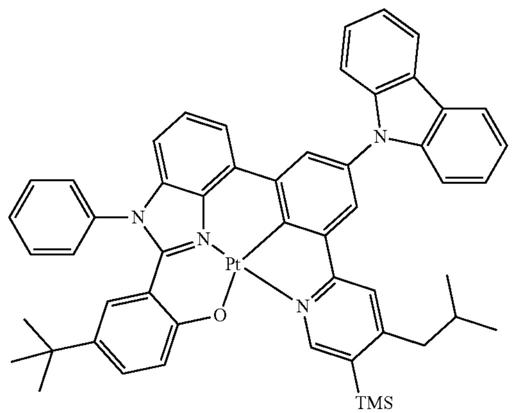
3-48
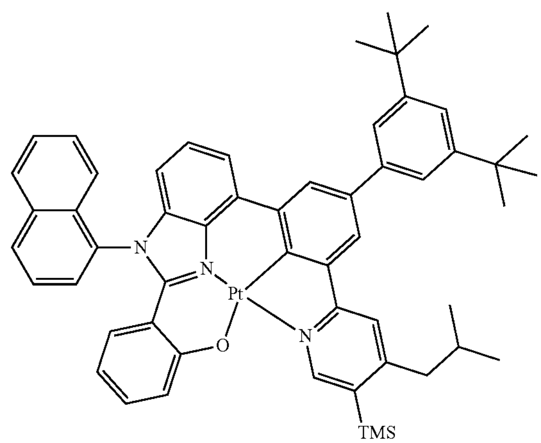
3-49
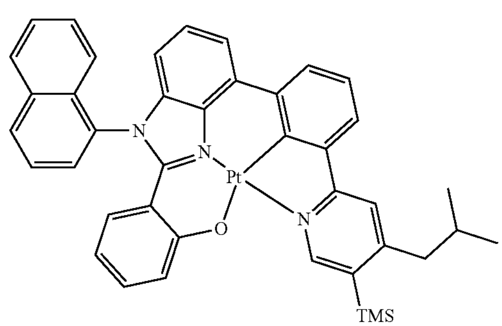

-continued
3-50
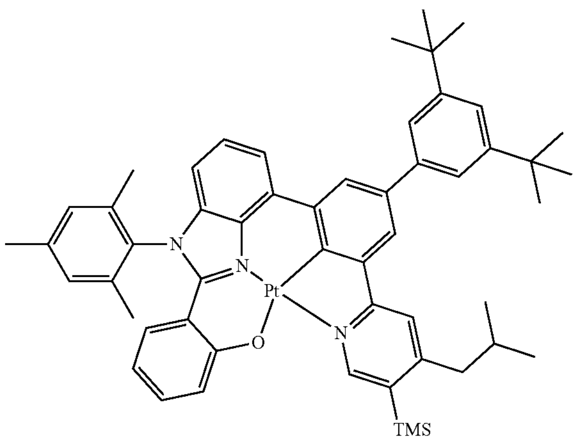
3-51
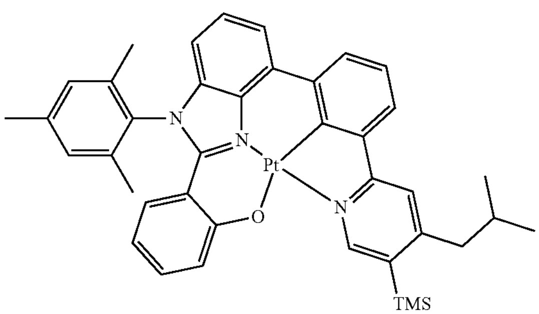
3-52
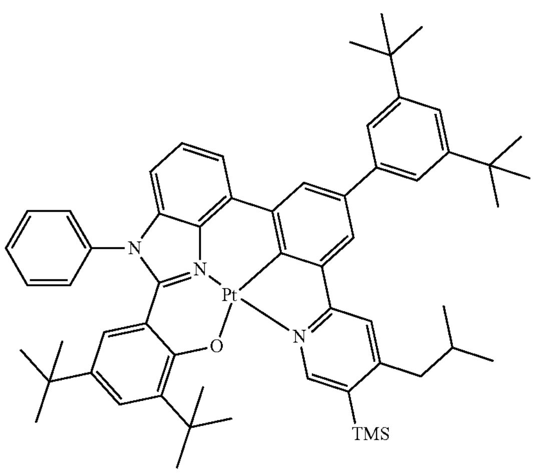
3-53
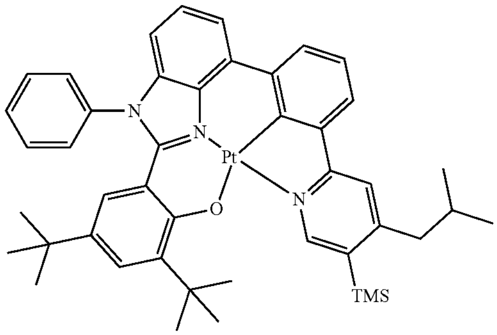
-continued
3-54
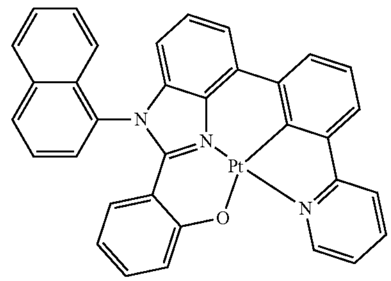
3-55
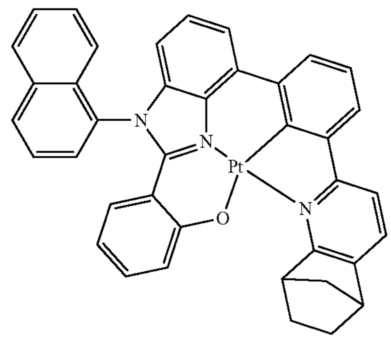
3-56
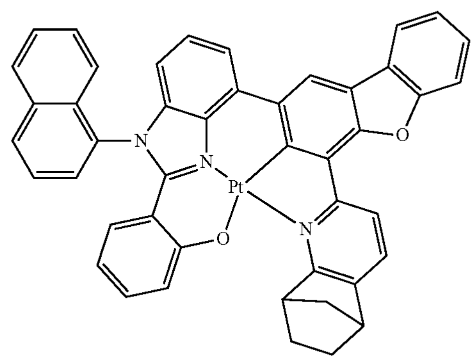
3-57
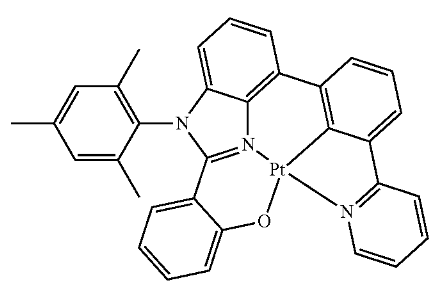
3-58
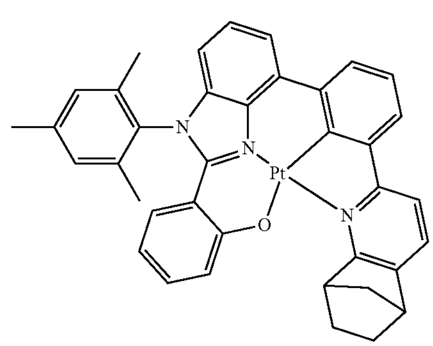

-continued
3-59
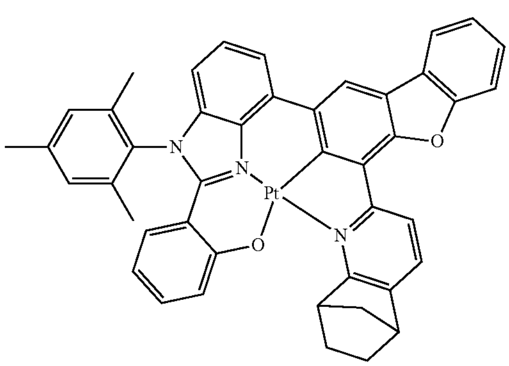
3-60
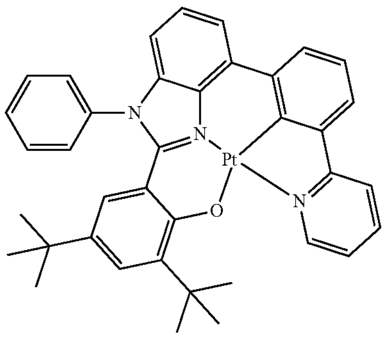
3-61
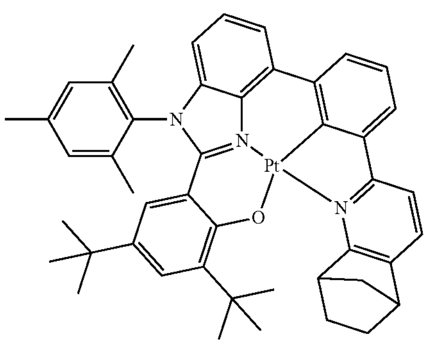
3-62
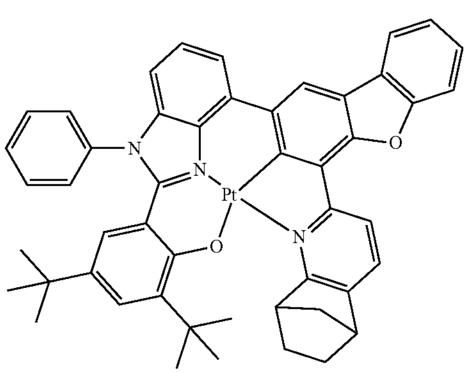
-continued
3-63
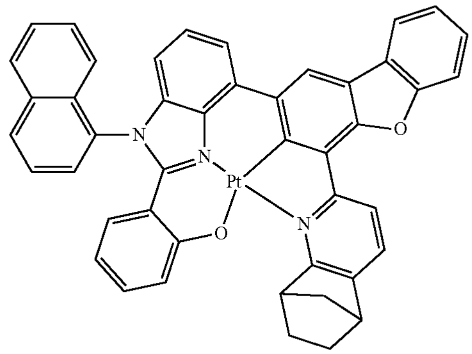
3-64
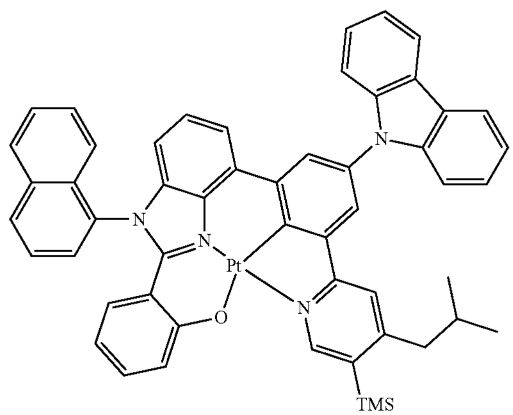
3-65
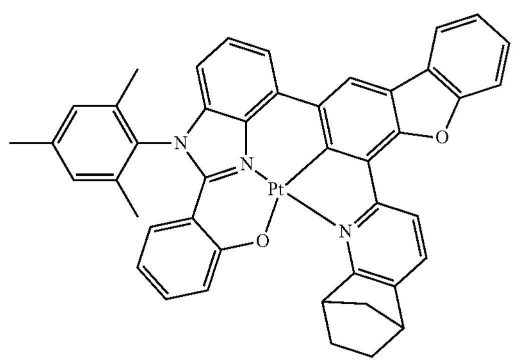
3-66
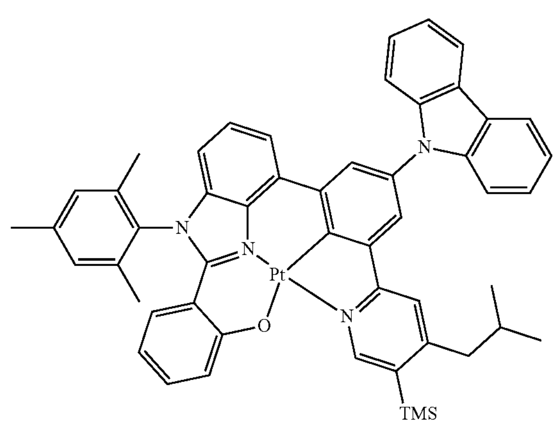

-continued
3-67
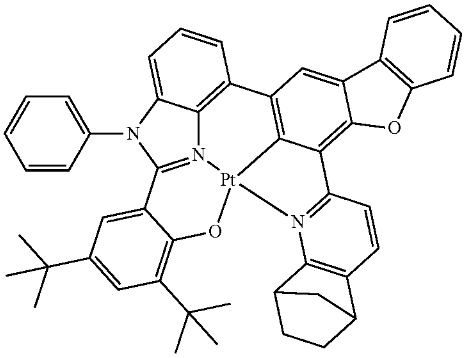
3-68
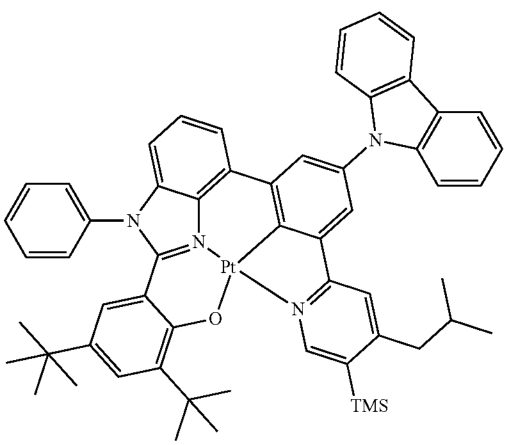
3-69
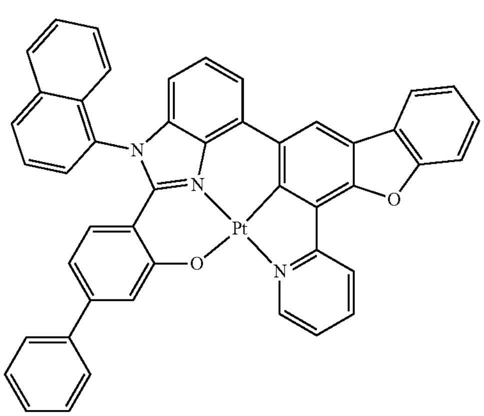
-continued
3-70
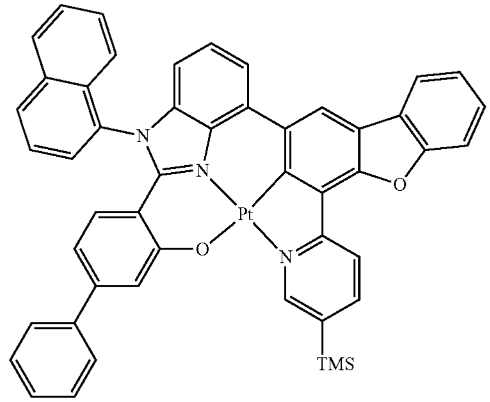
3-71
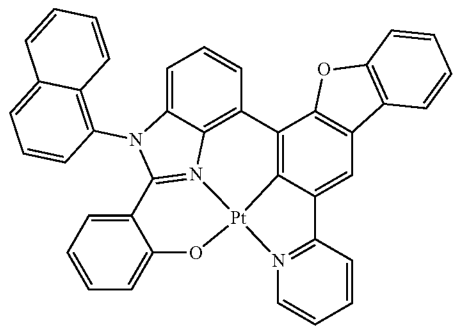
3-72
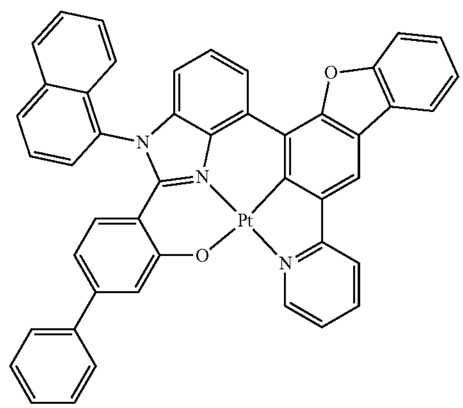
3-73
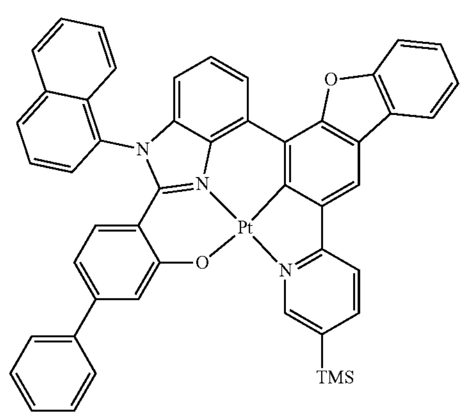

3-74
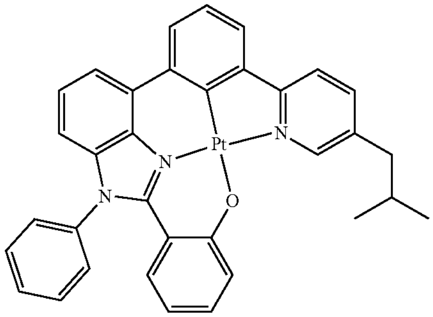
3-75
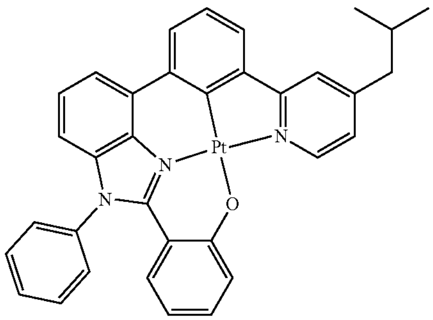
3-76
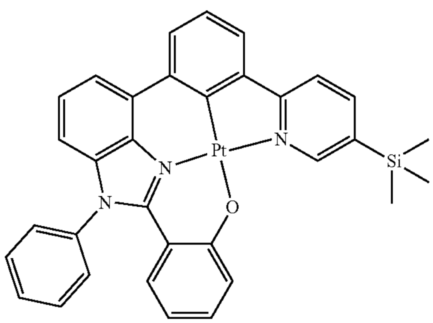
3-77
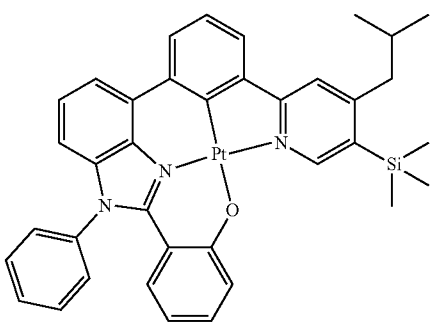
3-78
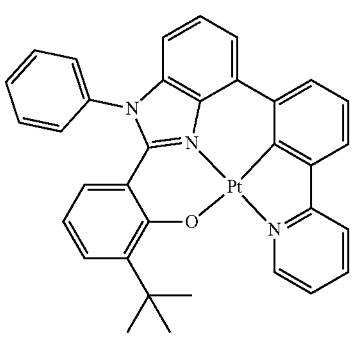
3-79
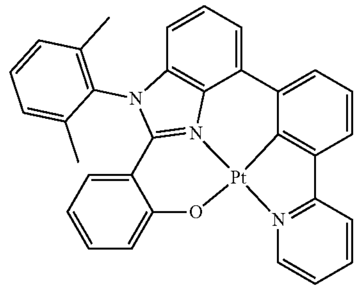
3-80
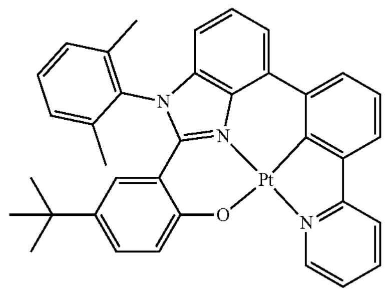
3-81
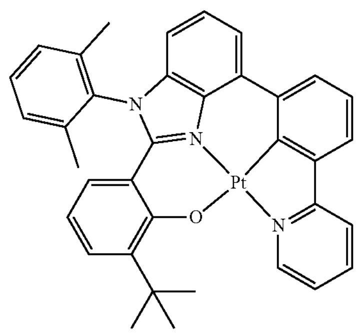
3-82
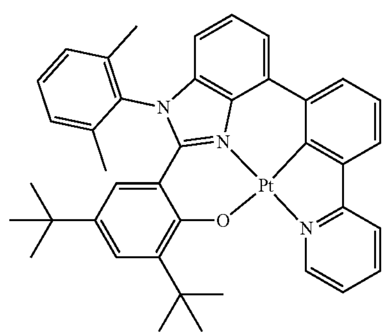
3-83
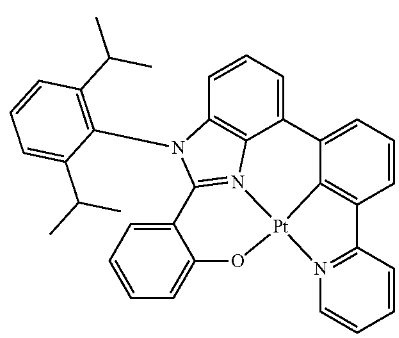

-continued
3-84
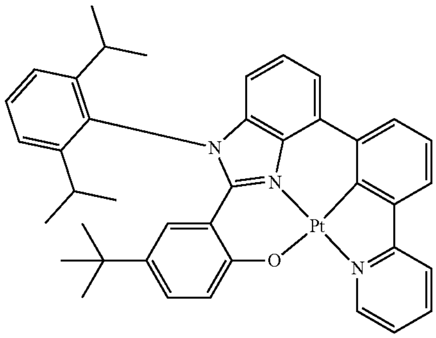
3-85
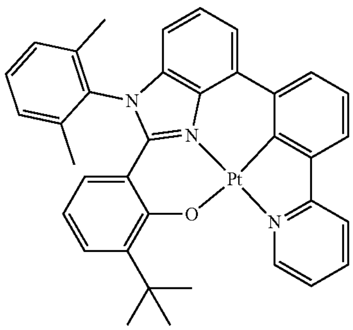
3-86
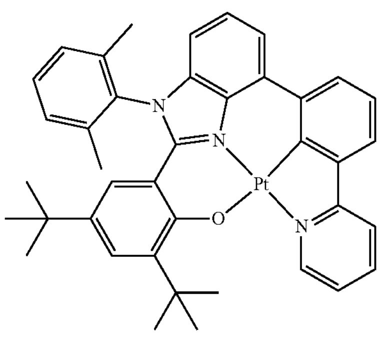
3-87
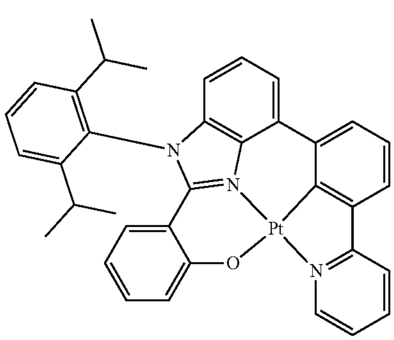
-continued
3-88
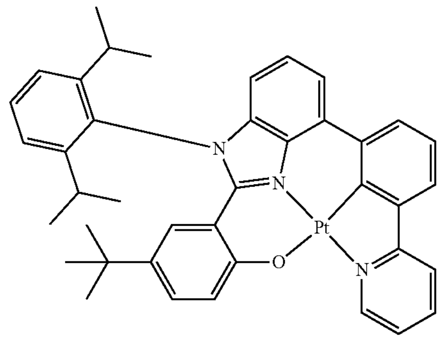
3-89
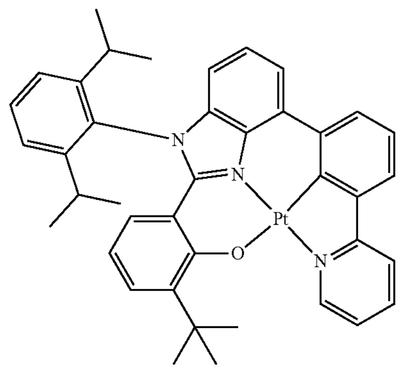
3-90
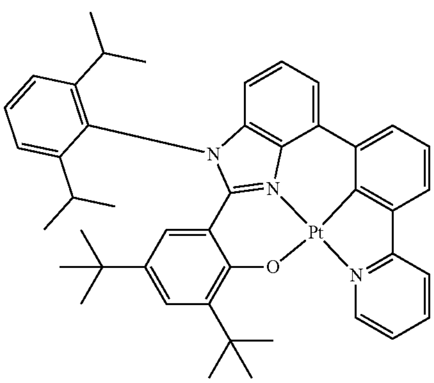
3-91
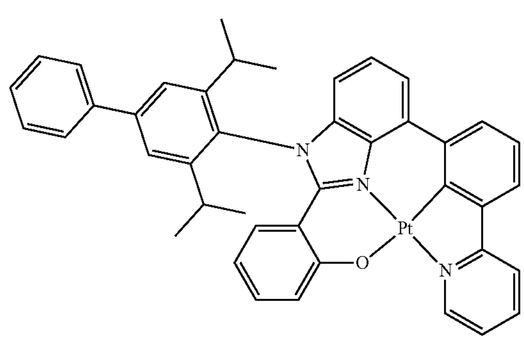

-continued
3-92
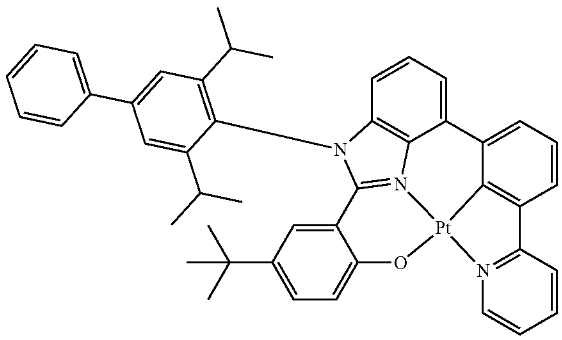
3-93
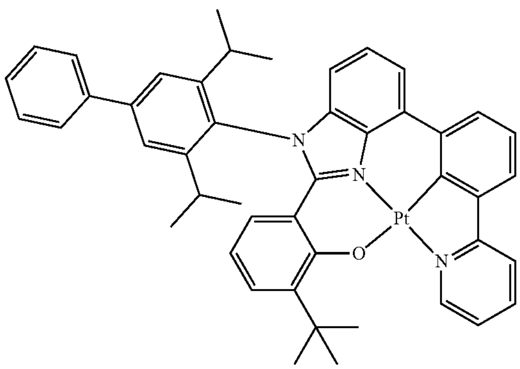
3-94
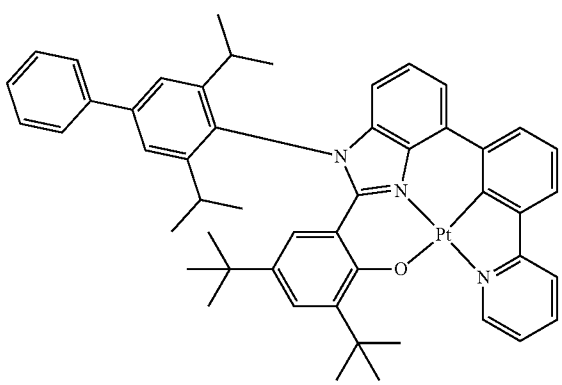
3-95
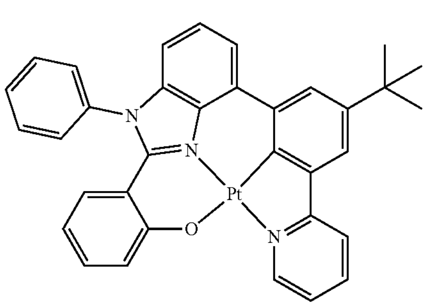
-continued
3-96
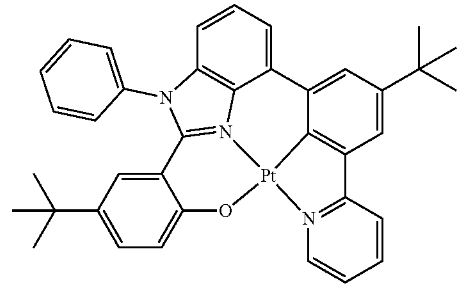
3-97
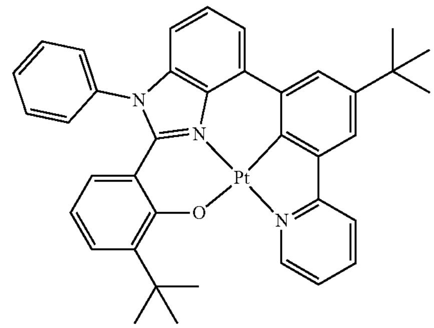
3-98
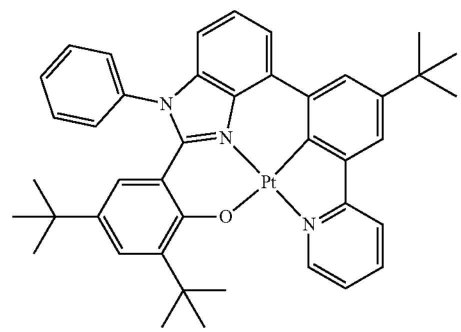
3-99
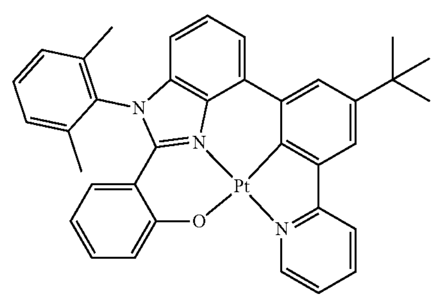
3-100
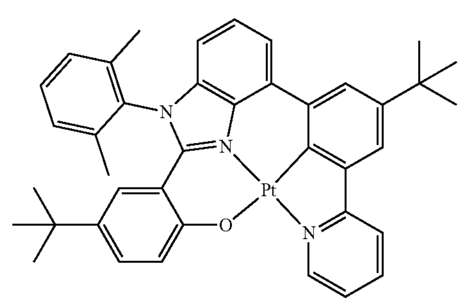

-continued
3-101
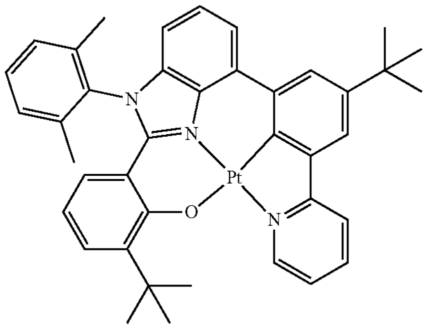
3-102
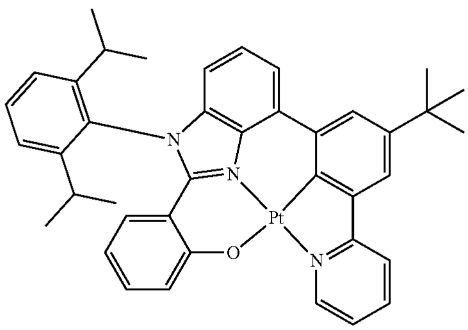
3-103
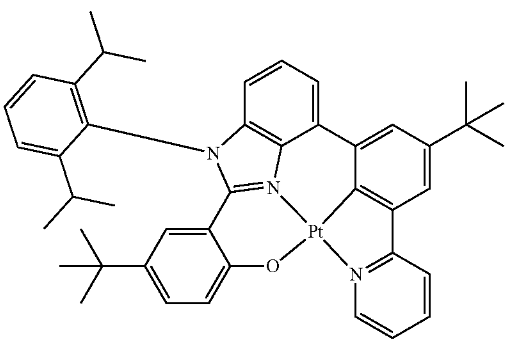
3-104
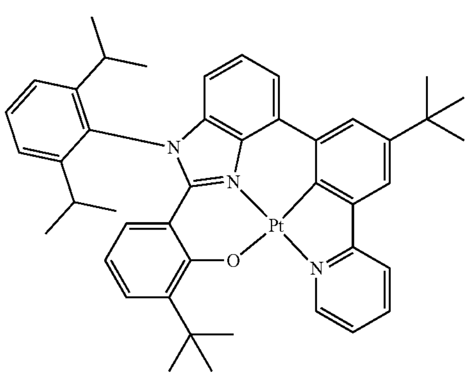
-continued
3-105
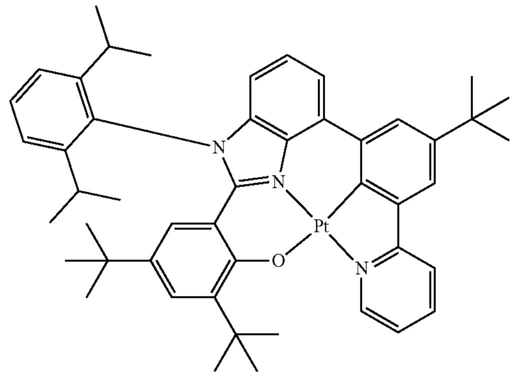
3-106
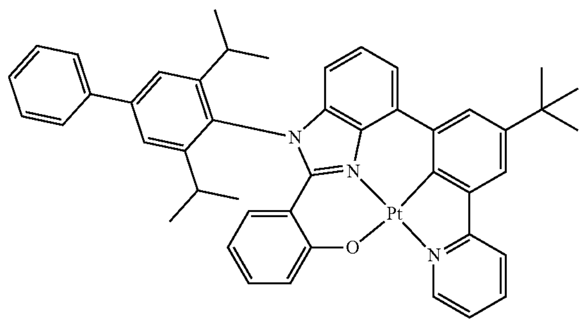
3-107
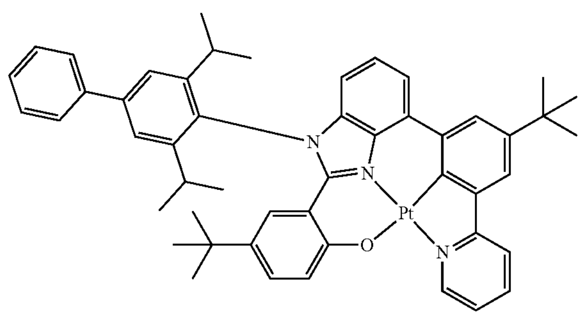
3-108
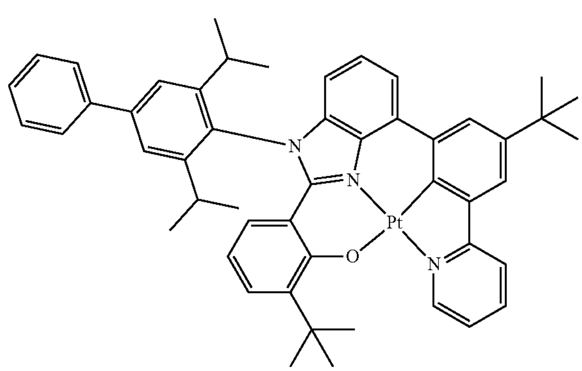

-continued
3-109
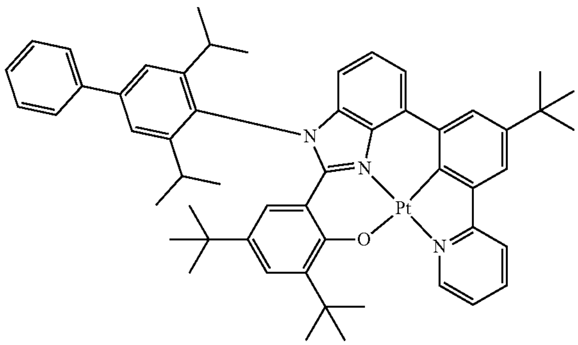
3-110
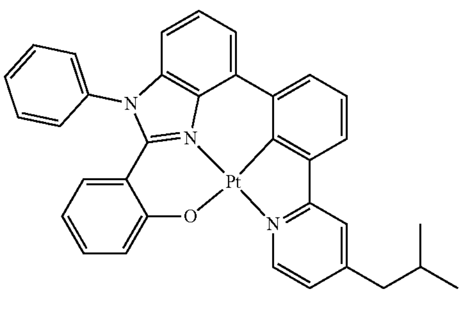
3-111
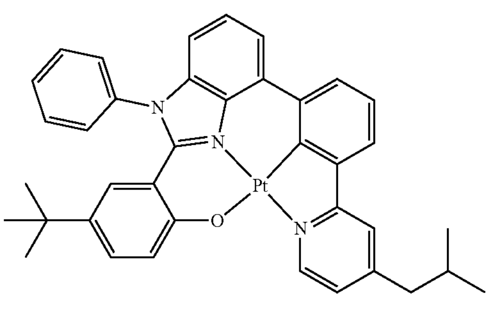
3-112
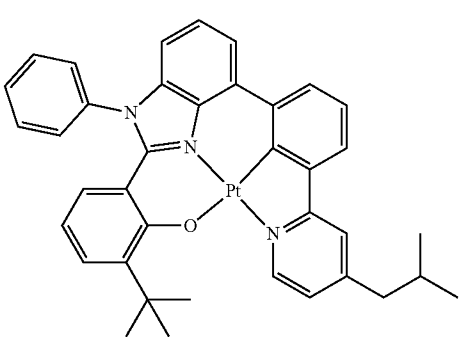
-continued
3-113
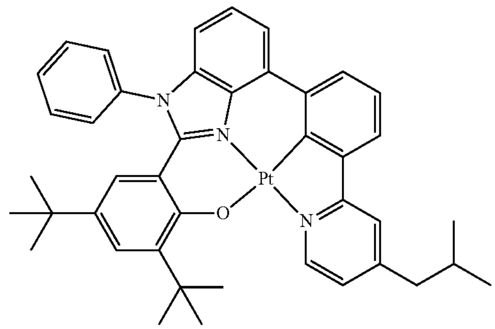
3-114
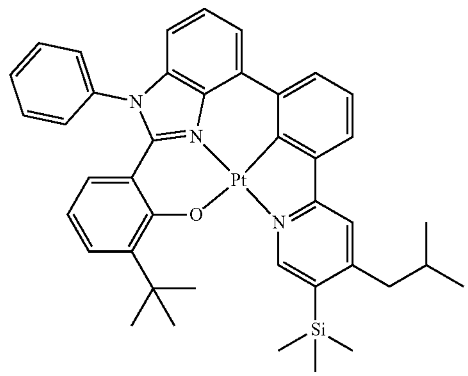
3-115
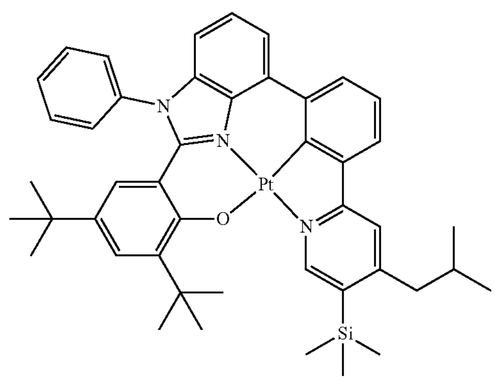
3-116
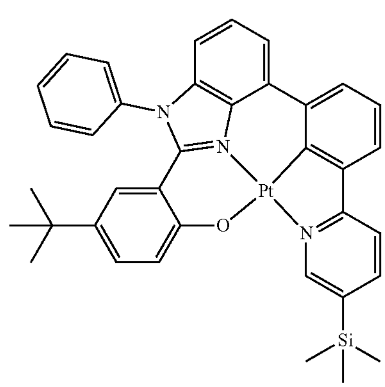

-continued
3-117
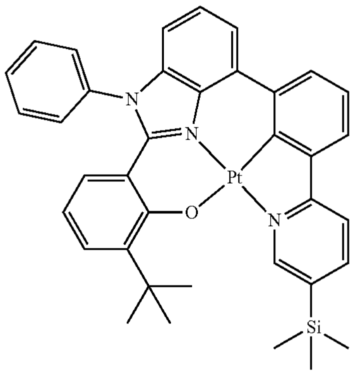
3-118
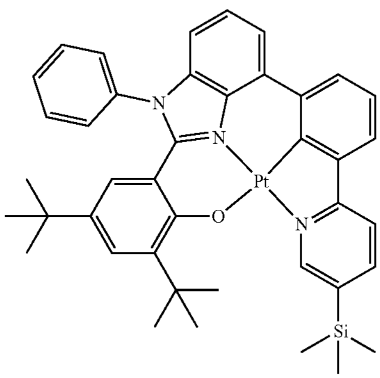
3-119
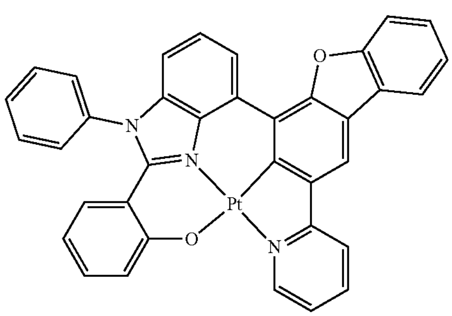
3-120
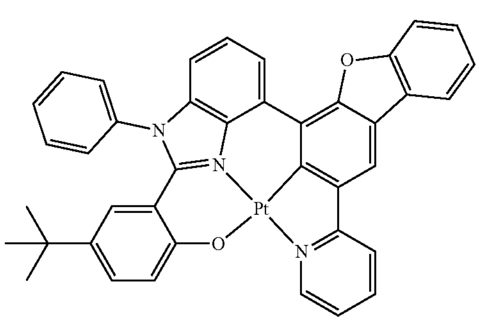
-continued
3-121
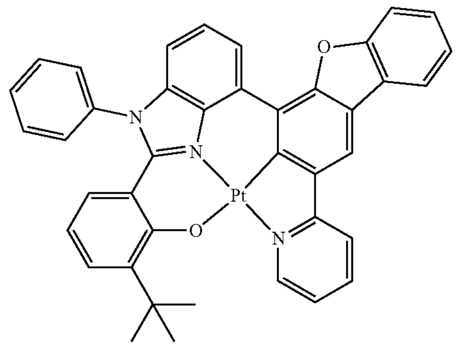
3-122
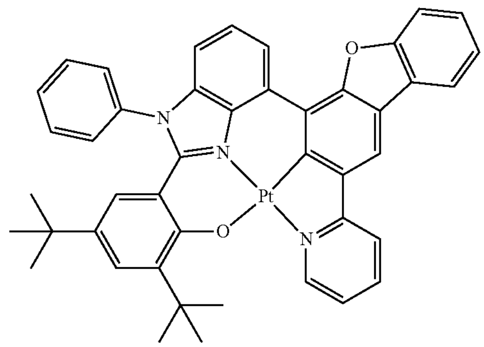
3-123
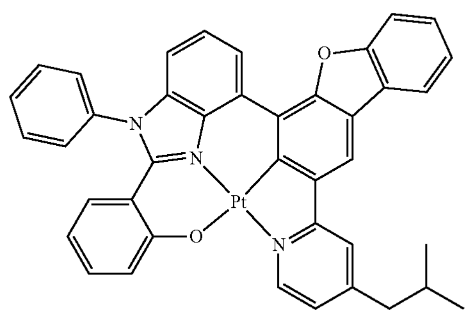
3-124
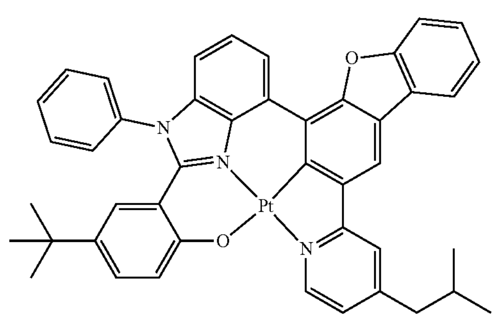

-continued
3-125
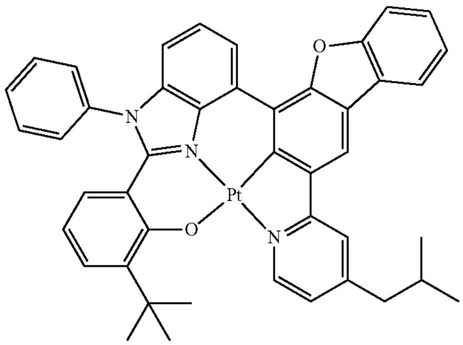
3-126
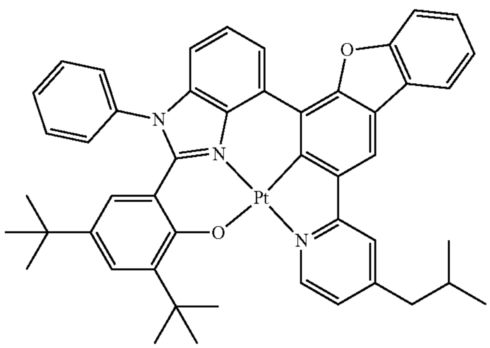
3-127
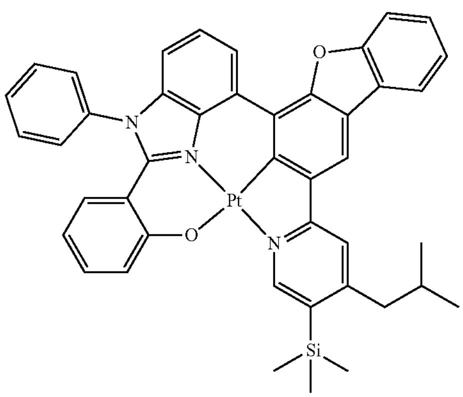
3-128
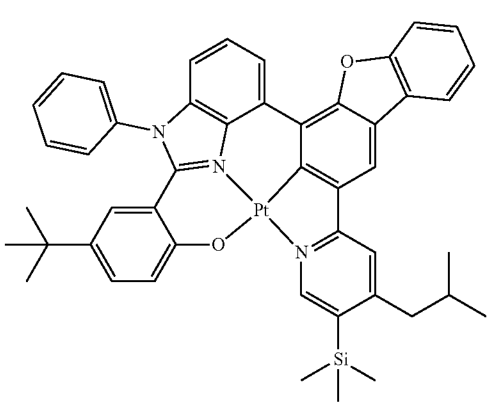
-continued
3-129
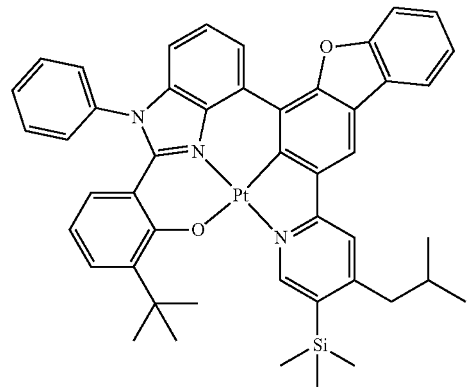
3-130
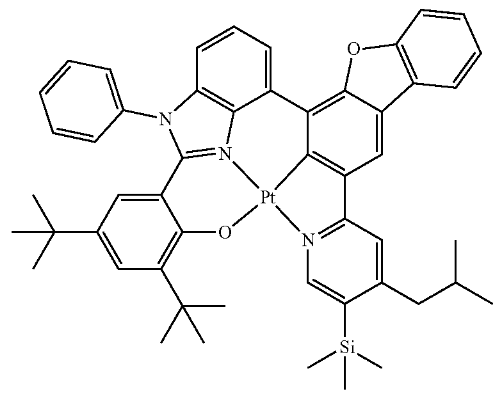
3-131
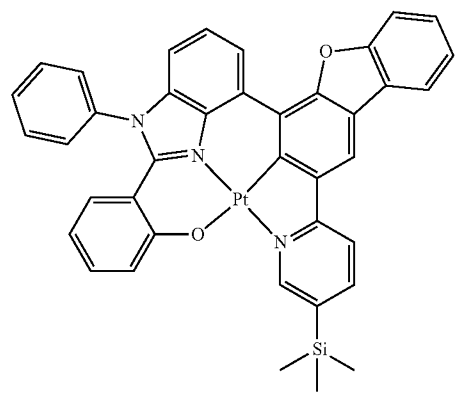
3-132
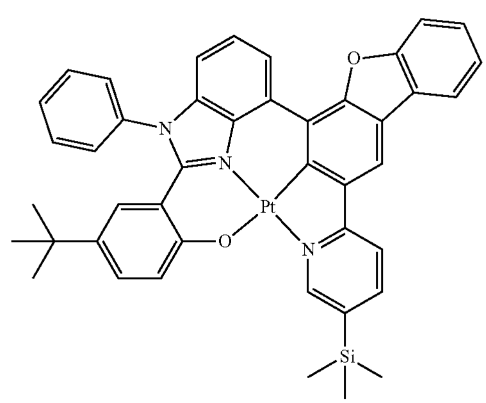

-continued
3-133
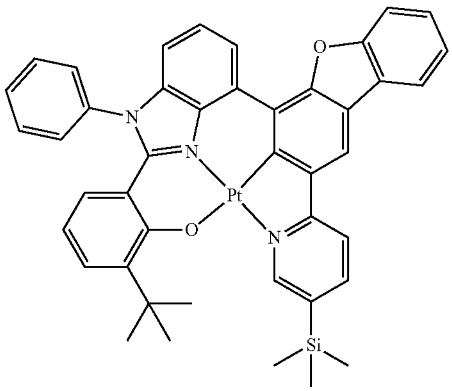
3-134
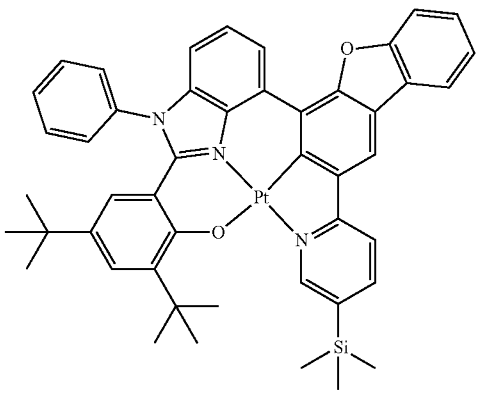
3-135
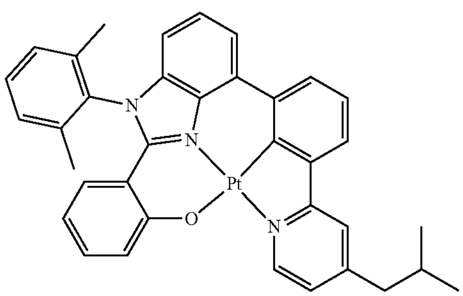
3-136
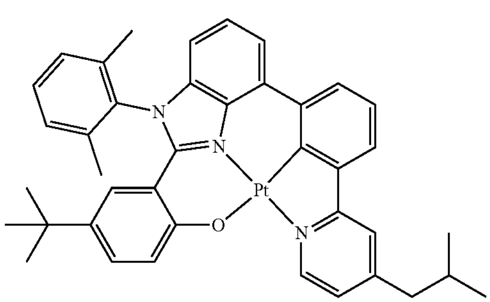
-continued
3-137
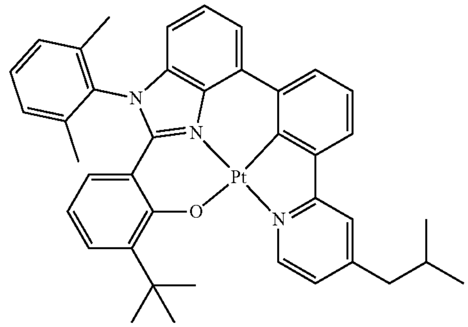
3-138
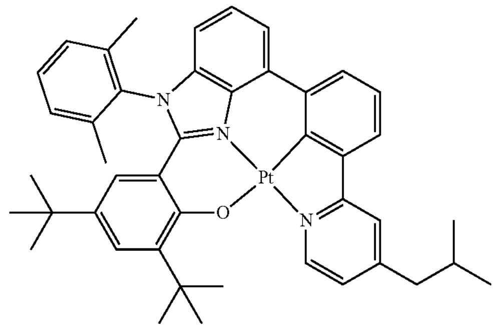
3-139
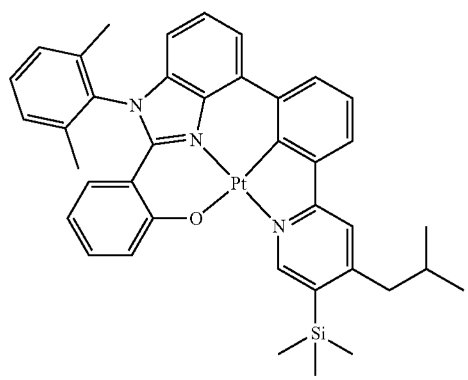
3-140
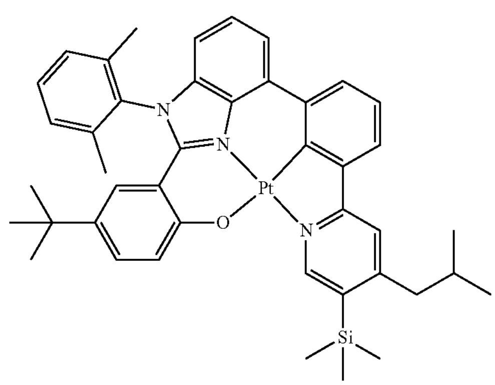

-continued
3-141
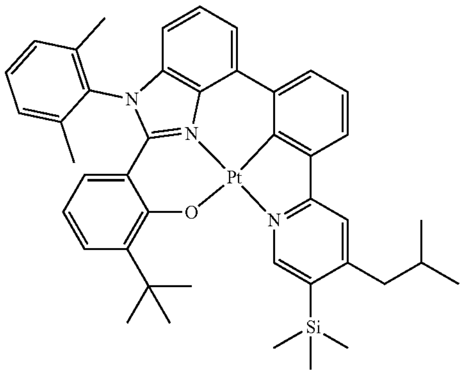
3-142
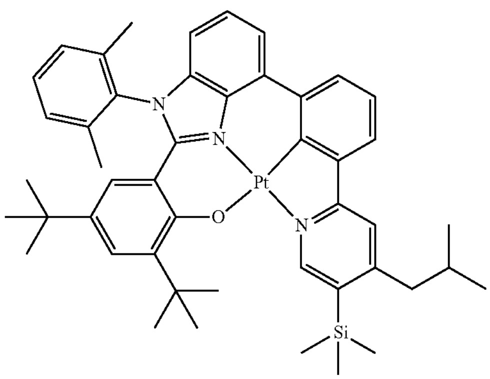
3-143
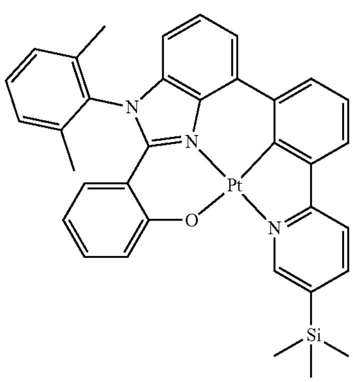
3-144
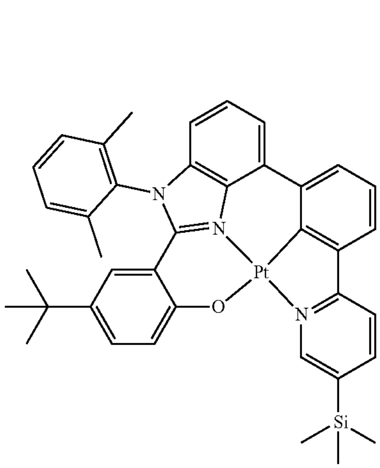
-continued
3-145
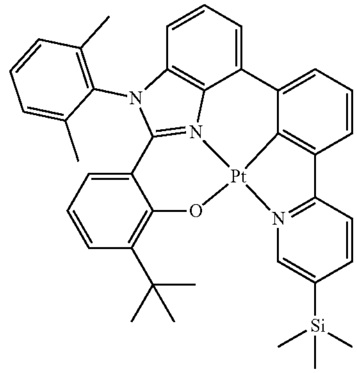
3-146
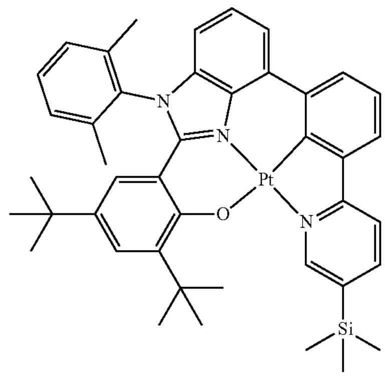
3-147
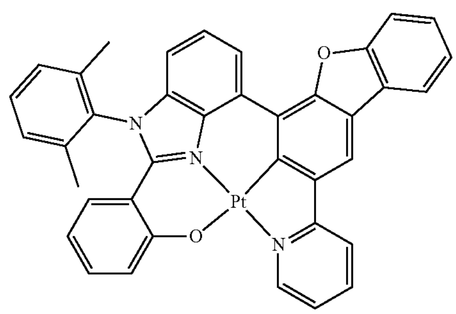
3-148
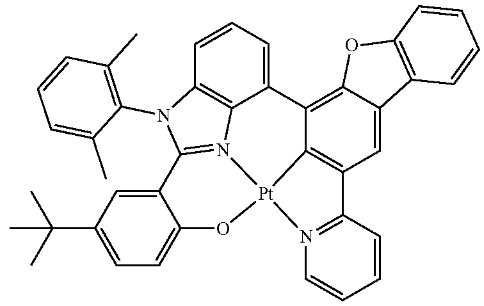

-continued
3-149
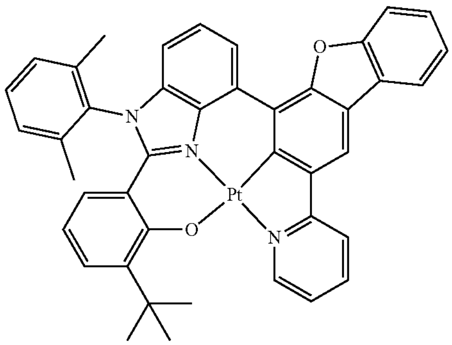
3-150
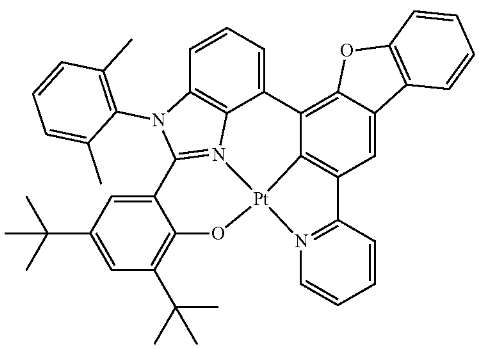
3-151
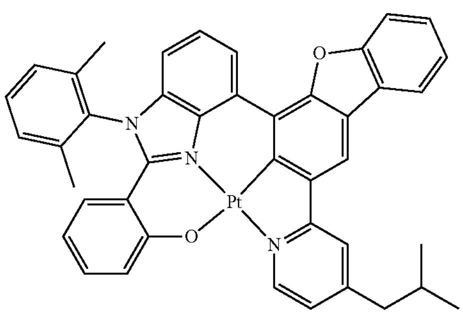
3-152
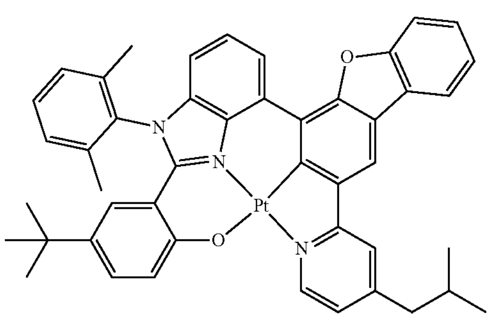
-continued
3-153
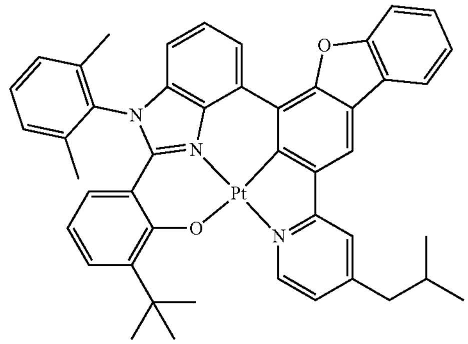
3-154
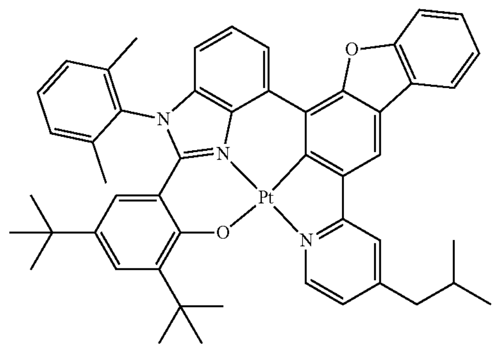
3-155
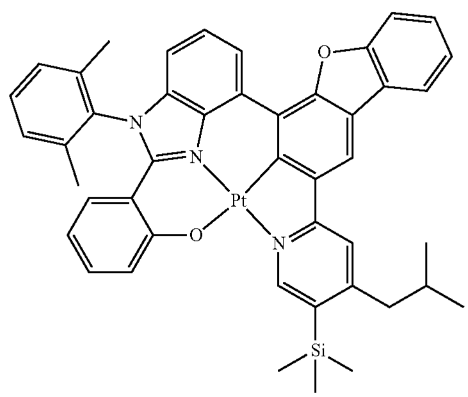
3-156
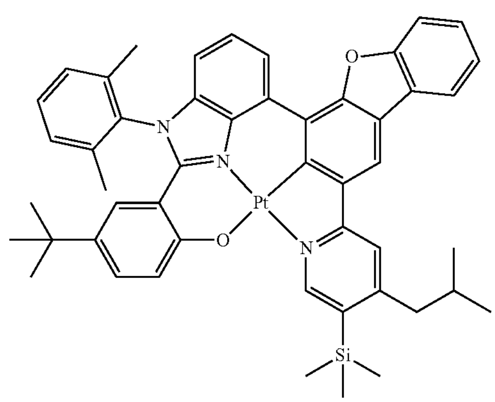

-continued
3-157
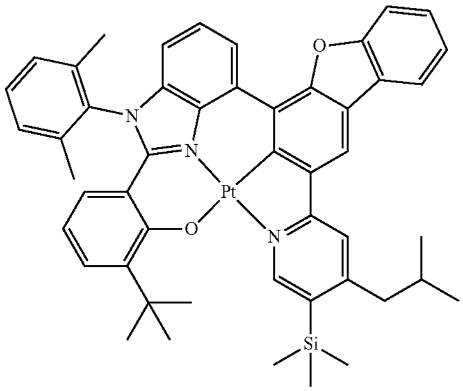
3-158
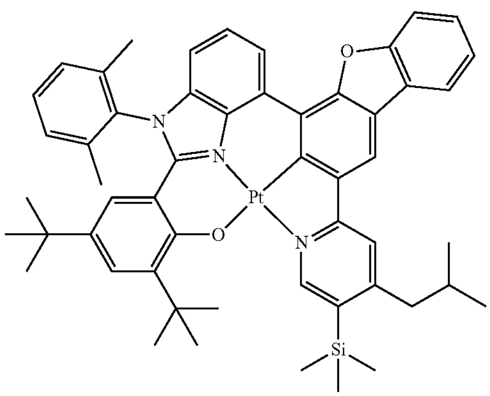
3-159
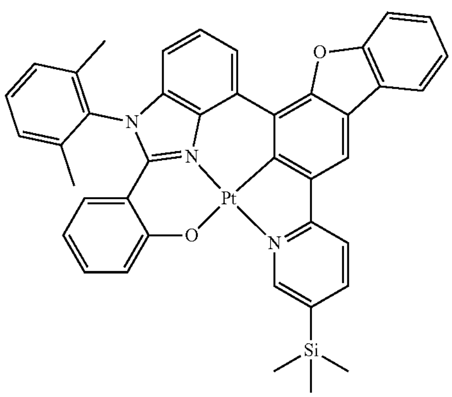
3-160
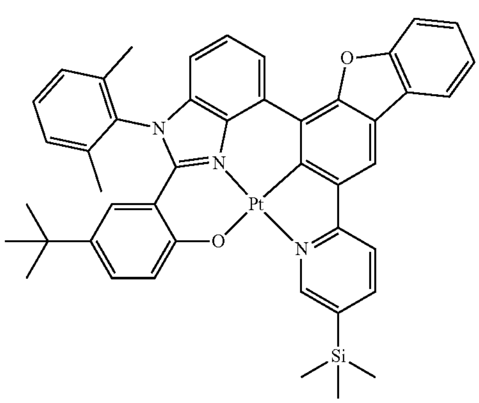
-continued
3-161
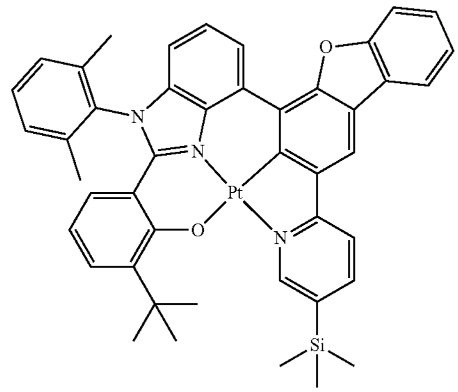
3-162
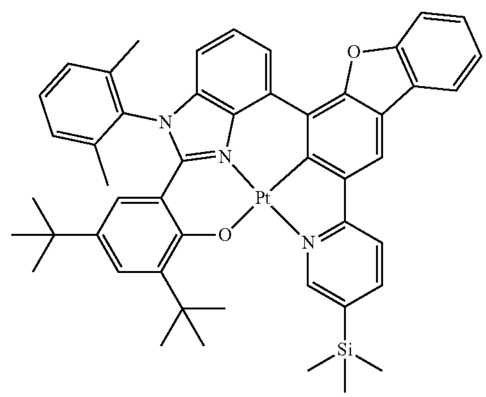
3-163
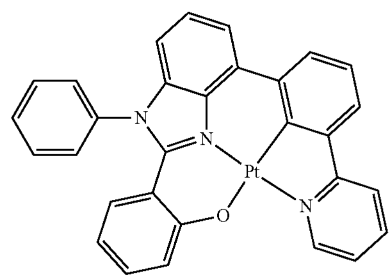
3-164
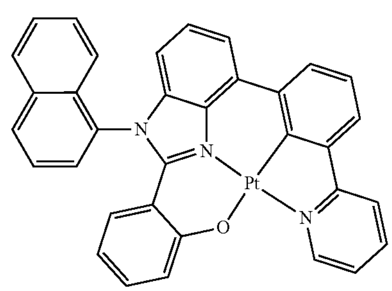

3-165
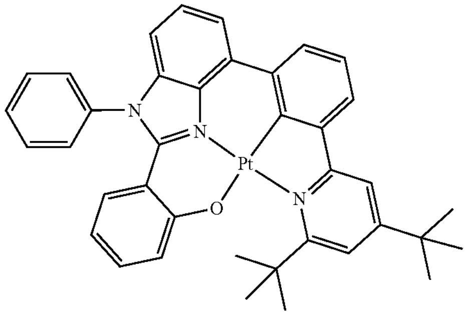
3-166
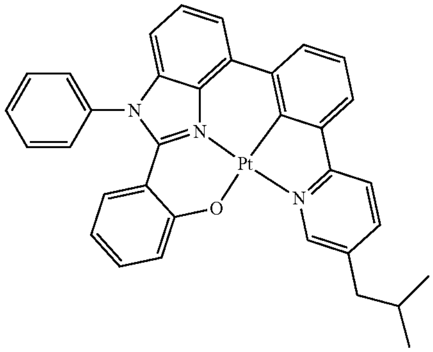
3-167
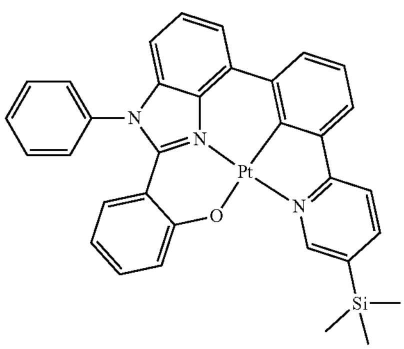
3-168
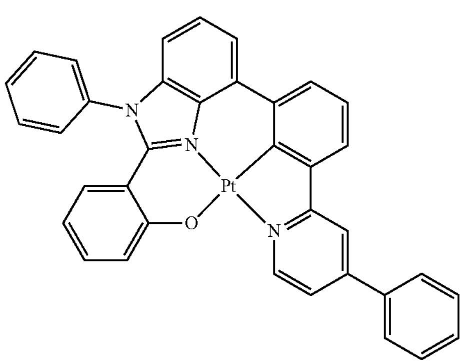
3-169
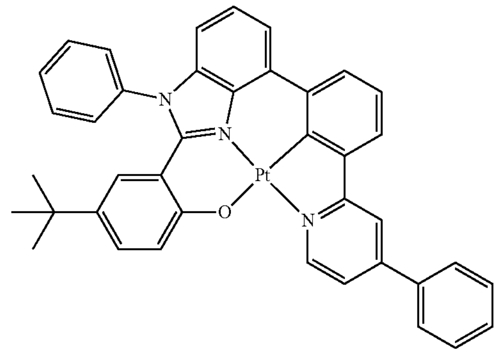
3-170
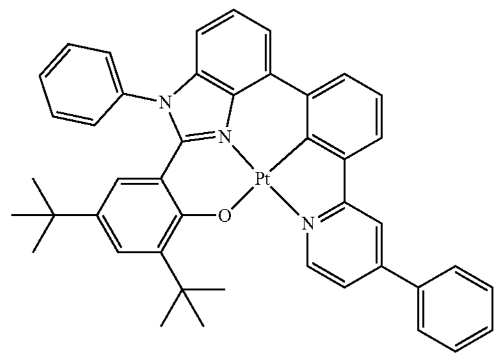
3-171
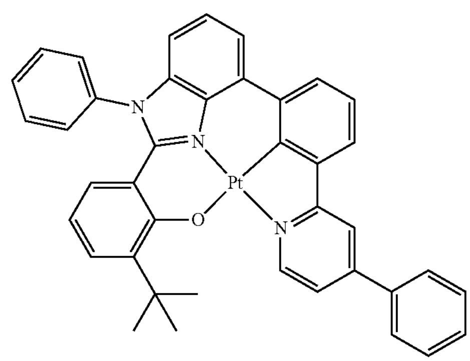
3-172
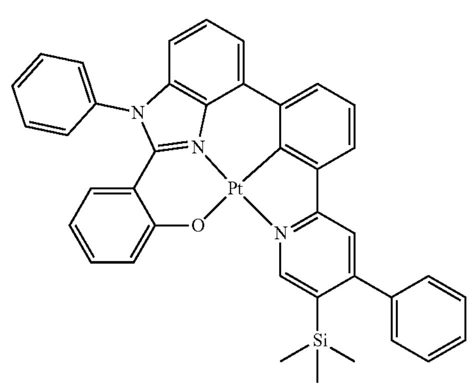

-continued
3-173
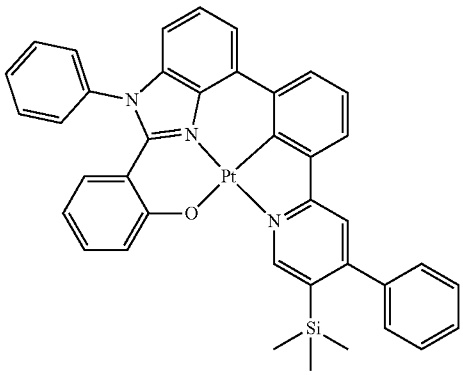
3-174
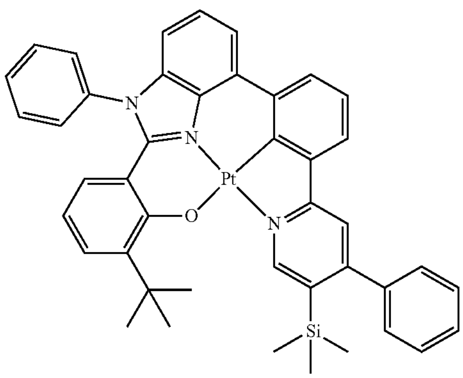
3-175
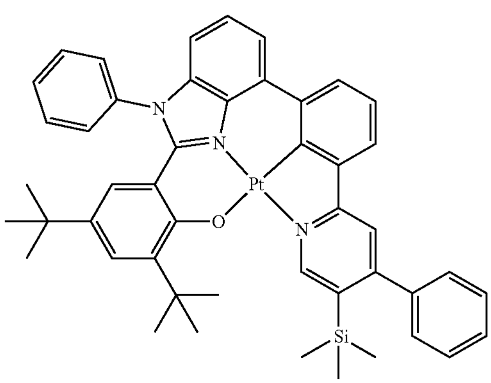
3-176
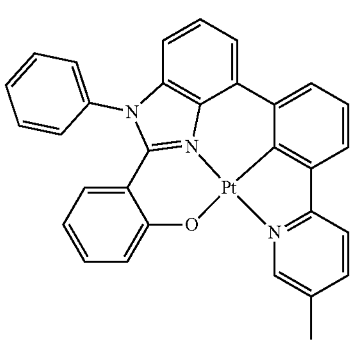
-continued
3-177
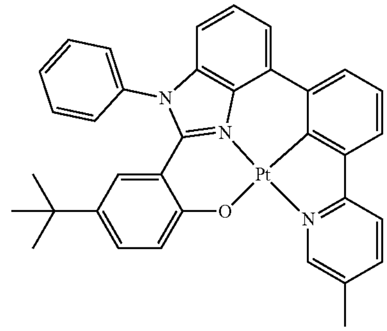
3-178
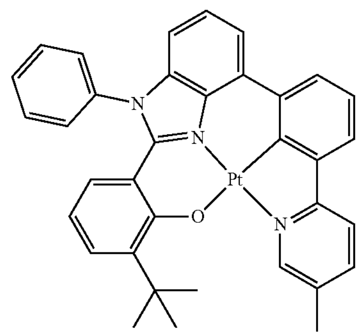
3-179
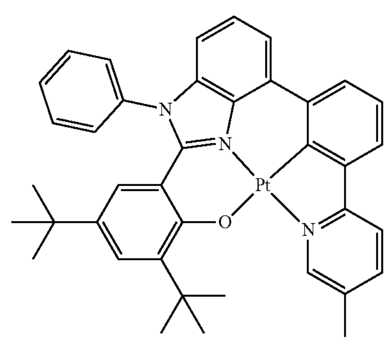
3-180
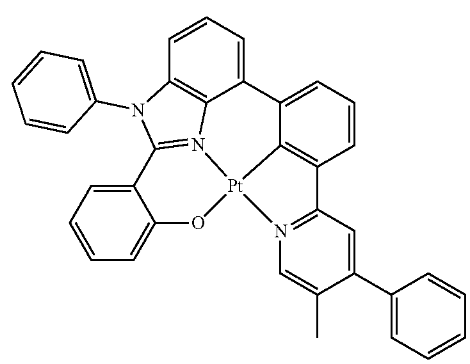

-continued
3-181
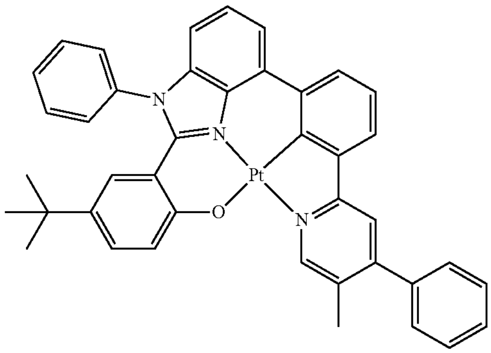
3-182
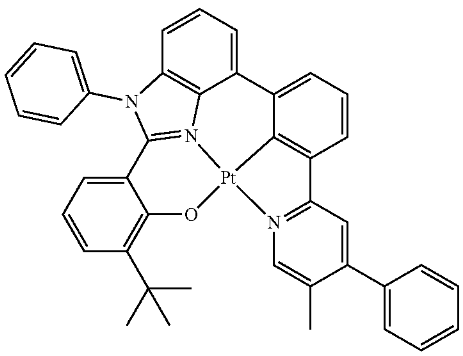
3-183
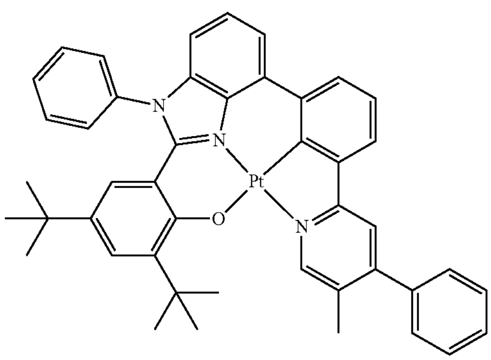
3-184
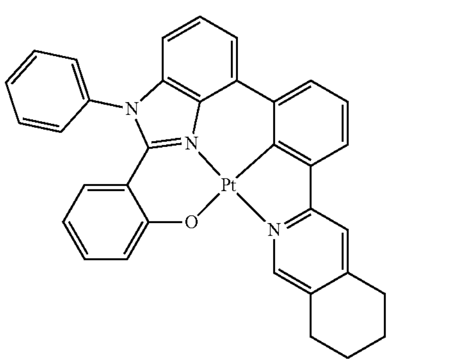
-continued
3-185
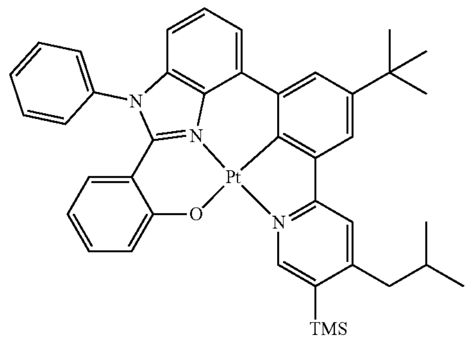
3-186
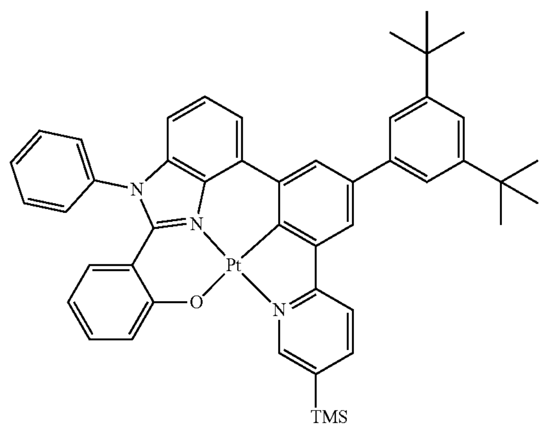
3-187
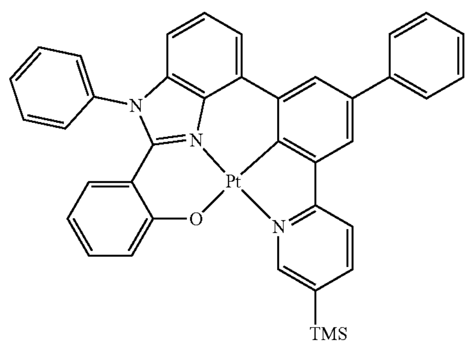
3-188
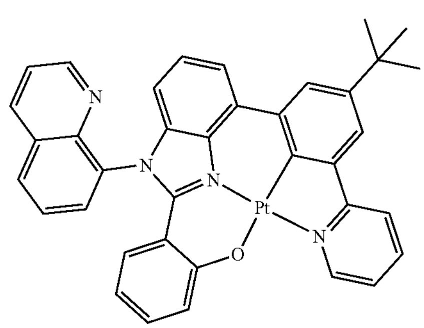

-continued
3-189
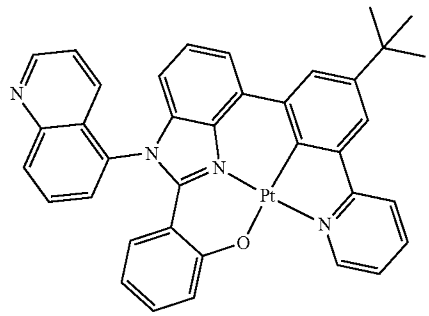
3-190
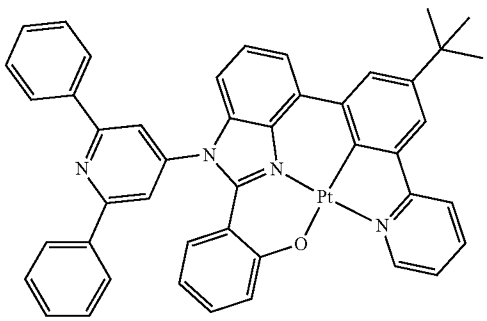
3-191
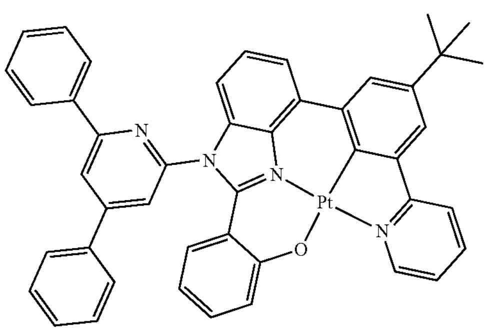
3-192
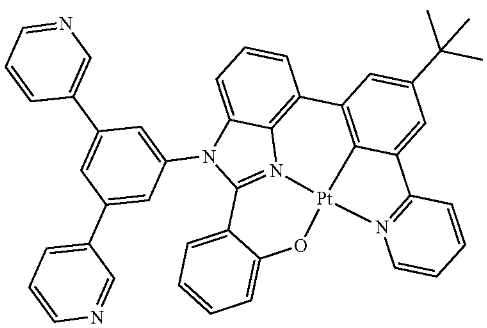
-continued
3-193
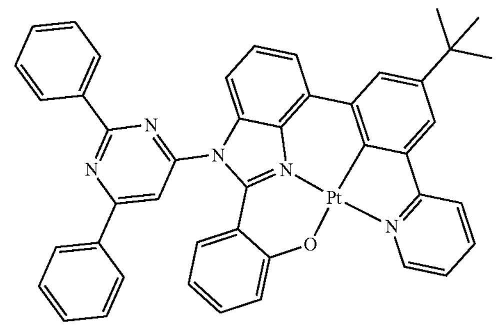
3-194
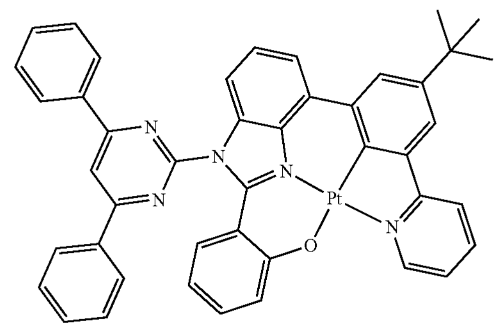
3-195
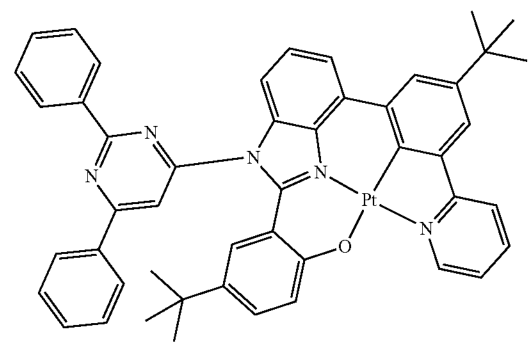
3-196
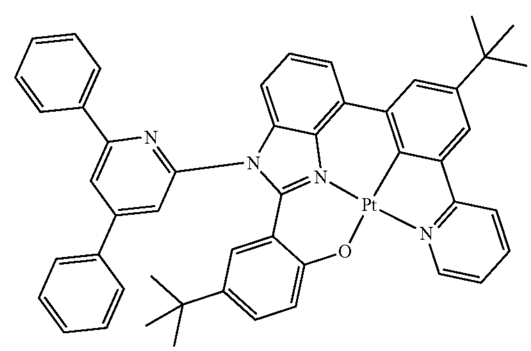

3-197
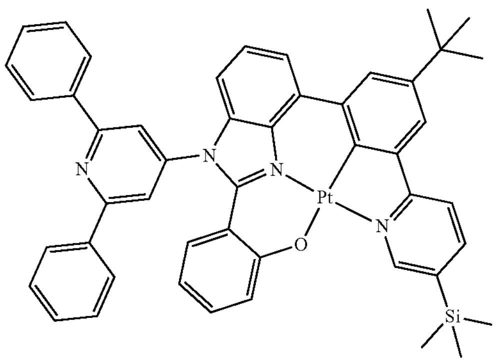
3-198
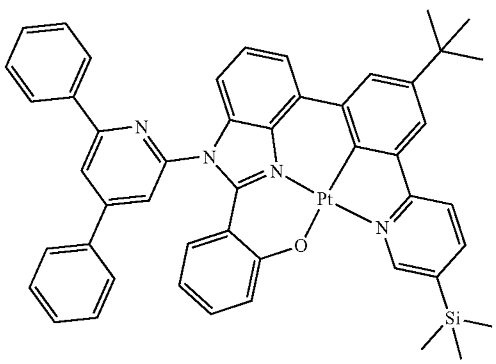
3-199
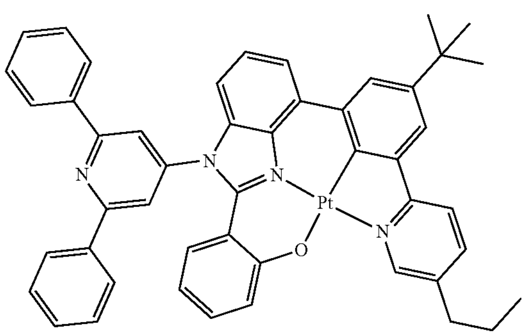
3-200
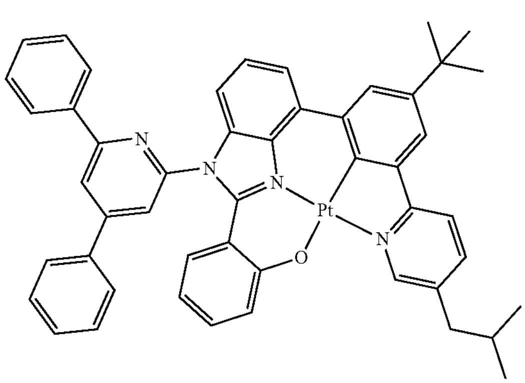
3-201
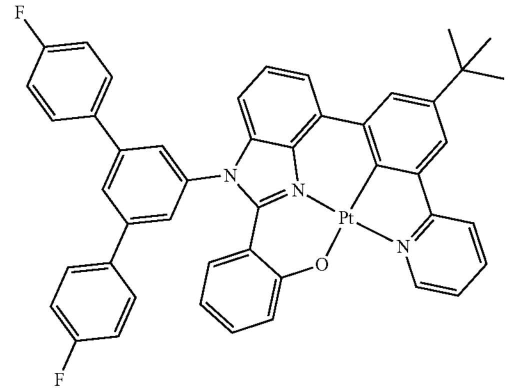
3-202
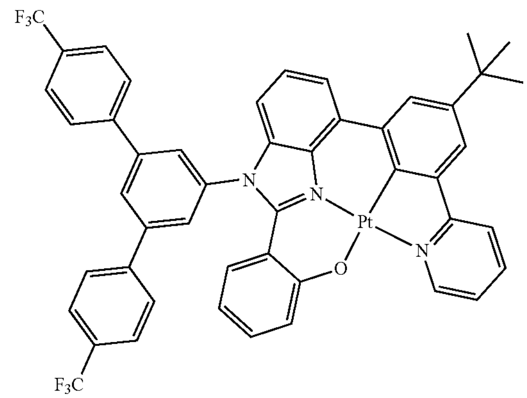
3-203
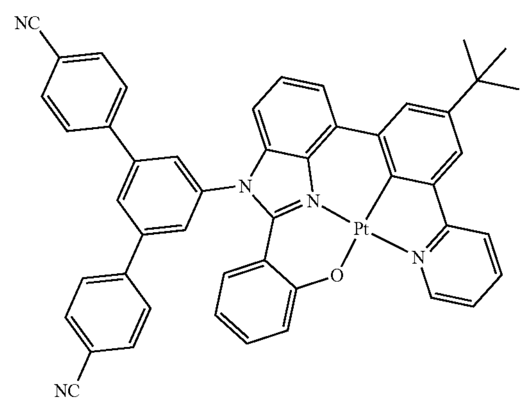
3-204
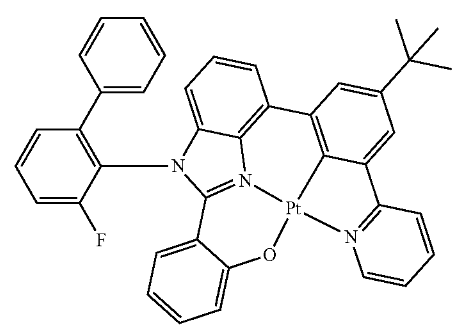

3-205
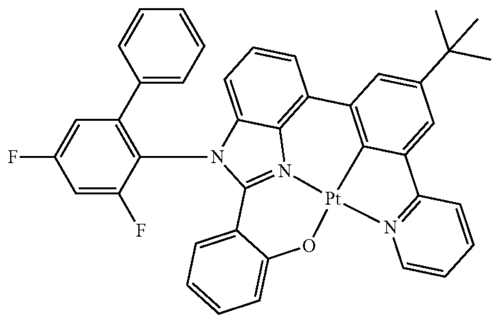
3-206
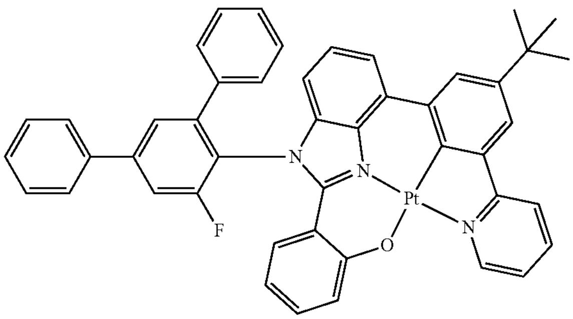
3-207
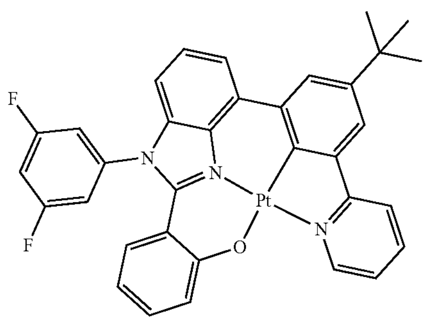
3-208
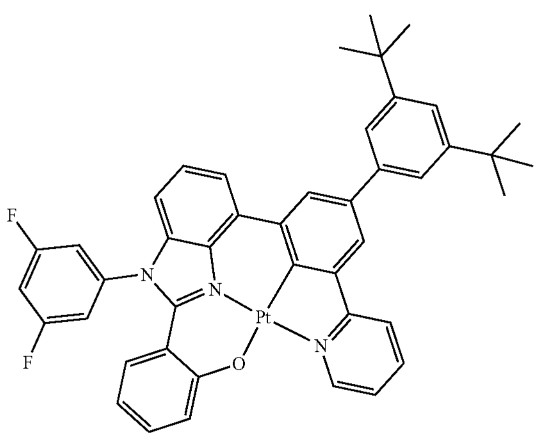
3-209
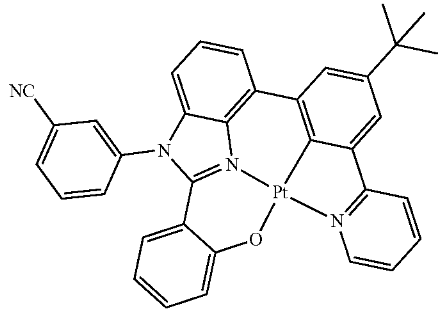
3-210
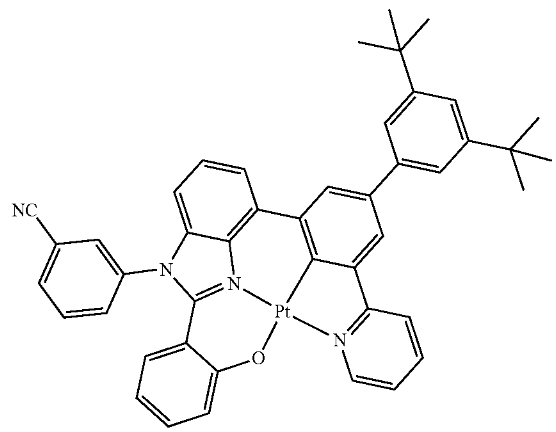
3-211
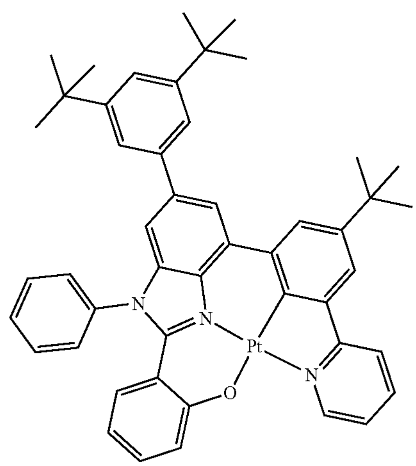
3-212
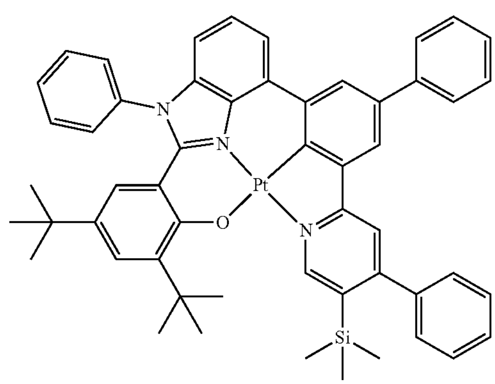

-continued
3-213
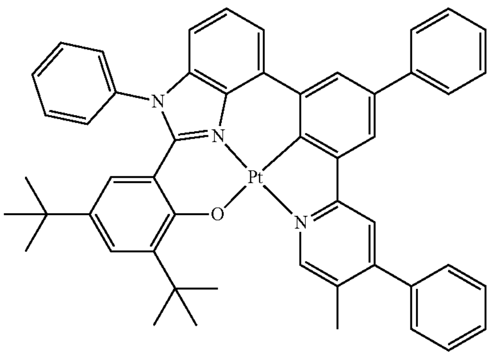
3-214
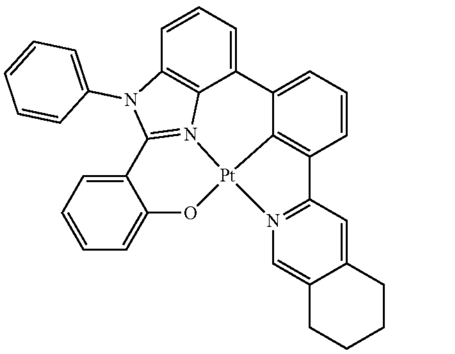
3-215
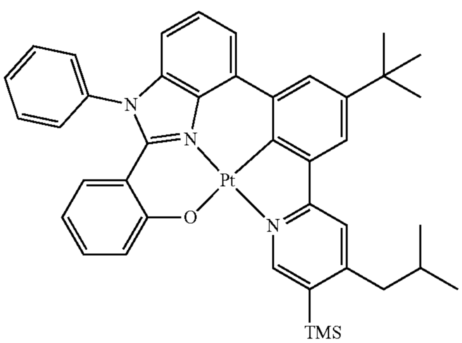
3-216
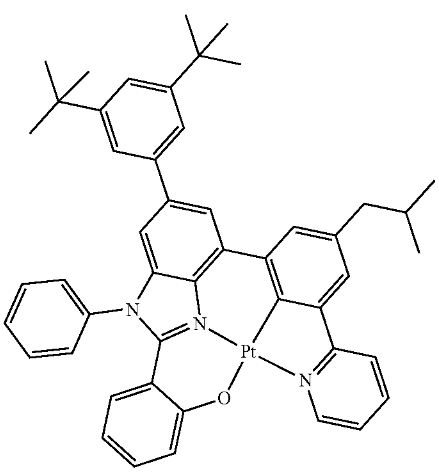
-continued
3-217
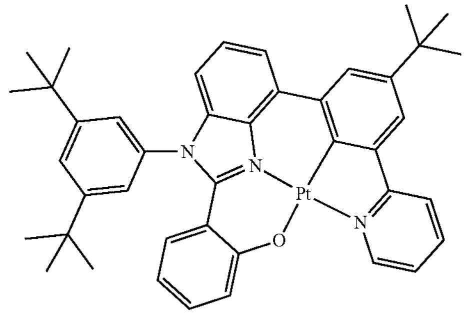
3-218
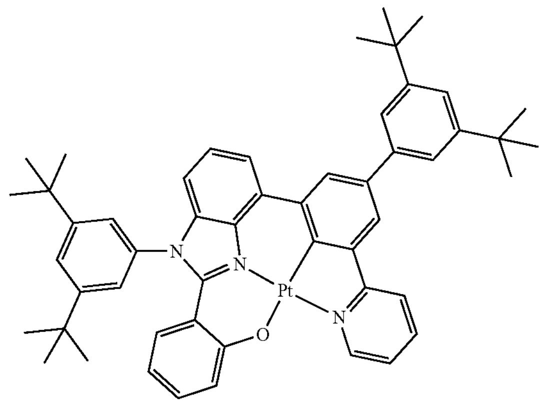
3-219
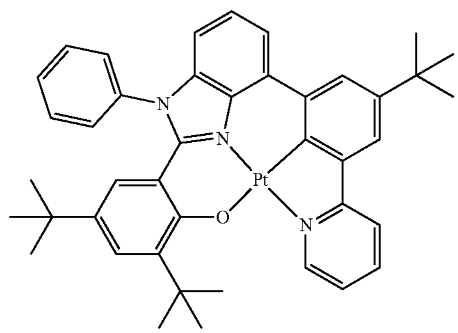
3-220
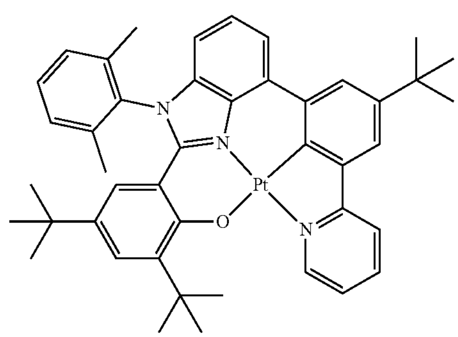

-continued
3-221
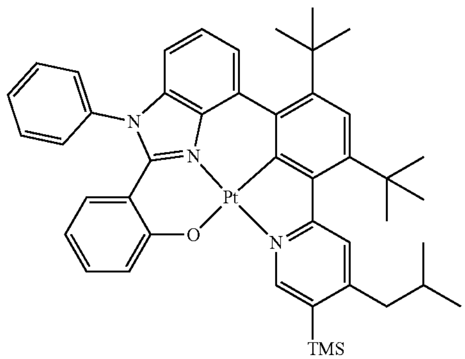
3-222
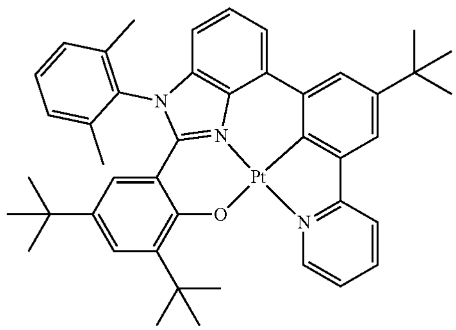
3-223
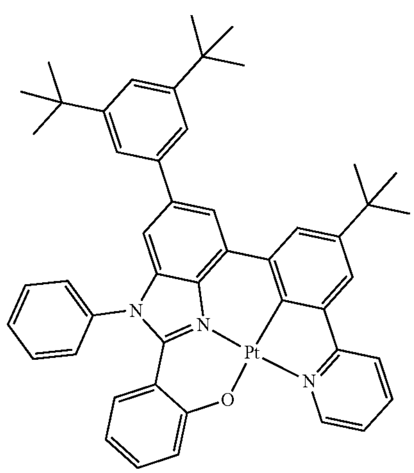
3-224
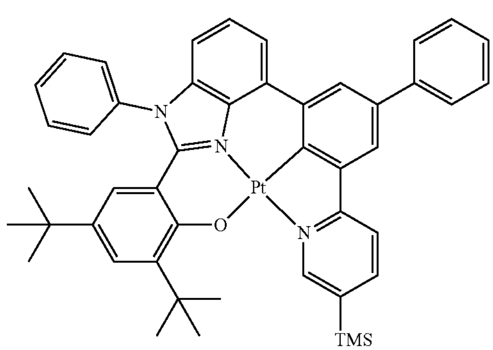
-continued
3-225
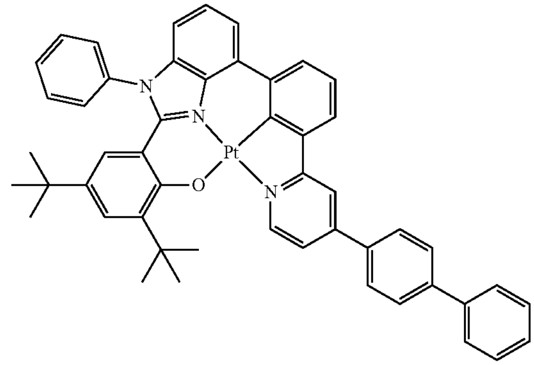
3-226
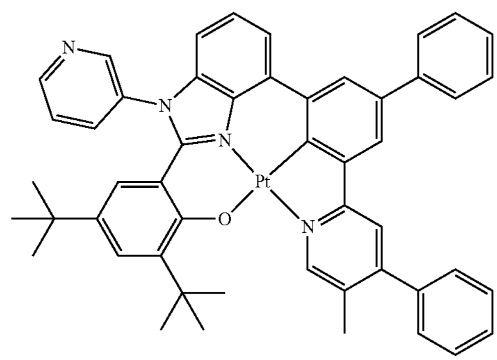
3-227
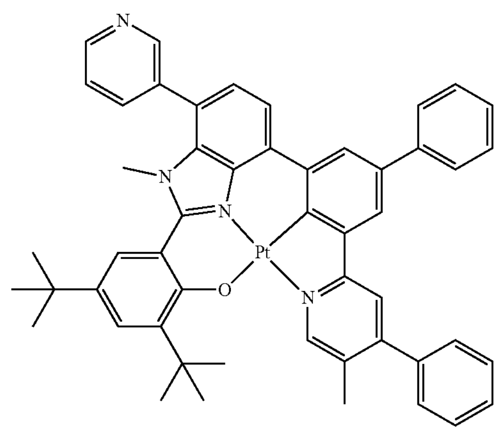
3-228
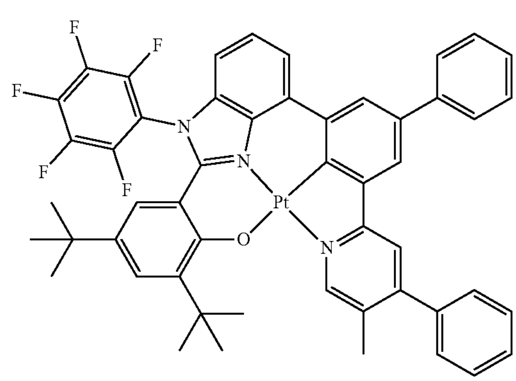

-continued
3-229
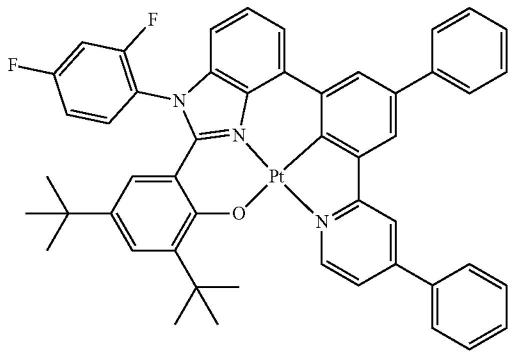
3-230
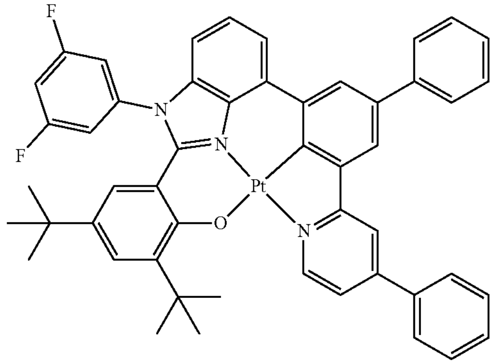
3-231
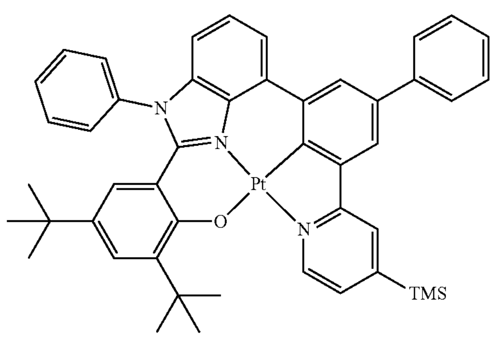
3-232
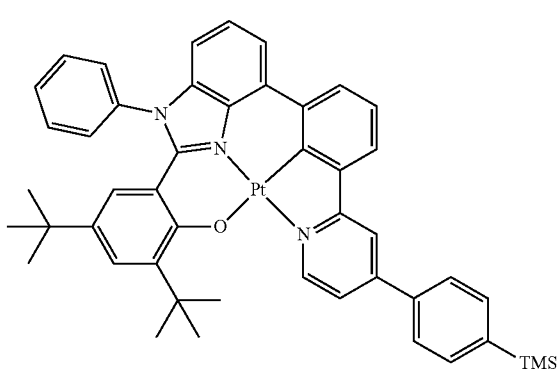
-continued
3-233
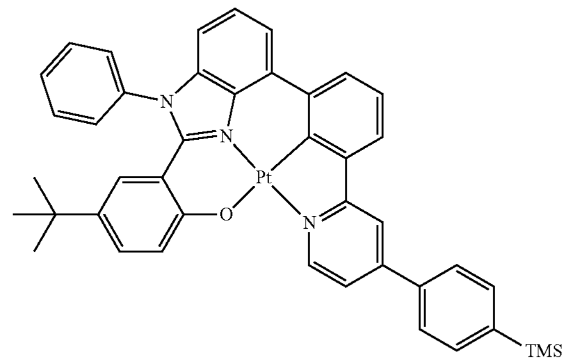
3-234
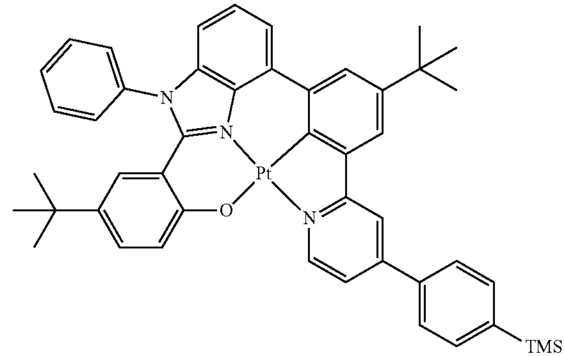
3-235
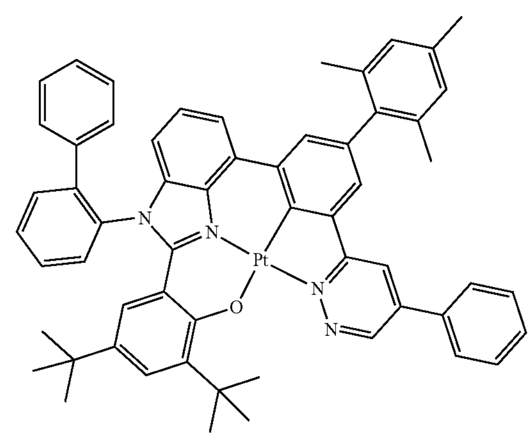
3-236
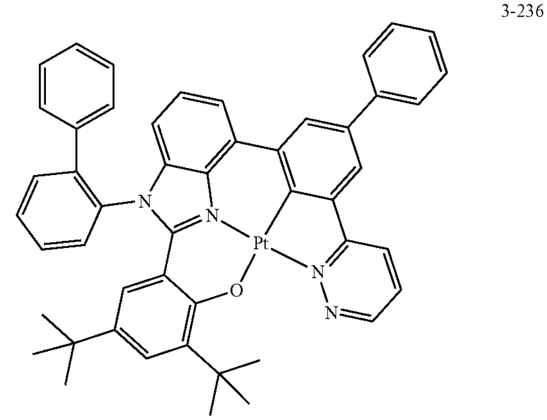

3-237
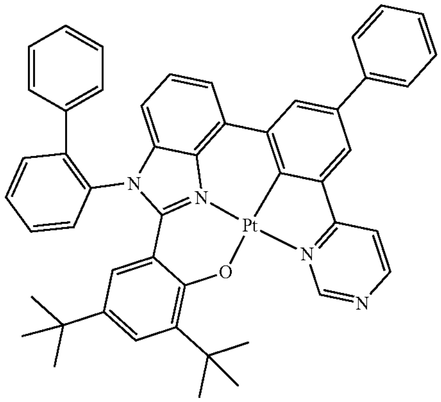
3-238
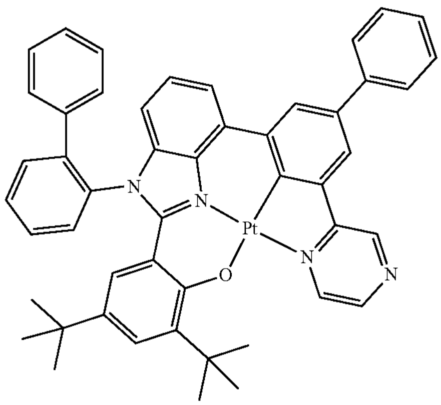
3-239
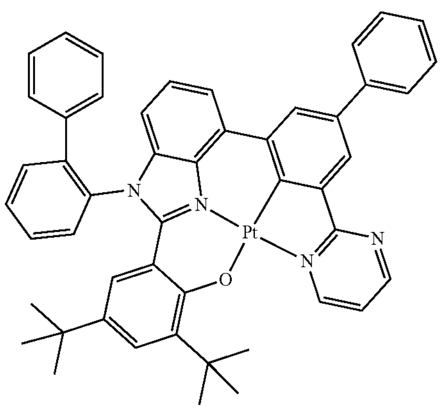
3-240
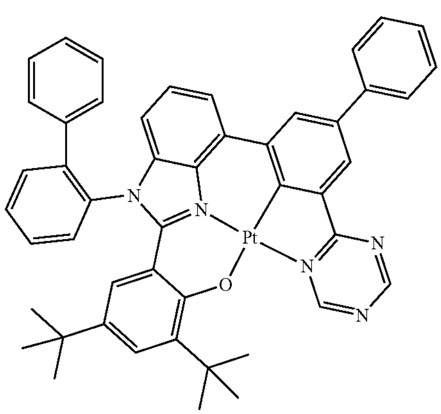
3-241
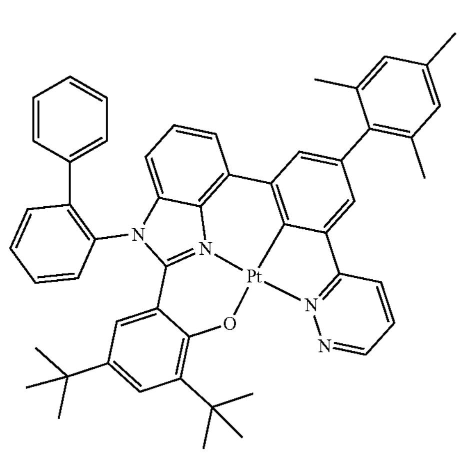
3-242
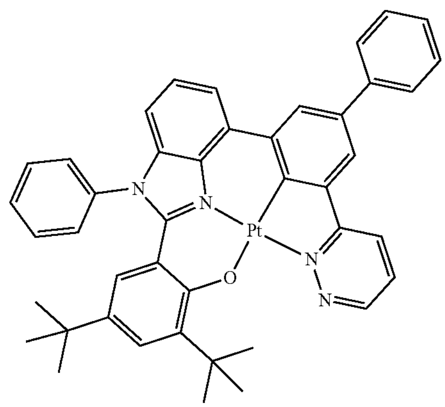
3-243
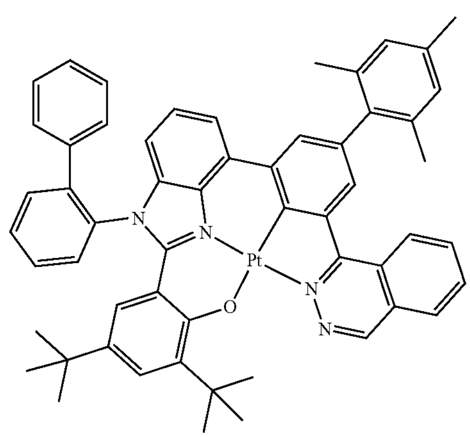

-continued
3-244
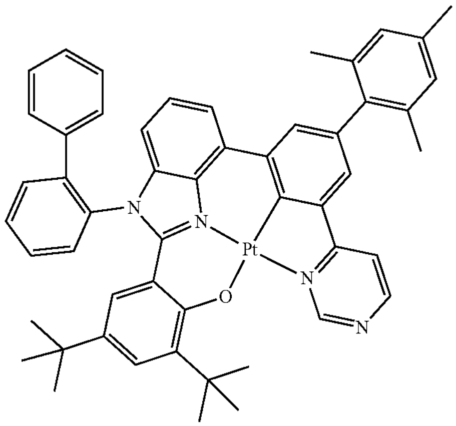
3-245
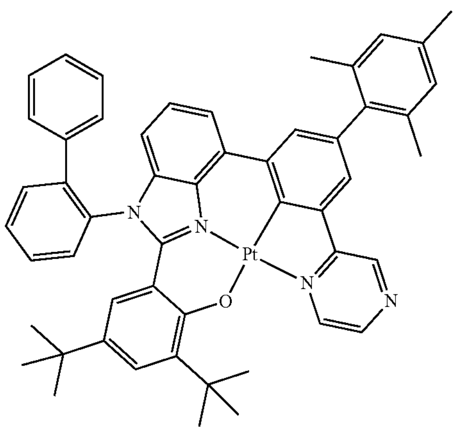
3-246
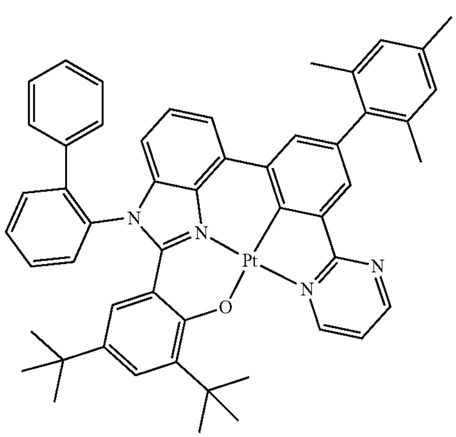
-continued
3-247
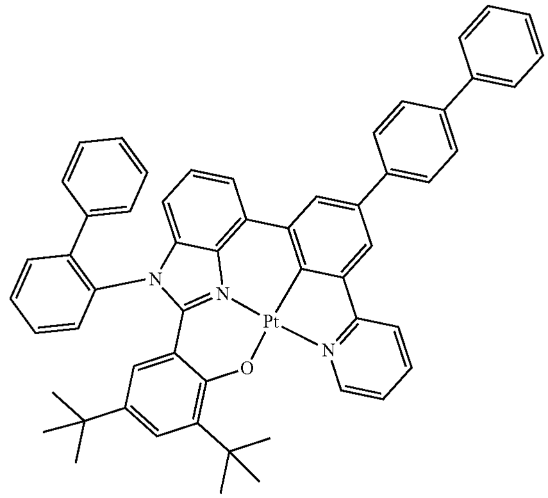
3-248
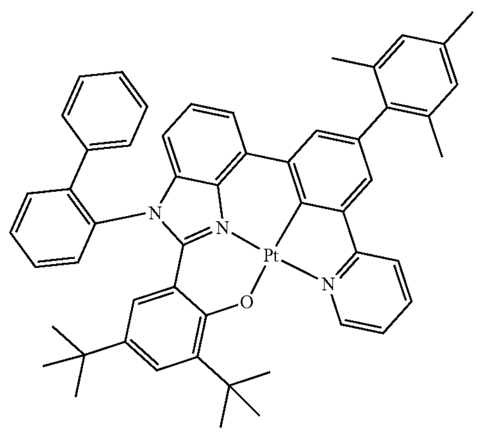
3-249
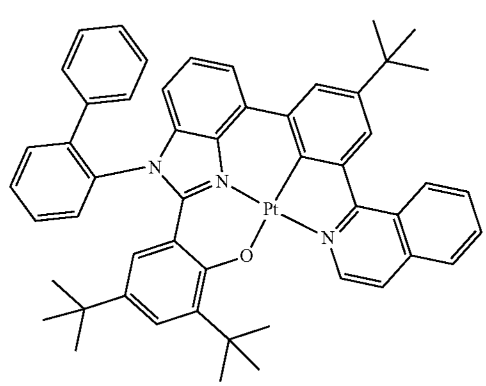

-continued
3-250
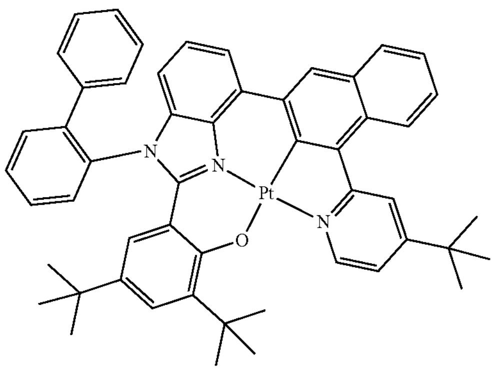
3-251
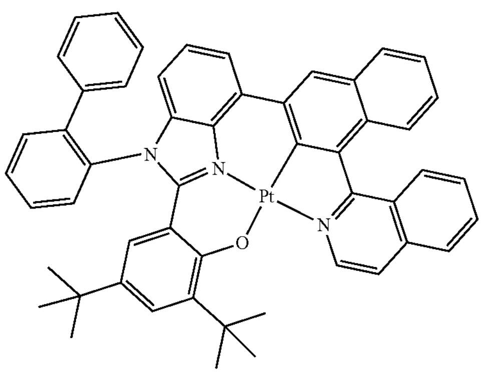
3-252
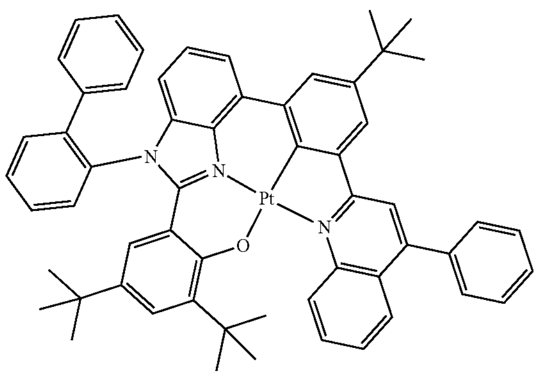
3-253
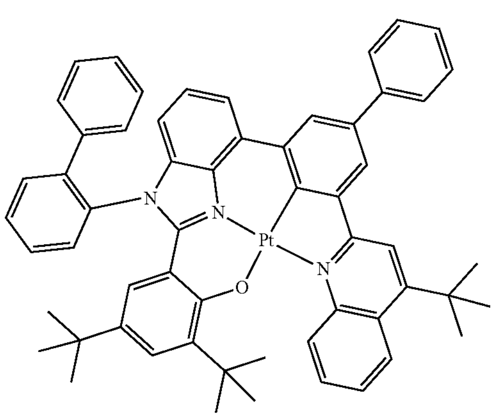
-continued
3-254
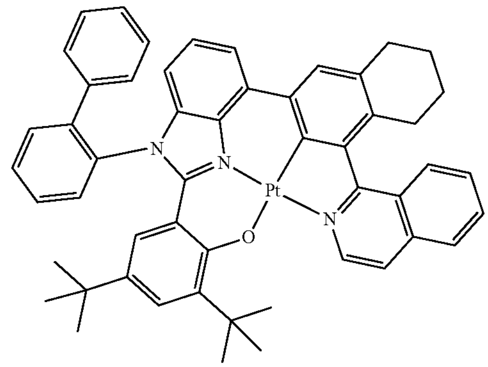
3-255
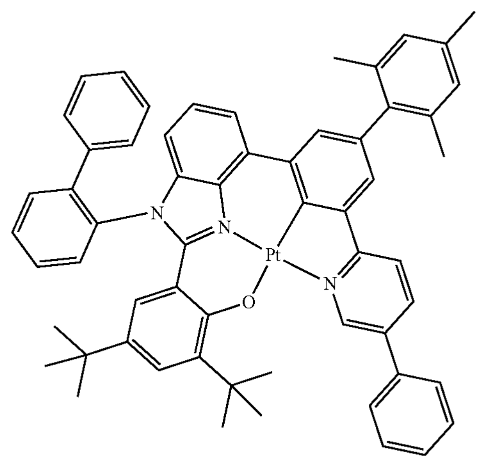
3-256
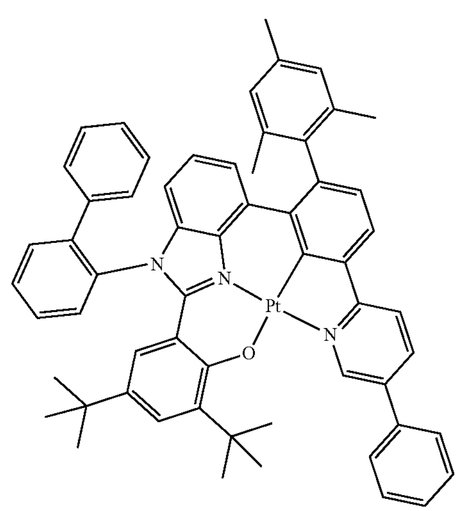

3-257
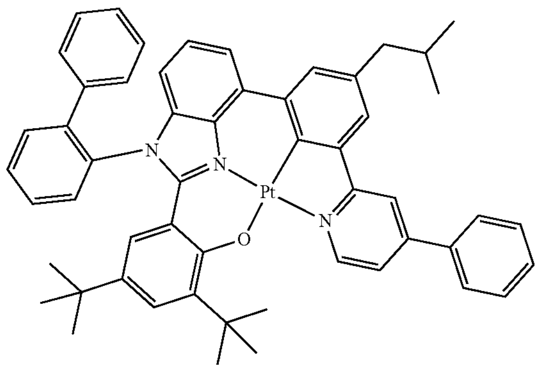
3-258
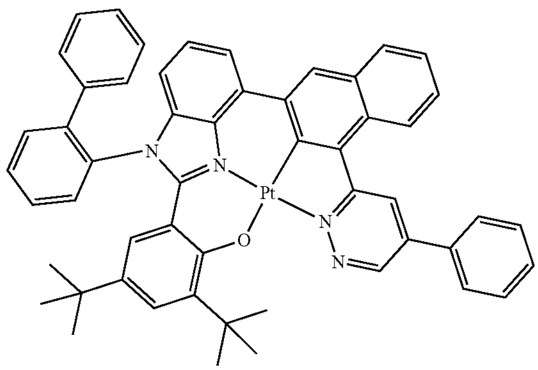
3-259
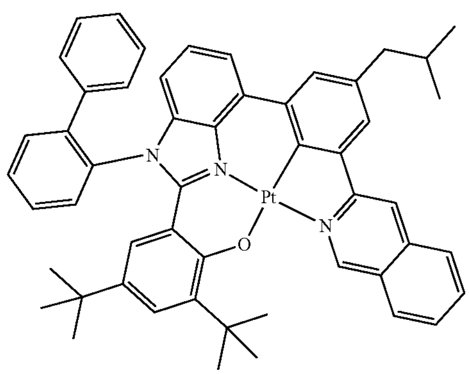
3-260
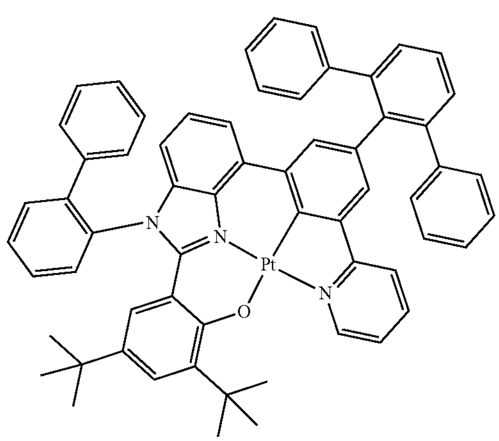
3-261
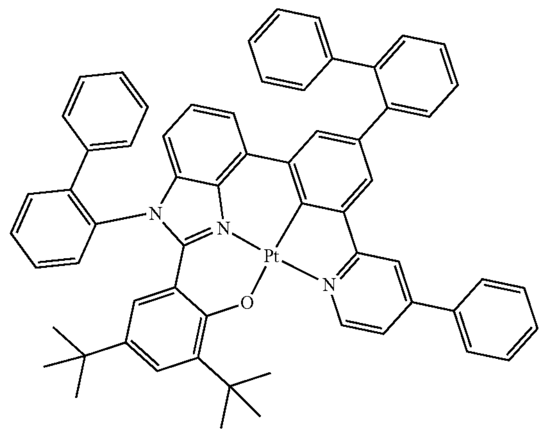
3-262
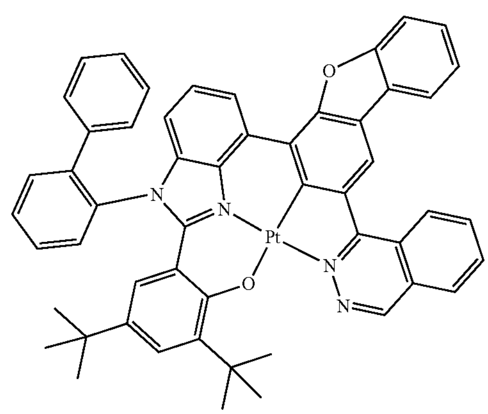
3-263
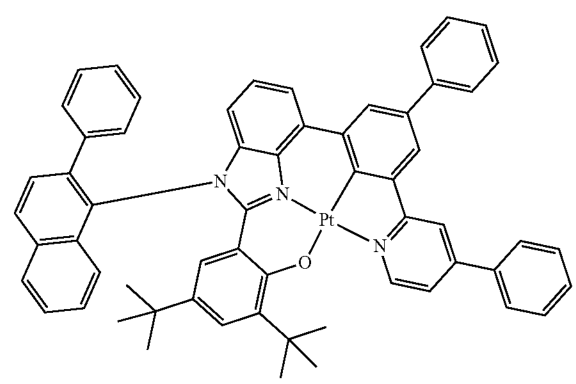

-continued
3-264
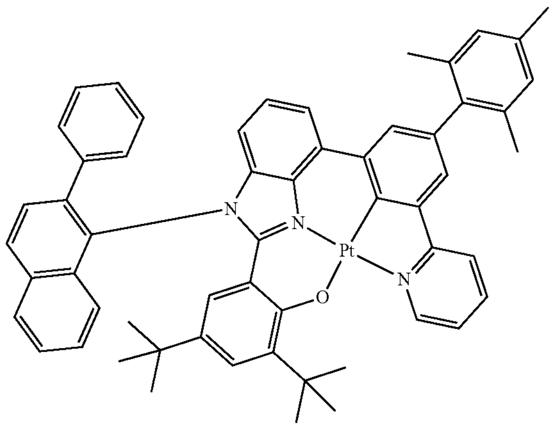
3-265
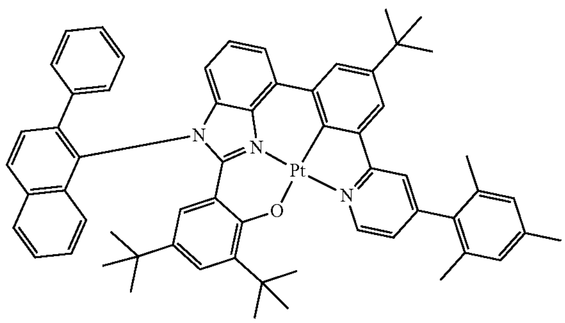
3-266
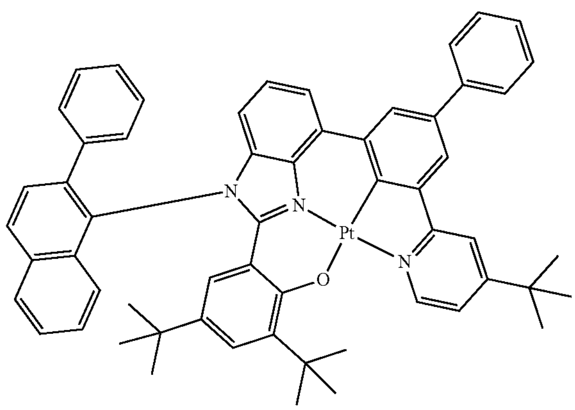
3-267
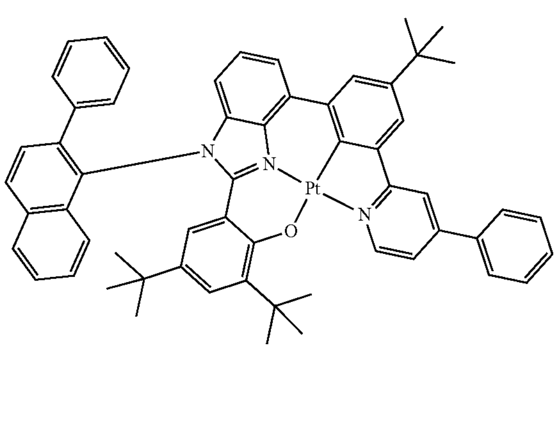
-continued
3-268
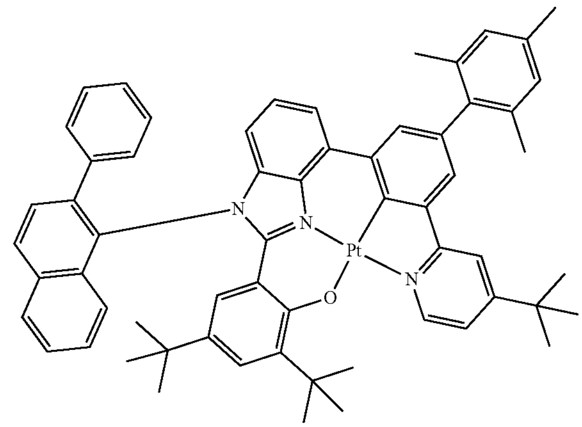
3-269
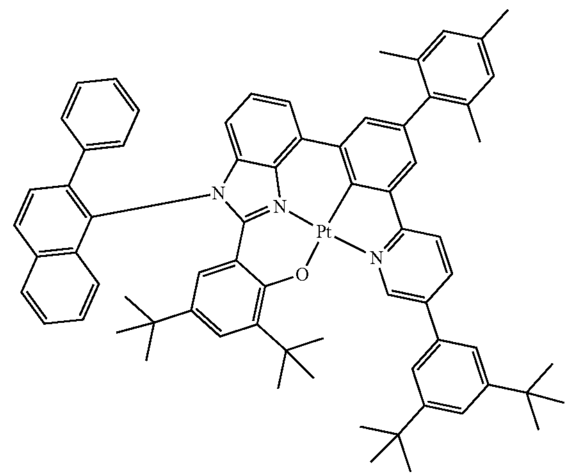
3-270
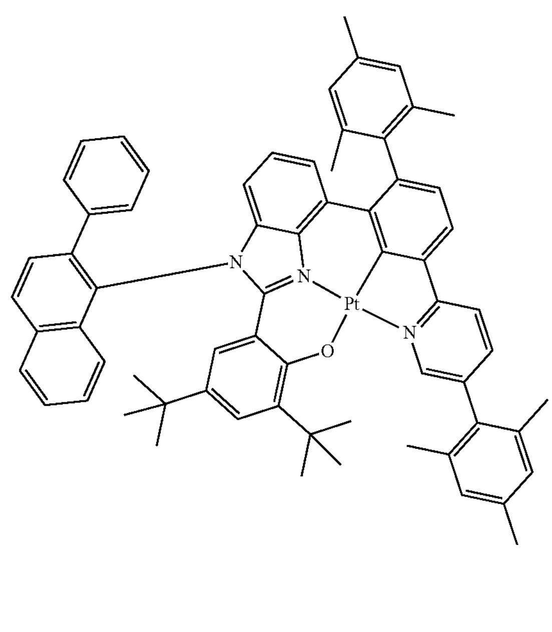

-continued
3-271
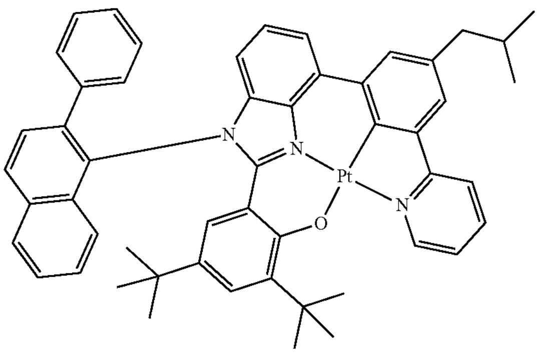
3-272
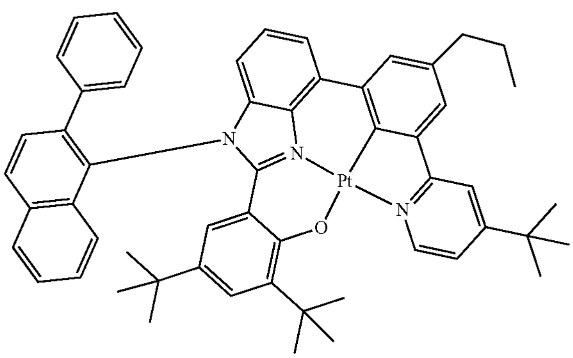
3-273
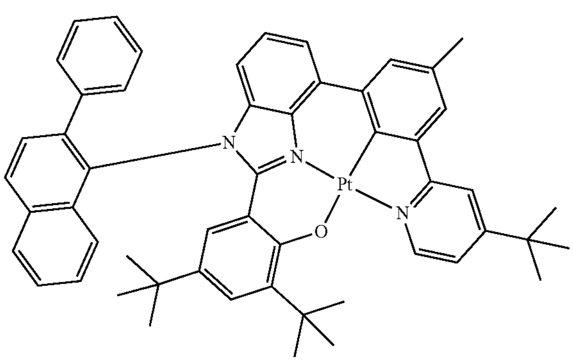
3-274
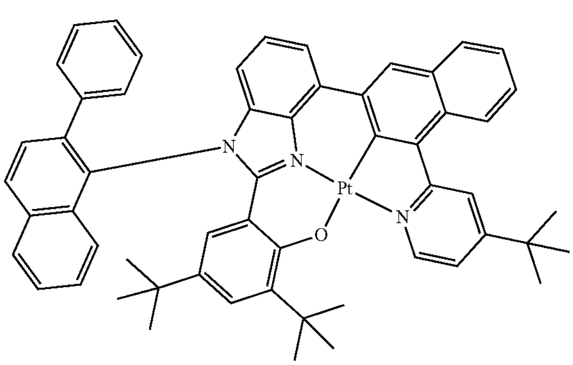
-continued
3-275
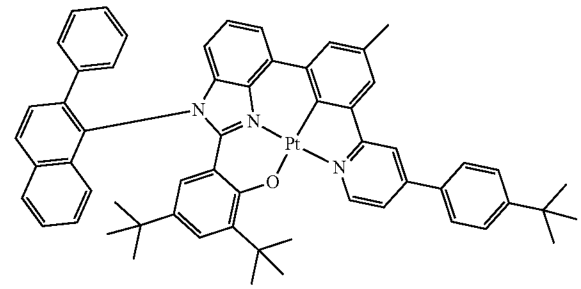
3-276
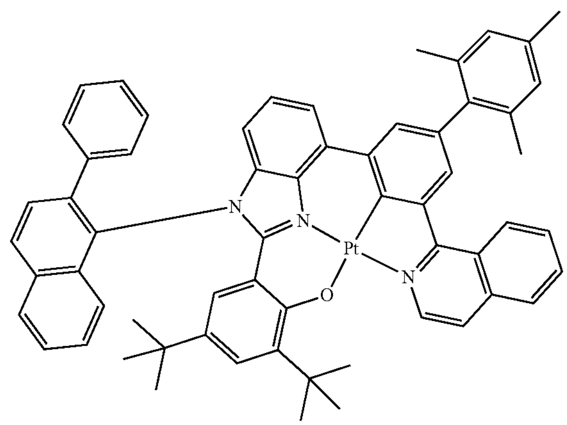
3-277
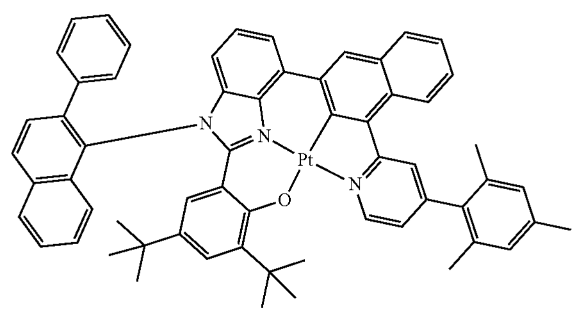
3-278
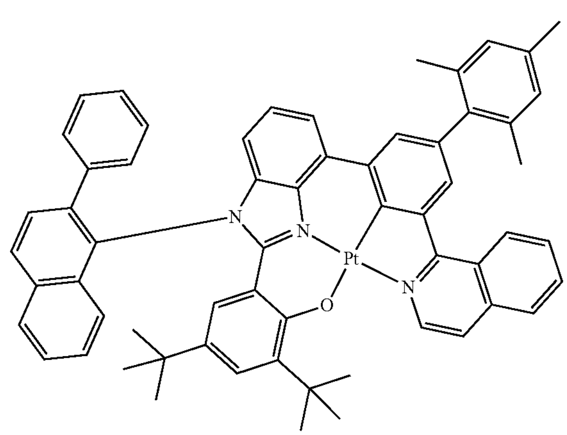

3-279
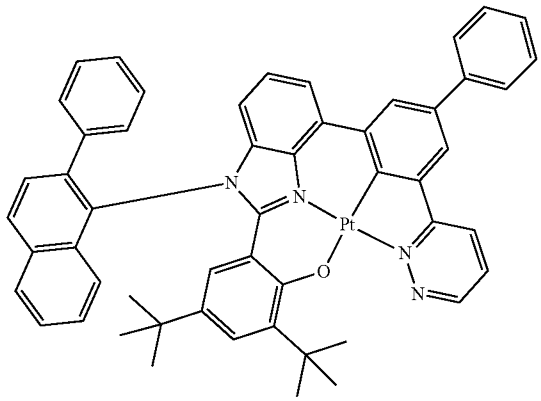
3-280
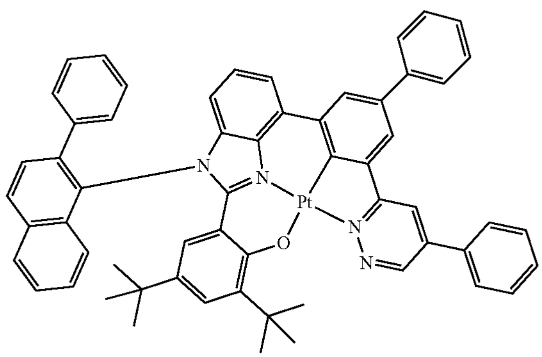
3-281
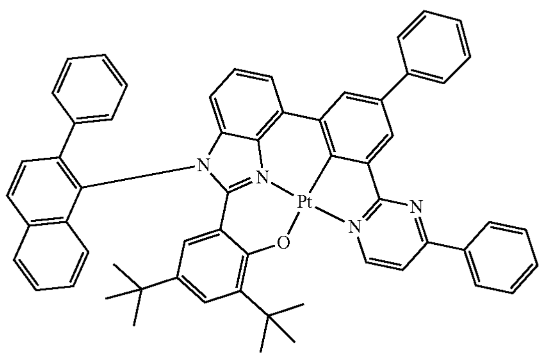
3-282
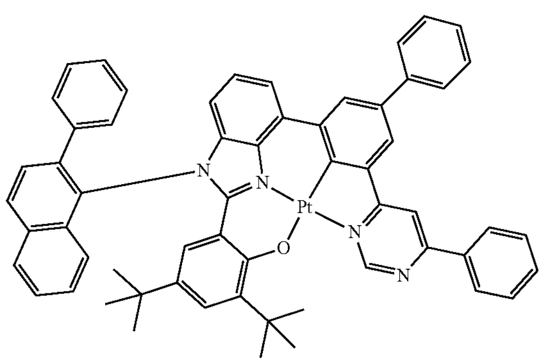
3-283
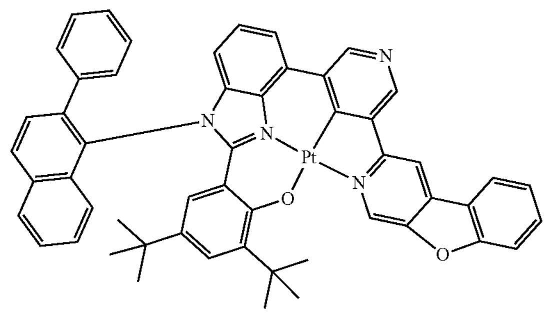
3-284
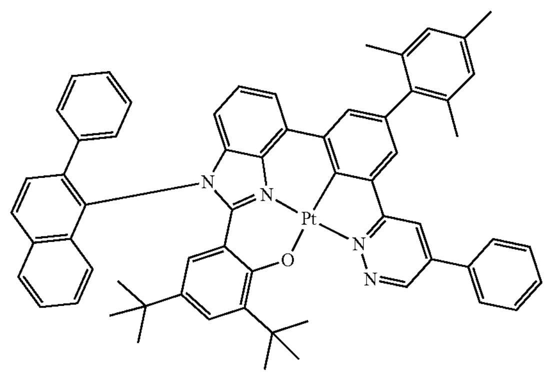
2-385
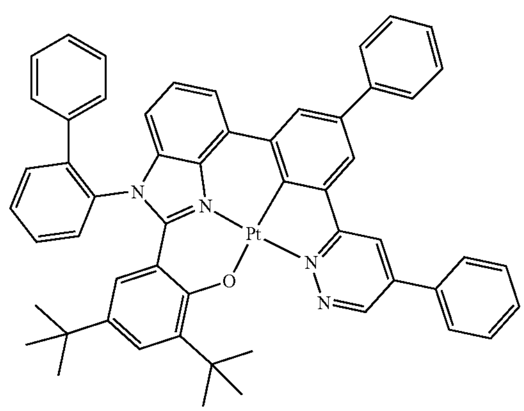
3-286
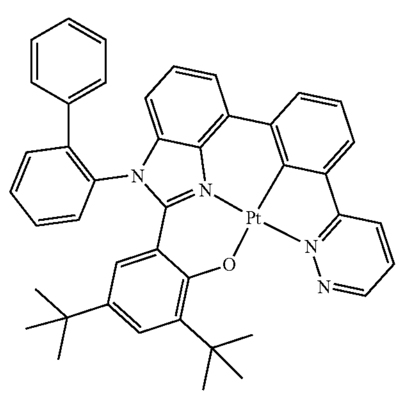

3-287
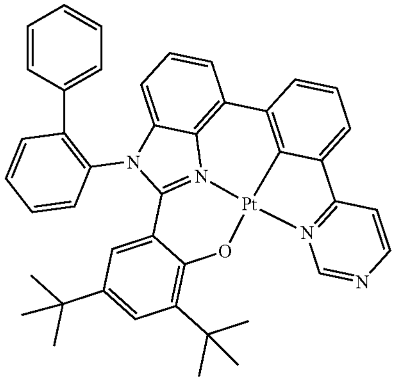
3-288
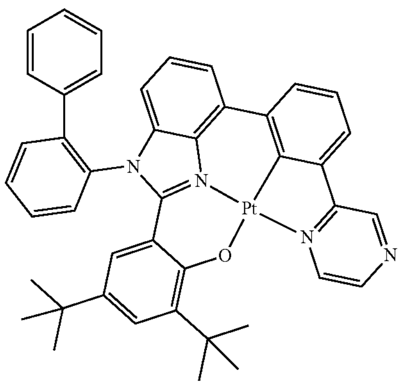
3-289
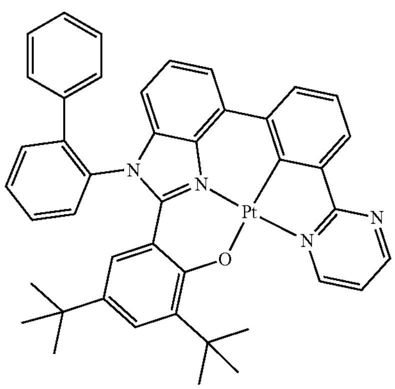
3-290
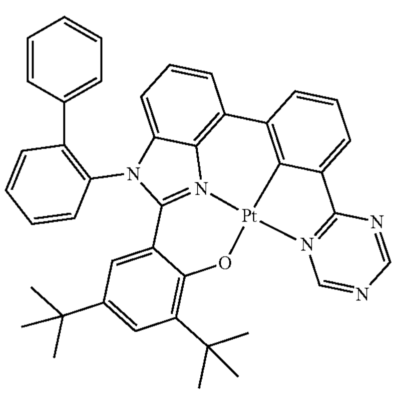
3-291
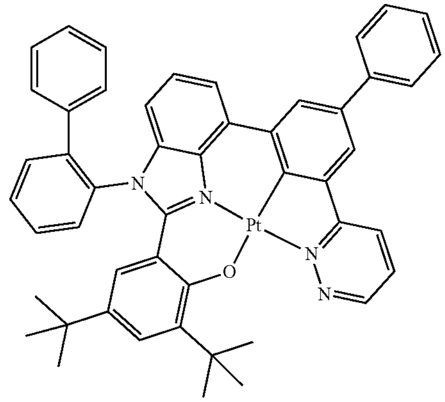
3-292
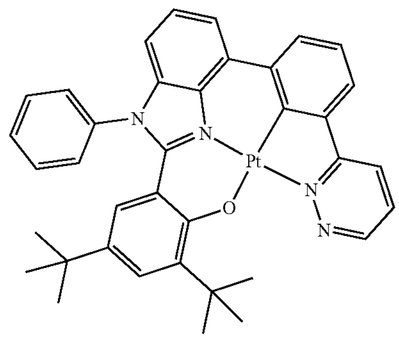
3-293
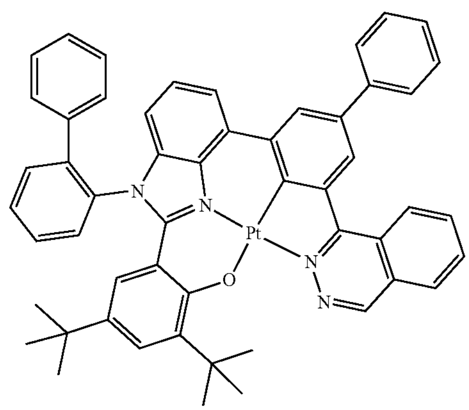
3-294
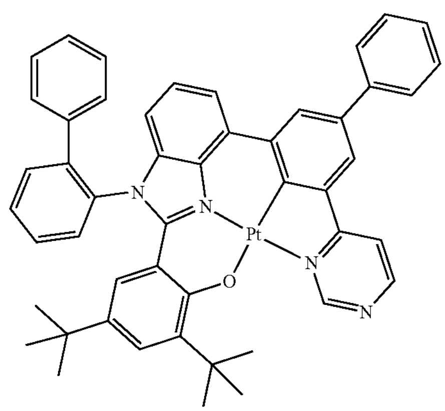

-continued
3-295
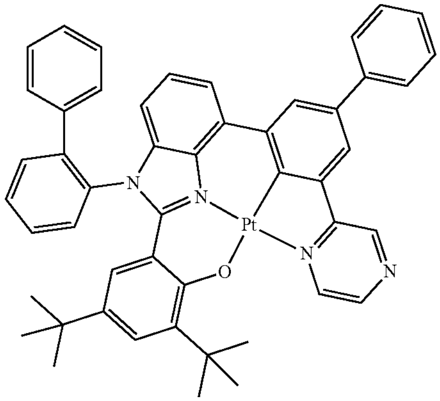
3-296
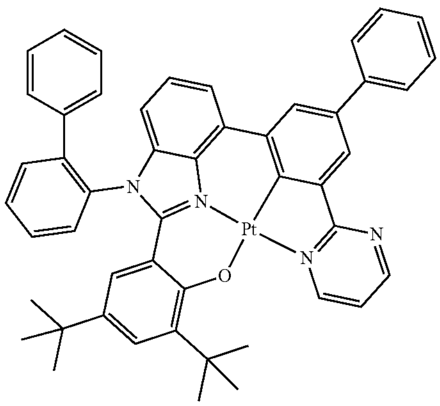
3-297
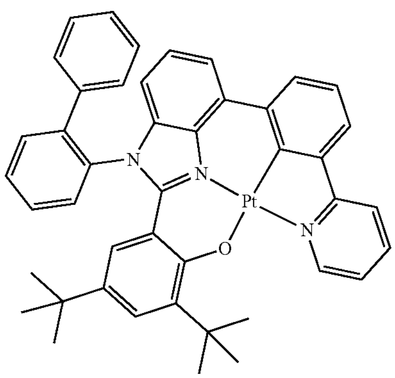
3-298
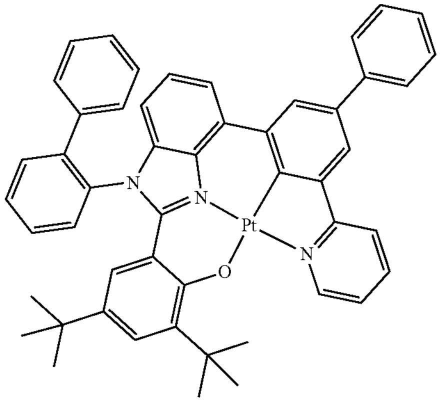
-continued
3-299
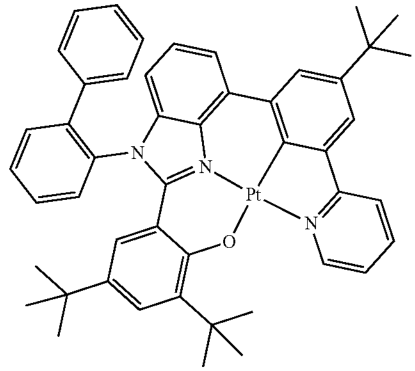
3-300
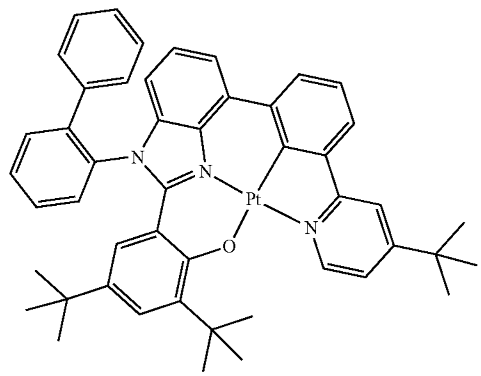
3-301
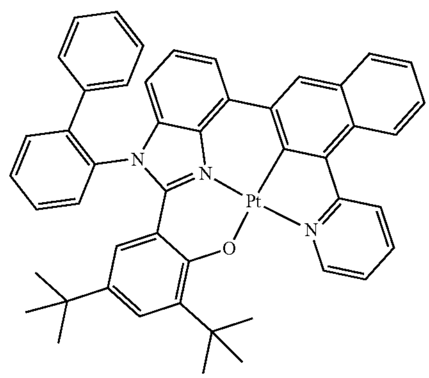
3-302
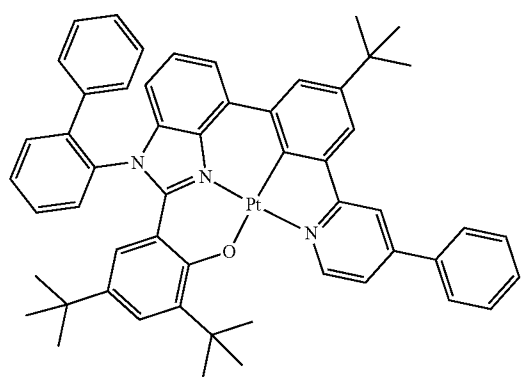

-continued
3-303
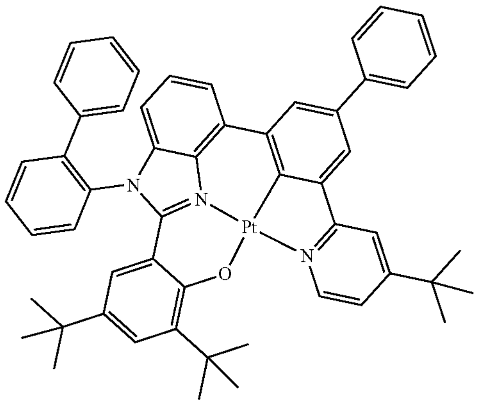
3-304
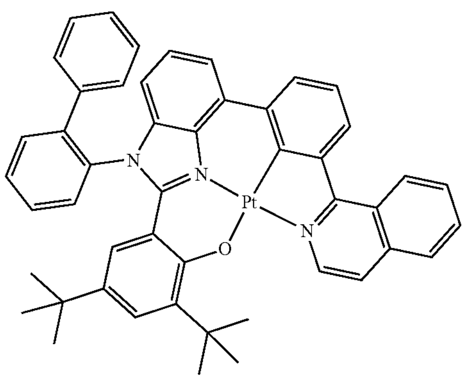
3-305
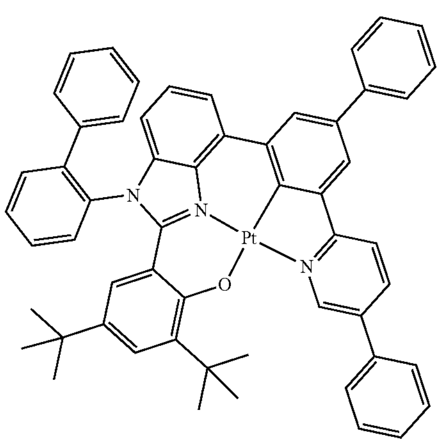
-continued
3-306
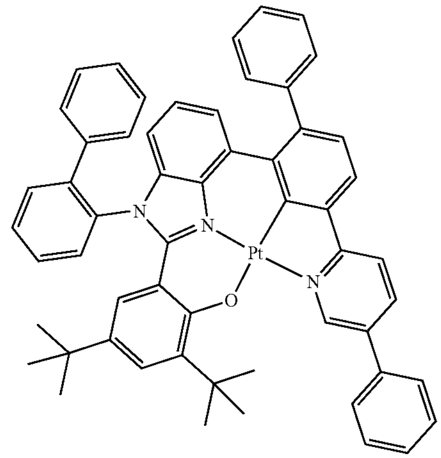
3-307
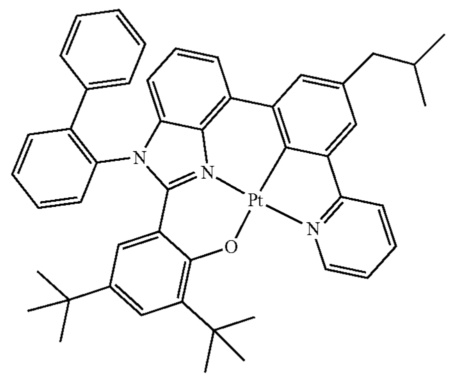
3-308
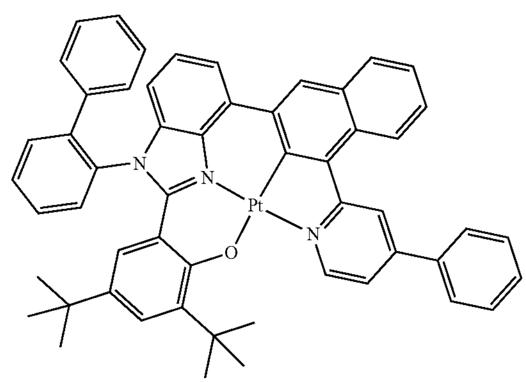
3-309
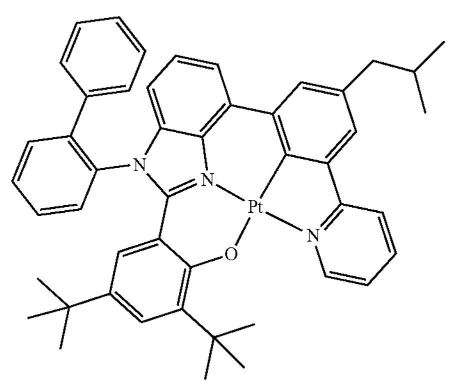

-continued
3-310
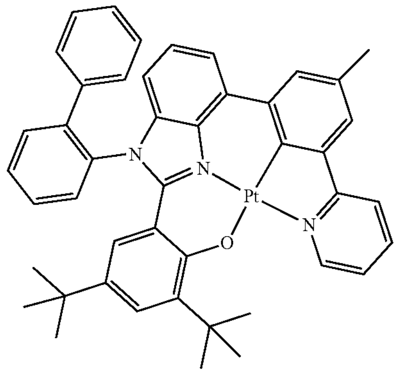
3-311
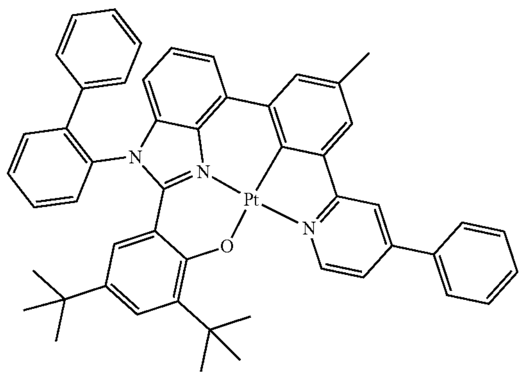
3-312
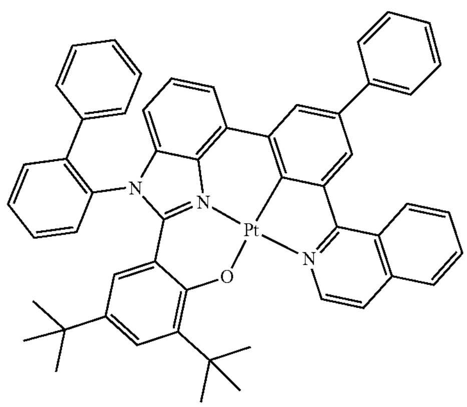
3-313
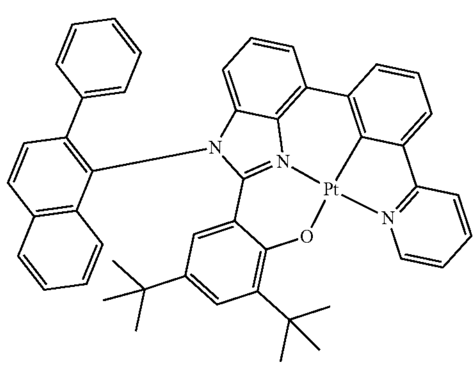
-continued
3-314
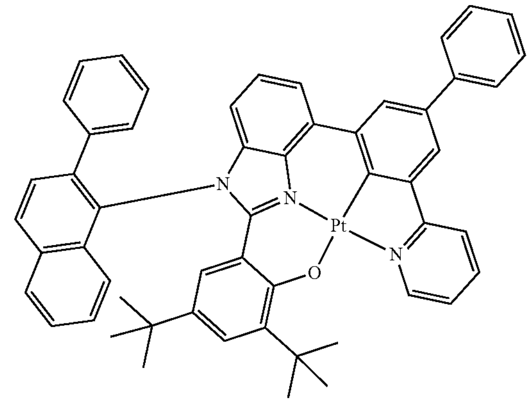
3-315
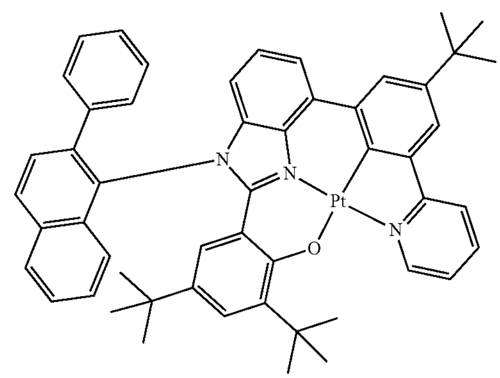
3-316
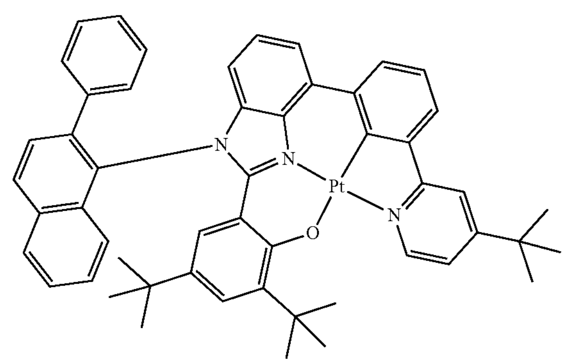
3-317
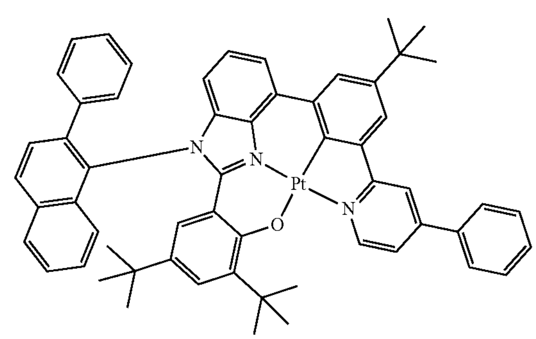

-continued
3-318
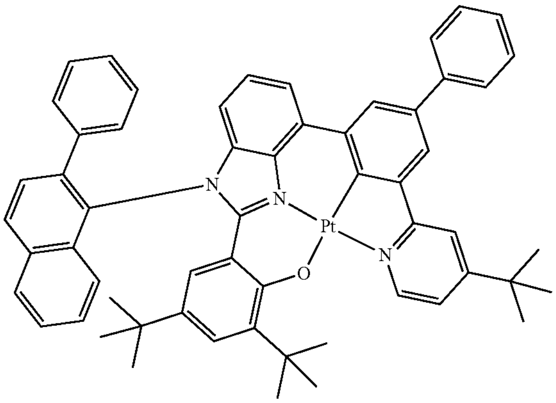
3-319
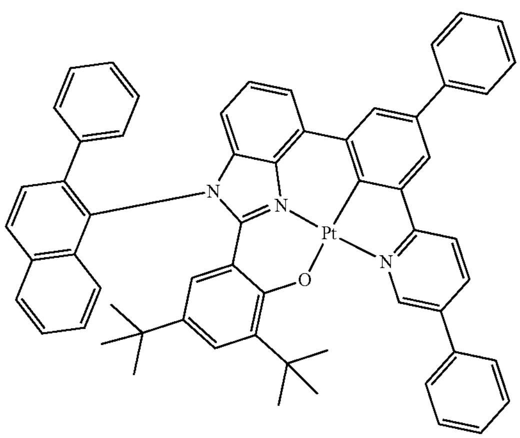
3-320
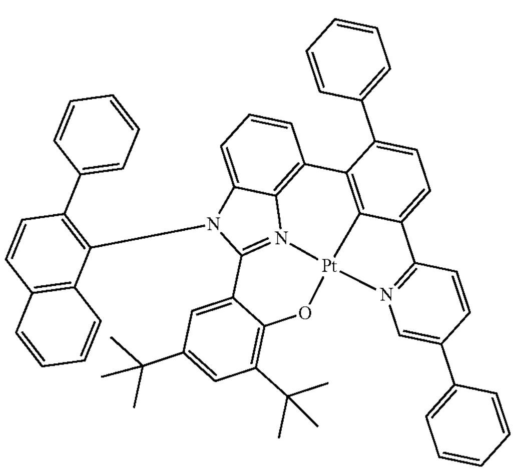
-continued
3-321
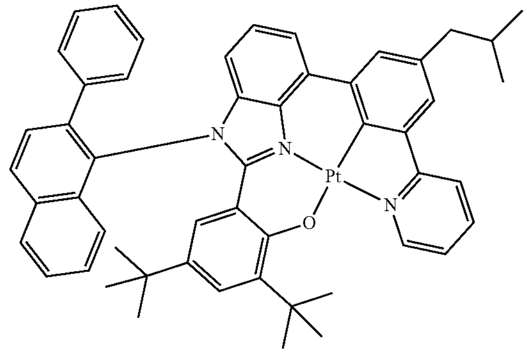
3-322
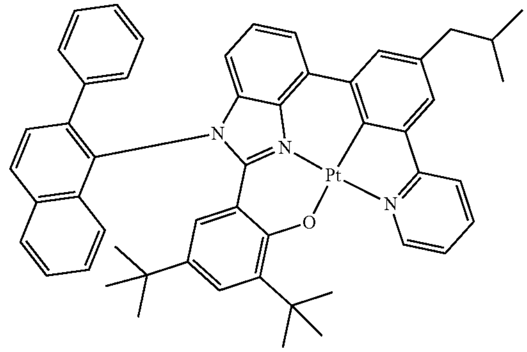
3-323
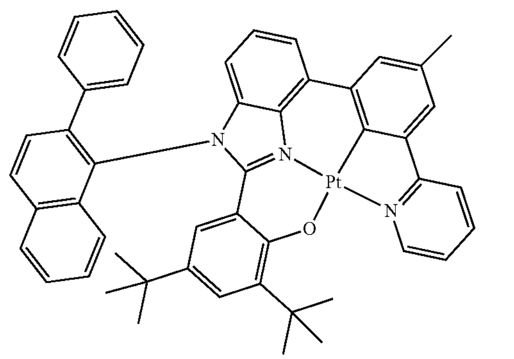
3-324
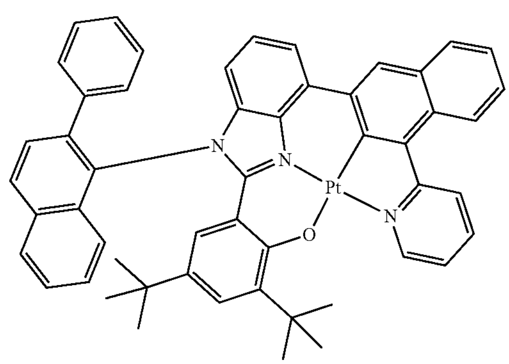

-continued
3-325
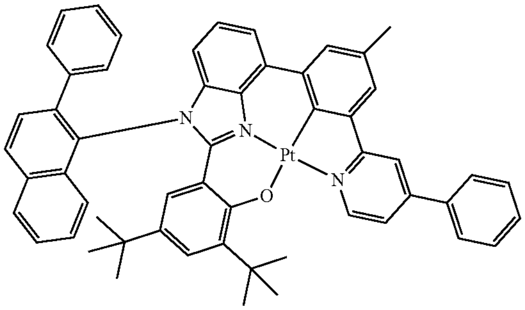
3-326
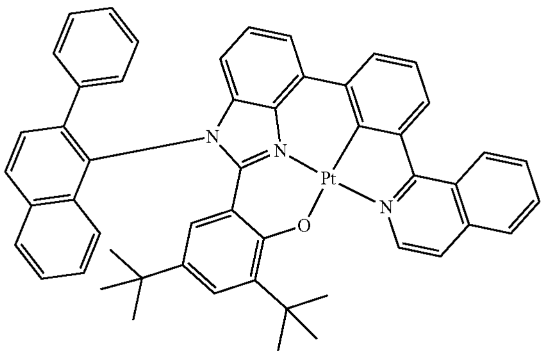
3-327
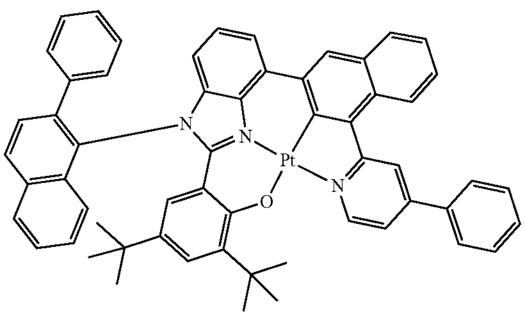
3-328
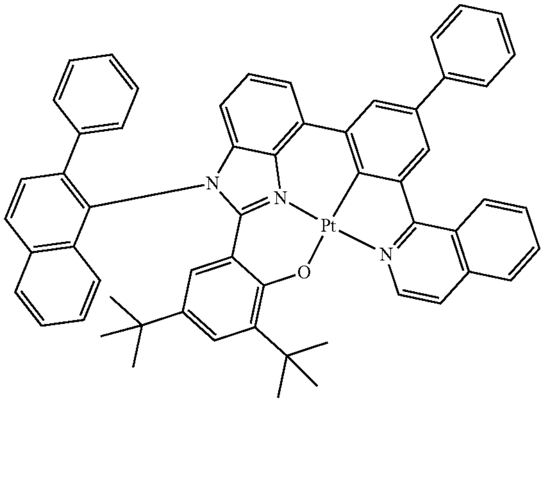
-continued
3-329
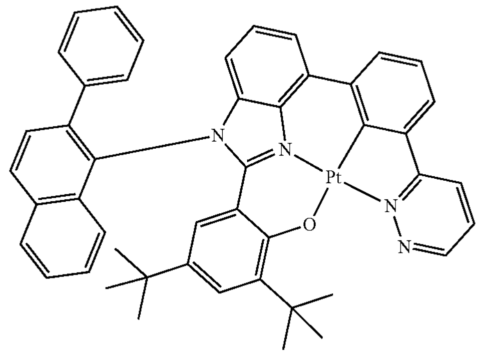
3-330
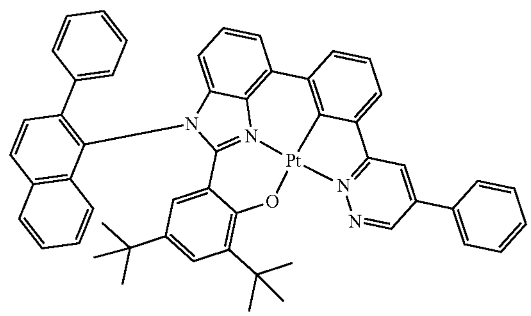
3-331
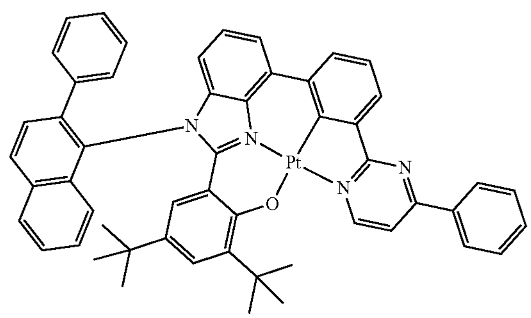
3-332
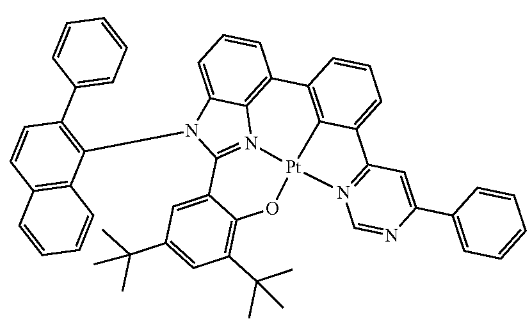

-continued
3-333
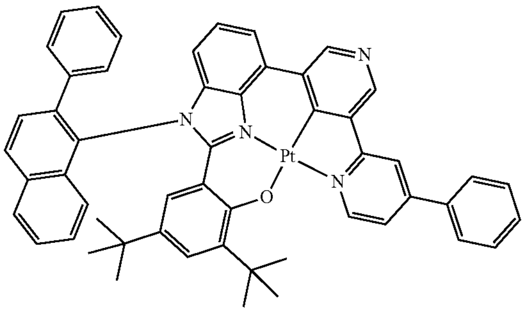
3-334
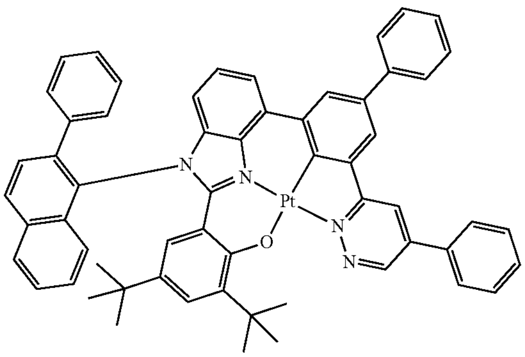
3-335
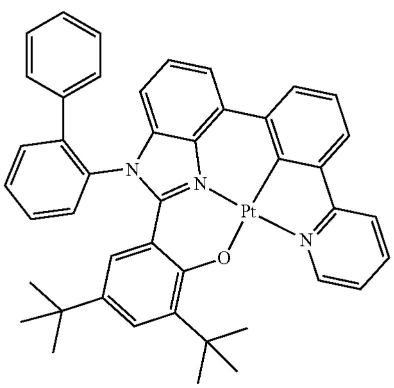
3-336
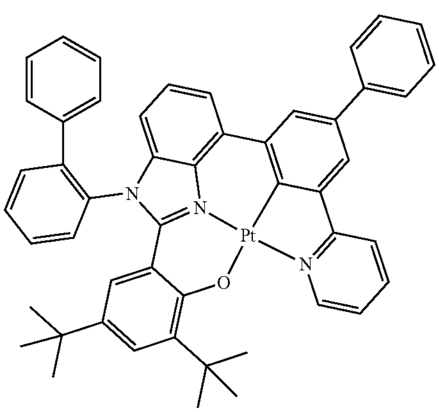
-continued
3-337
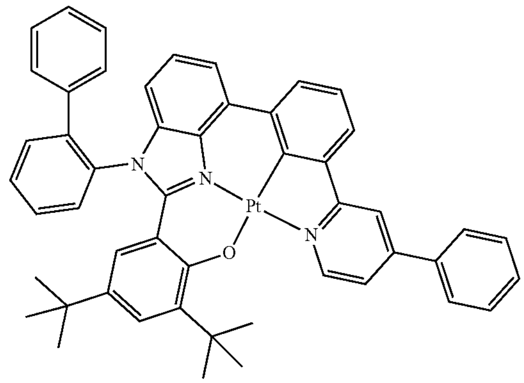
3-338
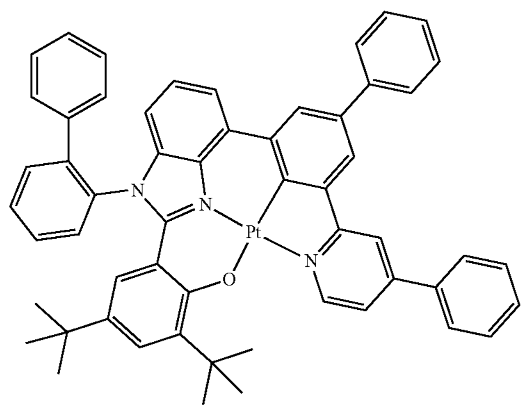
3-339
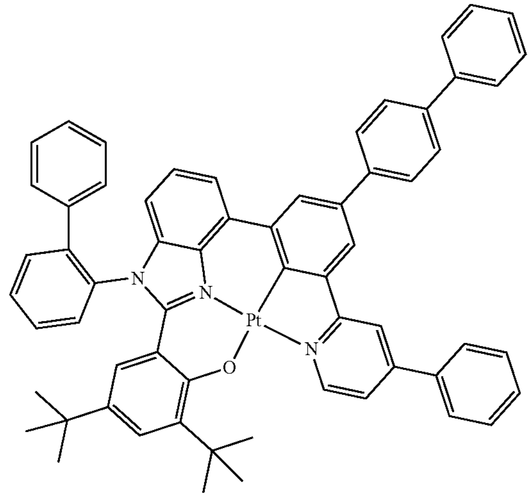

-continued
3-340
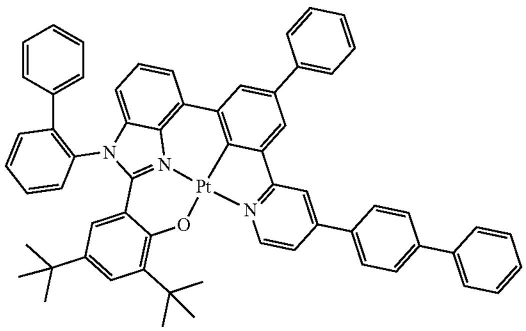
3-341
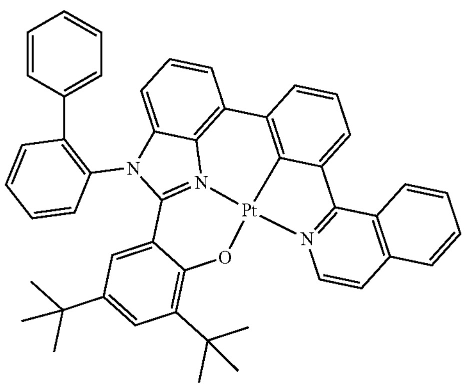
3-342
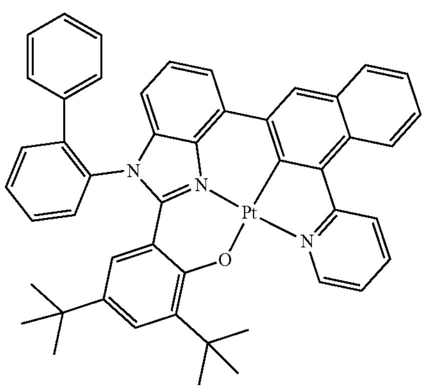
3-343
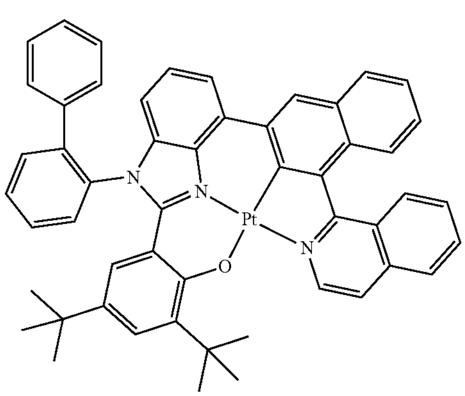
-continued
3-344
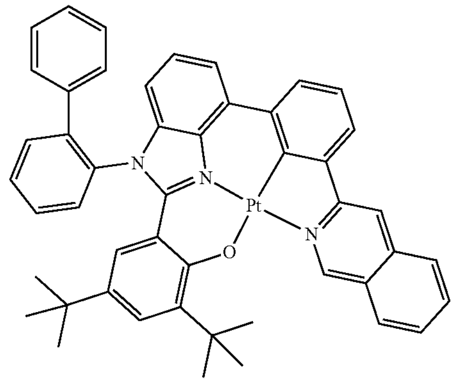
3-345
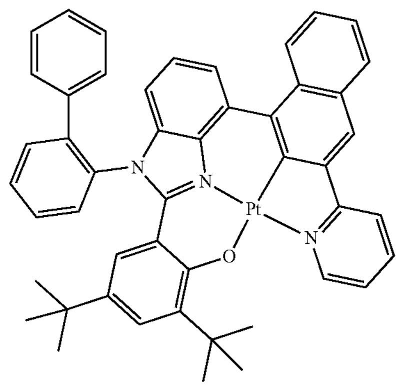
3-346
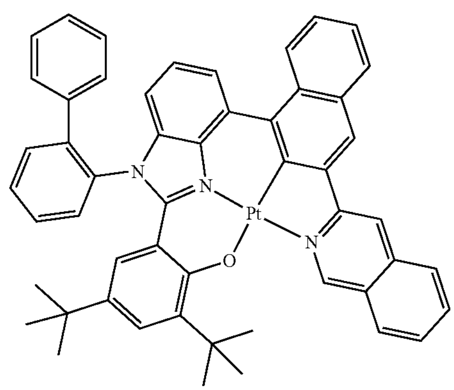
3-347
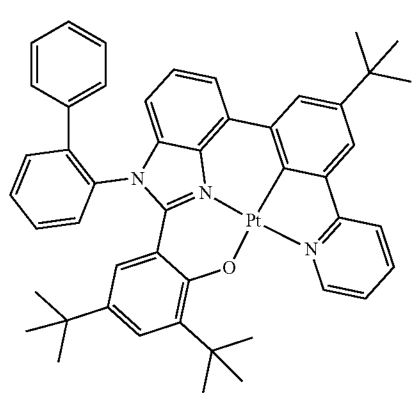

3-348
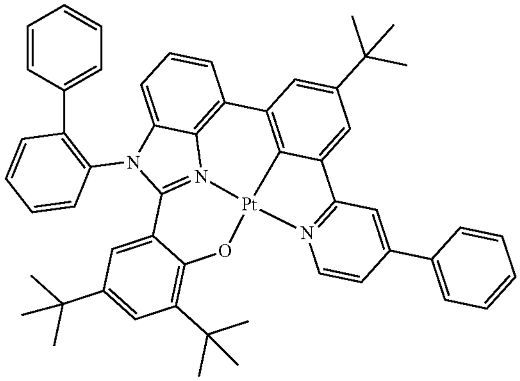
3-349
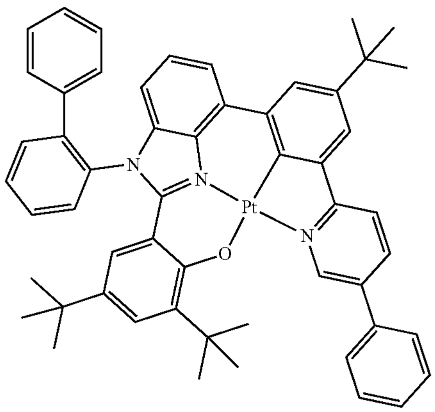
3-350
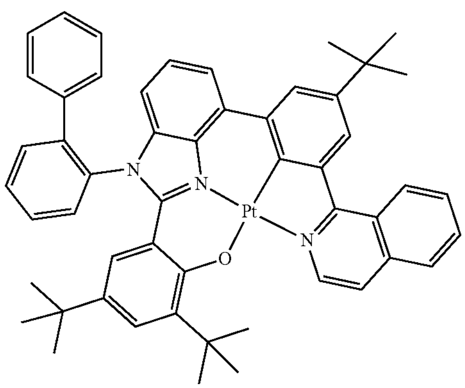
3-351
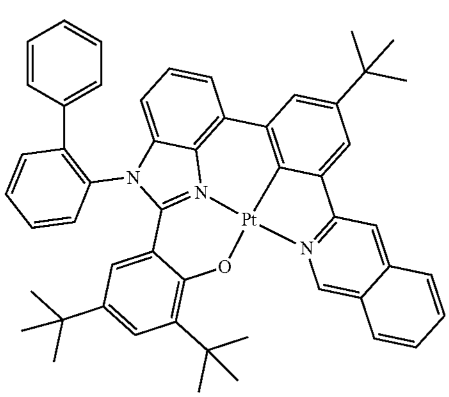
3-352
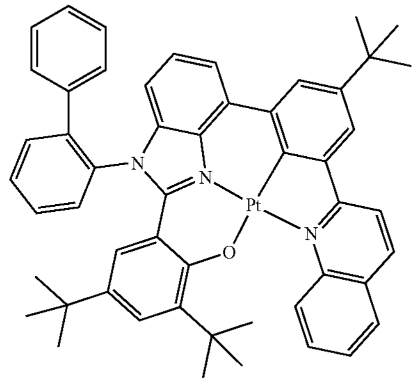
3-353
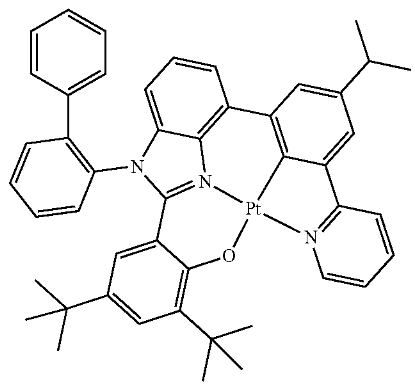
3-354
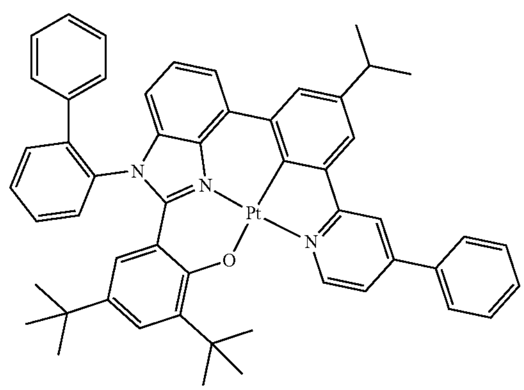
3-355
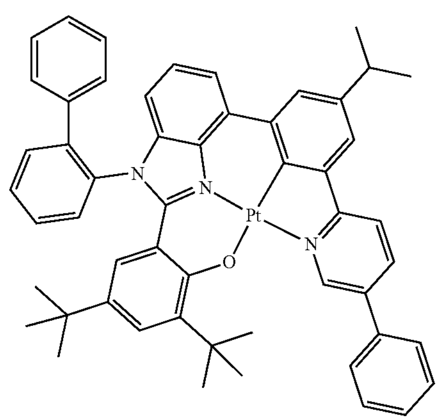

-continued
3-356
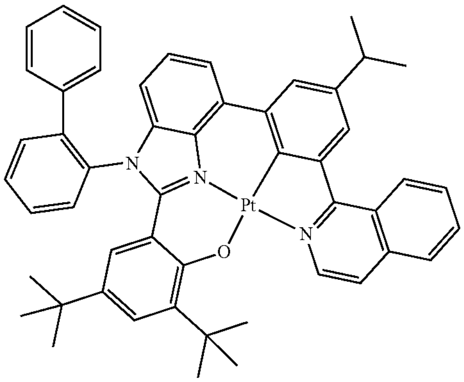
3-357
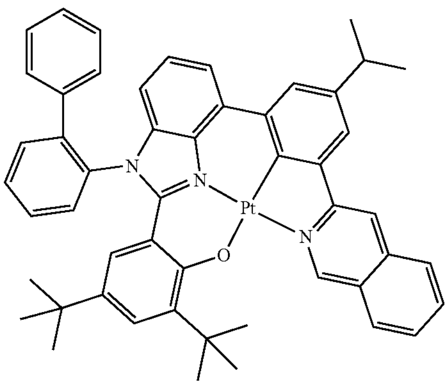
3-358
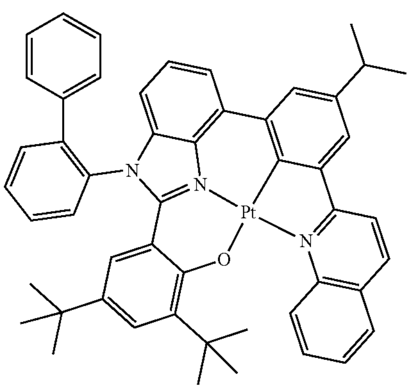
3-359
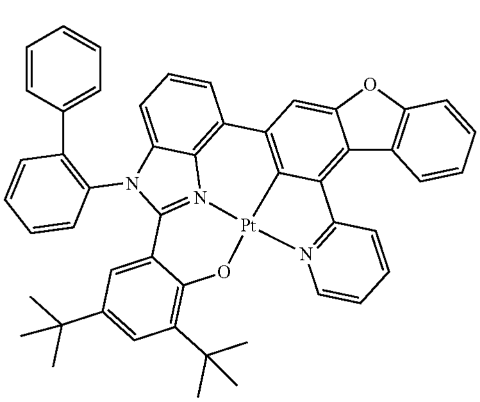
-continued
3-360
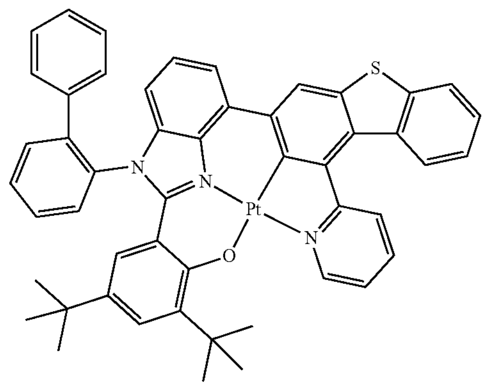
3-361
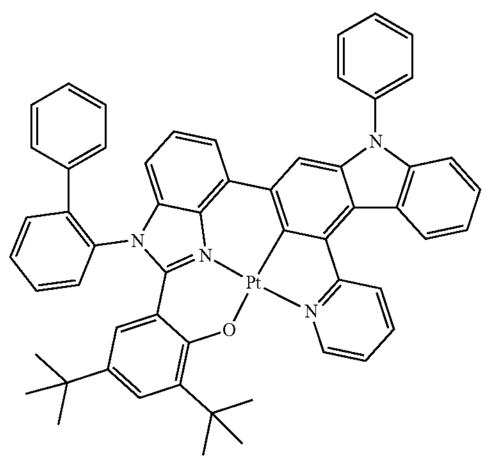
3-362
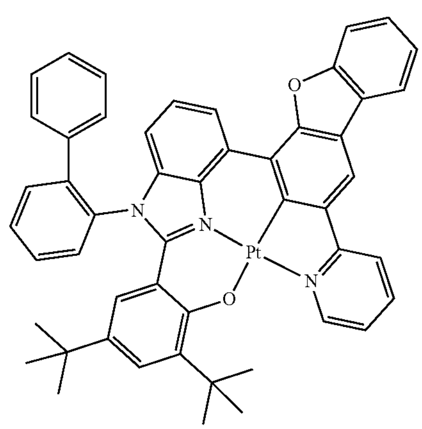

-continued
3-363
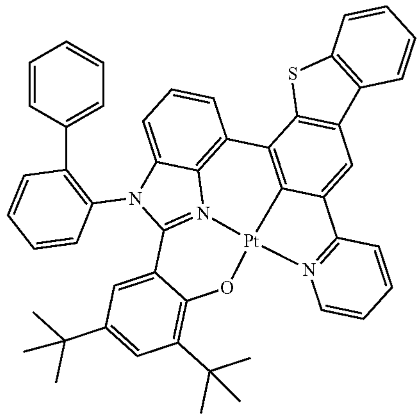
3-364
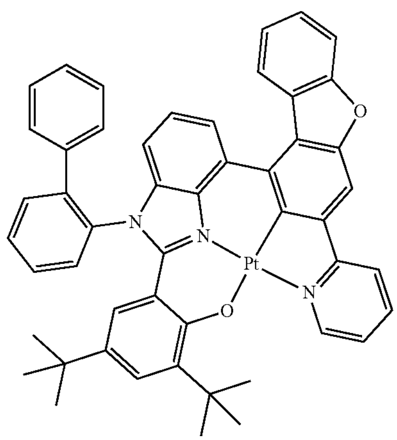
3-365
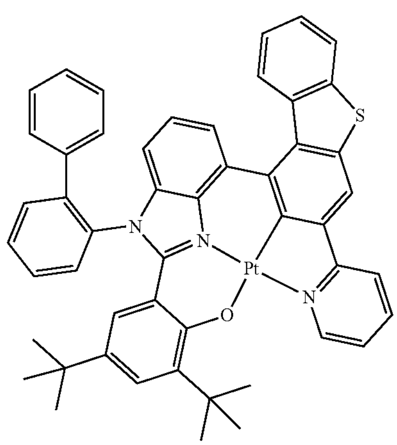
-continued
3-366
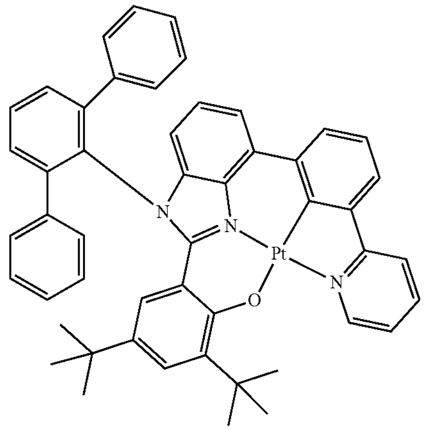
3-367
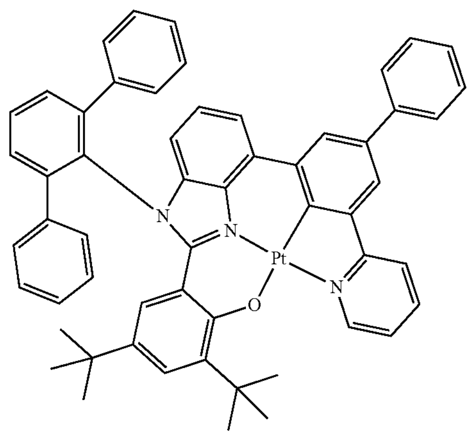
3-368
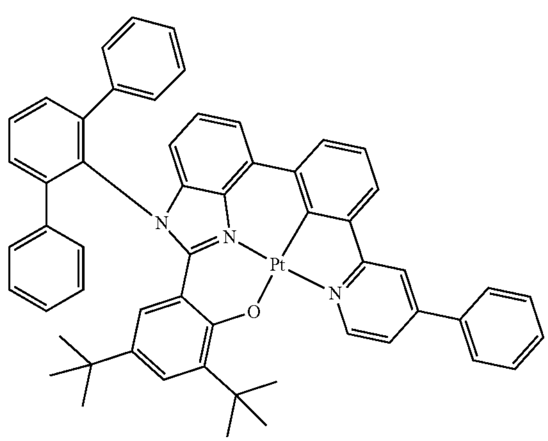

-continued
3-369
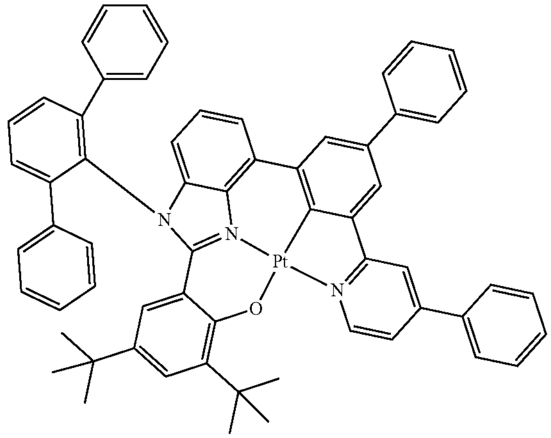
3-370
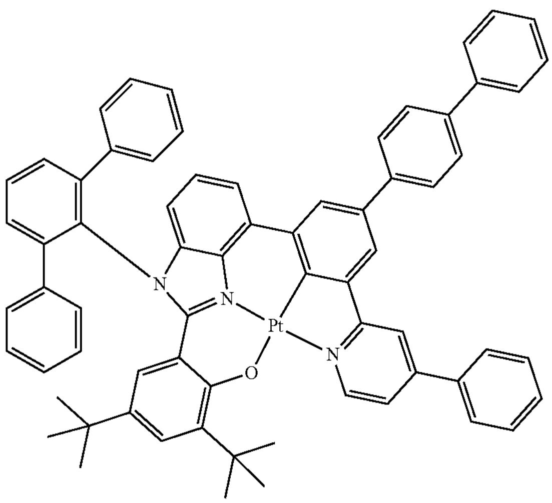
3-371
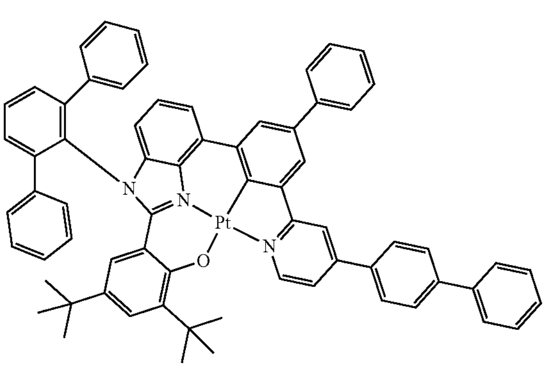
-continued
3-372
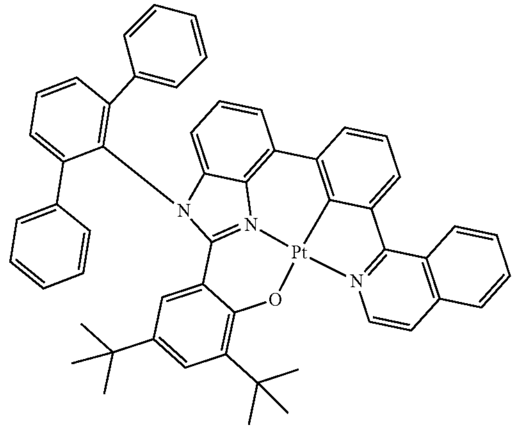
3-373
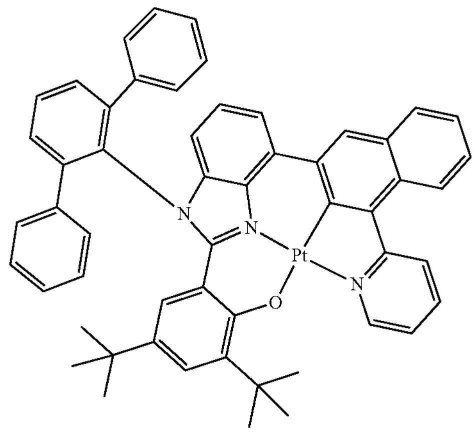
3-374
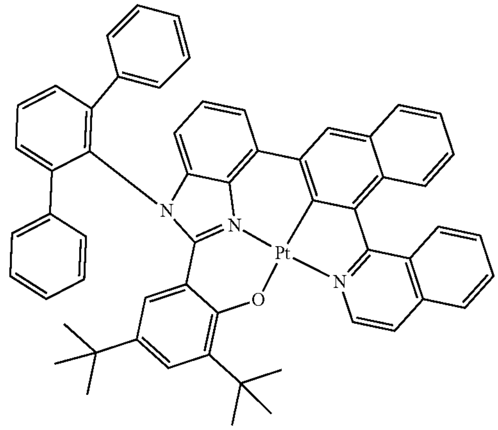

-continued
3-375
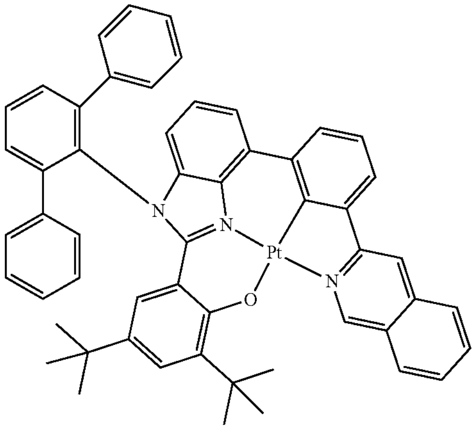
3-376
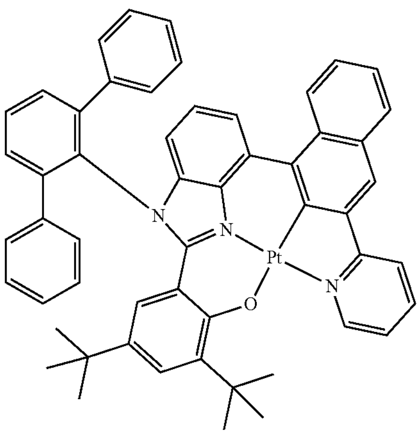
3-377
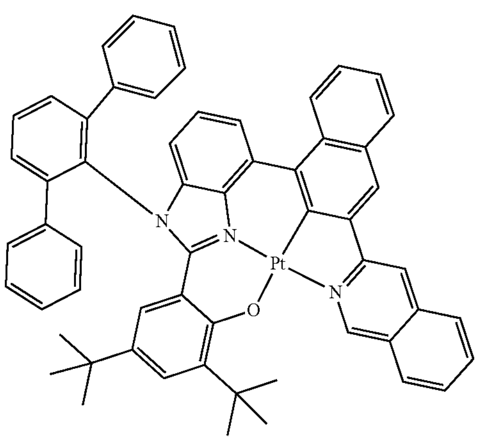
-continued
3-378
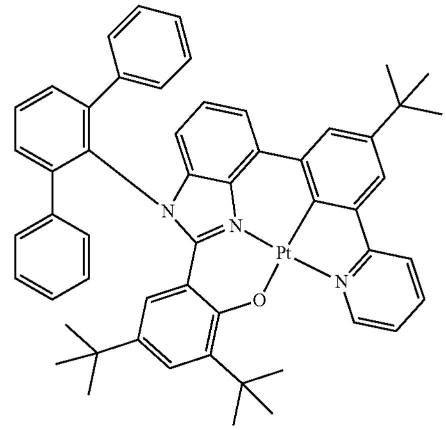
3-379
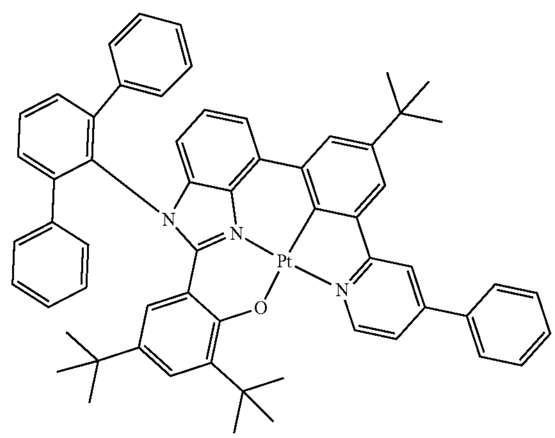
3-380
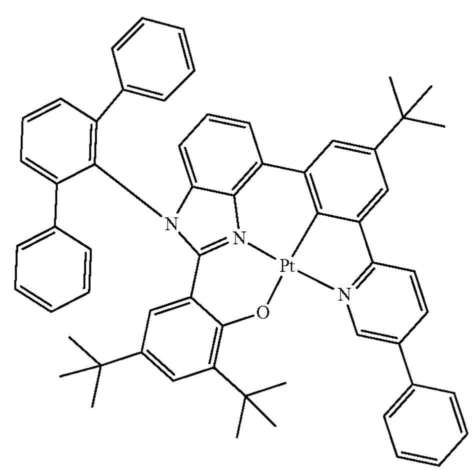

-continued
3-381
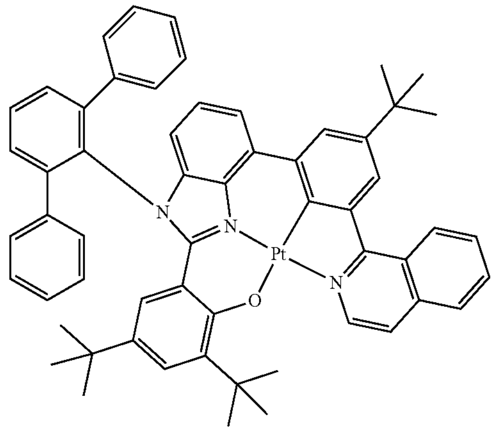
3-382
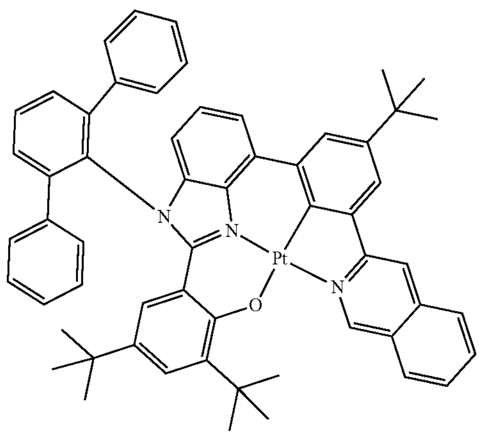
3-383
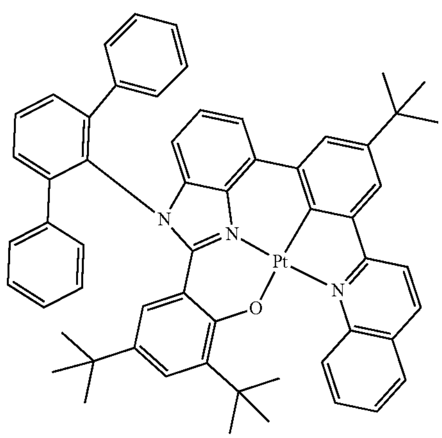
-continued
3-384
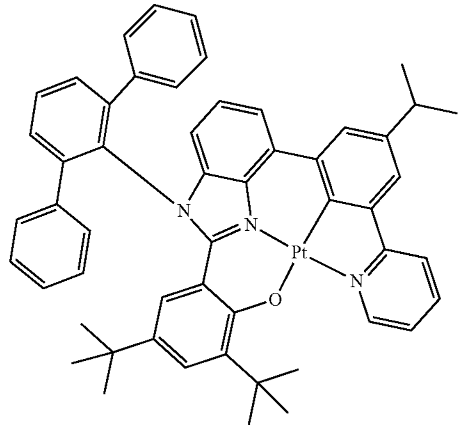
3-385
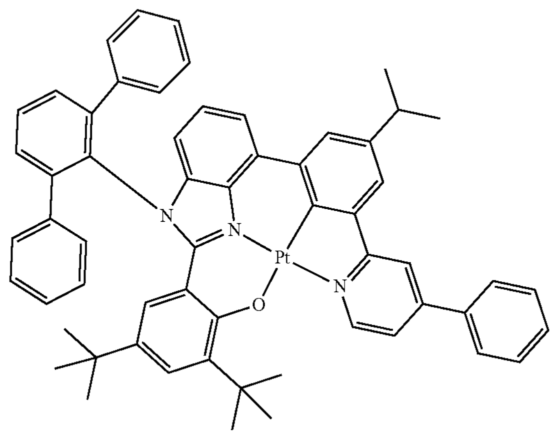
3-386
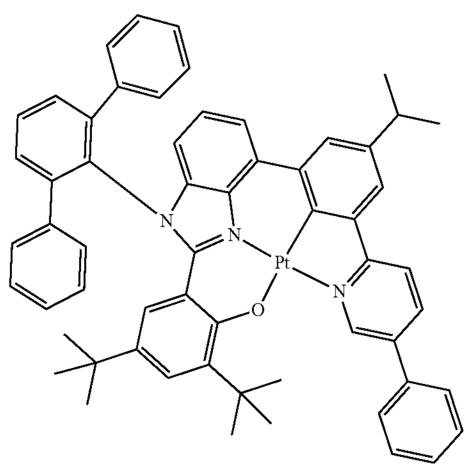

-continued
3-387
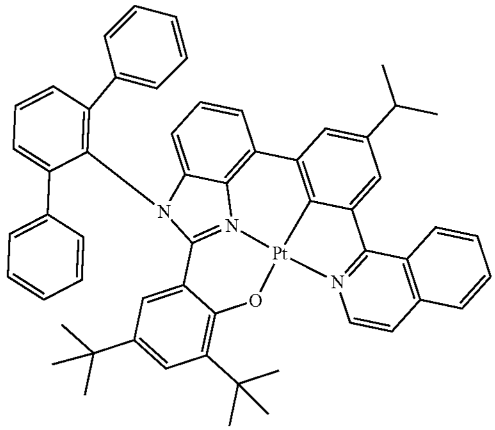
3-388
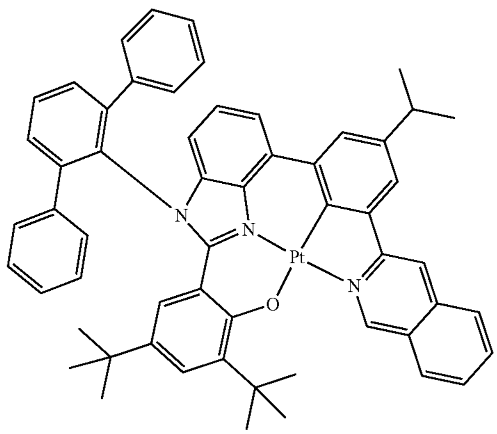
3-389
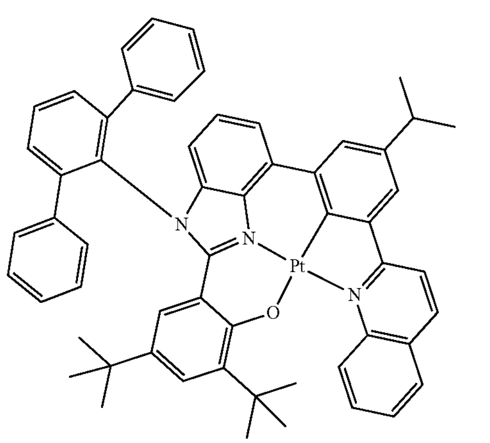
-continued
3-390
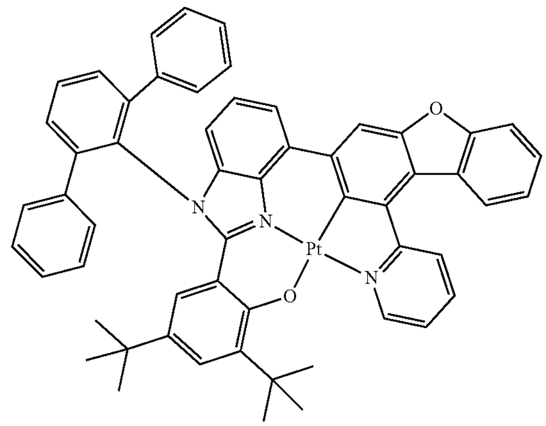
3-391
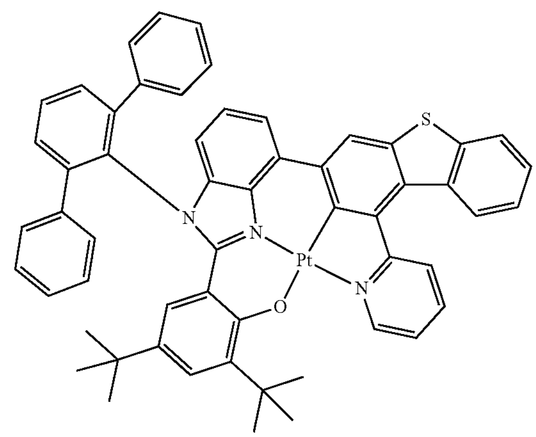
3-392
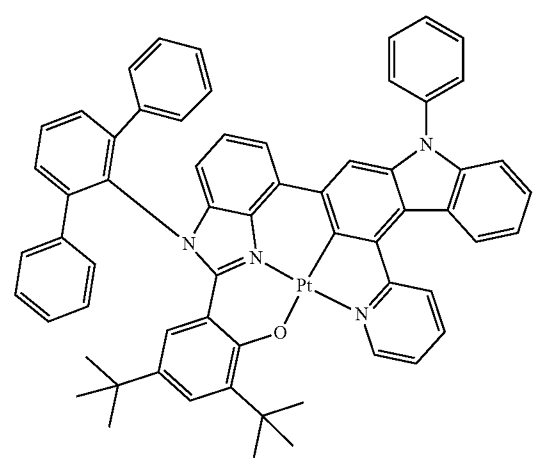

-continued
3-393
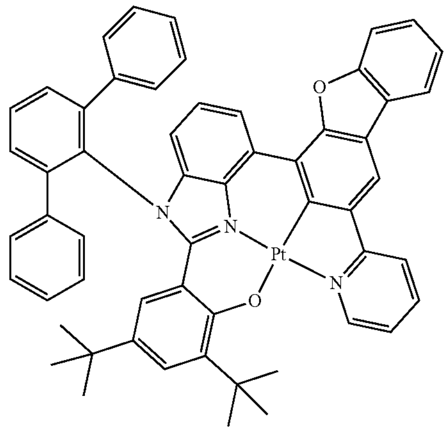
3-394
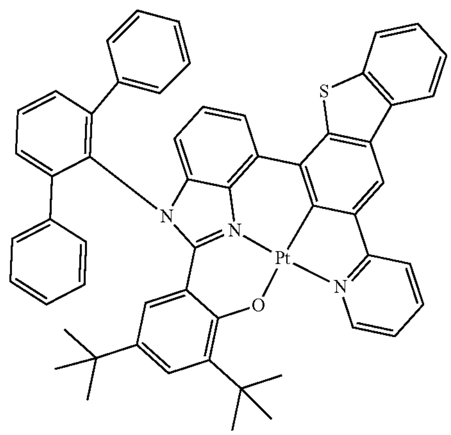
3-395
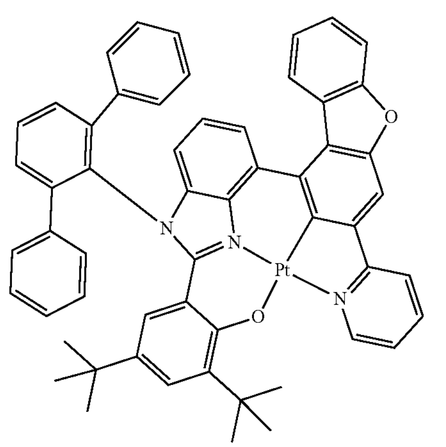
-continued
3-396
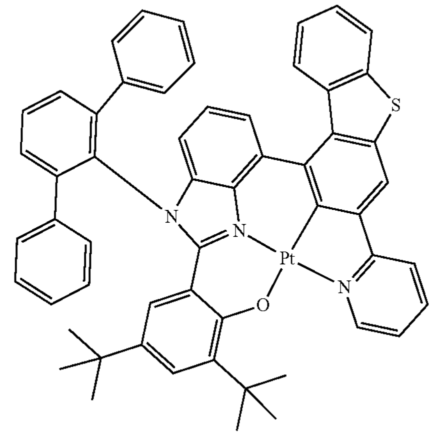
3-397
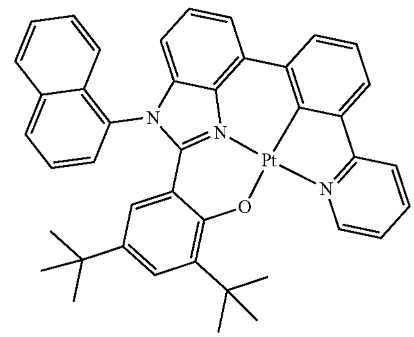
3-398
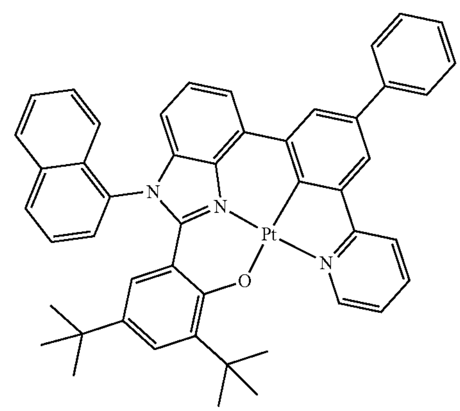
3-399
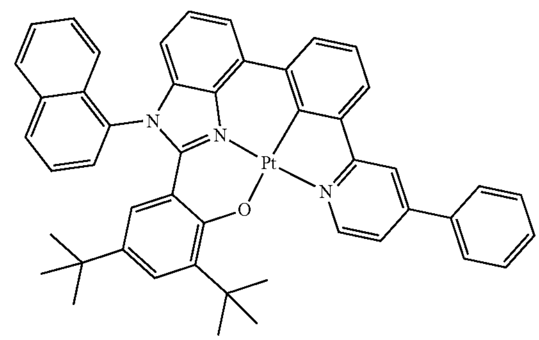

-continued
3-400
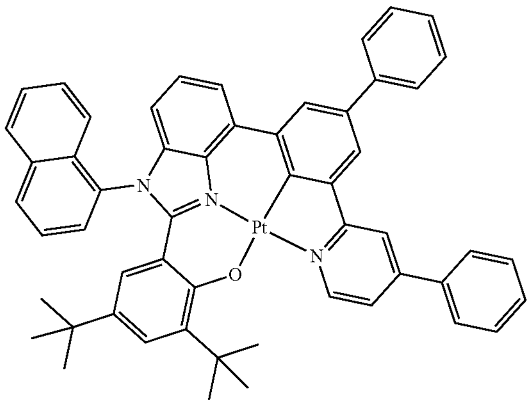
3-401
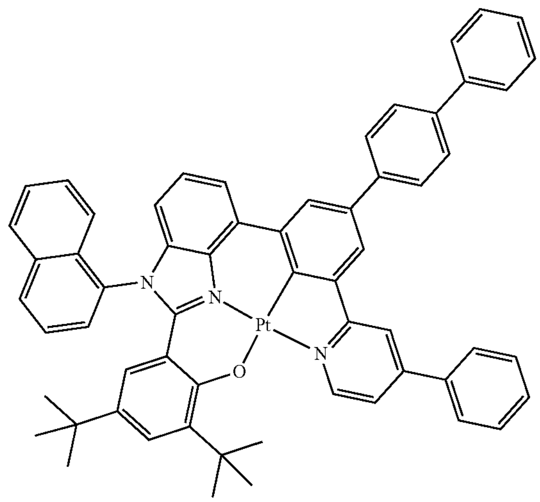
3-402
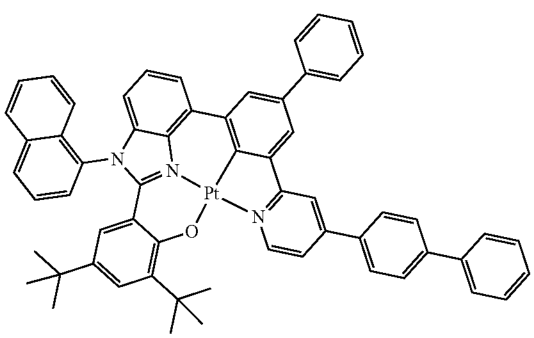
3-403
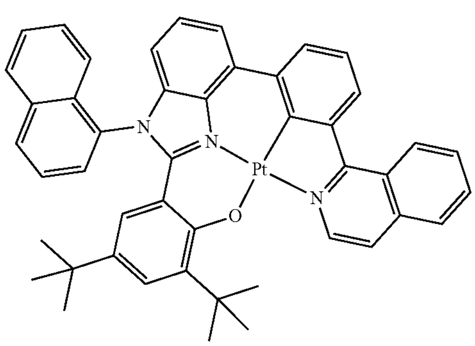
-continued
3-404
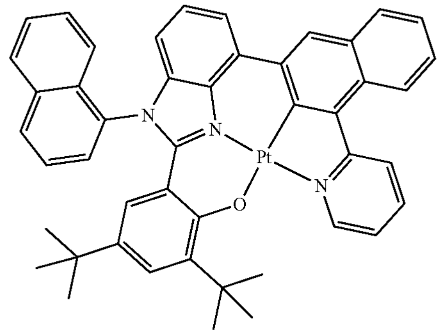
3-405
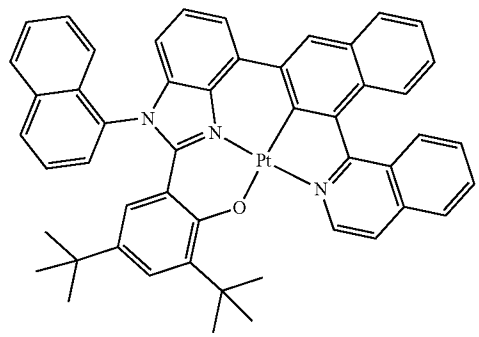
3-406
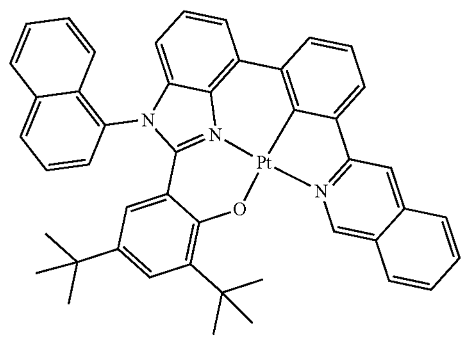
3-407
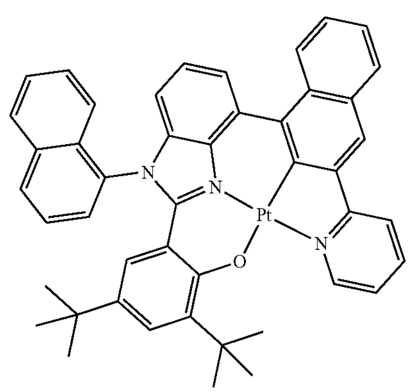

-continued
3-408
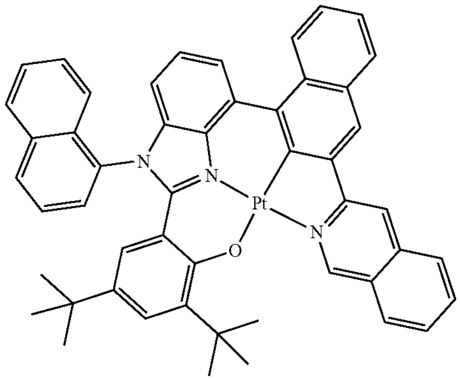
3-409
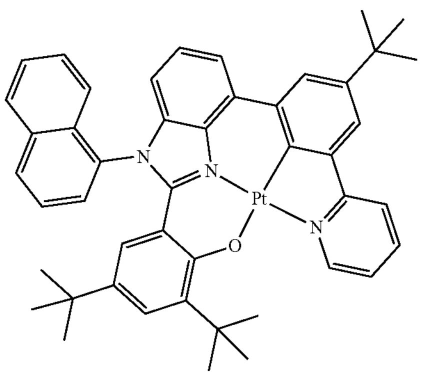
3-410
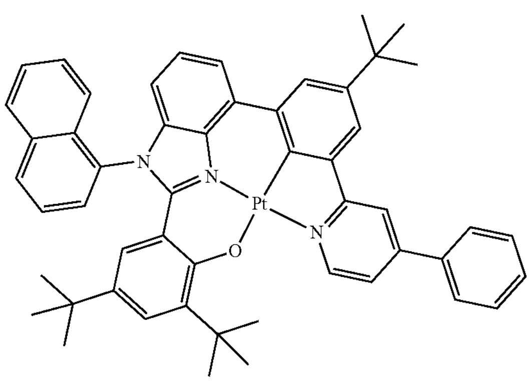
3-411
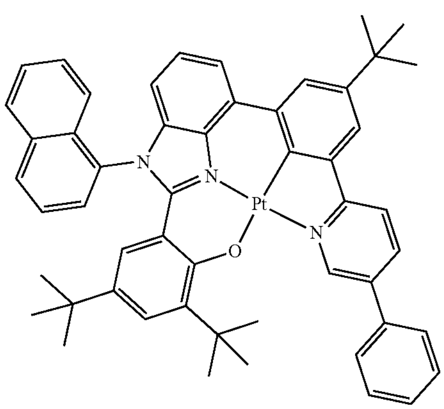
-continued
3-412
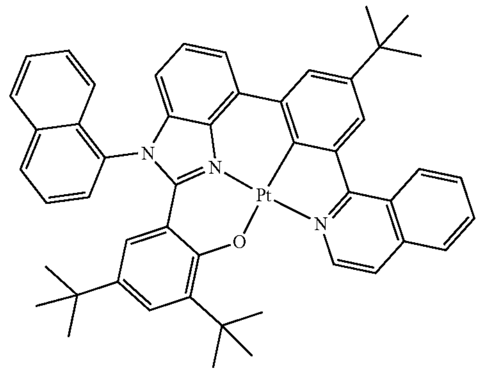
3-413
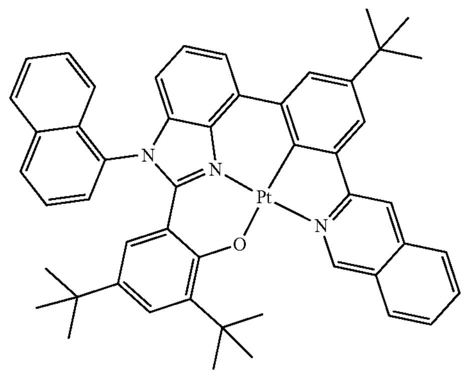
3-414
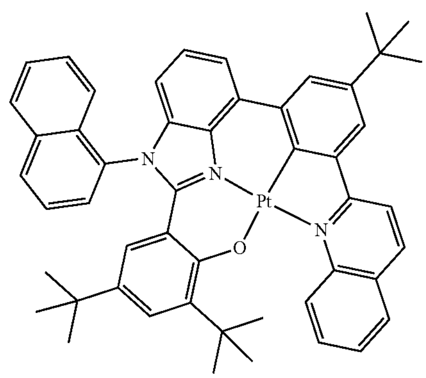
3-415
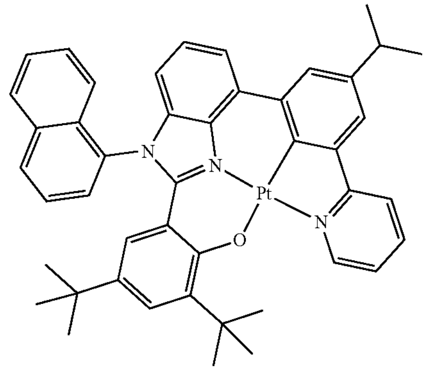

3-416
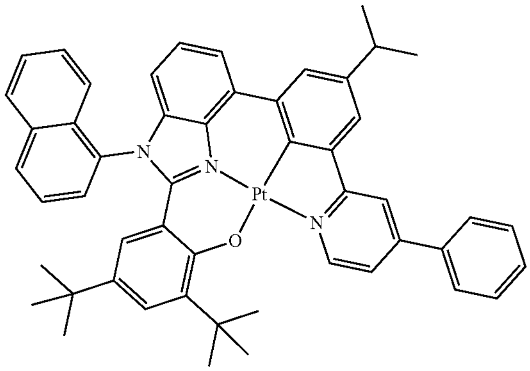
3-417
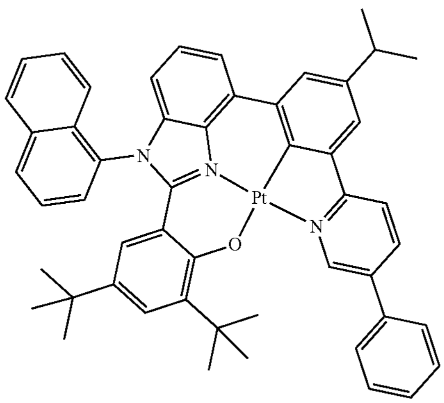
3-418
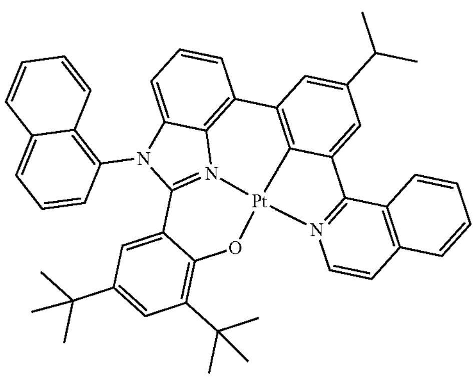
3-419
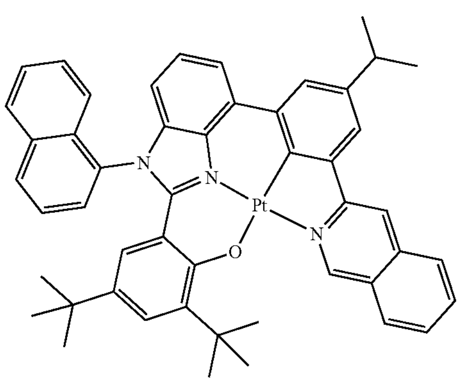
3-420
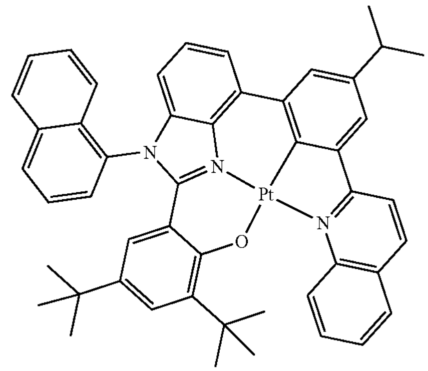
3-421
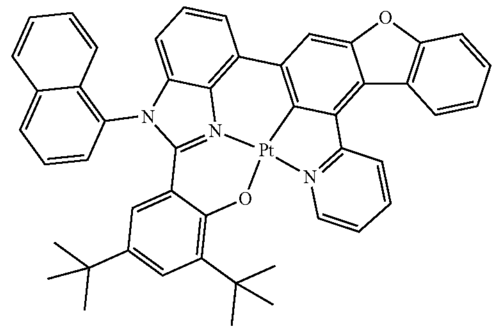
3-422
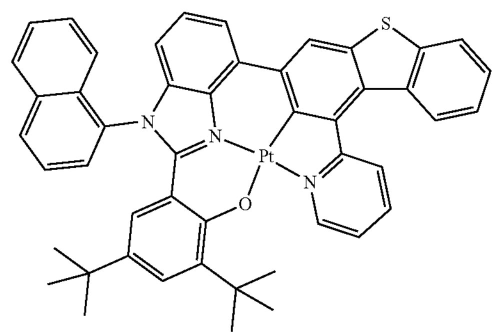
3-423
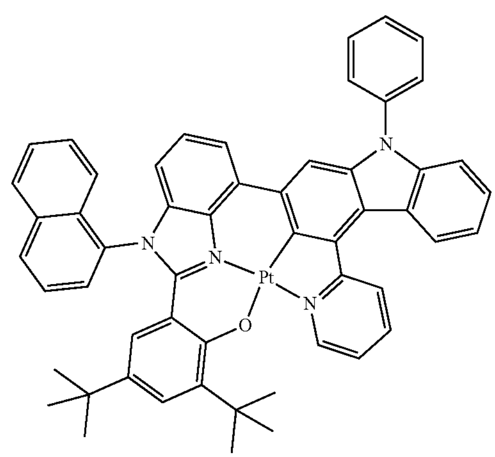

-continued
3-424
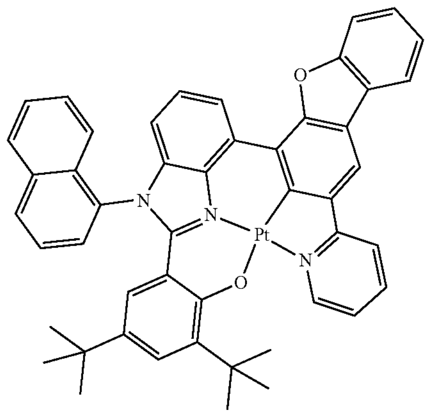
3-425
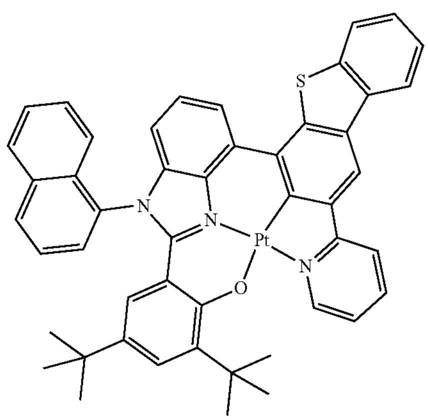
3-426
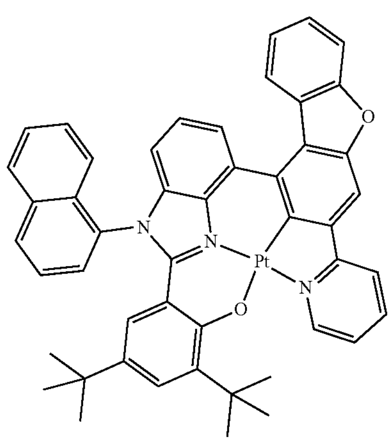
-continued
3-427
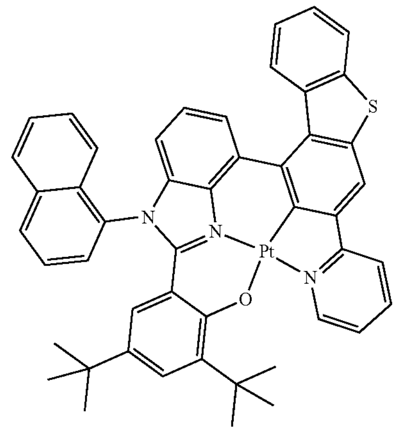
3-428
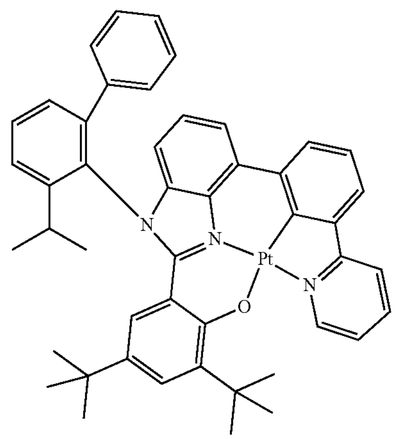
3-429
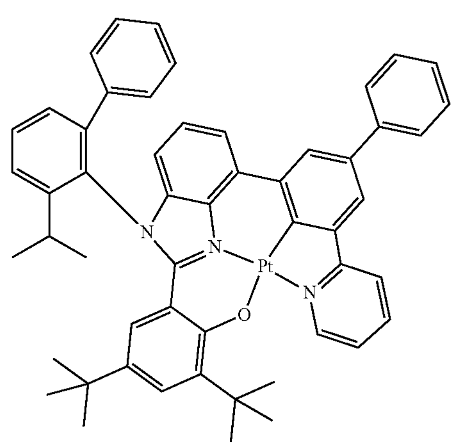

-continued
3-430
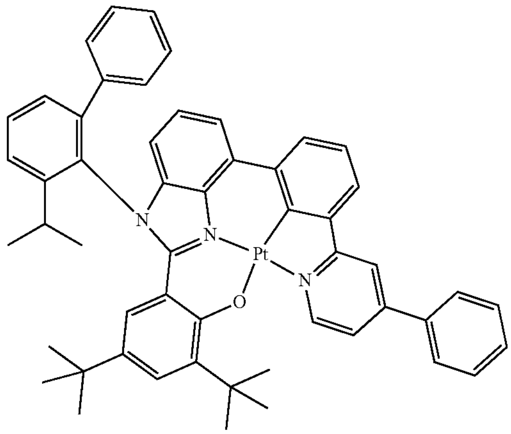
3-431
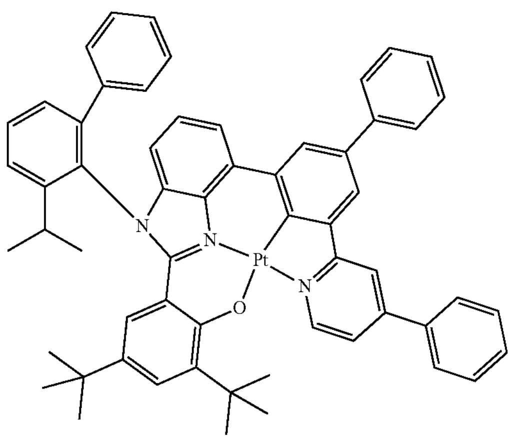
3-432
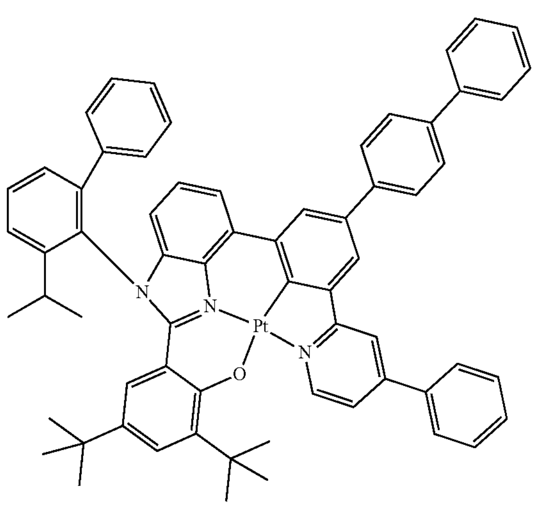
-continued
3-433
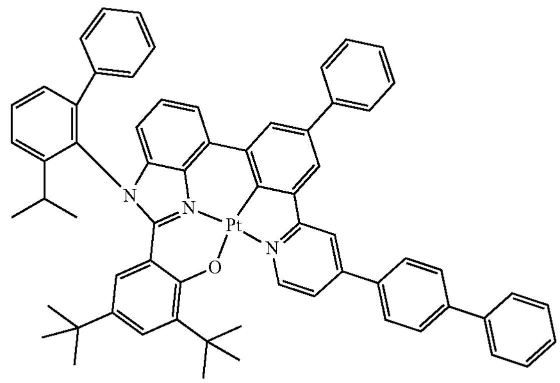
3-434
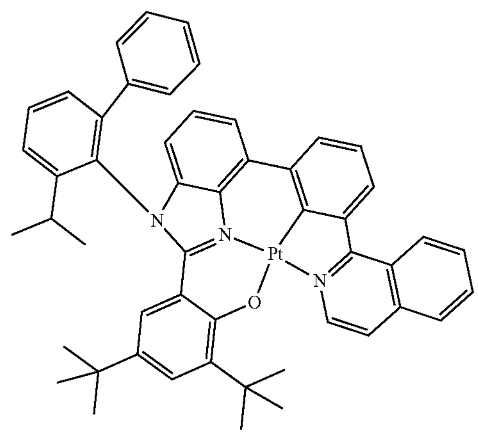
3-435
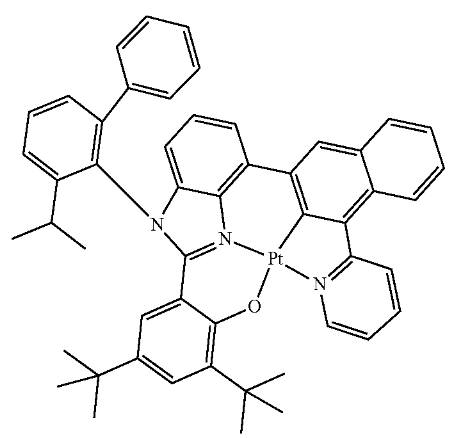

-continued
3-436
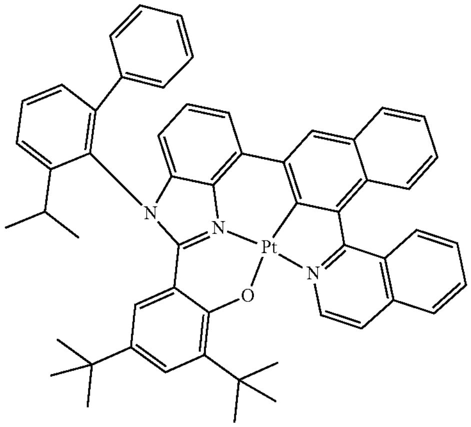
3-437
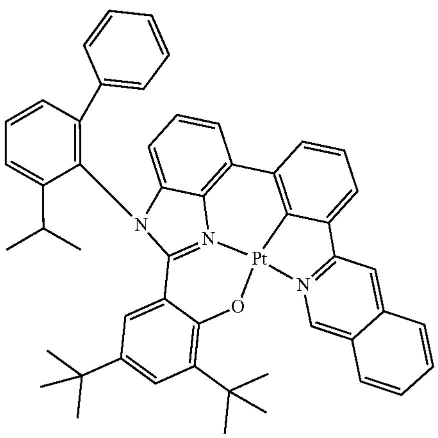
3-438
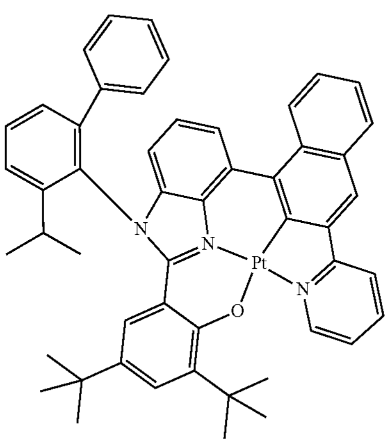
-continued
3-439
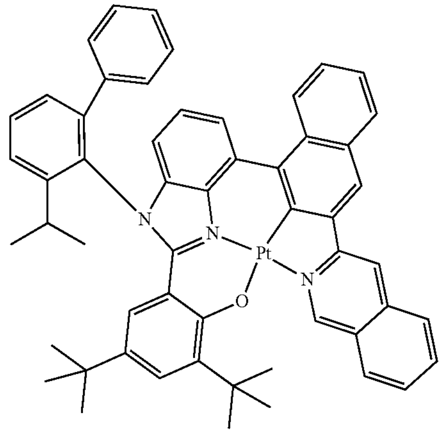
3-440
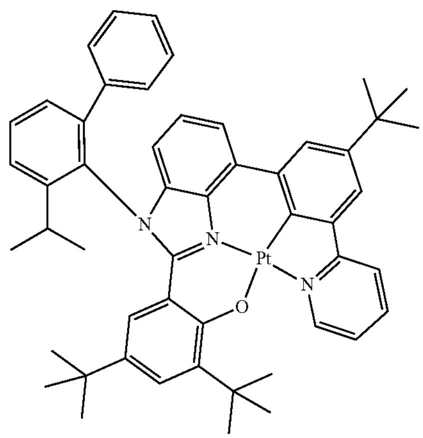
3-441
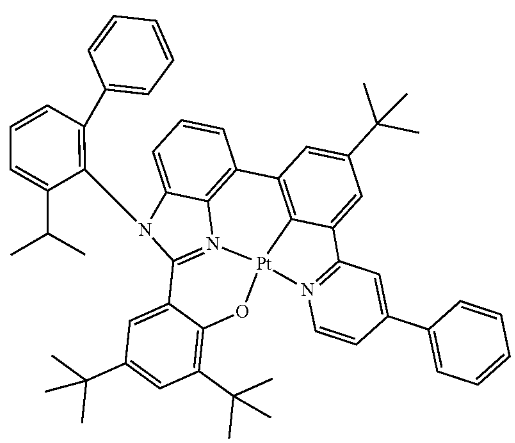

-continued
3-442
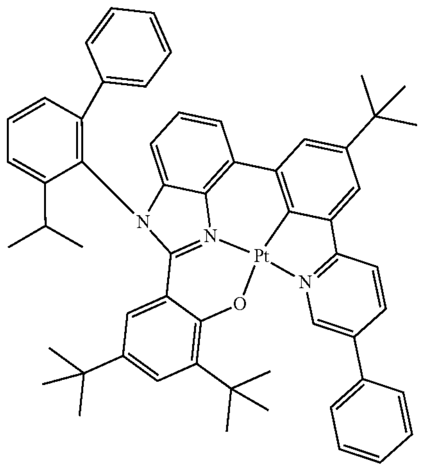
3-443
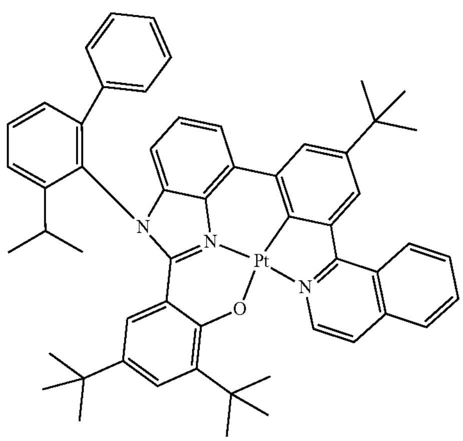
3-444
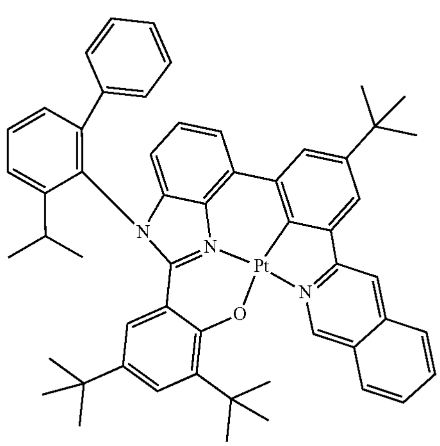
-continued
3-445
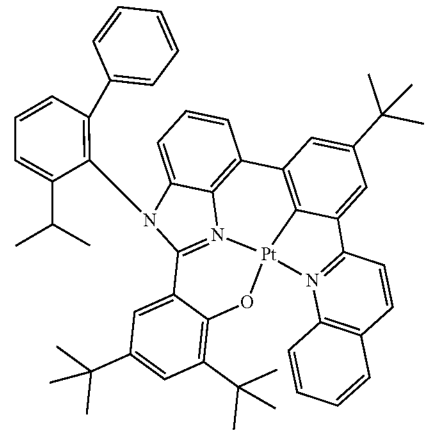
3-446
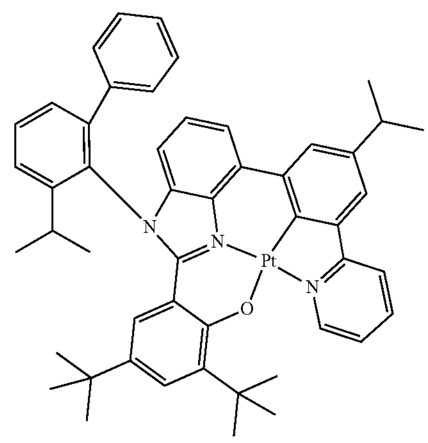
3-447
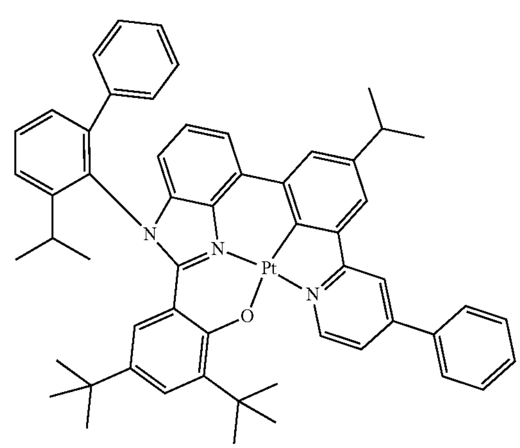

-continued
3-448
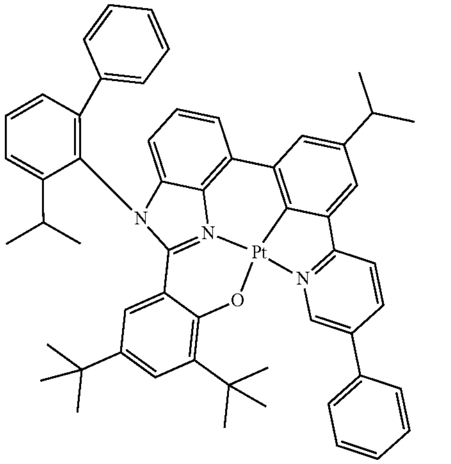
3-449
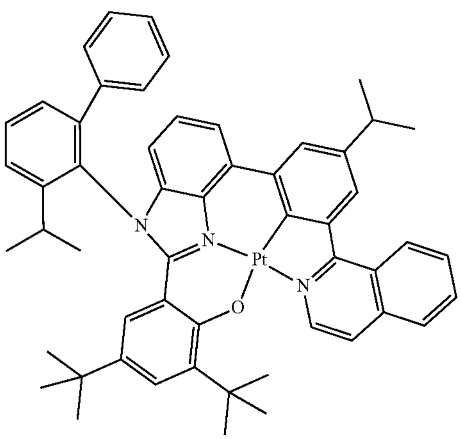
3-450
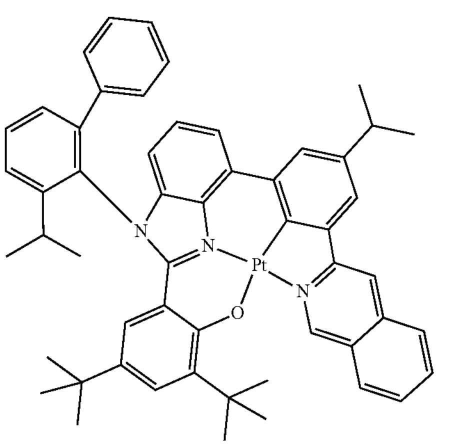
-continued
3-451
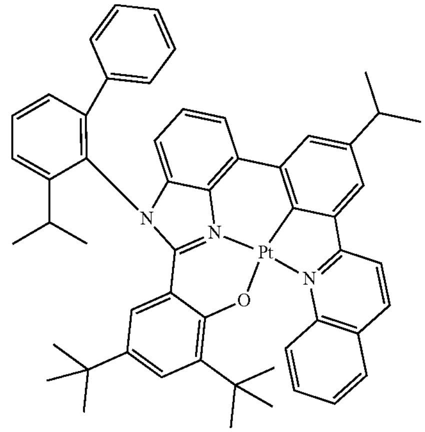
3-452
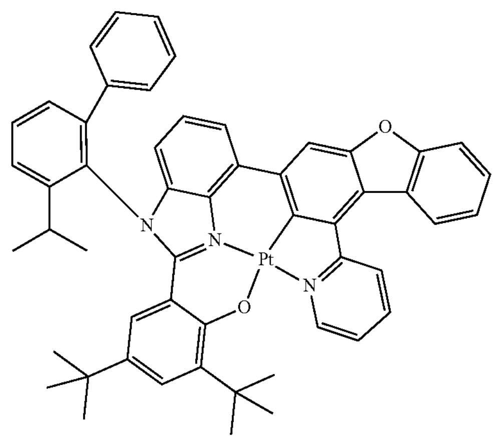
3-453
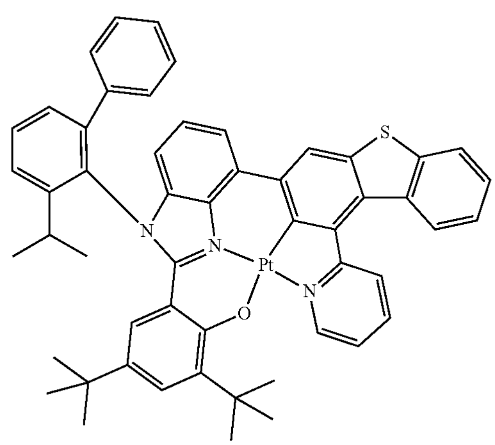

-continued
3-454
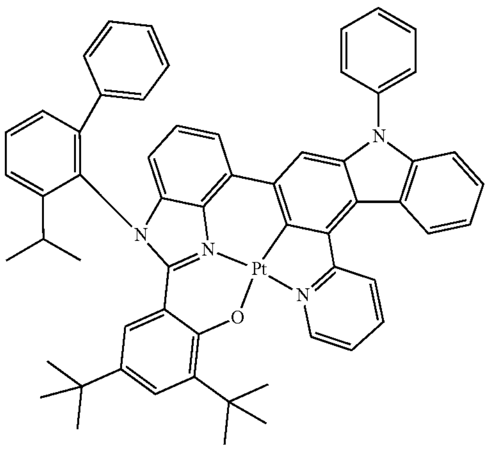
3-455
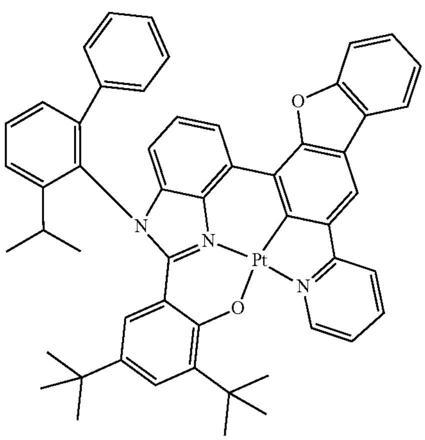
3-456
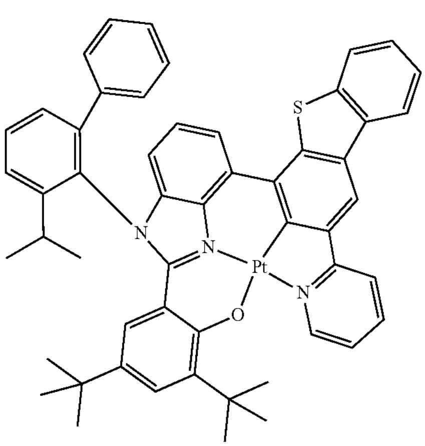
-continued
3-457
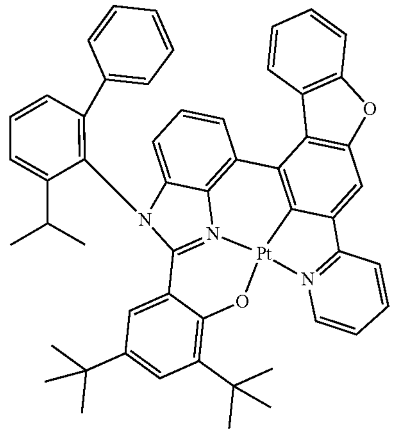
3-458
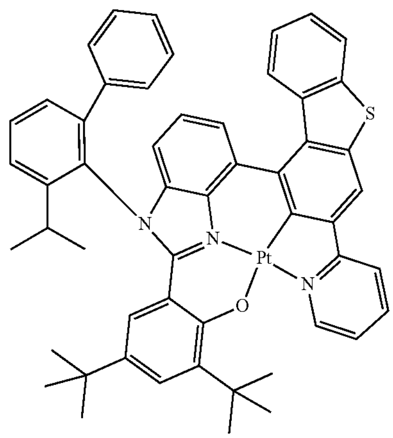
3-459
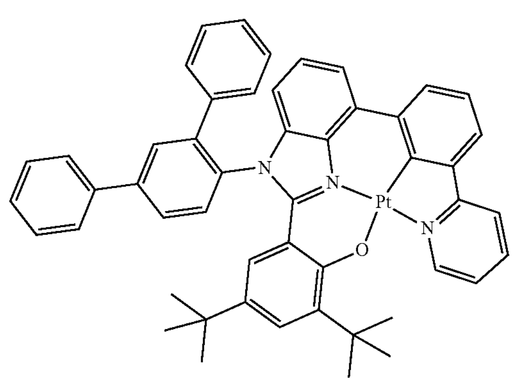

-continued
3-460
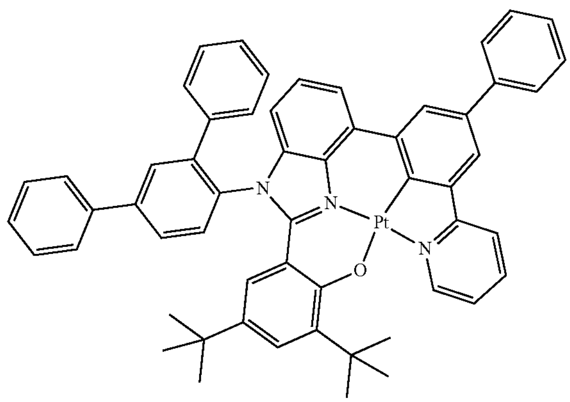
3-461
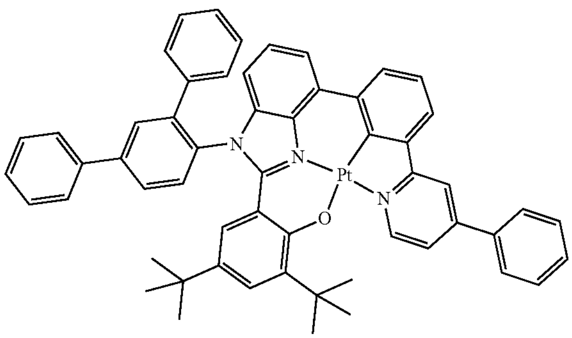
3-462
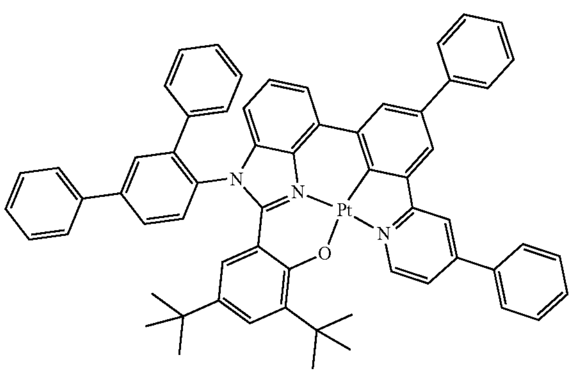
3-463
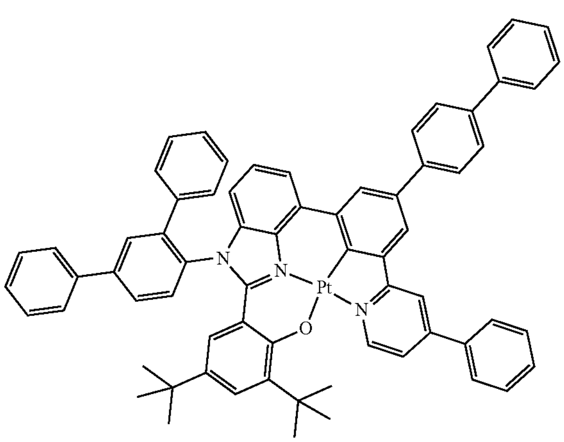
-continued
3-464
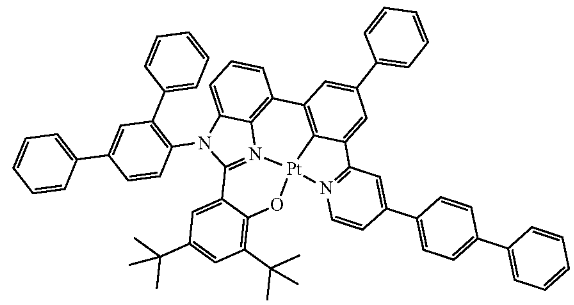
3-465
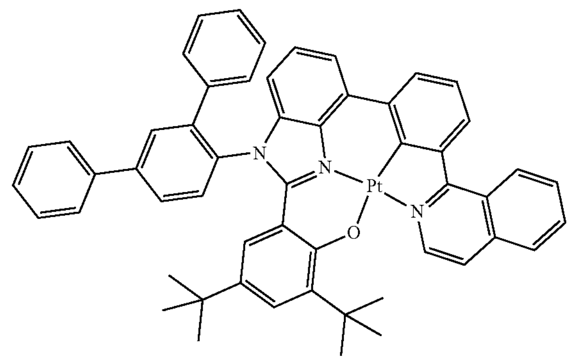
3-466
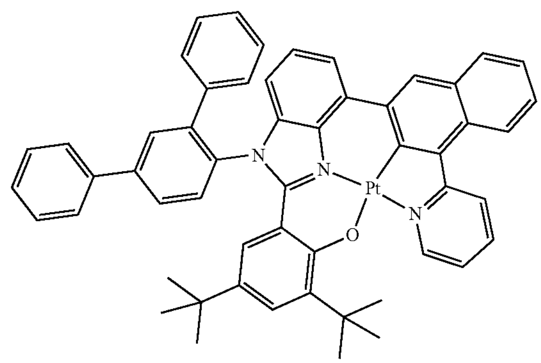
3-467
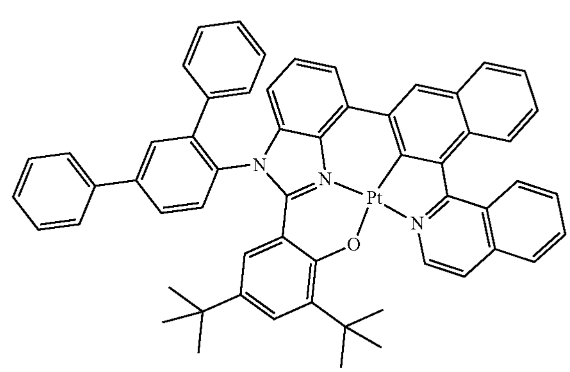

3-468
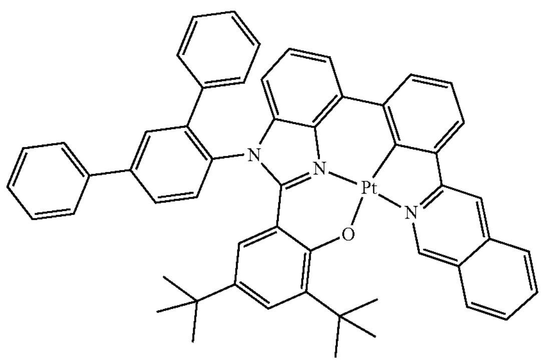
3-469
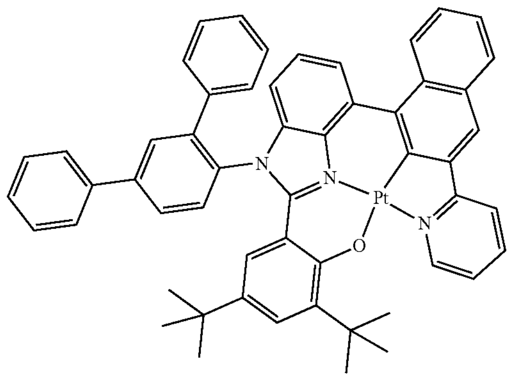
3-470
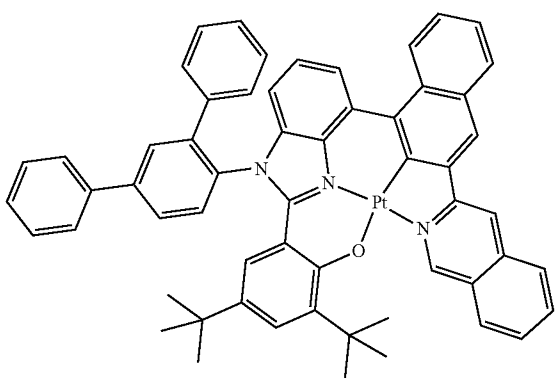
3-471
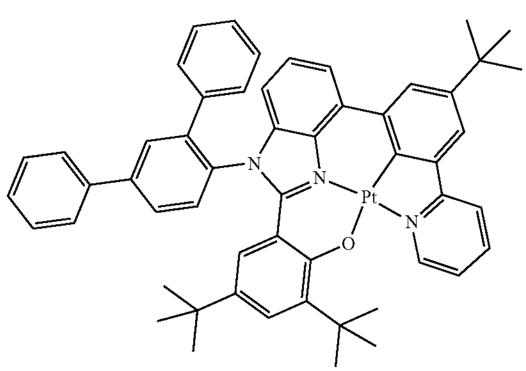
3-472
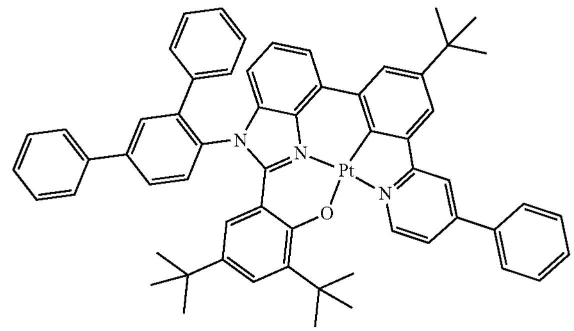
3-473
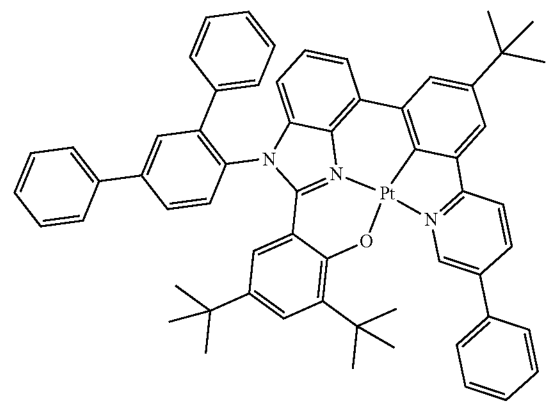
3-474
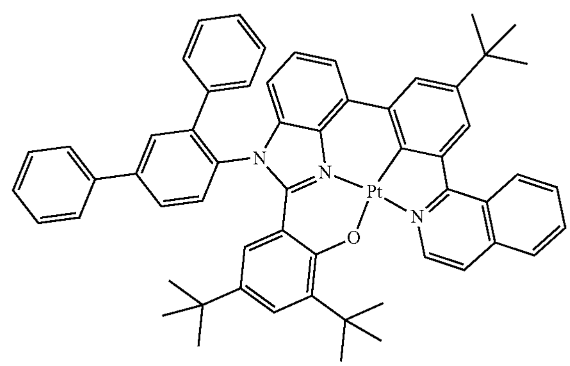
3-475
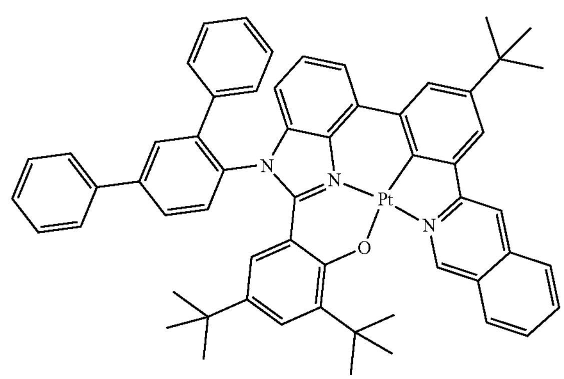

-continued
3-476
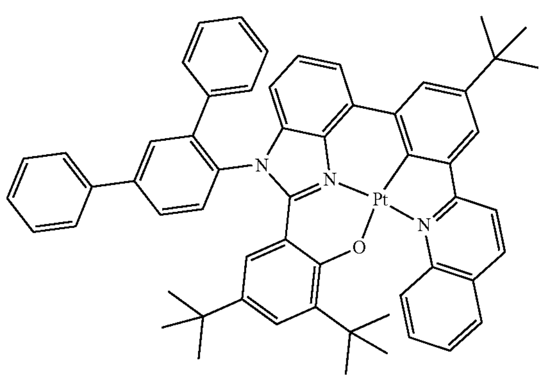
3-477
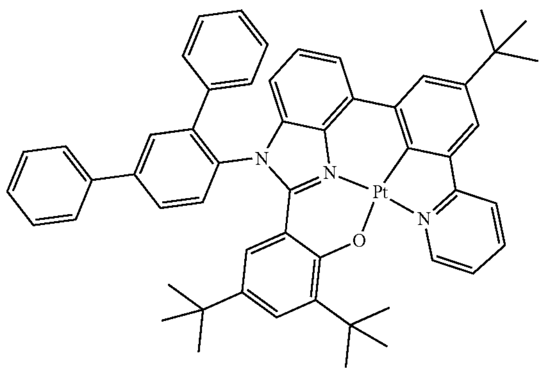
3-478
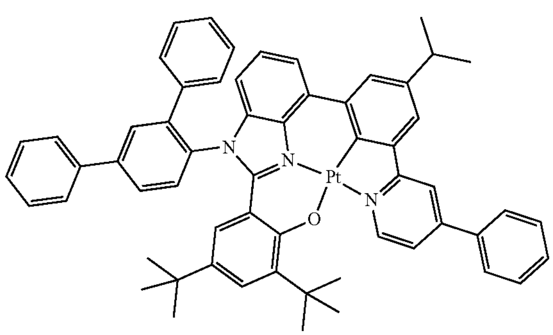
3-479
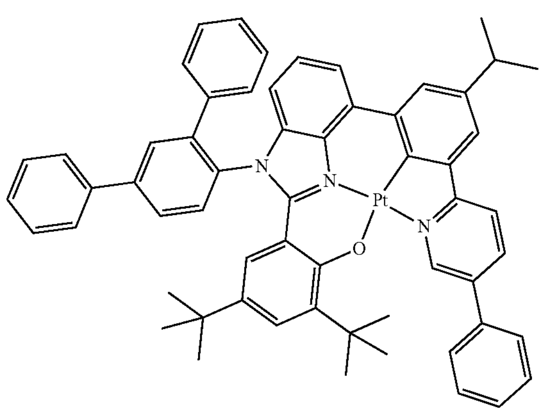
-continued
3-480
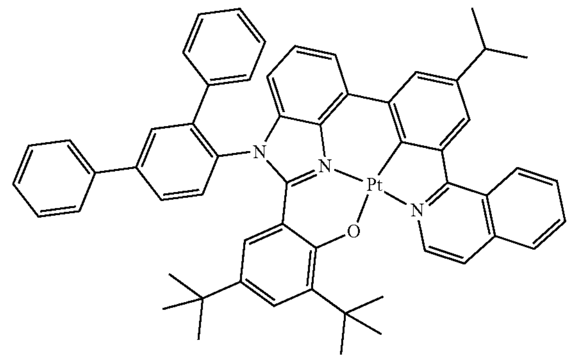
3-481
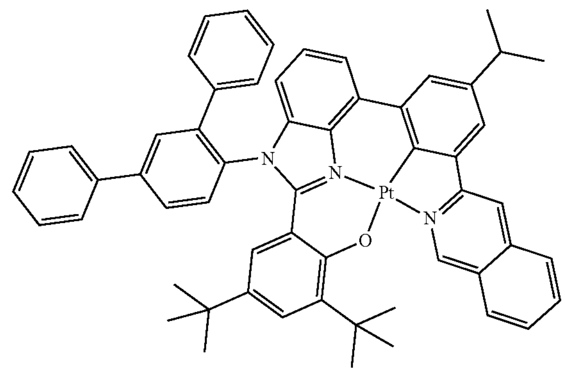
3-482
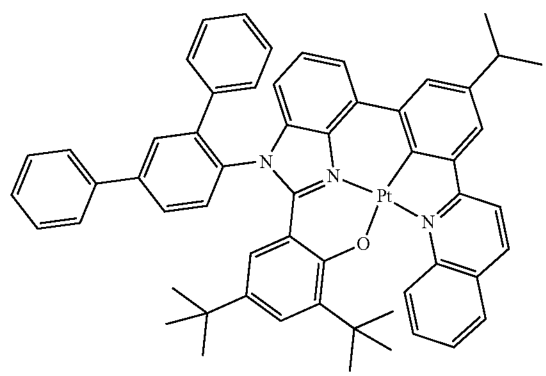
3-483
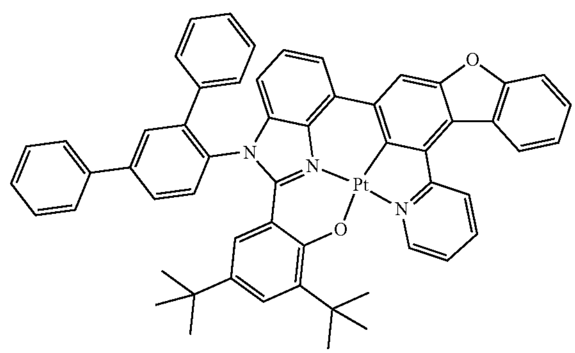

-continued
3-484
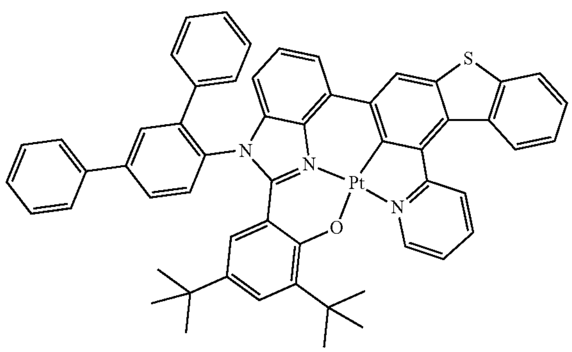
3-485
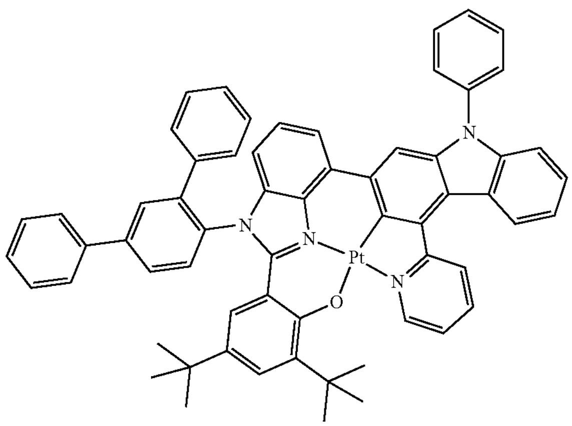
3-486
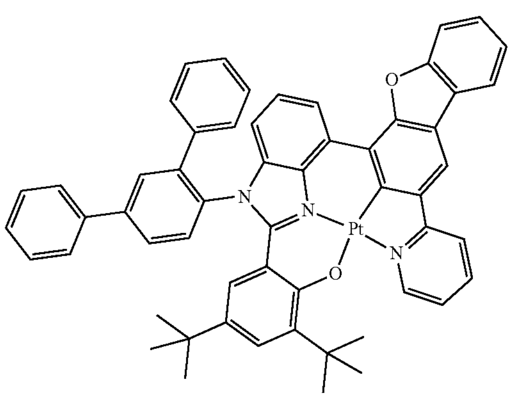
3-487
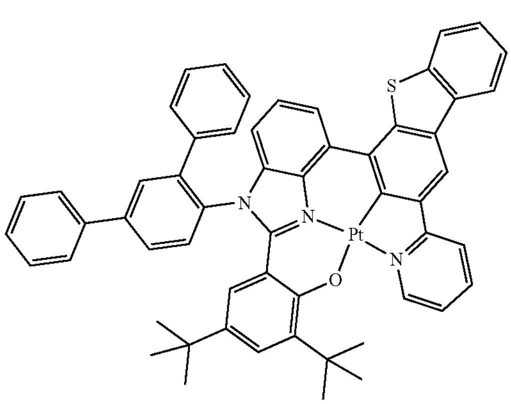
-continued
3-488
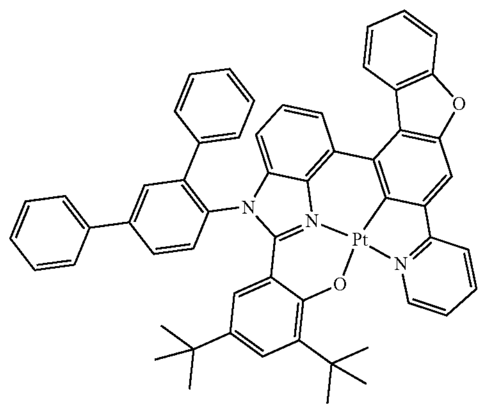
3-489
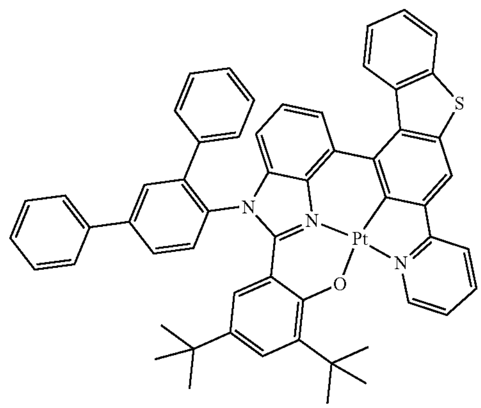
3-490
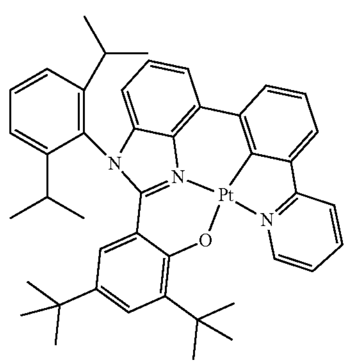
3-491
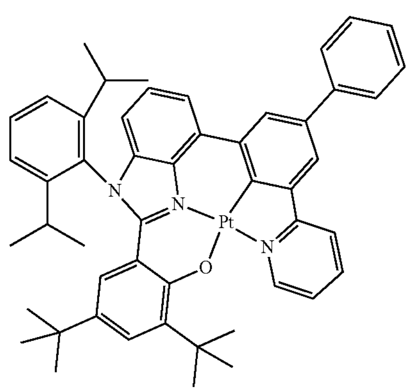

3-492
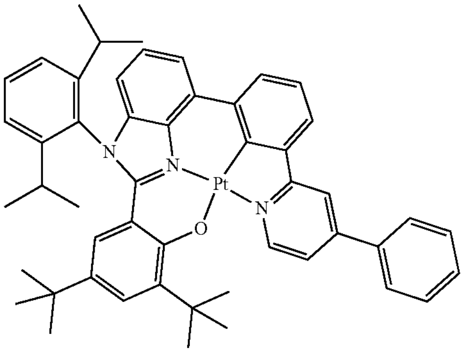
3-493
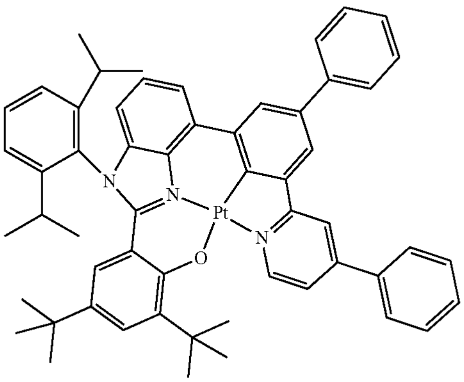
3-494
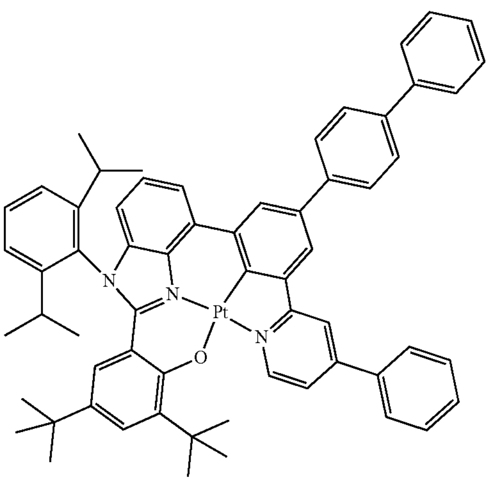
3-495
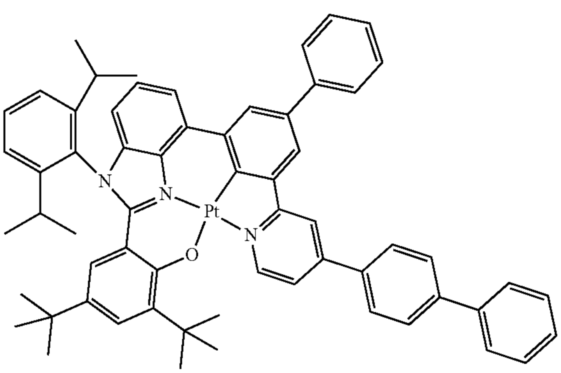
3-496
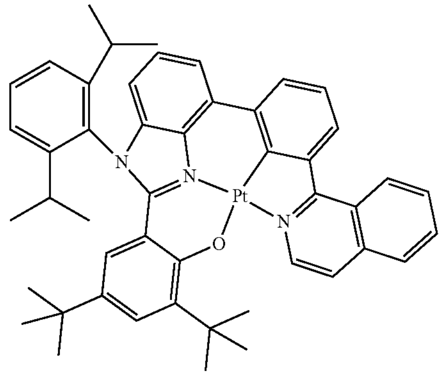
3-497
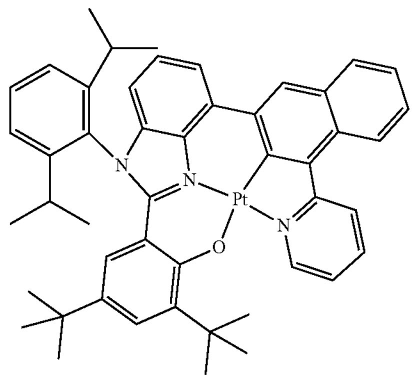
3-498
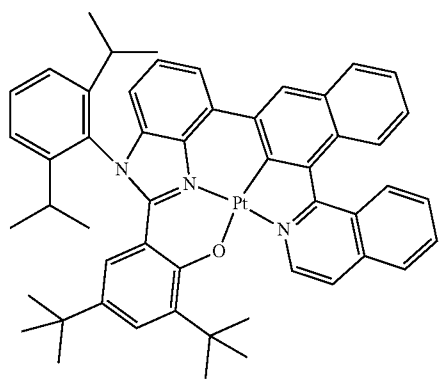
3-499
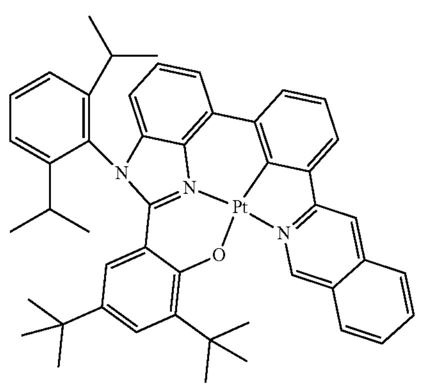

3-500
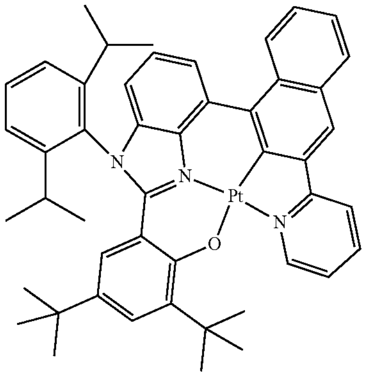
3-501
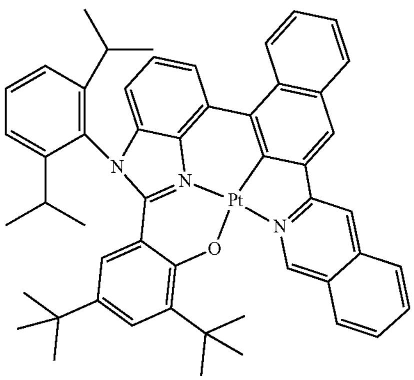
3-502
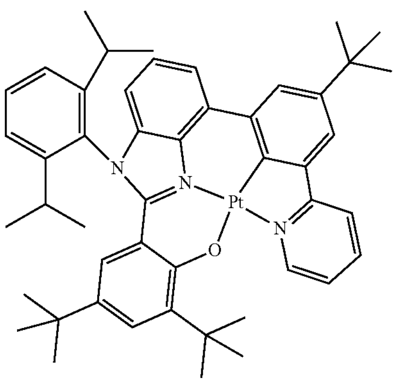
3-503
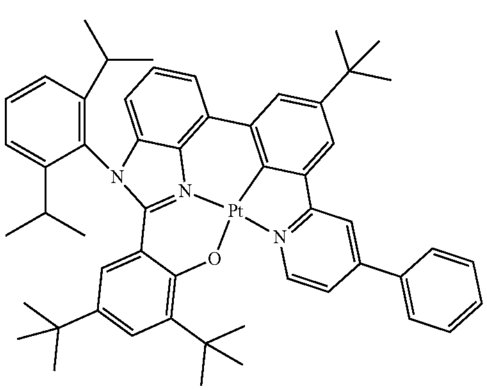
3-504
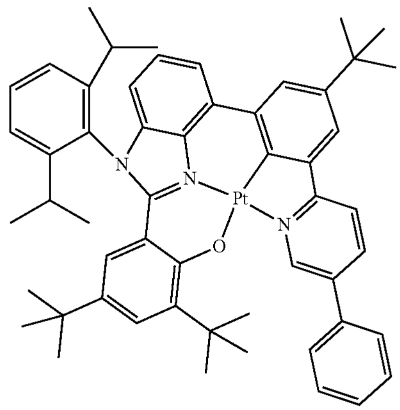
3-505
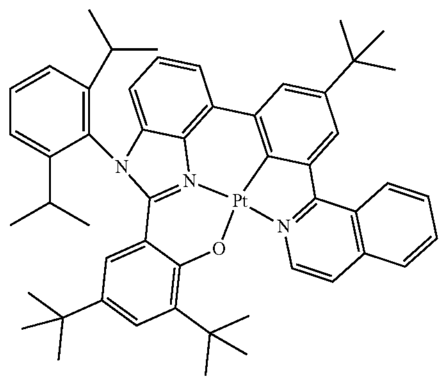
3-506
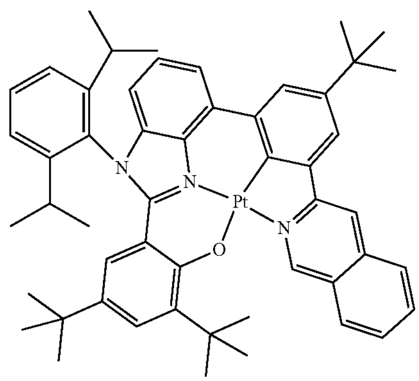
3-507
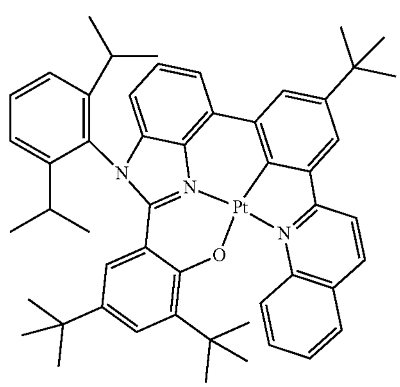

3-508
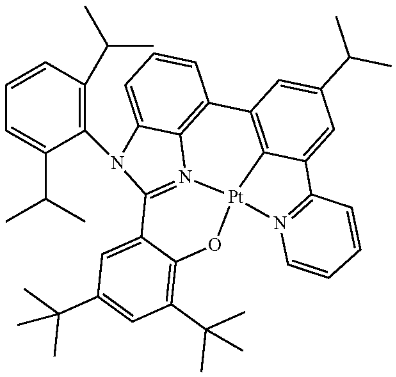
3-509
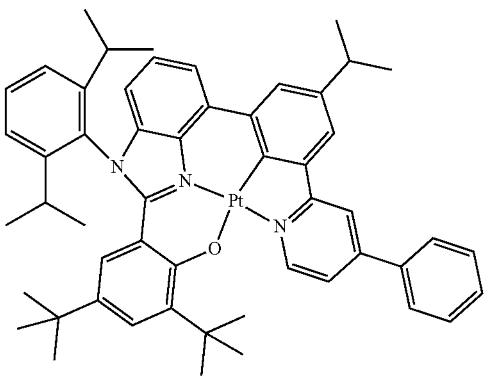
3-510
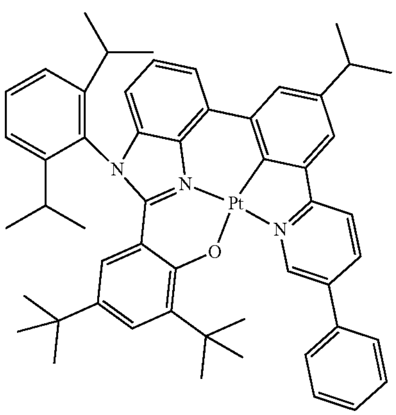
3-511
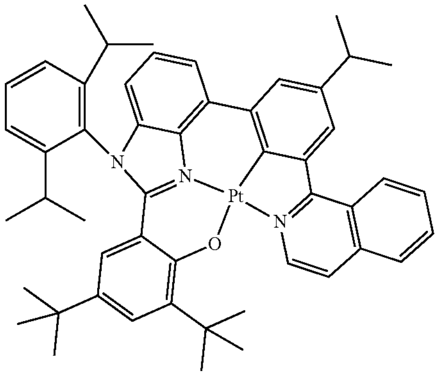
3-512
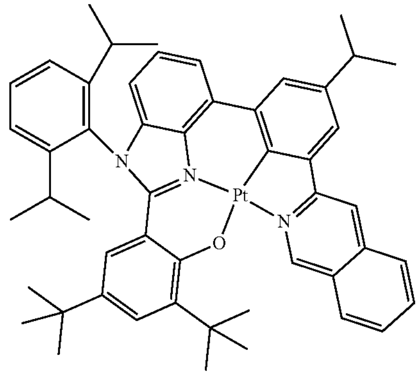
3-513
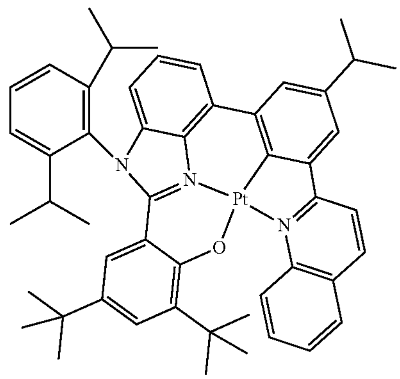
3-514
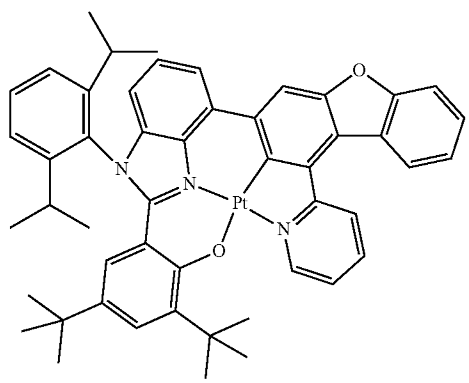
3-515
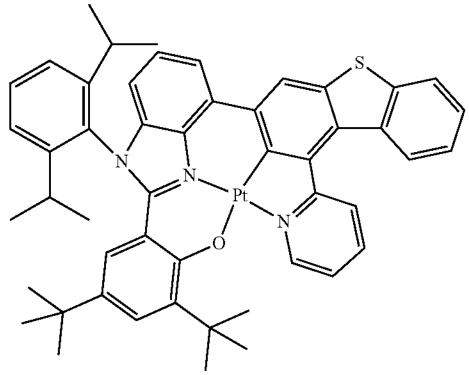

-continued
3-516
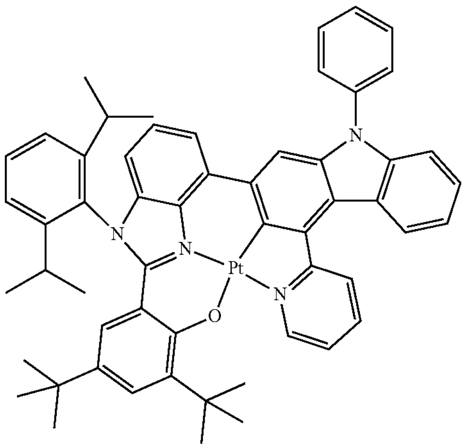
3-517
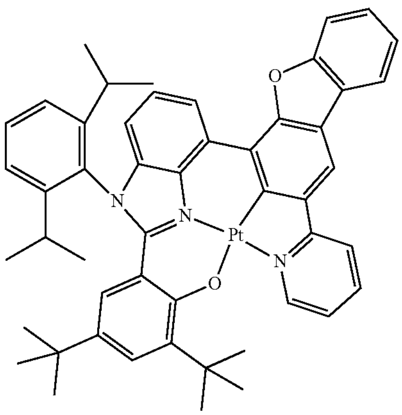
3-518
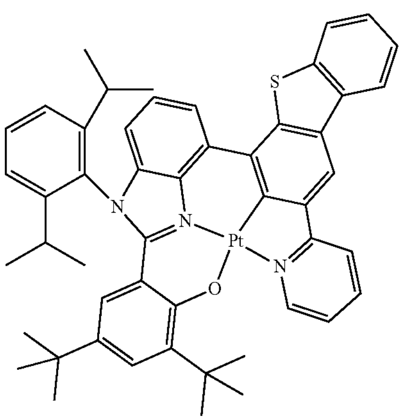
-continued
3-519
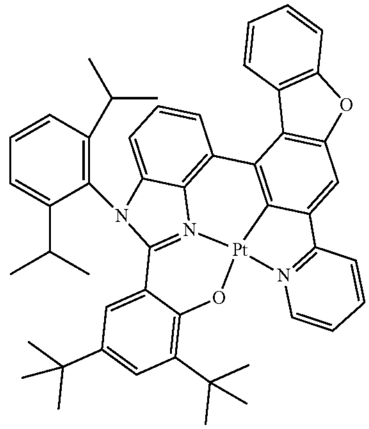
3-520
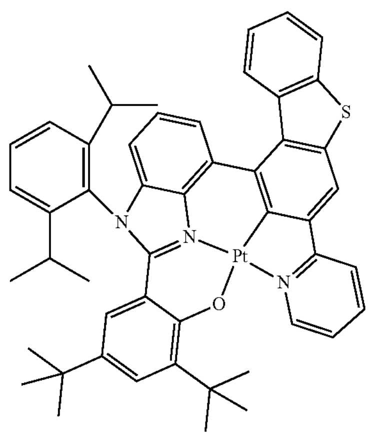
3-521
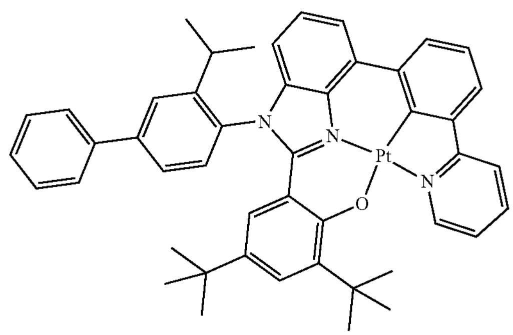
3-522
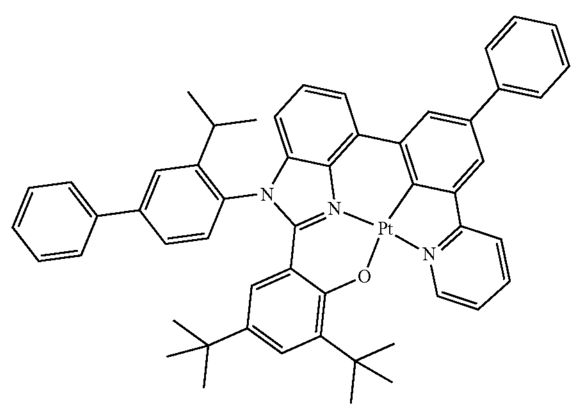

-continued
3-523
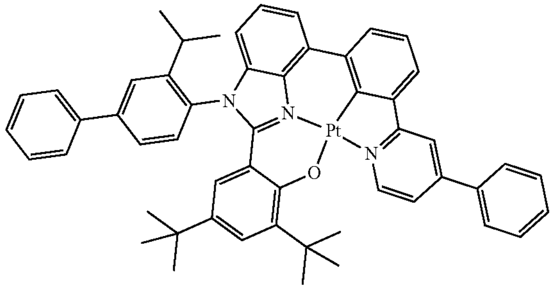
3-524
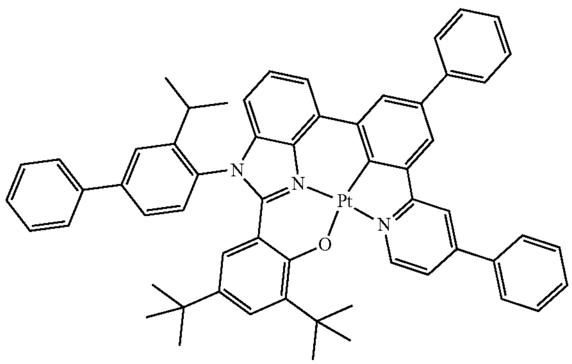
3-525
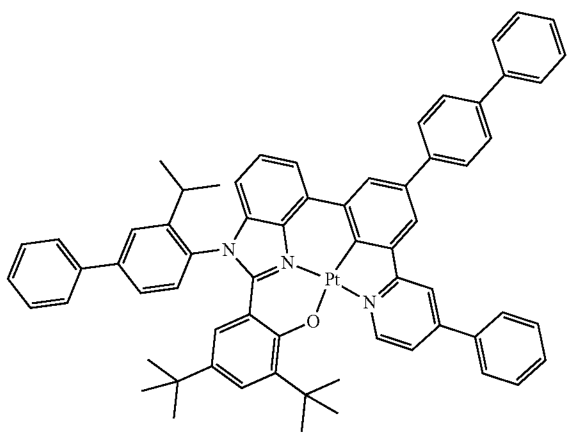
3-526
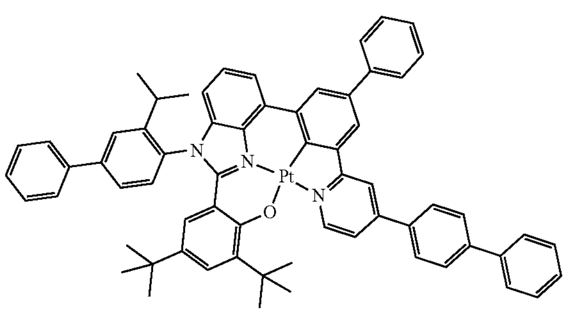
-continued
3-527
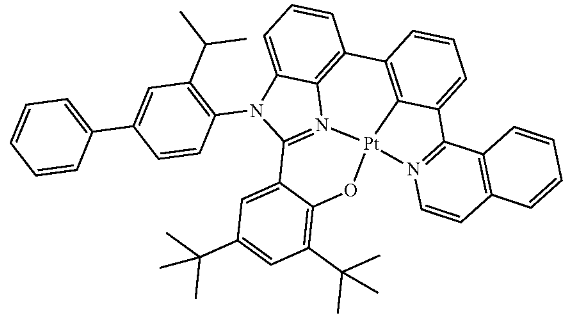
3-528
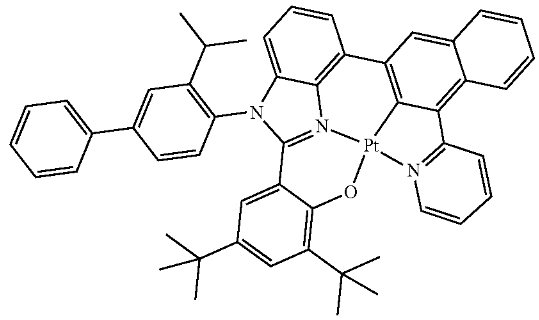
3-529
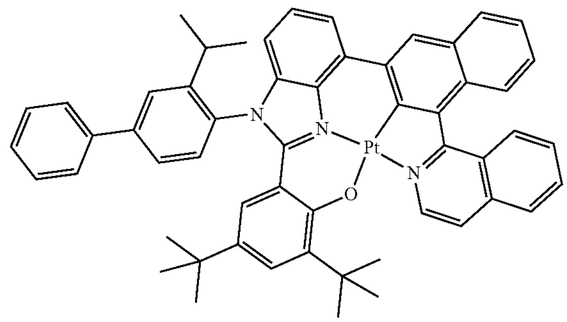
3-530
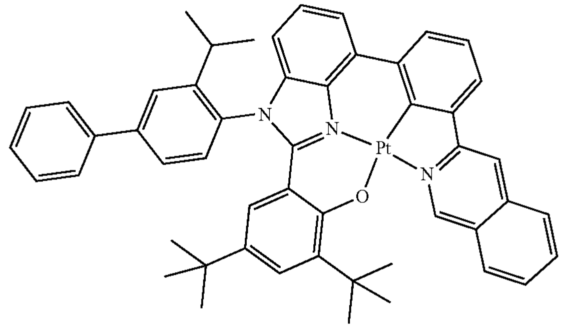

-continued
3-531
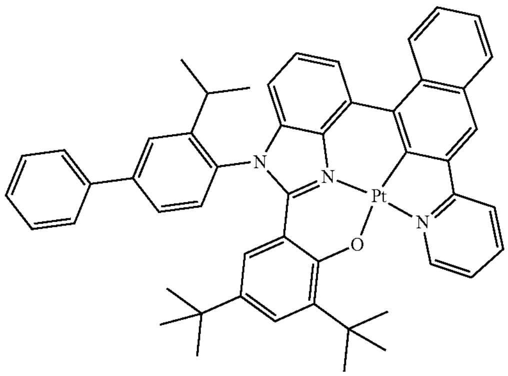
3-532
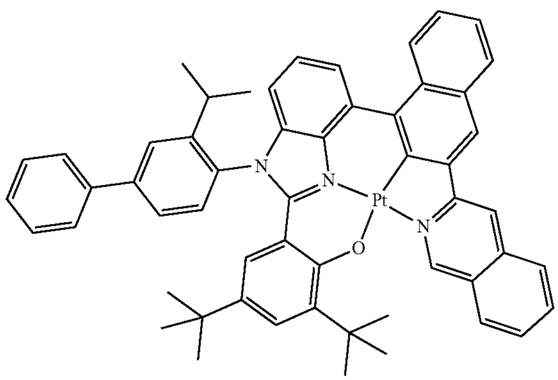
3-533
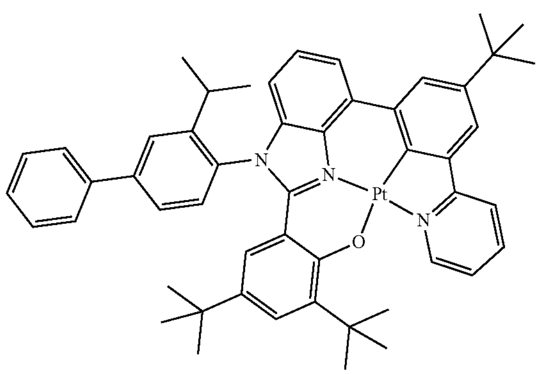
3-534
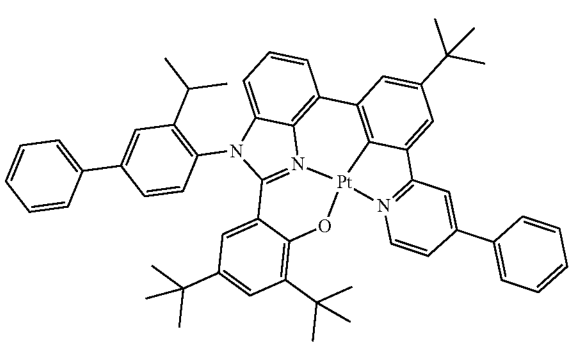
-continued
3-535
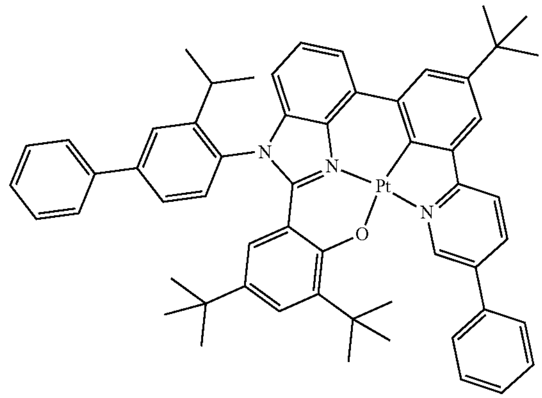
3-536
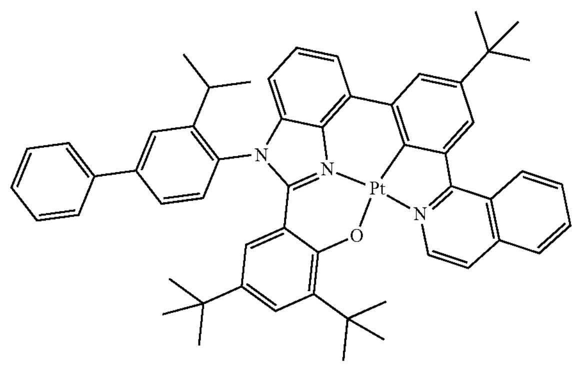
3-537
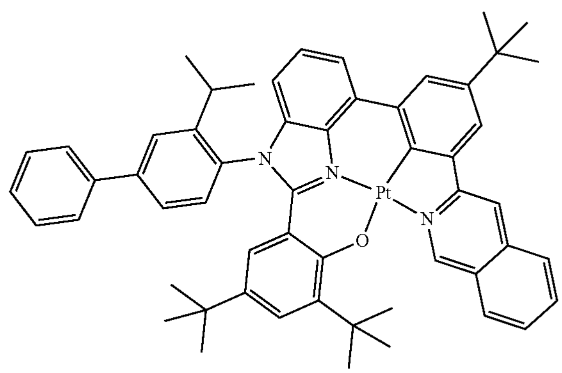
3-538
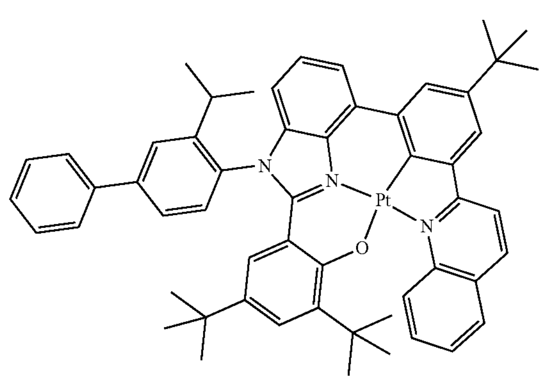

-continued
3-539
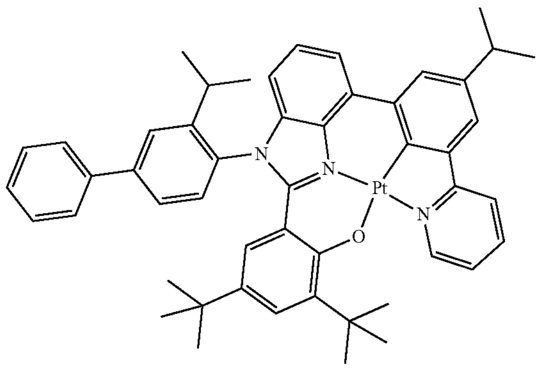
3-540
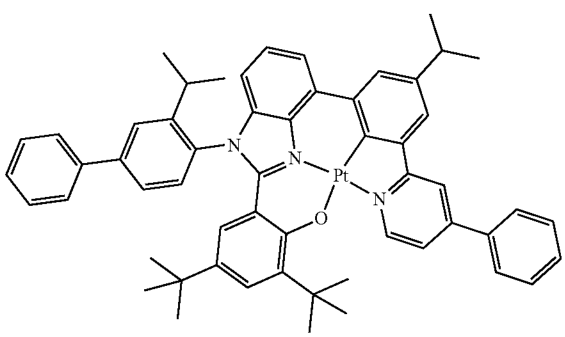
3-541
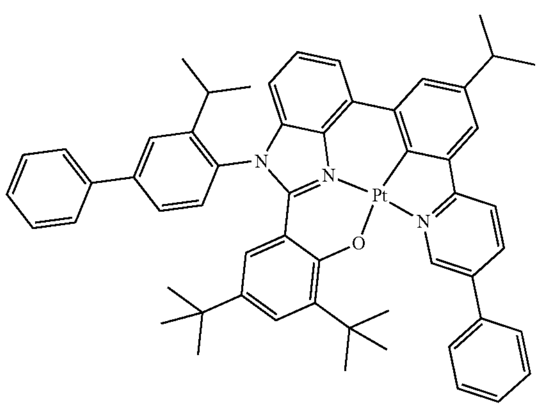
3-542
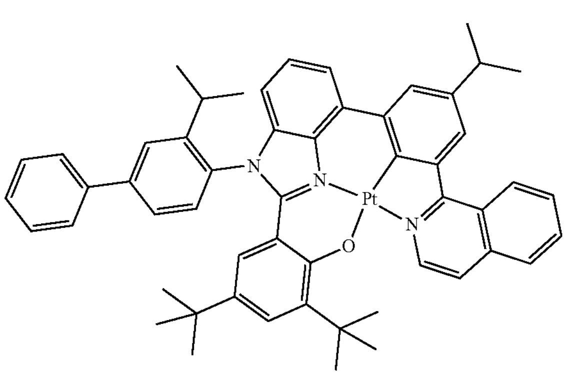
-continued
3-543
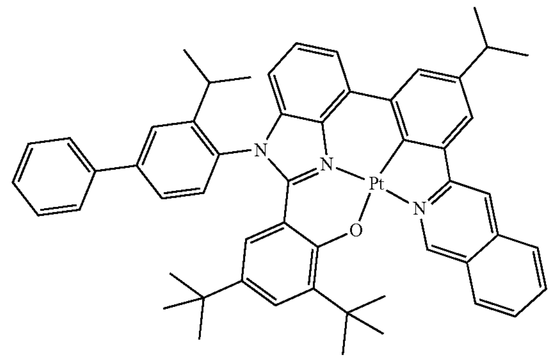
3-544
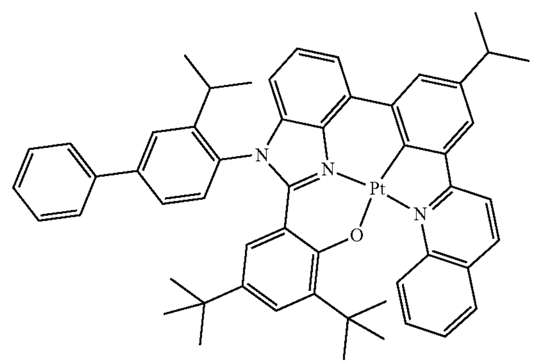
3-545
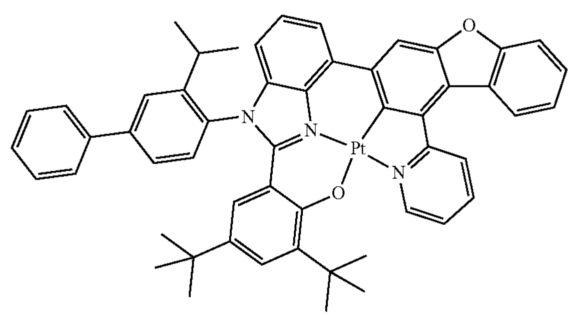
3-546
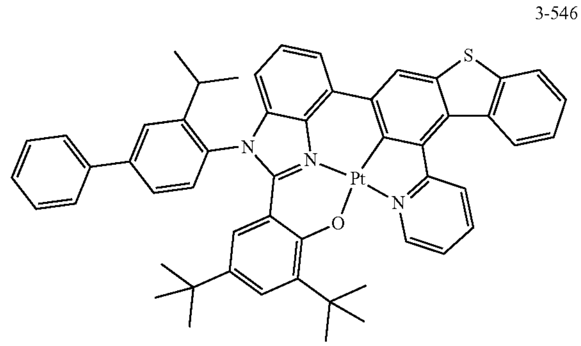

-continued
3-547
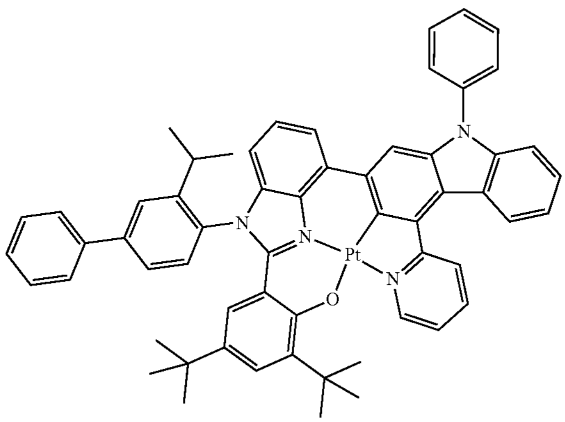
3-548
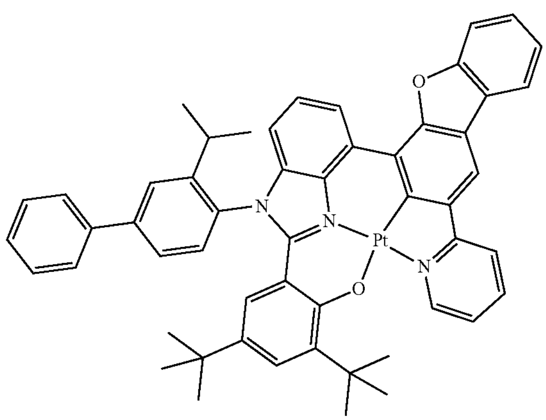
3-549
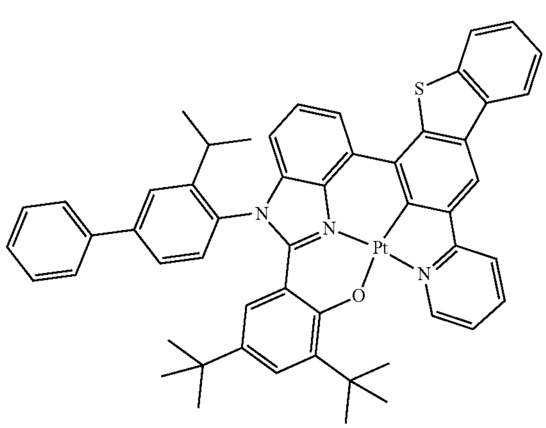
-continued
3-550
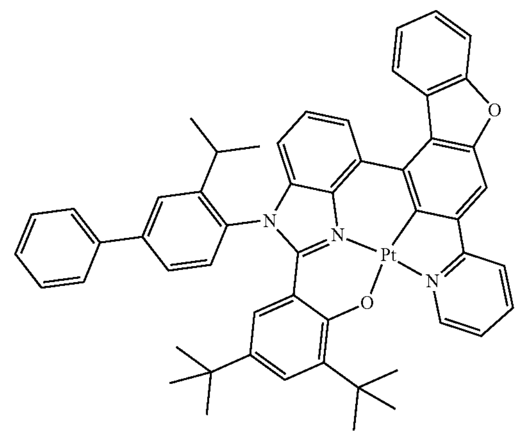
3-551
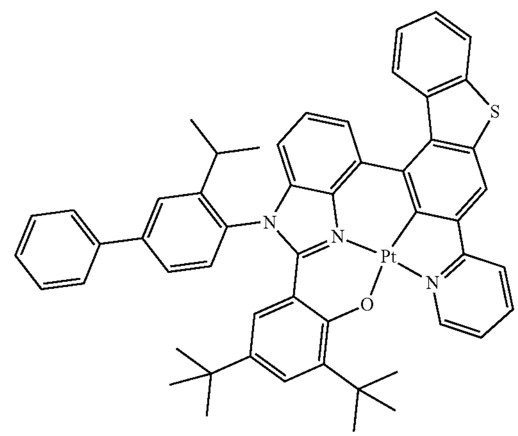
3-552
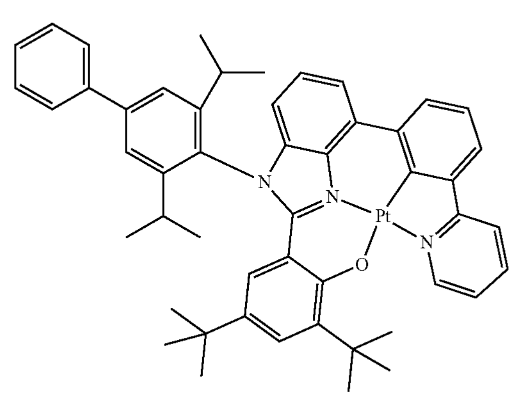

3-553
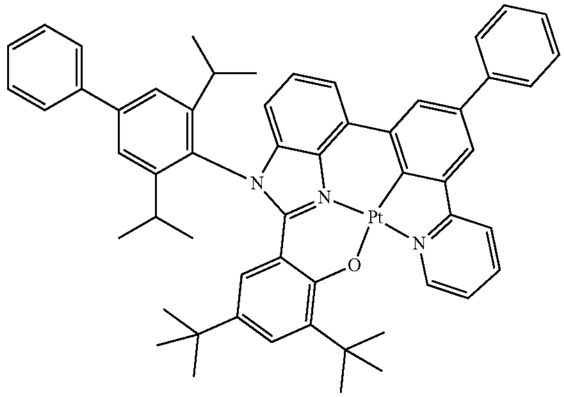
3-554
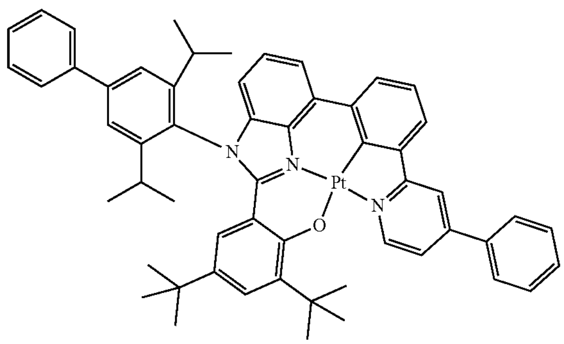
3-555
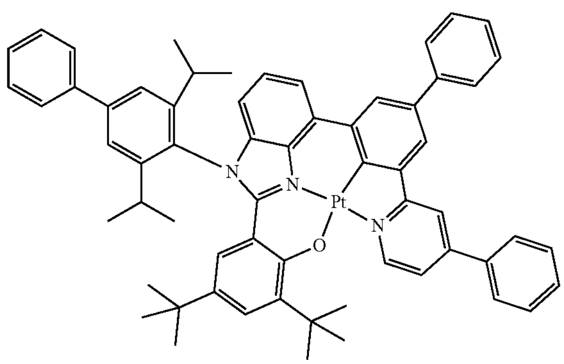
3-556
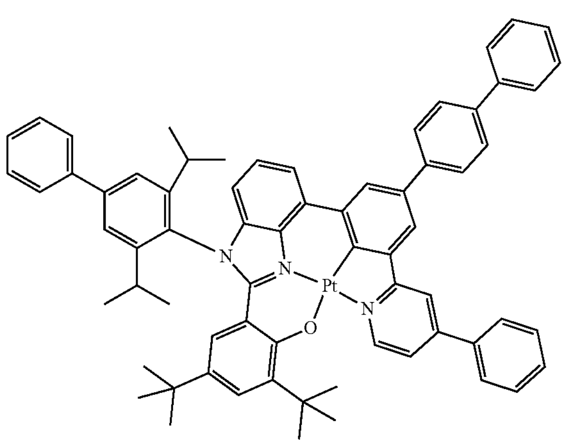
3-557
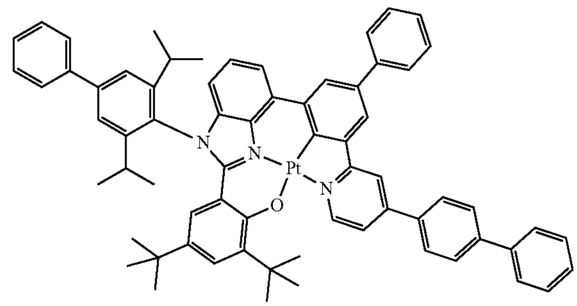
3-558
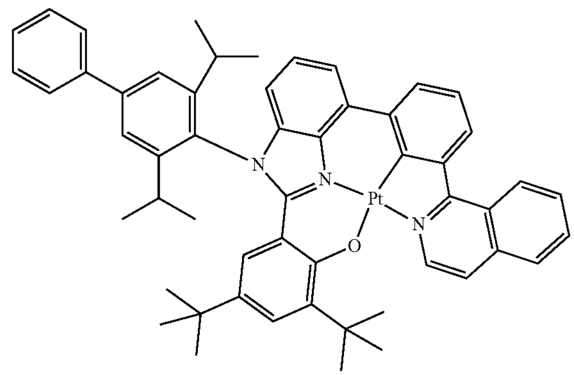
3-559
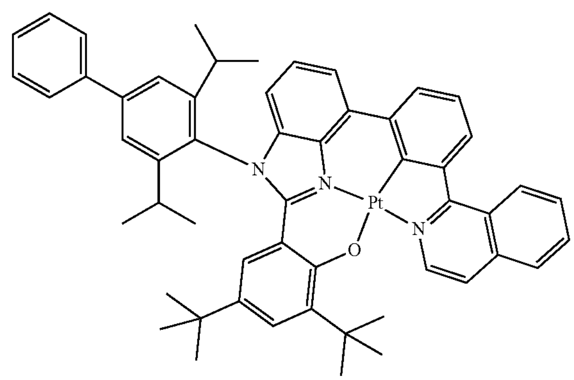
3-559
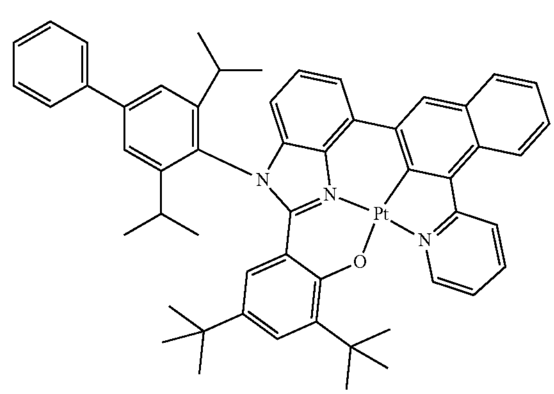

-continued
3-560
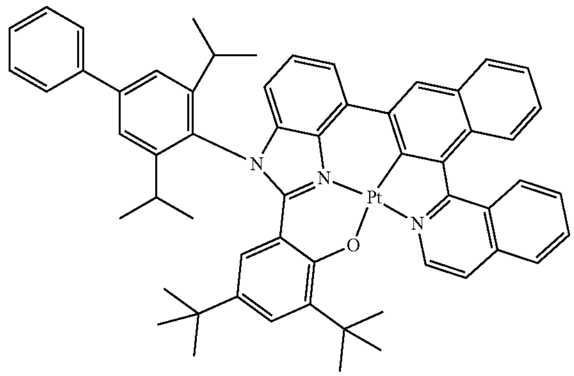
3-561
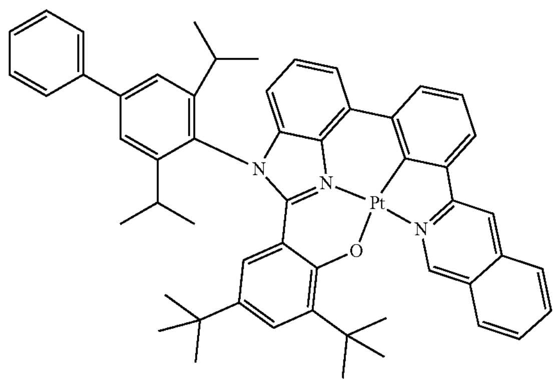
3-562
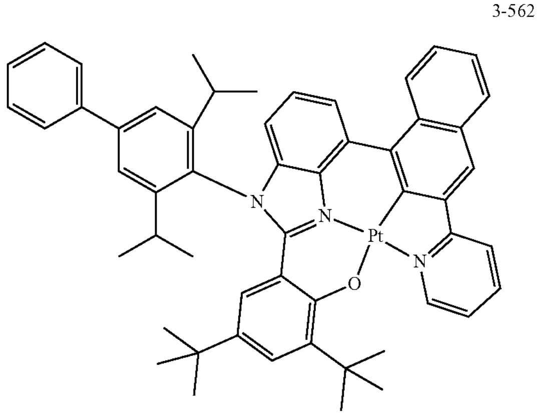
3-563
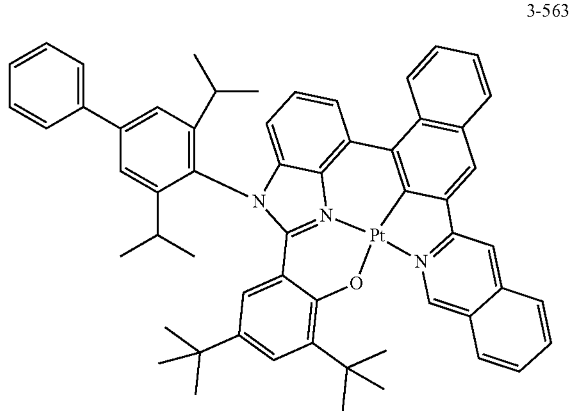
-continued
3-564
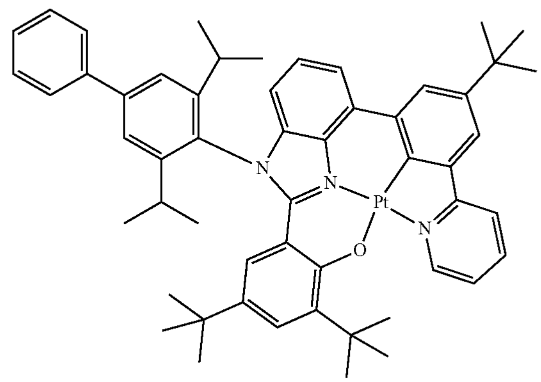
3-565
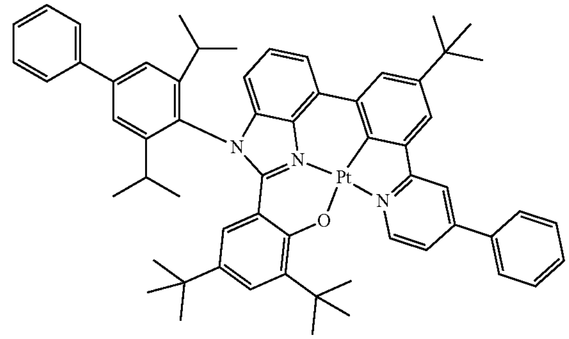
3-566
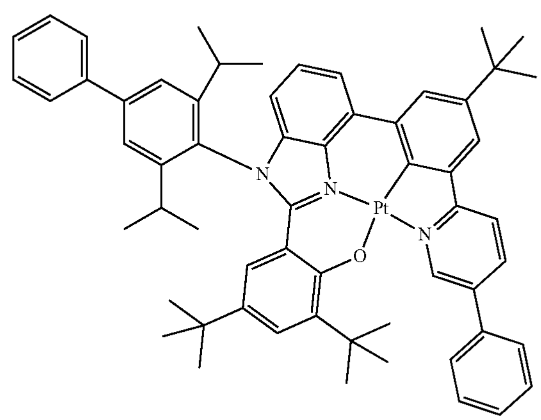
3-567
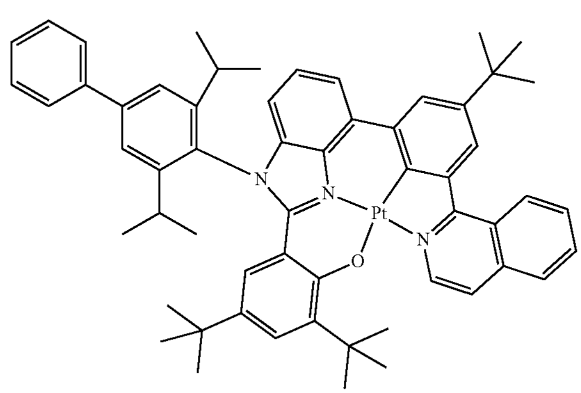

-continued
3-568
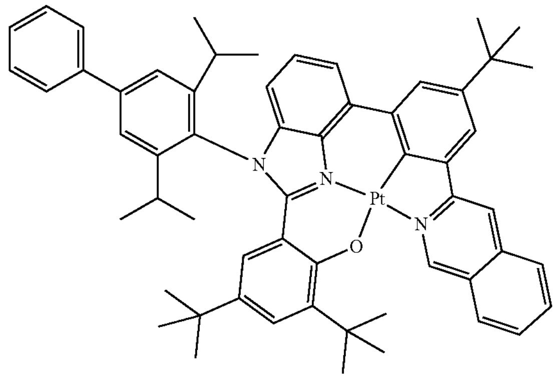
3-569
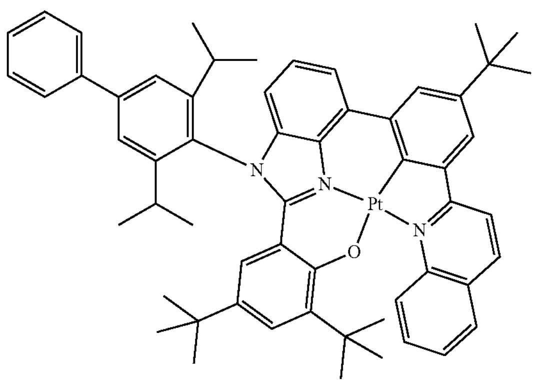
3-570
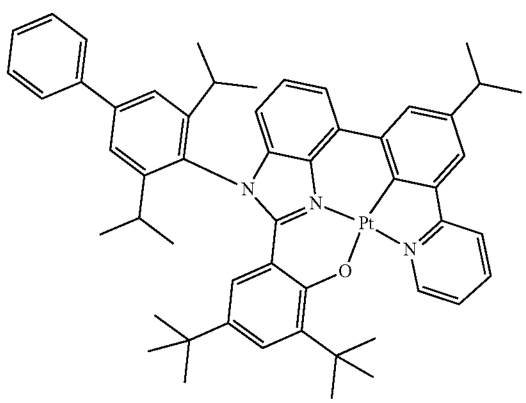
3-571
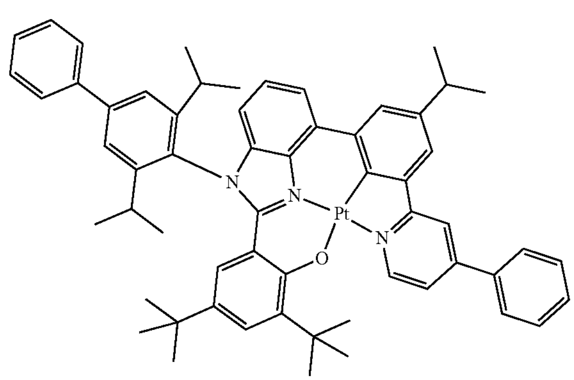
-continued
3-572
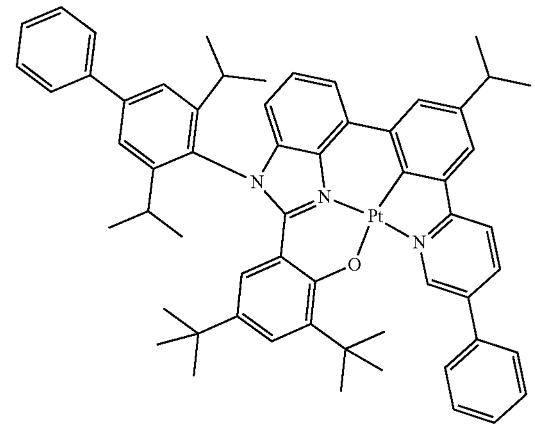
3-573
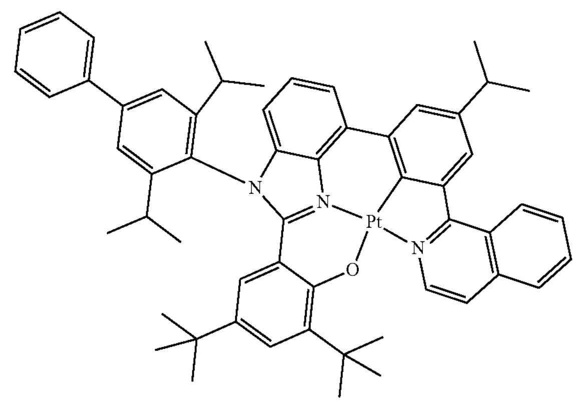
3-574
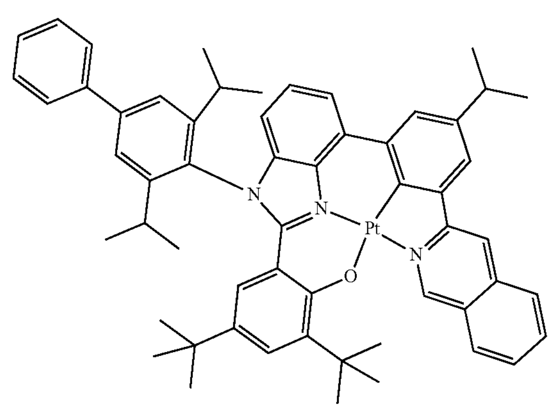

-continued
3-575
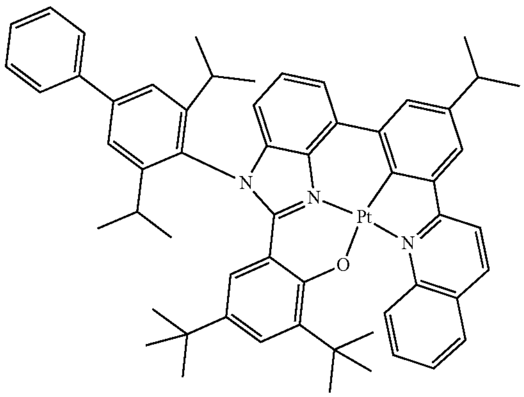
3-576
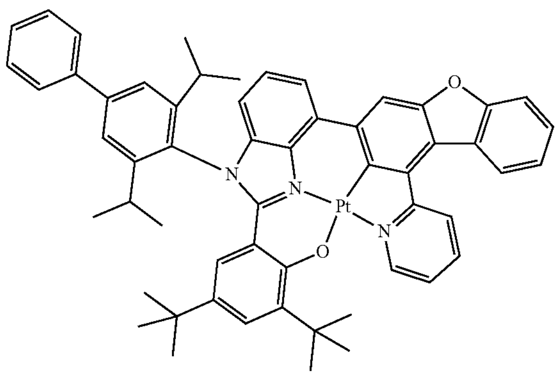
3-577
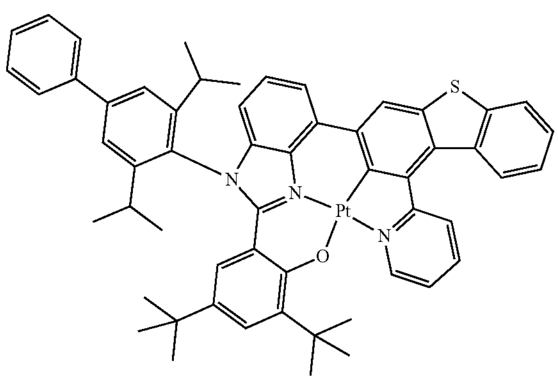
3-578
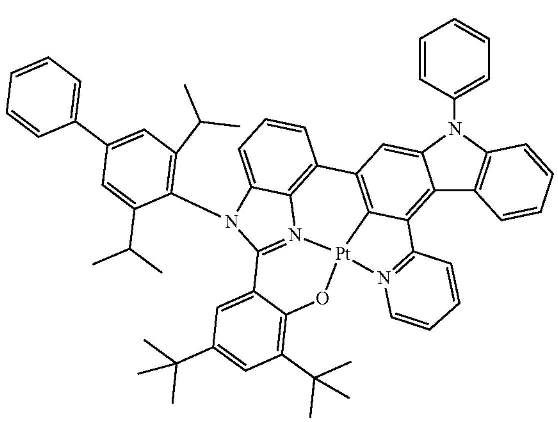
-continued
3-579
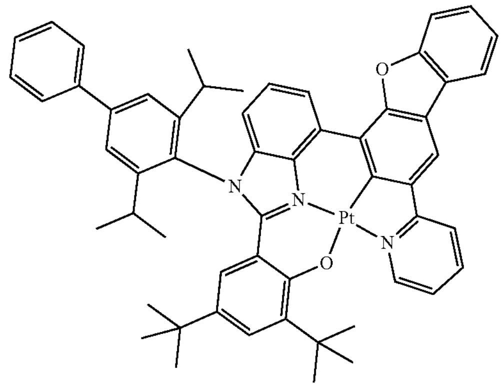
3-580
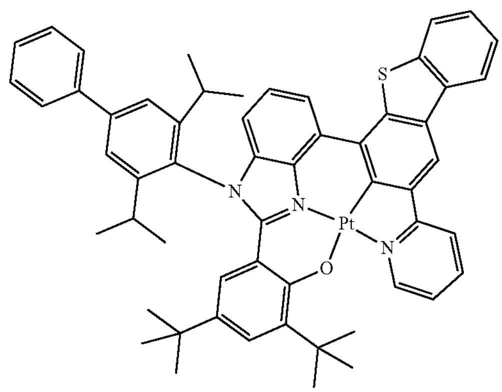
3-581
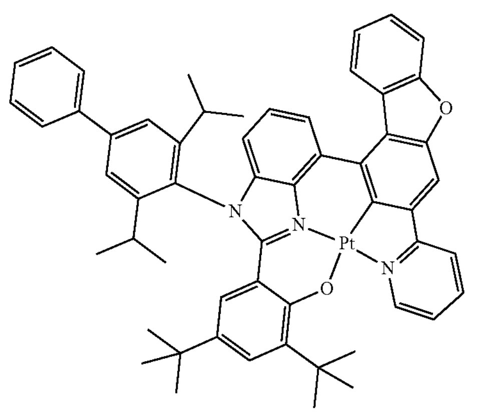
3-582
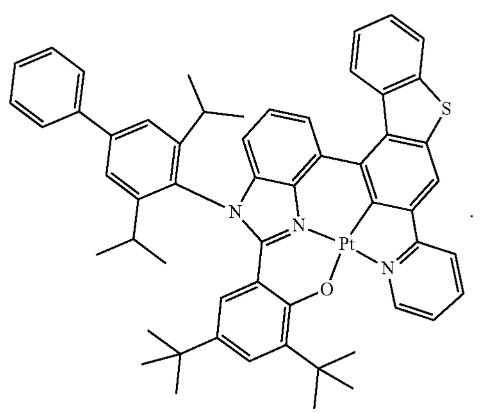

Formula 1A includes a5-membered ring represented by $CY_5$, Formula 1A includes a cyclometallated ring formed by $CY_5$, $CY_2$, $CY_3$, and Min Formula 1A which is a6-membered ring (see Formula 1A'). Accordingly, a stable bond angle may be formed between a tetradentate ligand and a metal in Formula 1A, thereby improving a molecular stability of the organometallic compound represented by Formula 1A:

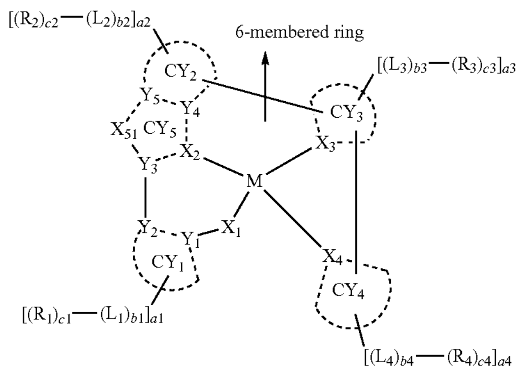

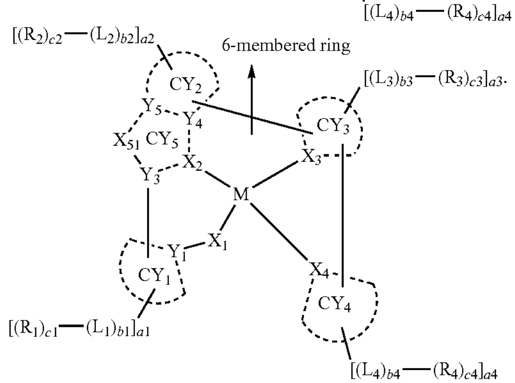

In addition, in Formula 1A, in cases where i) M is Pt, ii) $X_1$ is O, iii) $X_2$ and $X_4$ are each N, $X_3$ is C, a bond between $X_2$ and M and a bond between $X_4$ and M are each a coordinate bond, and a bond between $X_3$ and M is a covalent bond, iv) $Y_1$ to $Y_5$ are each C, v) a bond between $Y_5$ and $X_{51}$ and a bond between $Y_3$ and $X_{51}$ are each a single bond, vi) $CY_1$, $CY_2$, and $CY_3$ are each a benzene group, and $CY_4$ is a pyridine group, vii) $X_{51}$ is O, S, or N-$[(L_7)_{b7}$-$(R_7)_{c7}]$, and viii) b7 is 0, c7 is 1, and $R_7$ is a substituted or unsubstituted $C_1$-$C_{60}$ alkyl group, a1 to a4 may each independently be 1, 2, 3, 4, or 5, and at least one selected from $R_1$ to $R_4$ may be selected from a substituted or unsubstituted $C_3$-$C_{10}$ cycloalkyl group, a substituted or unsubstituted $C_1$-$C_{60}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group. Thus, the organometallic compound represented by Formula 1A may have improved molecular orientation, and in this regard, an electronic device, for example, an organic light-emitting device, which includes the organometallic compound represented by Formula 1A, may have improved efficiency and lifespan.

$X_4$ in Formula 1A may be N. Thus, the organometallic compound represented by Formula 1A may emit a phosphorescent light emission having a high luminescent efficiency due to a intermolecular charge transfer mechanism.

Furthermore, $CY_4$ in Formula 1A may not be a benzimidazole group. In an embodiment, $CY_4$ in Formula 1A may be selected from a) 6-membered ring, b) a condensed ring having two or more 6-membered rings that are condensed to each other, and c) a condensed ring having two or more 6-membered rings and one 5-membered ring that are condensed to each other, wherein the 6-membered ring may be selected from a cyclohexane group, a cyclohexene group, an adamantane group, a norbornane group, a norbornene group, a benzene group, a pyridine group, a pyrimidine group, a pyrazine group, a pyridazine group, and a triazine group, and the 5-membered ring may be selected from a cyclopentane group, a cyclopentene group, a cyclopentadiene group, a furan group, a thiophene group, a silole group, a pyrrole group, a pyrazole group, an imidazole group, a triazole group, an oxazole group, an isooxazole group, a thiazole group, an isothiazole group, an oxadiazole group, and a thiadiazole group. Thus, the organometallic compound represented by Formula 1A may emit a phosphorescent light emission having a high luminescent efficiency due to an intermolecular charge transfer mechanism.

For example, a highest occupied molecular orbital (HOMO) energy level, a lowest unoccupied molecular orbital (LUMO) energy level, a singlet ($S_1$) energy level, and a triplet ($T_1$) energy level of each of Compounds 1-28, 1-30, 1-17, 1-9, and 1-12 were evaluated by using a density functional theory (DFT) method of a Gaussian program (a structure was optimized at a B3LYP, 6-31G(d,p) level). Evaluation results thereof are shown in Table 1.

TABLE 1

| Compound No. | HOMO (eV) | LUMO (eV) | $S_1$ energy level (eV) | $T_1$ energy level (eV) |
|---|---|---|---|---|
| 1-28 | −4.869 | −1.589 | 2.728 | 2.472 |
| 1-30 | −4.994 | −1.793 | 2.661 | 2.439 |
| 1-17 | −4.794 | −1.528 | 2.721 | 2.47 |
| 1-9 | −4.782 | −1.528 | 2.719 | 2.466 |
| 1-12 | −4.813 | −1.598 | 2.693 | 2.395 |

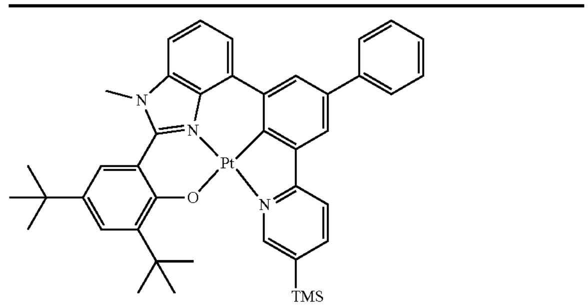

1-28

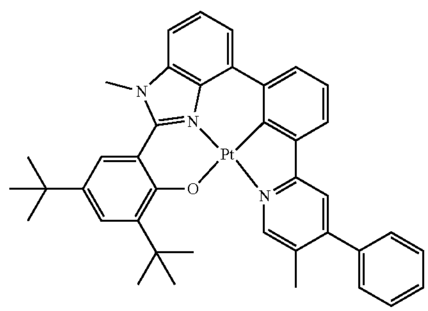

1-30

TABLE 1-continued

| Compound No. | HOMO (eV) | LUMO (eV) | $S_1$ energy level (eV) | $T_1$ energy level (eV) |
|---|---|---|---|---|

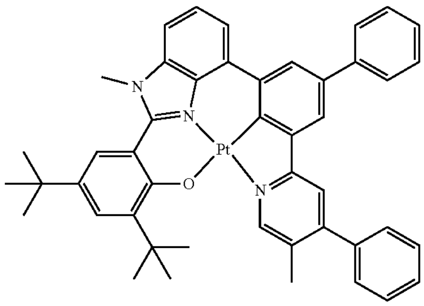

1-17

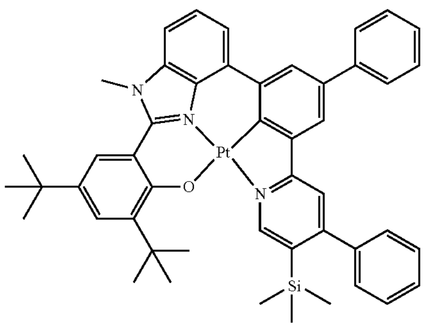

1-9

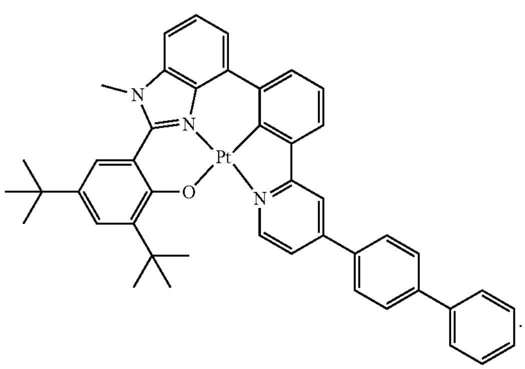

1-12

Referring to Table 1, it has been determined that the organometallic compound represented by Formula 1A has electrical characteristics suitable for use as a dopant of an electronic device, for example, an organic light-emitting device.

Synthesis methods of the organometallic compound represented by Formula 1A may be recognizable by one of ordinary skill in the art by referring to Synthesis Examples provided below.

The organometallic compound represented by Formula 1A is suitable for use in an organic layer of an organic light-emitting device, for example, for use as a dopant in an emission layer of the organic layer. Thus, another aspect of the present disclosure provides an organic light-emitting device that includes: a first electrode; a second electrode; and an organic layer that is disposed between the first electrode and the second electrode and includes an emission layer, wherein the organic layer includes at least one of the organometallic compound represented by Formula 1A.

The organic light-emitting device may have, due to the inclusion of an organic layer including the organometallic compound represented by Formula 1A, a low driving voltage, high efficiency, high power, high quantum efficiency, a long lifespan, a low roll-off ratio, and excellent color purity.

The organometallic compound represented by Formula 1A may be used between a pair of electrodes of an organic light-emitting device. For example, the organometallic compound represented by Formula 1A may be included in the emission layer. In this regard, the organometallic compound may act as a dopant, and the emission layer may further include a host (that is, an amount of the organometallic compound represented by Formula 1A is smaller than an amount of the host).

The expression "(an organic layer) includes at least one of organometallic compounds" as used herein may include an embodiment in which "(an organic layer) includes identical organometallic compounds represented by Formula 1A" and an embodiment in which "(an organic layer) includes two or more different organometallic compounds represented by Formula 1A."

For example, the organic layer may include, as the organometallic compound, only Compound 1-1. In this regard, Compound 1-1 may be included in an emission layer of the organic light-emitting device. In one or more embodiments, the organic layer may include, as the organometallic compound, Compound 1-1 and Compound 1-2. In this regard, Compound 1-1 and Compound 1-2 may be included in an identical layer (for example, Compound 1-1 and Compound 1-2 all may be included in an emission layer).

The first electrode may be an anode, which is a hole injection electrode, and the second electrode may be a cathode, which is an electron injection electrode, or the first electrode may be a cathode, which is an electron injection electrode, and the second electrode may be an anode, which is a hole injection electrode.

For example, in the organic light-emitting device, the first electrode may be an anode, and the second electrode may be a cathode, and the organic layer may further include a hole transport region disposed between the first electrode and the emission layer and an electron transport region disposed between the emission layer and the second electrode, and the hole transport region may include a hole injection layer, a hole transport layer, an electron blocking layer, or any combination thereof, and the electron transport region may include a hole blocking layer, an electron transport layer, an electron injection layer, or any combination thereof.

The term "organic layer" as used herein refers to a single layer and/or a plurality of layers disposed between the first electrode and the second electrode of the organic light-emitting device. The "organic layer" may include, in addition to an organic compound, an organometallic complex including metal.

The FIGURE is a schematic view of an organic light-emitting device 10 according to an embodiment. Hereinafter, the structure of an organic light-emitting device according to an embodiment and a method of manufacturing an organic light-emitting device according to an embodiment will be described in connection with the FIGURE. The organic light-emitting device 10 includes a first electrode 11, an organic layer 15, and a second electrode 19, which are sequentially stacked.

A substrate may be additionally disposed under the first electrode 11 or above the second electrode 19. For use as the substrate, any substrate that is used in general organic light-emitting devices may be used, and the substrate may be a glass substrate or a transparent plastic substrate, each having excellent mechanical strength, thermal stability, transparency, surface smoothness, ease of handling, and water resistance.

The first electrode 11 may be formed by depositing or sputtering a material for forming the first electrode 11 on the substrate. The first electrode 11 may be an anode. The material for forming the first electrode 11 may be selected from materials with a high work function to facilitate hole injection. The first electrode 11 may be a reflective electrode, a semi-transmissive electrode, or a transmissive electrode. The material for forming the first electrode may be, for example, indium tin oxide (ITO), indium zinc oxide (IZO), tin oxide ($SnO_2$), and zinc oxide (ZnO). In one or more embodiments, magnesium (Mg), aluminum (Al), aluminum-lithium (Al—Li), calcium (Ca), magnesium-indium (Mg—In), or magnesium-silver (Mg—Ag) may be used as the material for forming the first electrode.

The first electrode 11 may have a single-layered structure or a multi-layered structure including two or more layers. For example, the first electrode 11 may have a three-layered structure of ITO/Ag/ITO, but the structure of the first electrode 110 is not limited thereto.

The organic layer 15 is disposed on the first electrode 11.

The organic layer 15 may include a hole transport region, an emission layer, and an electron transport region.

The hole transport region may be disposed between the first electrode 11 and the emission layer.

The hole transport region may include a hole injection layer, a hole transport layer, an electron blocking layer, a buffer layer, or any combination thereof.

The hole transport region may include only either a hole injection layer or a hole transport layer. In one or more embodiments, the hole transport region may have a hole injection layer/hole transport layer structure or a hole injection layer/hole transport layer/electron blocking layer structure, which are sequentially stacked in this stated order from the first electrode 11.

A hole injection layer may be formed on the first electrode 11 by using one or more suitable methods selected from vacuum deposition, spin coating, casting, or Langmuir-Blodgett (LB) deposition.

When a hole injection layer is formed by vacuum deposition, the deposition conditions may vary according to a compound that is used to form the hole injection layer, and the structure and thermal characteristics of the hole injection layer. For example, the deposition conditions may include a deposition temperature of about 100° C. to about 500° C., a vacuum pressure of about $10^{-8}$ torr to about $10^{-3}$ torr, and a deposition rate of about 0.01 Angstroms per second (A/sec) to about 100 Å/sec. However, the deposition conditions are not limited thereto.

When the hole injection layer is formed using spin coating, coating conditions may vary according to the material used to form the hole injection layer, and the structure and thermal properties of the hole injection layer. For example, a coating speed may be from about 2,000 revolutions per minute (rpm) to about 5,000 rpm, and a temperature at which a heat treatment is performed to remove a solvent after coating may be from about 80° C. to about 200° C. However, the coating conditions are not limited thereto.

Conditions for forming a hole transport layer and an electron blocking layer may be understood by referring to conditions for forming the hole injection layer.

The hole transport region may include at least one selected from m-MTDATA, TDATA, 2-TNATA, NPB, β-NPB, TPD, spiro-TPD, spiro-NPB, methylated-NPB, TAPC, HMTPD, 4,4',4"-tris(N-carbazolyl)triphenylamine (TCTA), polyaniline/dodecylbenzene sulfonic acid (PANI/DBSA), poly(3,4-ethylenedioxythiophene)/poly(4-styrene sulfonate) (PEDOT/PSS), polyaniline/camphor sulfonic acid (PANI/CSA), polyaniline/poly(4-styrene sulfonate) (PANI/PSS), a compound represented by Formula 201 below, and a compound represented by Formula 202 below:

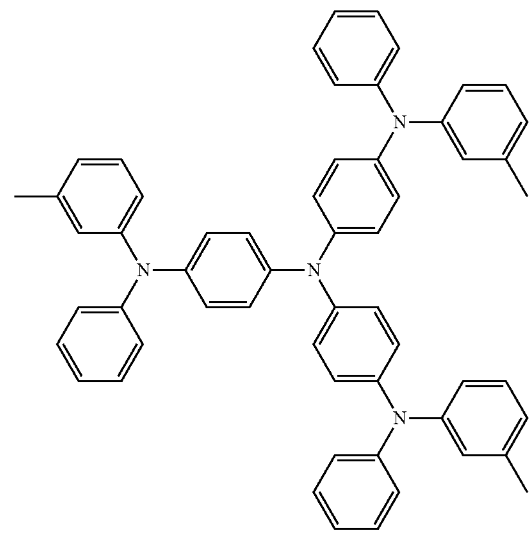

m-MTDATA

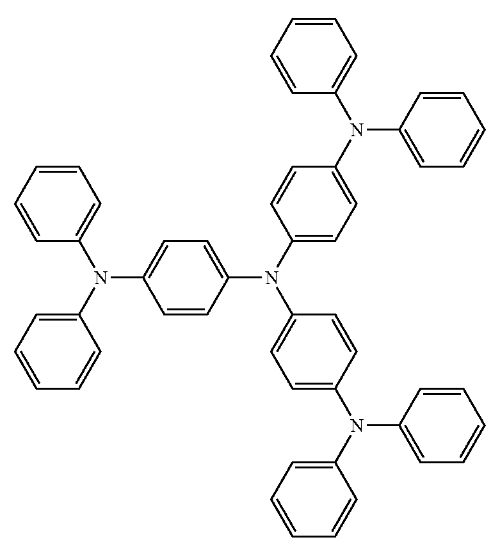

TDATA

-continued
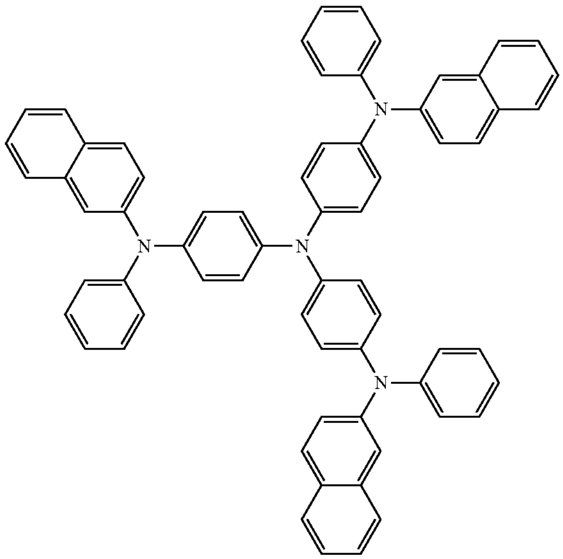
2-TNATA
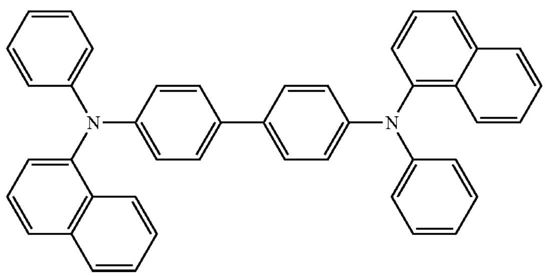
NPB
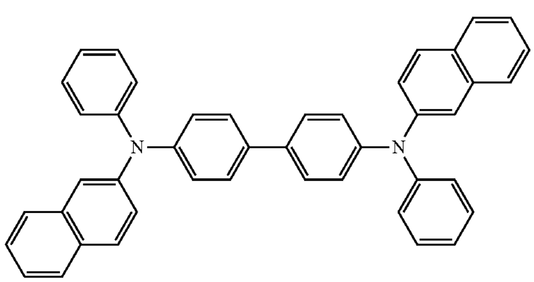
β-NPB
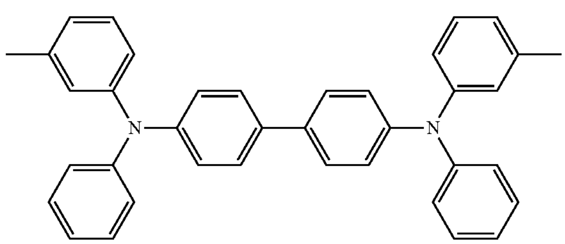
TPD
-continued
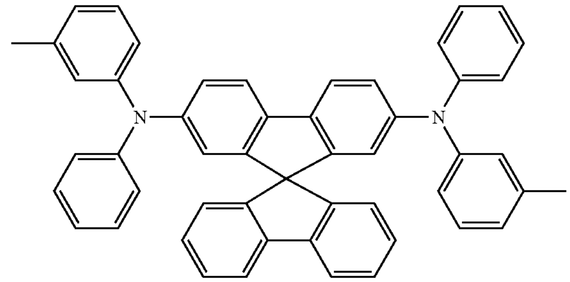
Spiro-TPD
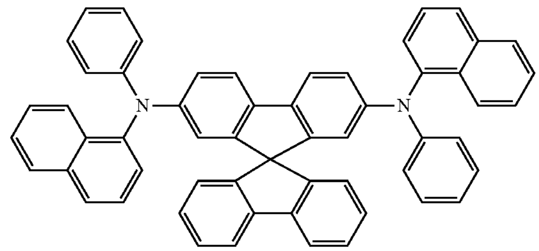
Spiro-NPB
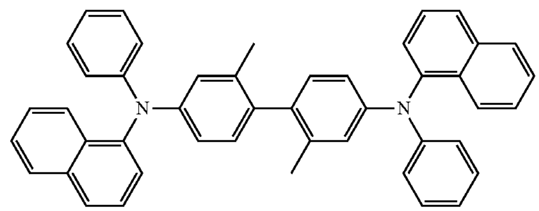
methylated NPB
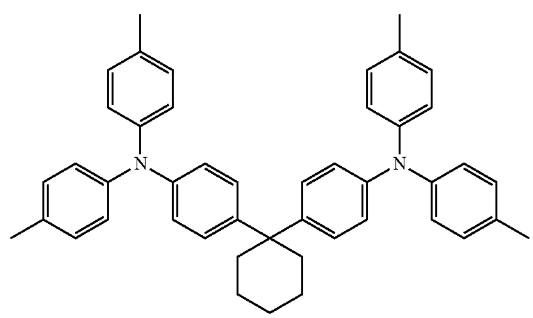
TAPC
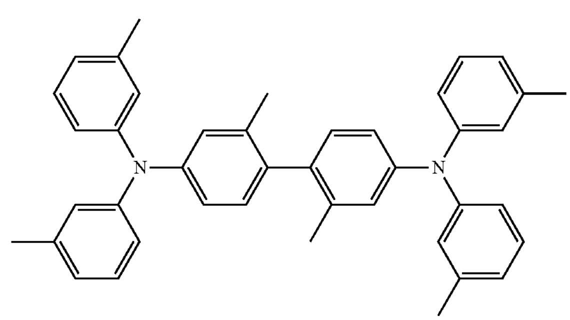
HMTPD -continued Formula 201

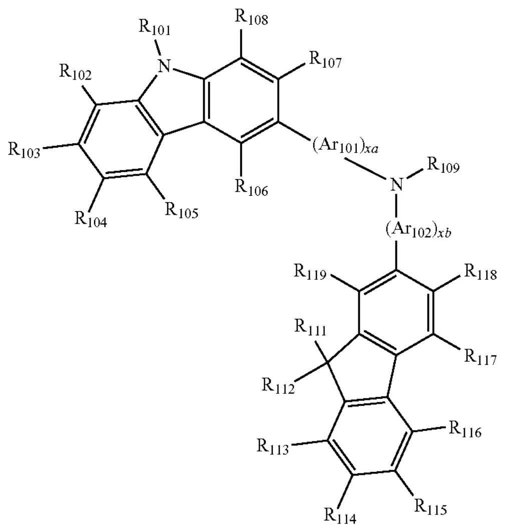

Formula 202

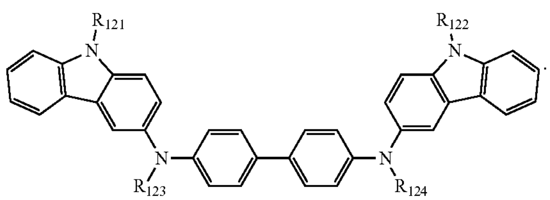

In Formula 201, $Ar_{101}$ and $Ar_{102}$ may each independently be selected from:

a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, and a pentacenylene group; and a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, and a pentacenylene group, each substituted with at least one selected from deuterium, —F, —C, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_1$-$C_{10}$ heterocycloalkyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_2$-$C_{60}$ heteroaryloxy group, a $C_2$-$C_{60}$ heteroarylthio group, a $C_3$-$C_{60}$ heteroarylalkyl group, a monovalent non-aromatic condensed polycyclic group, and a monovalent non-aromatic condensed heteropolycyclic group.

In Formula 201, xa and xb may each independently be an integer from 0 to 5, or may each independently be 0, 1, or 2. For example, xa may be 1 and xb may be 0, but embodiments of the present disclosure are not limited thereto.

In Formulae 201 and 202, $R_{101}$ to $R_{108}$, $R_{111}$ to $R_{119}$, and $R_{121}$ to $R_{124}$ may each independently be selected from:

hydrogen, deuterium, —F, —C, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group (for example, a methyl group, an ethyl group, a propyl group, a butyl group, pentyl group, a hexyl group, and the like), and a $C_1$-$C_{10}$ alkoxy group (for example, a methoxy group, an ethoxy group, a propoxy group, a butoxy group, a pentoxy group, and the like);

a $C_1$-$C_{10}$ alkyl group and a $C_1$-$C_{10}$ alkoxy group, each substituted with at least one selected from deuterium, —F, —C, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, and a phosphoric acid group or a salt thereof;

a phenyl group, a naphthyl group, an anthracenyl group, a fluorenyl group, and a pyrenyl group; and a phenyl group, a naphthyl group, an anthracenyl group, a fluorenyl group, and a pyrenyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, and a $C_1$-$C_{10}$ alkoxy group;

but embodiments of the present disclosure are not limited thereto.

In Formula 201, $R_{109}$ may be selected from:

a phenyl group, a naphthyl group, an anthracenyl group, and a pyridinyl group; and a phenyl group, a naphthyl group, an anthracenyl group, and a pyridinyl group, each substituted with at least one selected from deuterium, —F, —C, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthracenyl group, and a pyridinyl group.

In an embodiment, the compound represented by Formula 201 may be represented by Formula 201A, but embodiments of the present disclosure are not limited thereto:

Formula 201A

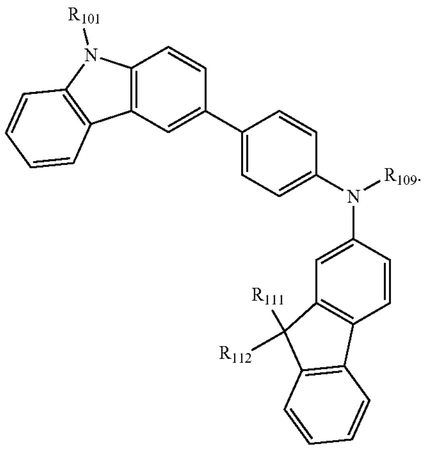

In Formula 201A, $R_{101}$, $R_{111}$, $R_{112}$, and $R_{109}$ may be understood by referring to the description provided herein.

For example, the compound represented by Formula 201, and the compound represented by Formula 202 may include Compounds HT1 to HT20 below, but embodiments of the present disclosure are not limited thereto:

HT1

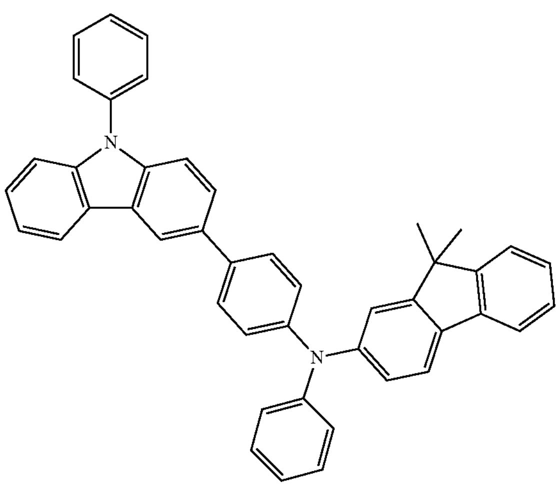

-continued

HT2

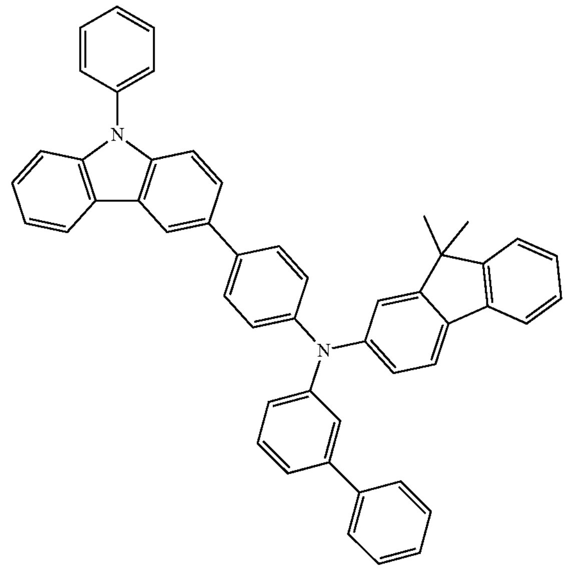

HT3

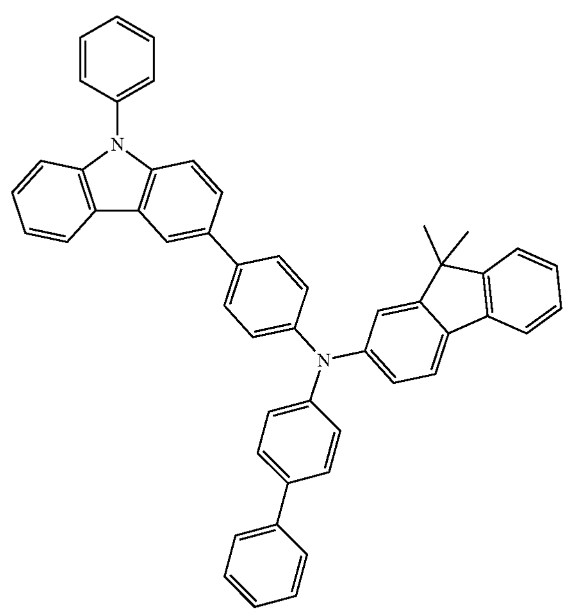

-continued
HT4
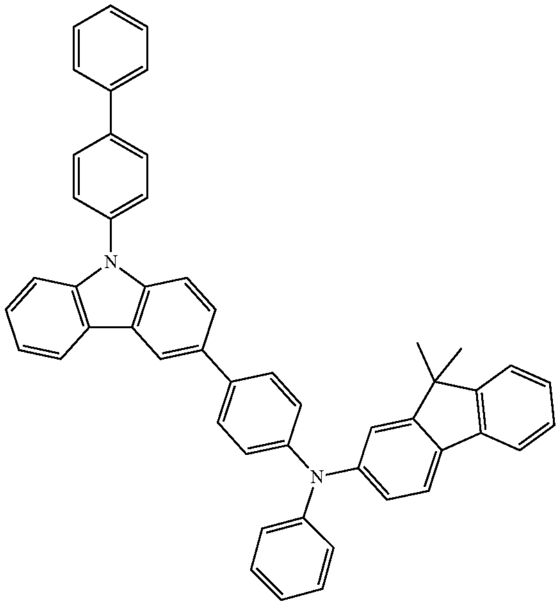
-continued
HT6
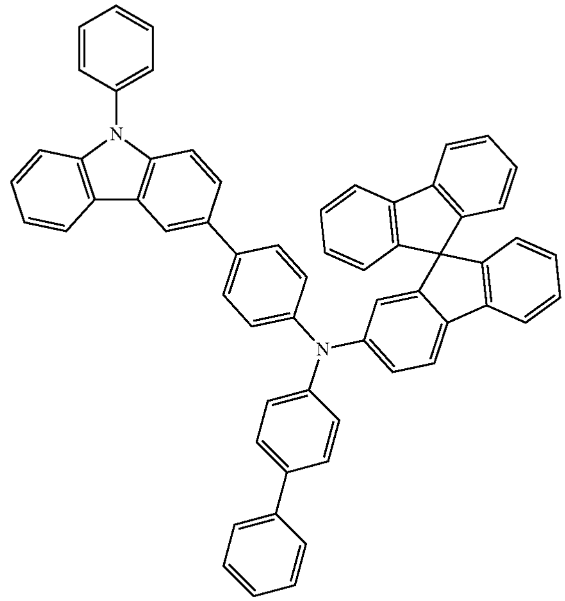
HT5
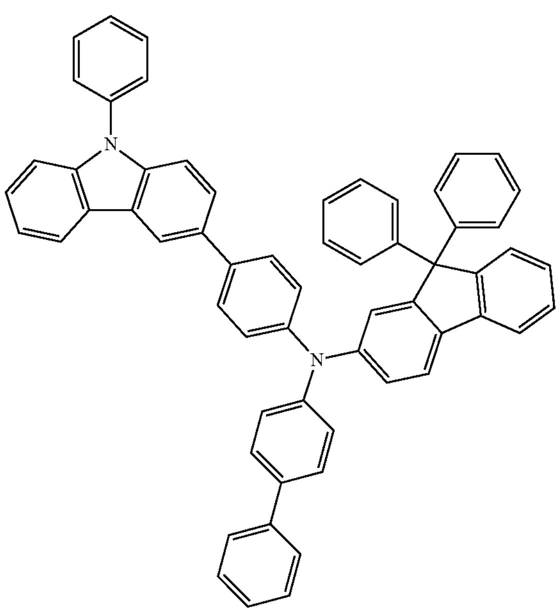
HT7
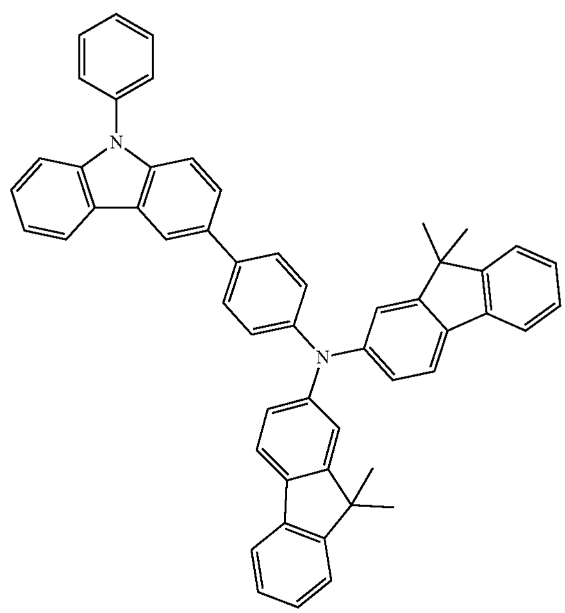

-continued
HT8
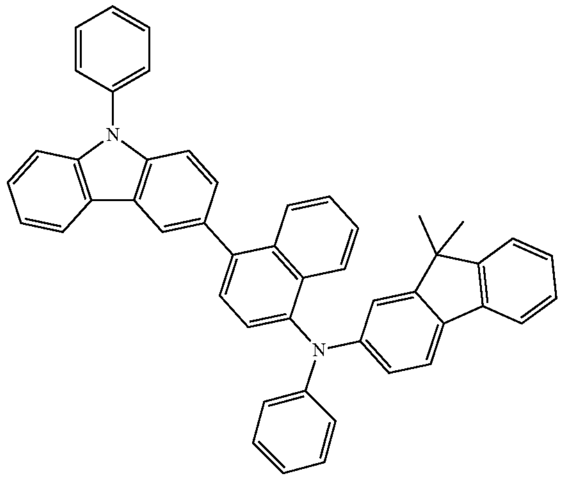
HT9
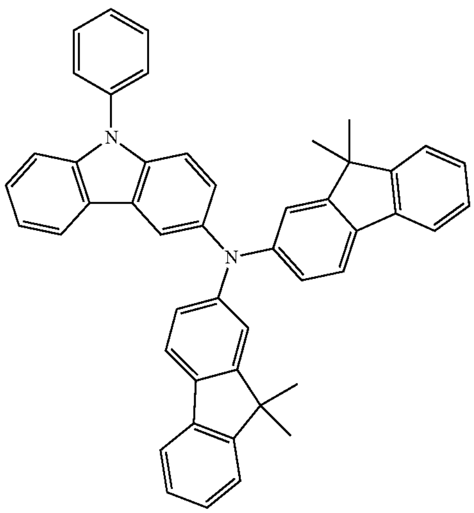
HT10
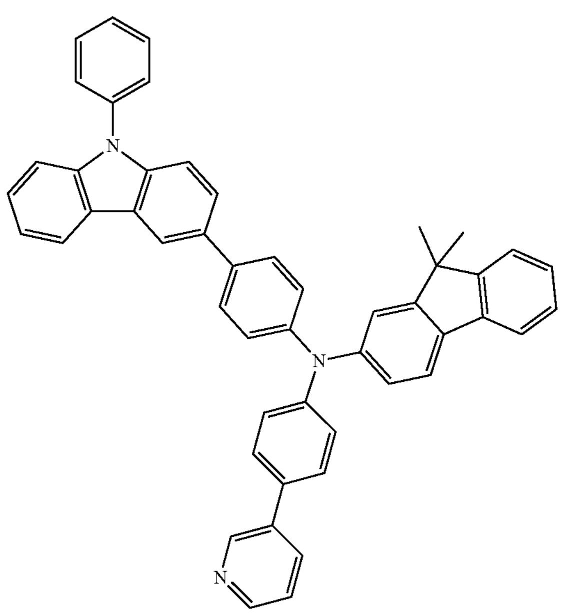
-continued
HT11
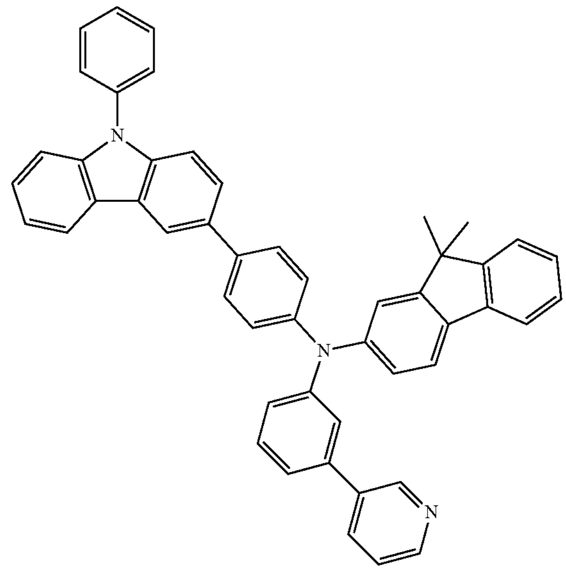
HT12
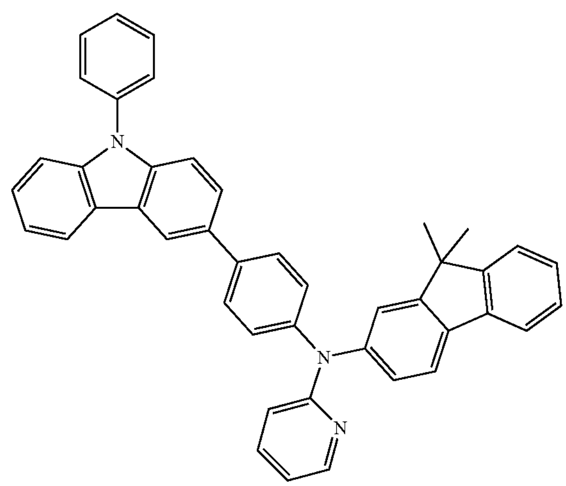
HT13
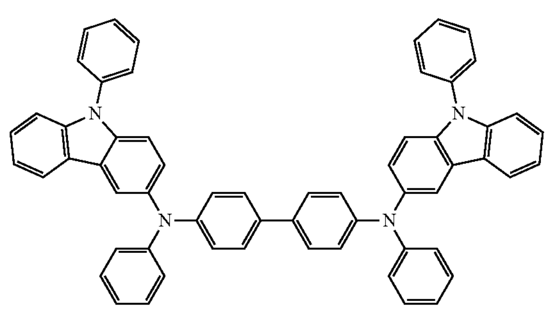

-continued

HT14

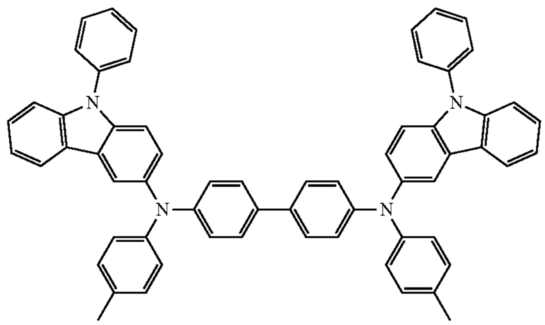

HT15

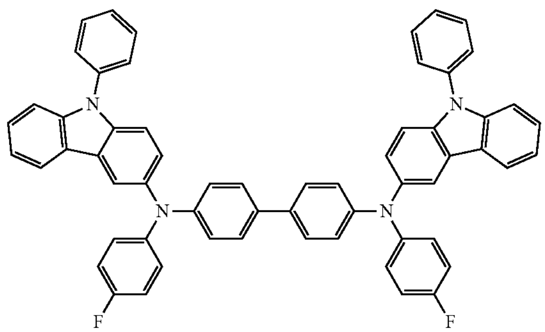

HT16

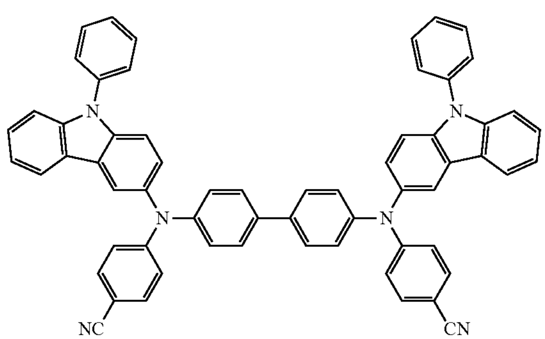

HT17

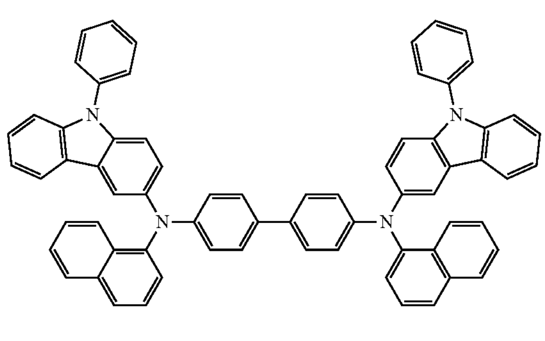

-continued

HT18

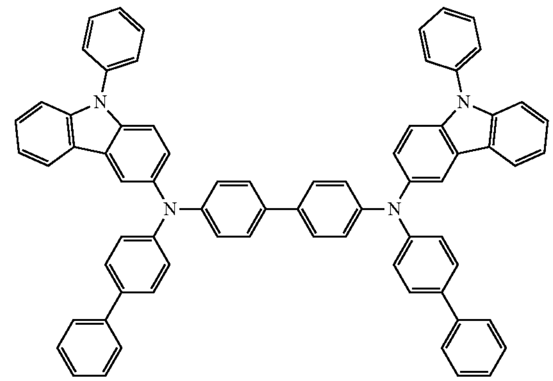

HT19

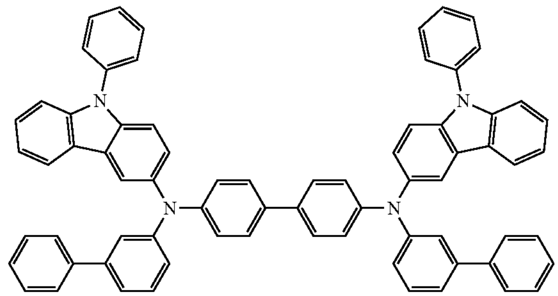

HT20

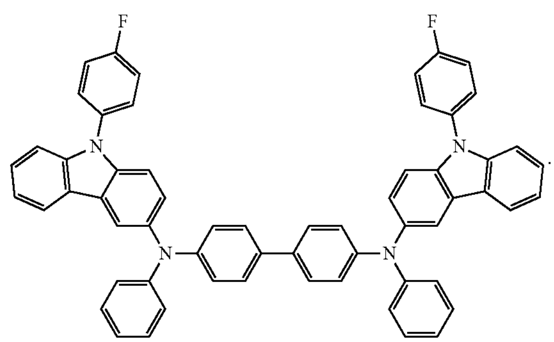

A thickness of the hole transport region may be in a range of about 100 Angstroms (Å) to about 10,000 Å, for example, about 100 Å to about 1,000 Å. When the hole transport region includes at least one of a hole injection layer and a hole transport layer, the thickness of the hole injection layer may be in a range of about 100 Å to about 10,000 Å, and for example, about 100 Å to about 1,000 Å, and the thickness of the hole transport layer may be in a range of about 50 Å to about 2,000 Å, and for example, about 100 Å to about 1,500 Å. While not wishing to be bound by theory, it is understood that when the thicknesses of the hole transport region, the hole injection layer, and the hole transport layer are within these ranges, satisfactory hole transporting characteristics may be obtained without a substantial increase in driving voltage.

The hole transport region may further include, in addition to these materials, a charge-generation material for the improvement of conductive properties. The charge-generation material may be homogeneously or non-homogeneously dispersed in the hole transport region.

The charge-generation material may be, for example, a p-dopant. The p-dopant may be one selected from a quinone derivative, a metal oxide, and a cyano group-containing compound, but embodiments of the present disclosure are not limited thereto. Non-limiting examples of the p-dopant are a quinone derivative, such as tetracyanoquinonedimethane (TCNQ) or 2,3,5,6-tetrafluoro-tetracyano-1,4-benzoquinonedimethane (F4-TCNQ); a metal oxide, such as a tungsten oxide or a molybdenium oxide; and a cyano group-containing compound, such as Compound HT-D1 or Compound HT-D2 below, but embodiments of the present disclosure are not limited thereto:

HT-D1

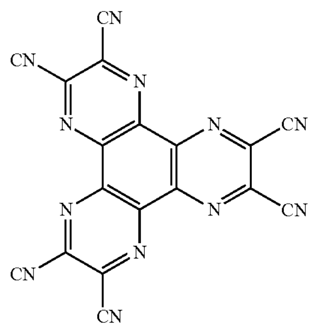

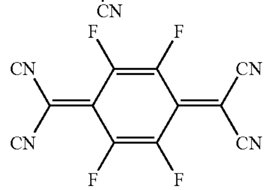

F4-TCNQ

HT-D2

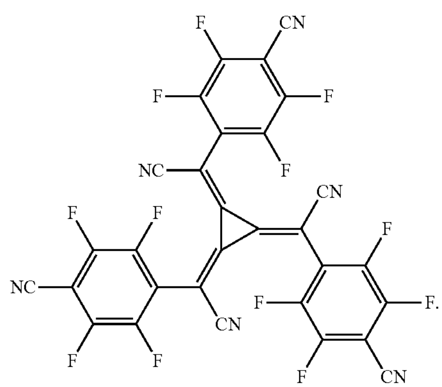

The hole transport region may include a buffer layer.

The buffer layer may compensate for an optical resonance distance according to a wavelength of light emitted from the emission layer, and thus, efficiency of a formed organic light-emitting device may be improved.

Then, an emission layer may be formed on the hole transport region by vacuum deposition, spin coating, casting, LB deposition, or the like. When the emission layer is formed by vacuum deposition or spin coating, the deposition or coating conditions may be similar to those applied in forming the hole injection layer although the deposition or coating conditions may vary according to a material that is used to form the emission layer.

Meanwhile, when the hole transport region includes an electron blocking layer, a material for the electron blocking layer may be selected from materials for the hole transport region described above and materials for a host to be explained later. However, the material for the electron blocking layer is not limited thereto. For example, when the hole transport region includes an electron blocking layer, a material for the electron blocking layer may be mCP, which will be explained later.

The emission layer may include a host and a dopant, and the dopant may include the organometallic compound represented by Formula 1A.

The host may include at least one selected from TPBi, TBADN, ADN (also referred to as "DNA"), CBP, CDBP, TCP, mCP, Compound H50, and Compound H51:

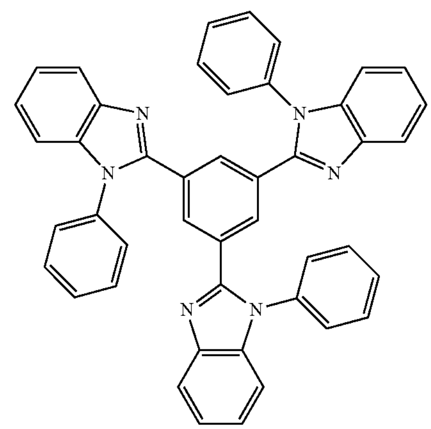

TPBi

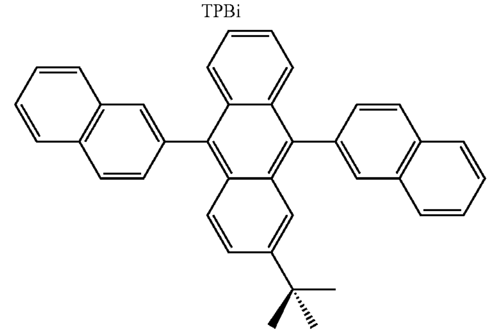

TBADN

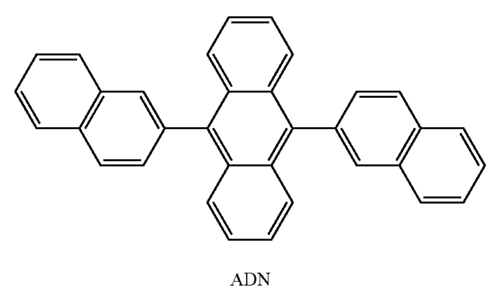

ADN

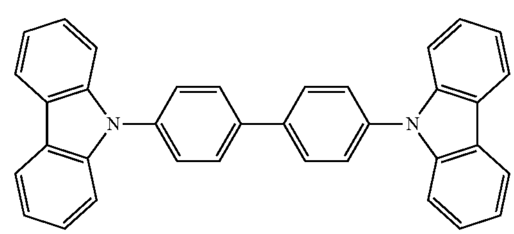

CBP

-continued

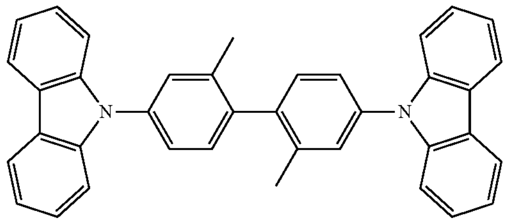

CDBP

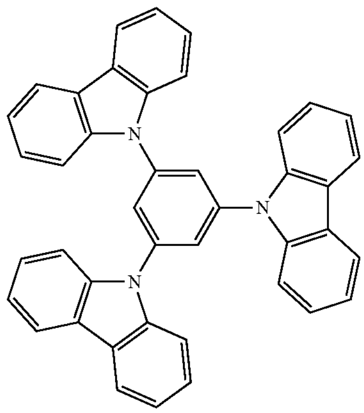

TCP

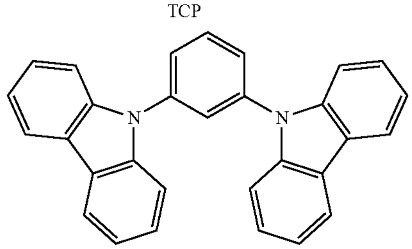

mCP

H50

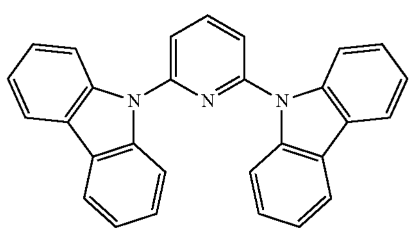

H51

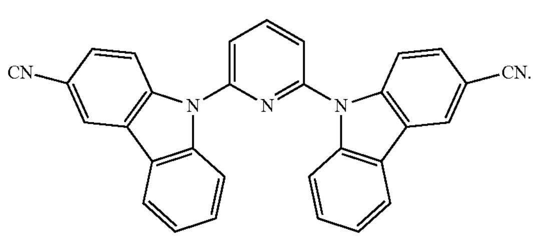

In one or more embodiments, the host may further include a compound represented by Formula 301 below:

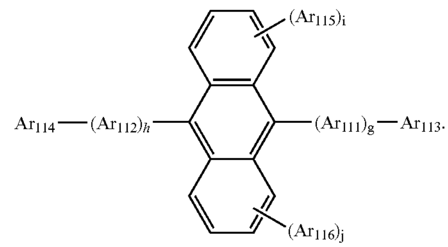

In Formula 301, $Ar_{111}$ and $Ar_{112}$ may each independently be selected from:

a phenylene group, a naphthylene group, a phenanthrenylene group, and a pyrenylene group; and a phenylene group, a naphthylene group, a phenanthrenylene group, and a pyrenylene group, each substituted with at least one selected from a phenyl group, a naphthyl group, and an anthracenyl group.

In Formula 301, $Ar_{113}$ to $Ar_{11}$ may each independently be selected from:

a $C_1$-$C_{10}$ alkyl group, a phenyl group, a naphthyl group, a phenanthrenyl group, and a pyrenyl group; and a phenyl group, a naphthyl group, a phenanthrenyl group, and a pyrenyl group, each substituted with at least one selected from a phenyl group, a naphthyl group, and an anthracenyl group.

In Formula 301, g, h, i, and j may each independently be an integer from 0 to 4, for example, 0, 1, or 2.

In Formula 301, $Ar_{113}$ to $Ar_{116}$ may each independently be selected from:

a $C_1$-$C_{10}$ alkyl group substituted with at least one selected from a phenyl group, a naphthyl group, and an anthracenyl group;

a phenyl group, a naphthyl group, an anthracenyl group, a pyrenyl group, a phenanthrenyl group, and a fluorenyl group;

a phenyl group, a naphthyl group, an anthracenyl group, a pyrenyl group, a phenanthrenyl group, and a fluorenyl group, each substituted with at least one selected from deuterium, —F, —C, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthracenyl group, a pyrenyl group, a phenanthrenyl group, and a fluorenyl group; and

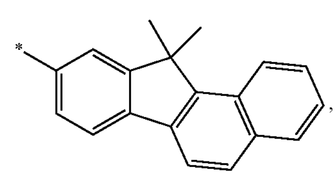 [SMILES: *c1ccc2c(c1)C(C)(C)c1c-2ccc2ccccc12]

but embodiments of the present disclosure are not limited thereto.

In one or more embodiments, the host may include a compound represented by Formula 302:

Formula 302

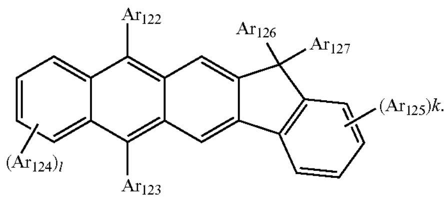

In Formula 302, $Ar_{122}$ to $Ar_{125}$ are the same as described in detail in connection with $Ar_{113}$ in Formula 301.

In Formula 302, $Ar_{126}$ and $Ar_{127}$ may each independently be a $C_1$-$C_{10}$ alkyl group (for example, a methyl group, an ethyl group, or a propyl group).

In Formula 302, k and l may each independently be an integer from 0 to 4. For example, k and l may be 0, 1, or 2.

The compound represented by Formula 301 and the compound represented by Formula 302 may include Compounds H1 to H42 below, but embodiments of the present disclosure are not limited thereto.

H1

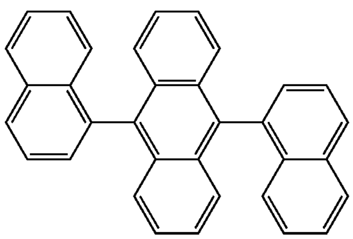

H2

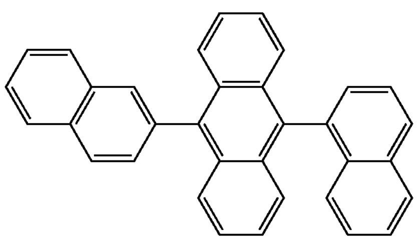

H3

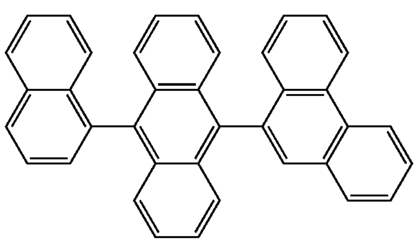

H4

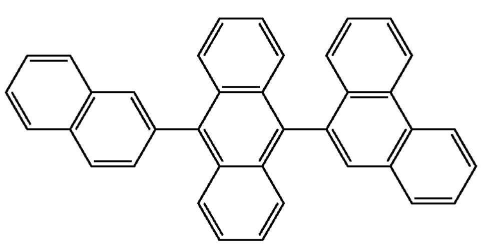

-continued

H5

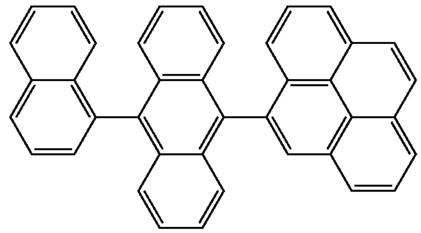

H6

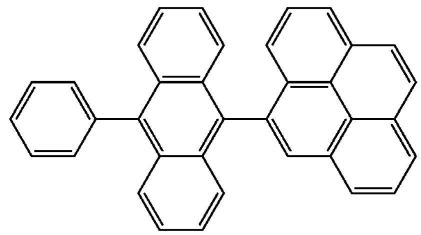

H7

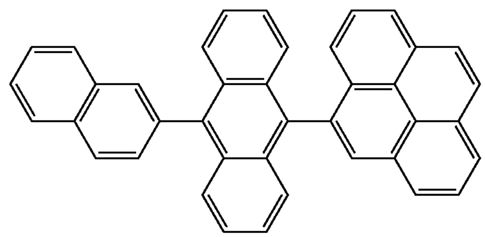

H8

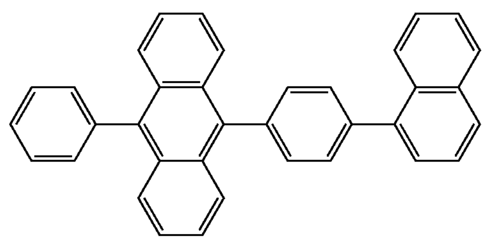

H9

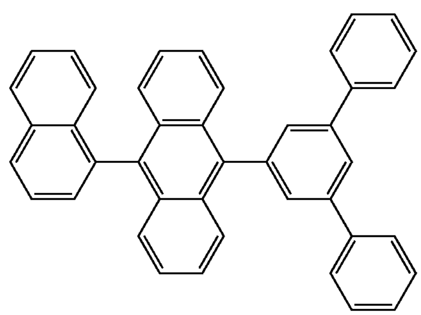

H10

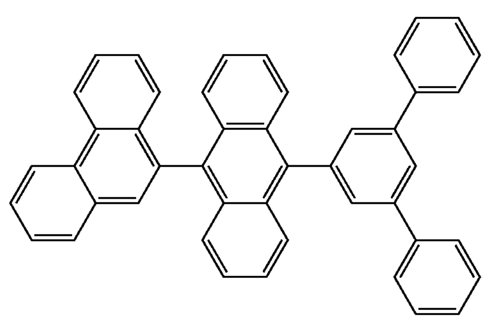

H11
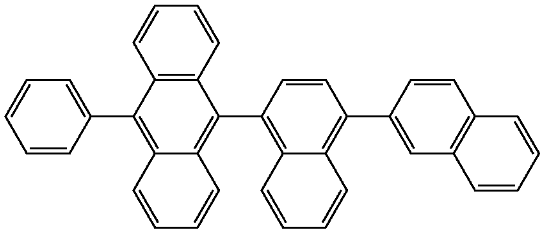
H12
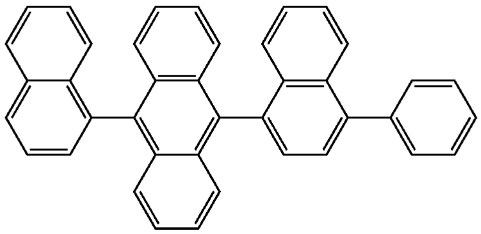
H13
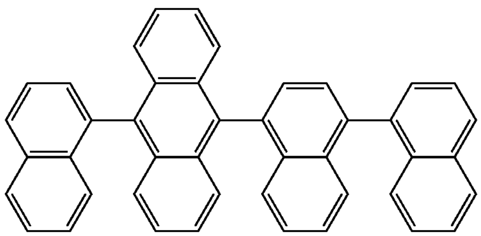
H14
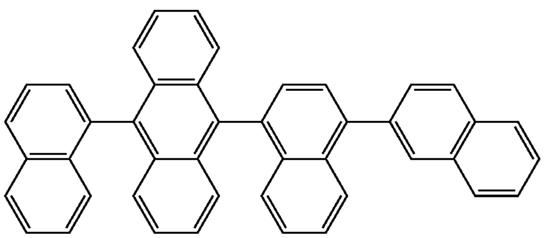
H15
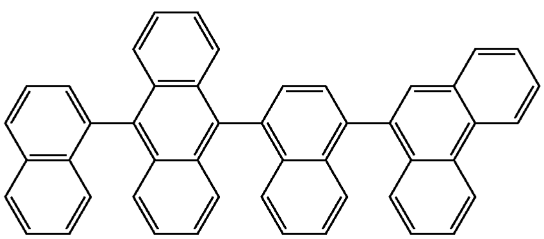
H16
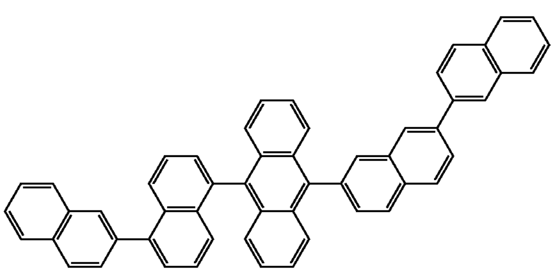
H17
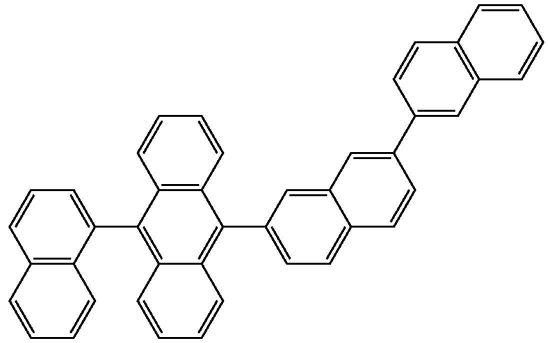
H18
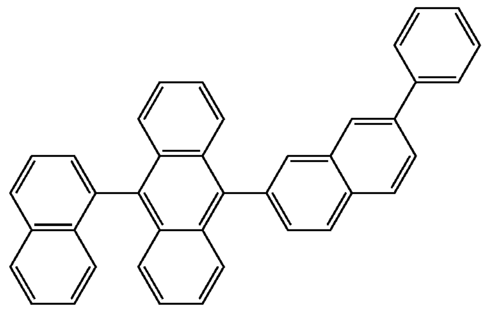
H19
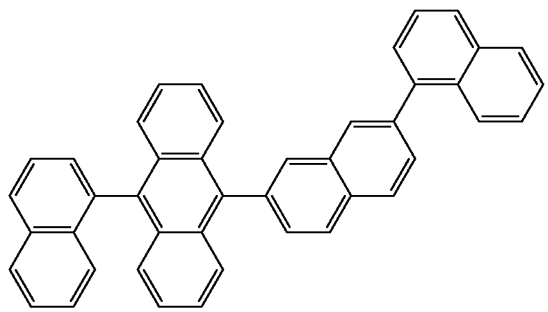
H20
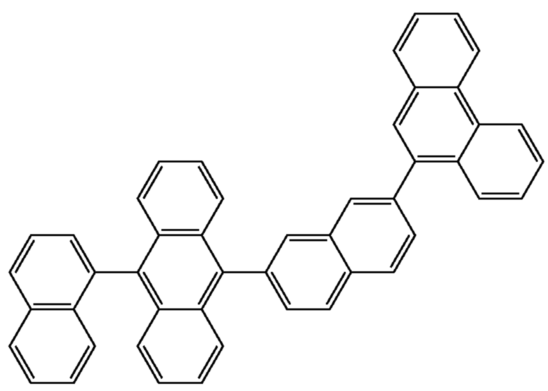
H21
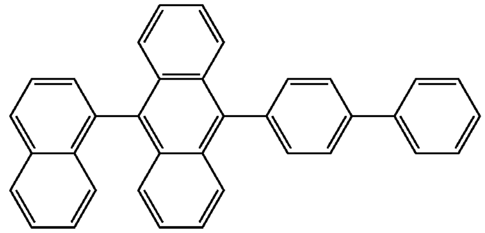

H22
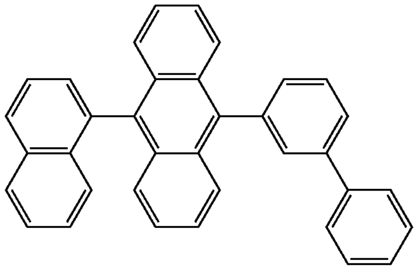
H23
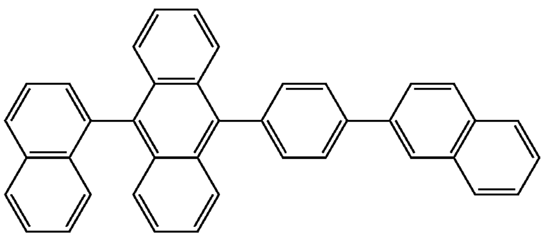
H24
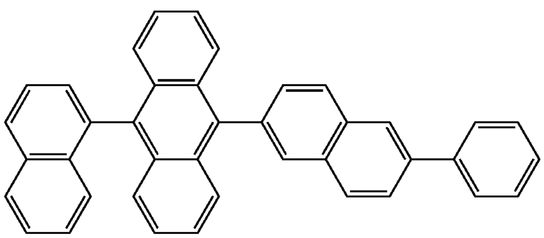
H25
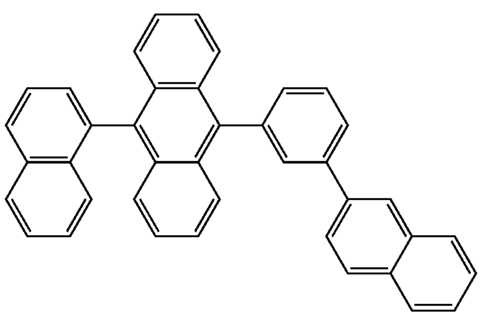
H26
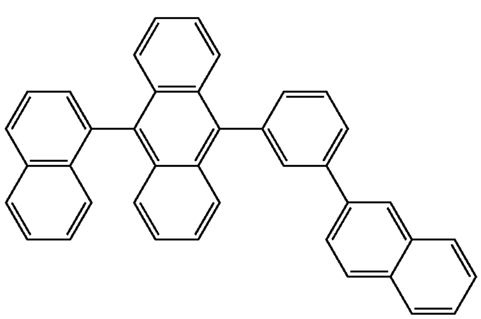
H27
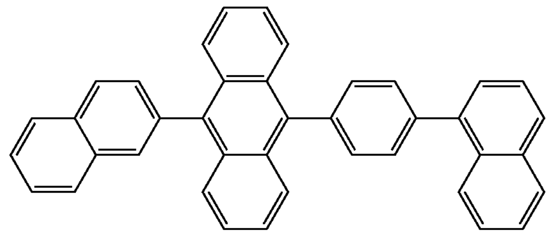
H28
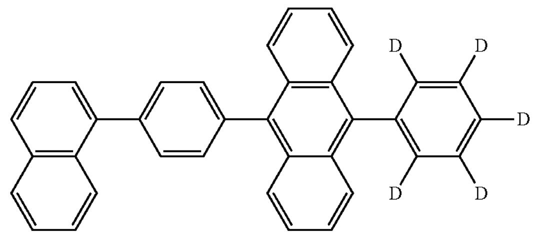
H29
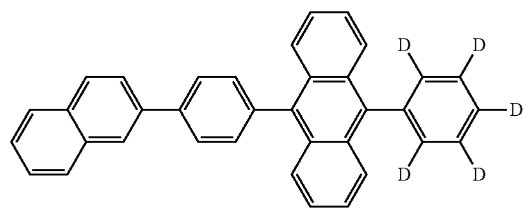
H30
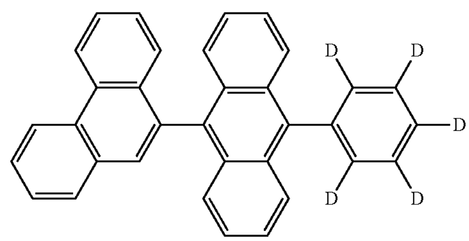
H31
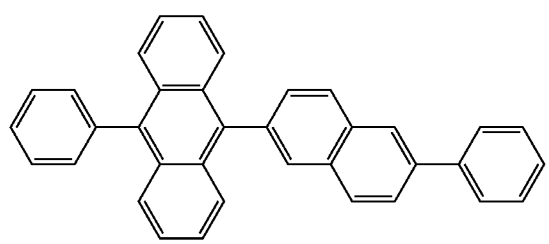
H32
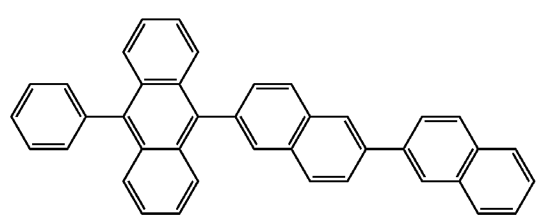

H33
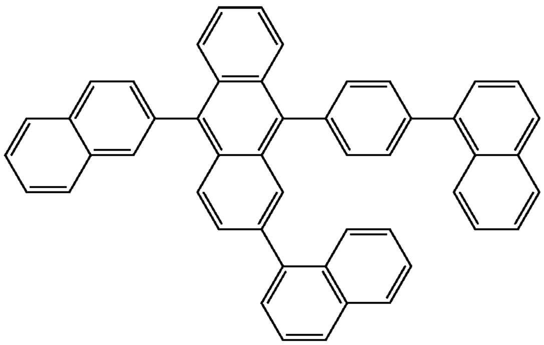
H34
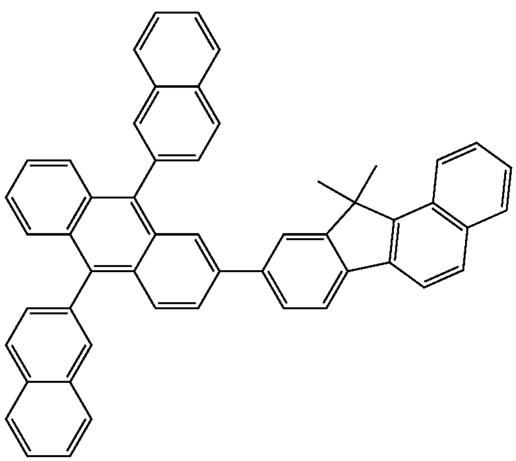
H35
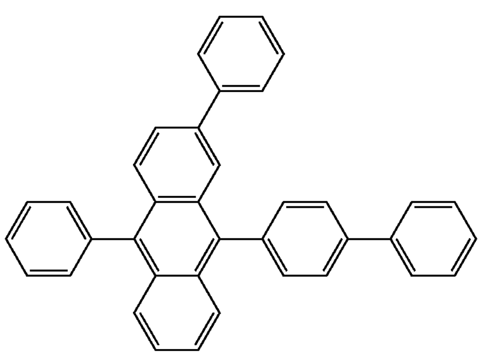
H36
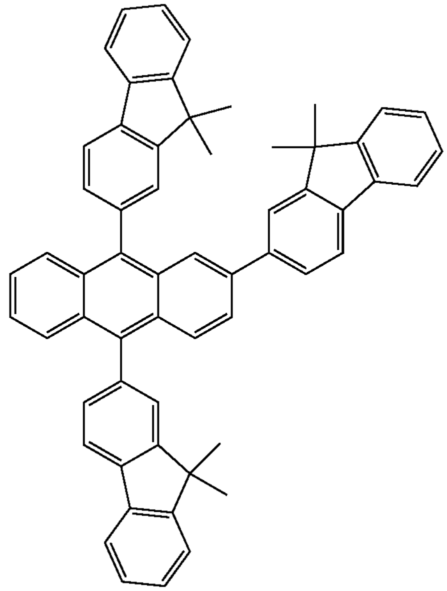
H37
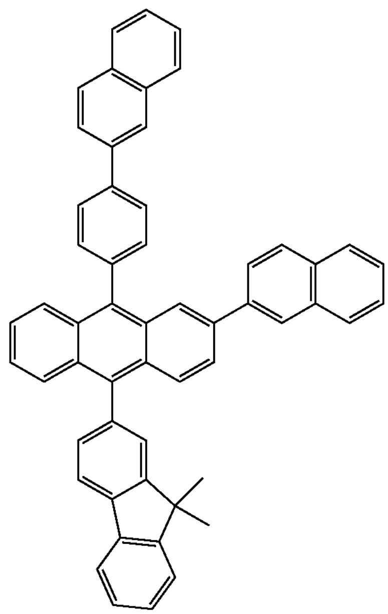
H38
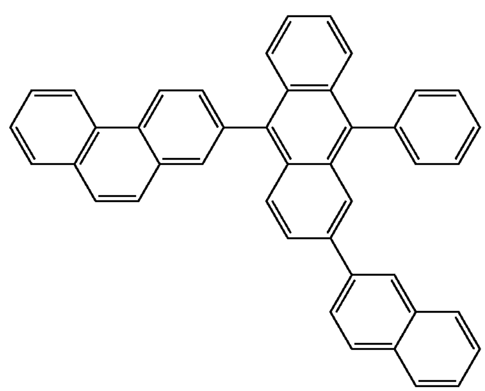

-continued

H39

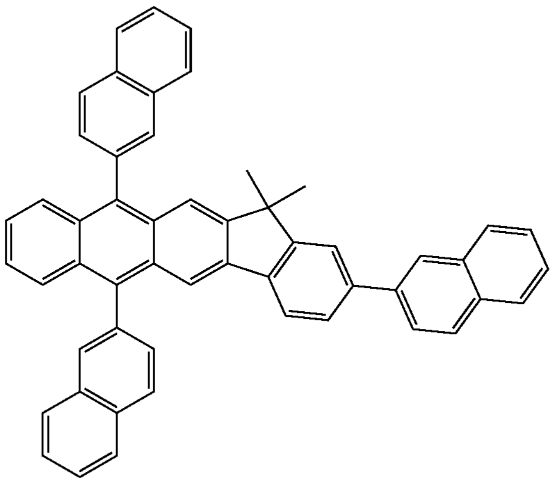

H40

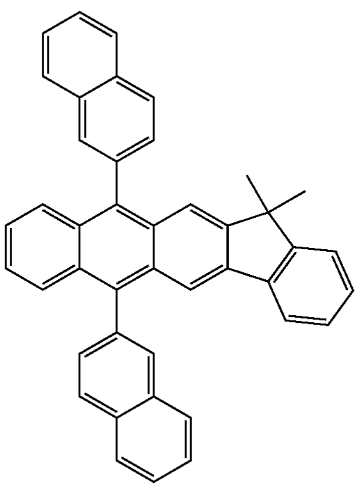

H41

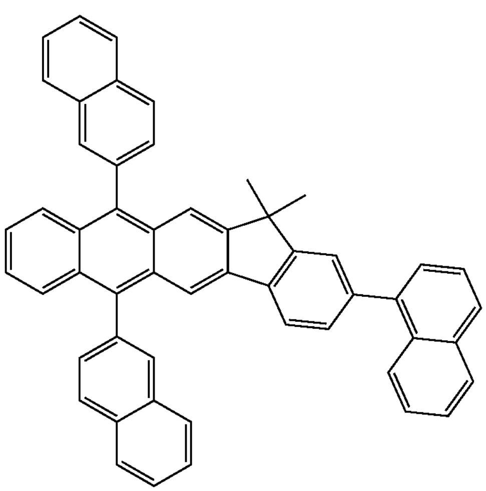

-continued

H42

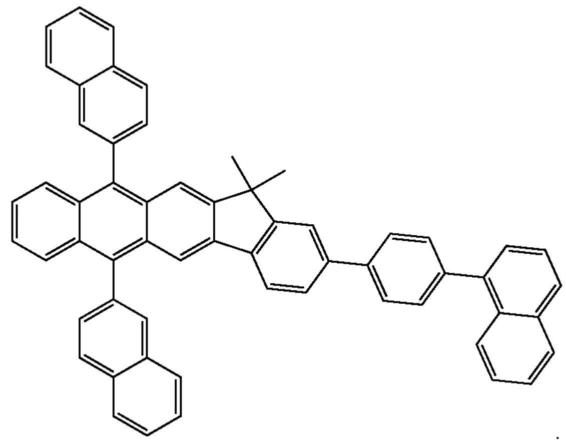

When the organic light-emitting device is a full-color organic light-emitting device, the emission layer may be patterned into a red emission layer, a green emission layer, and a blue emission layer. In one or more embodiments, due to a stacked structure including a red emission layer, a green emission layer, and/or a blue emission layer, the emission layer may emit white light.

When the emission layer includes a host and a dopant, an amount of the dopant may be in a range of about 0.01 parts by weight to about 15 parts by weight based on 100 parts by weight of the host, but embodiments of the present disclosure are not limited thereto.

A thickness of the emission layer may be in a range of about 100 Å to about 1,000 Å, for example, about 200 Å to about 600 Å. While not wishing to be bound by theory, it is understood that when the thickness of the emission layer is within this range, excellent light-emission characteristics may be obtained without a substantial increase in driving voltage.

Then, an electron transport region may be disposed on the emission layer.

The electron transport region may include a hole blocking layer, an electron transport layer, an electron injection layer, or any combination thereof.

For example, the electron transport region may have a hole blocking layer/electron transport layer/electron injection layer structure or an electron transport layer/electron injection layer structure, but the structure of the electron transport region is not limited thereto. The electron transport layer may have a single-layered structure or a multi-layered structure including two or more different materials.

Conditions for forming the hole blocking layer, the electron transport layer, and the electron injection layer which constitute the electron transport region may be understood by referring to the conditions for forming the hole injection layer.

When the electron transport region includes a hole blocking layer, the hole blocking layer may include, for example, at least one of BCP, Bphen, and BAlq but embodiments of the present disclosure are not limited thereto:

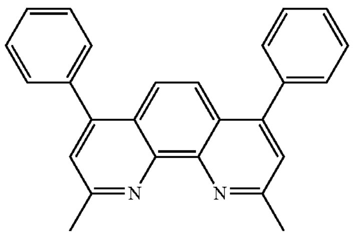
BCP

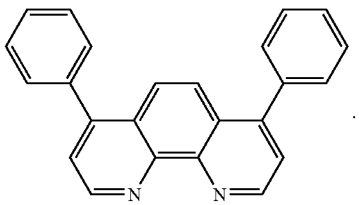
Bphen

A thickness of the hole blocking layer may be in a range of about 20 Å to about 1,000 Å, for example, about 30 Å to about 300 Å. While not wishing to be bound by theory, it is understood that when the thickness of the hole blocking layer is within these ranges, the hole blocking layer may have improved hole blocking ability without a substantial increase in driving voltage.

The electron transport layer may further include at least one selected from BCP, Bphen, $Alq_3$, BAlq, TAZ, and NTAZ:

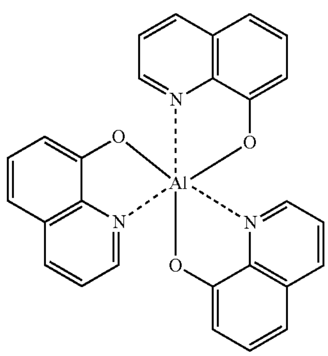
$Alq_3$

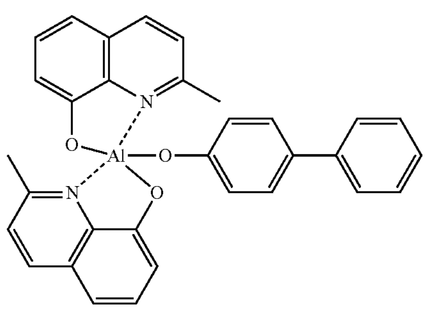
BAlq

-continued

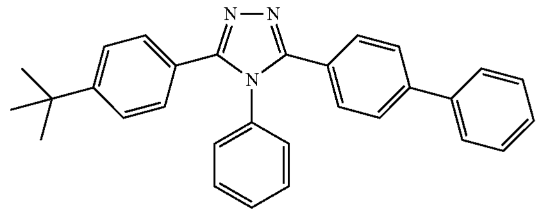
TAZ

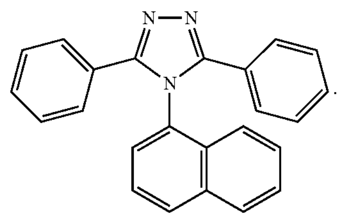
NTAZ

In one or more embodiments, the electron transport layer may include at least one of Compounds ET1 to ET25, but embodiments of the present disclosure are not limited thereto:

ET1

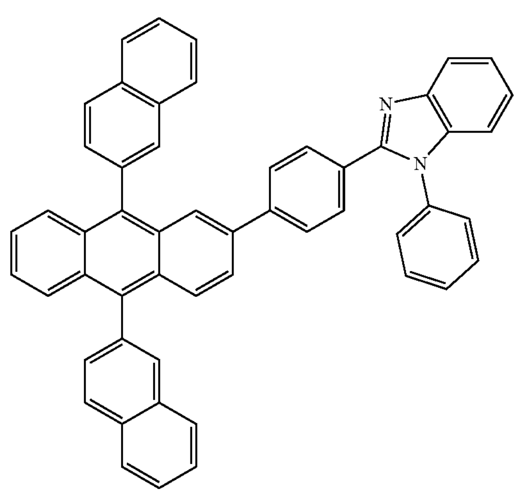

-continued
ET2
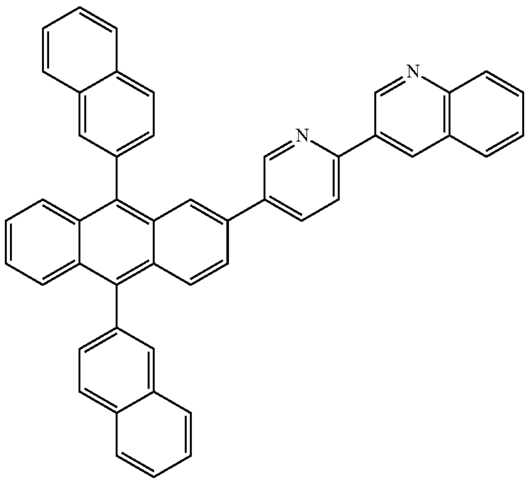
ET3
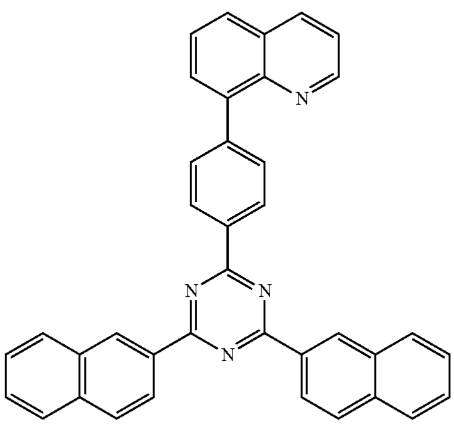
ET4
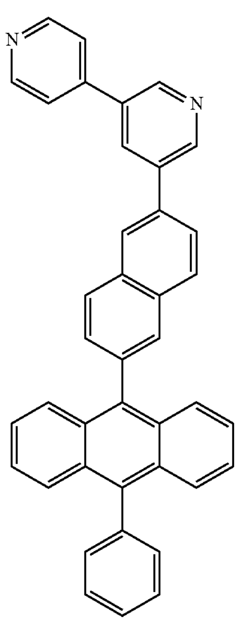
-continued
ET5
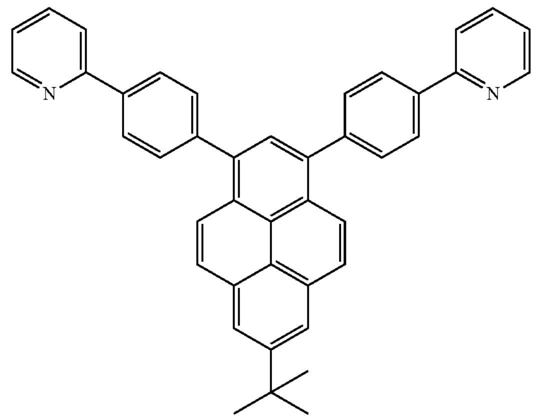
ET6
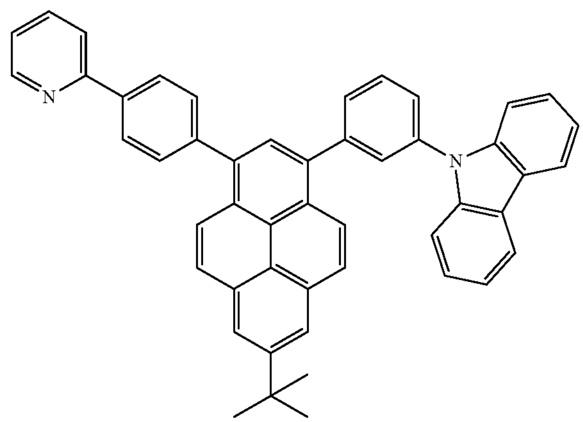
ET7
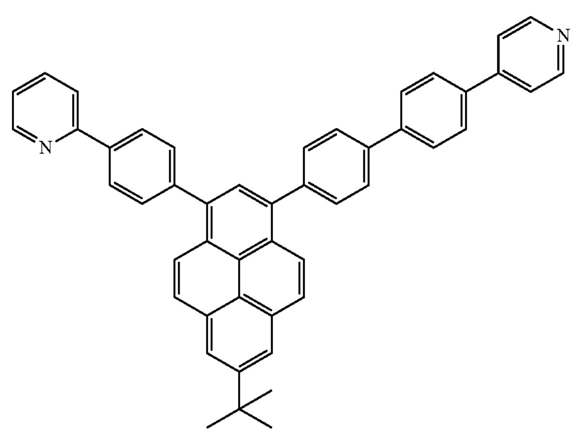

ET8
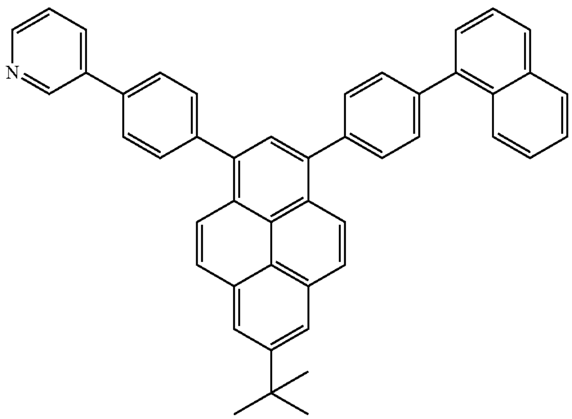
ET9
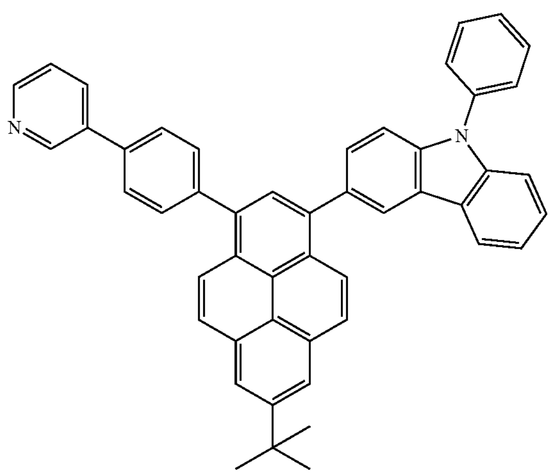
ET10
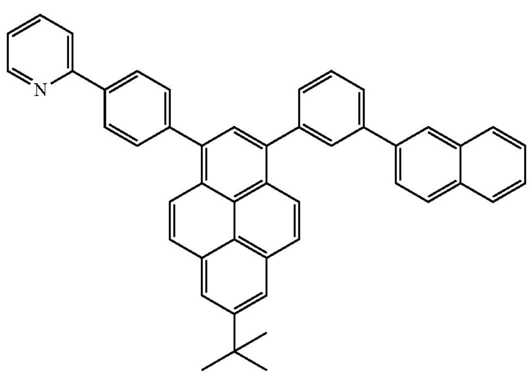
ET11
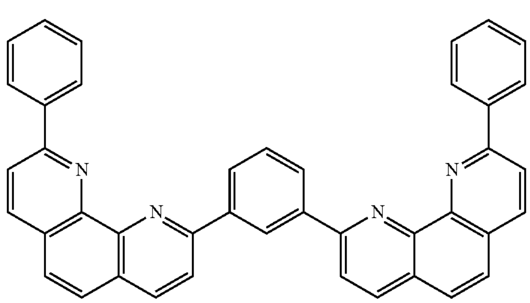
ET12
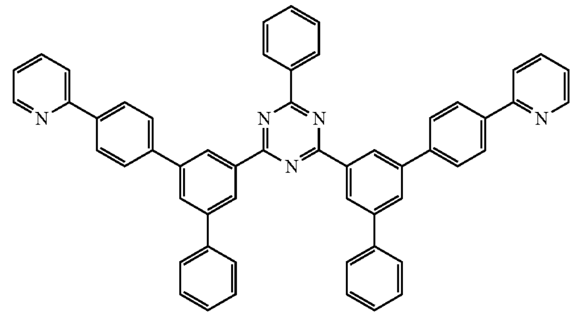
ET13
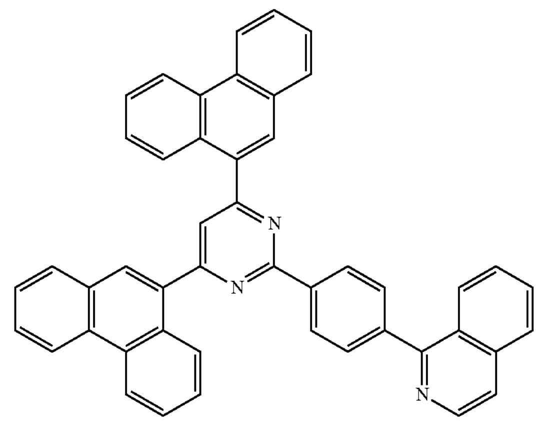
ET14
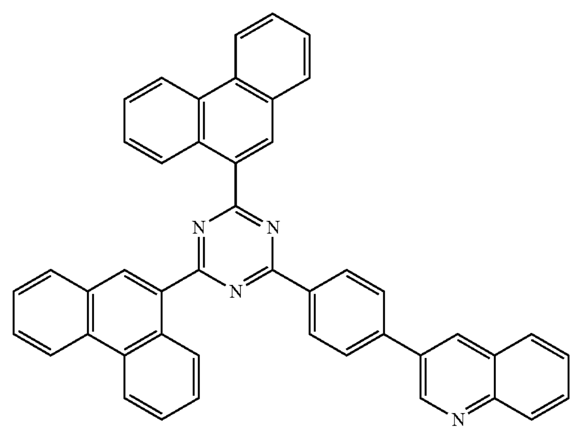
ET15
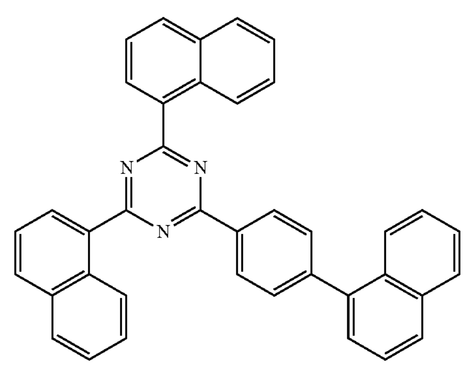

-continued
ET16
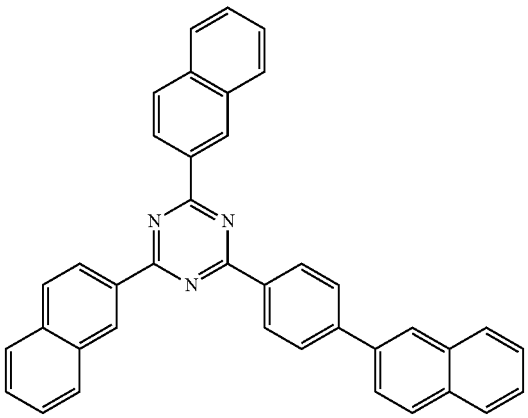
ET17
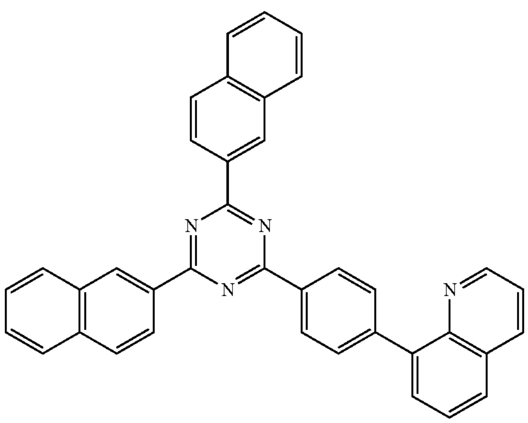
ET18
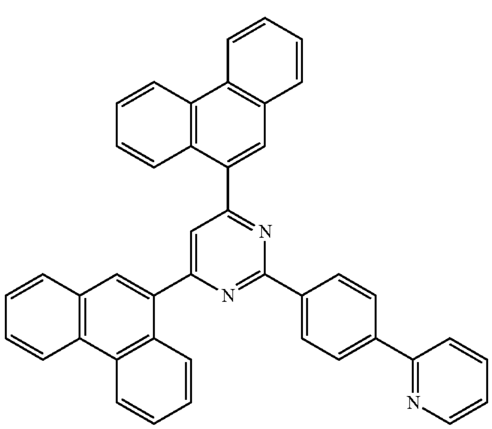
-continued
ET19
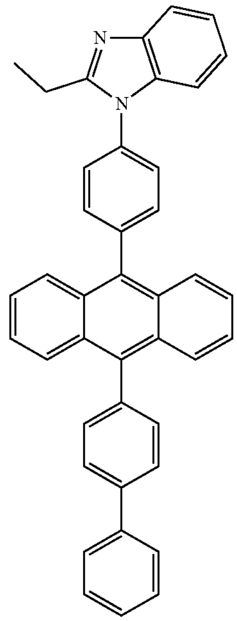
ET20
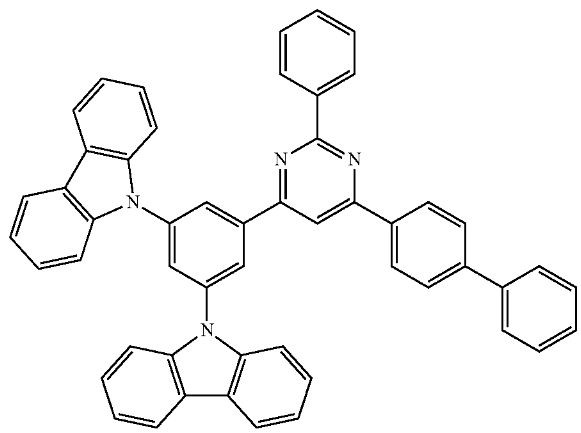
ET21
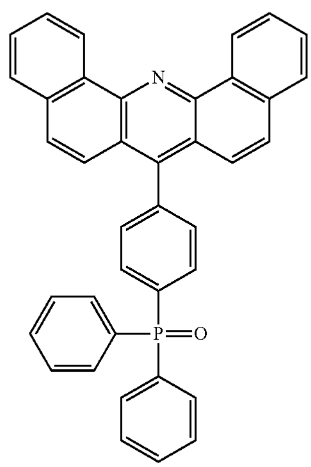

-continued

ET22

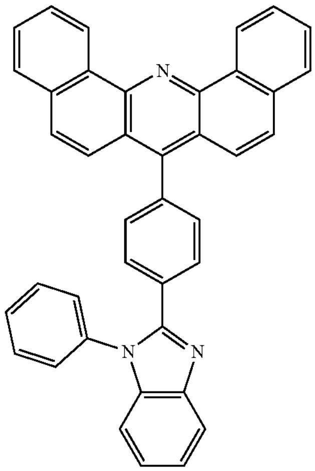

ET23

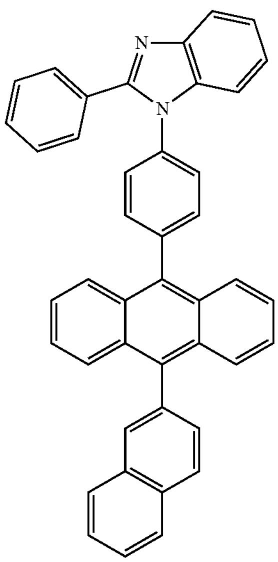

ET24

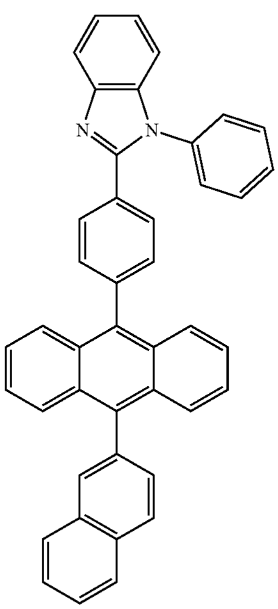

ET25

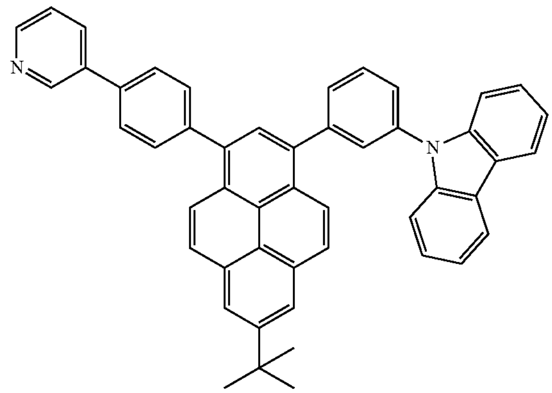

A thickness of the electron transport layer may be in a range of about 100 Å to about 1,000 Å, for example, about 150 Å to about 500 Å. While not wishing to be bound by theory, it is understood that when the thickness of the electron transport layer is within the range described above, the electron transport layer may have satisfactory electron transport characteristics without a substantial increase in driving voltage.

Also, the electron transport layer may further include, in addition to the materials described above, a metal-containing material.

The metal-containing material may include a Li complex. The Li complex may include, for example, Compound ET-D1 (lithium 8-hydroxyquinolate, LiQ) or Compound ET-D2:

ET-D1

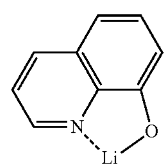

ET-D2

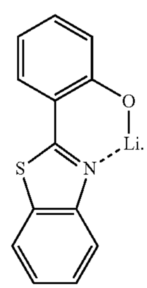

The electron transport region may include an electron injection layer that promotes flow of electrons from the second electrode 19 thereinto.

The electron injection layer may include at least one selected from LiF, NaCl, CsF, $Li_2$, and BaO.

A thickness of the electron injection layer may be in a range of about 1 Å to about 100 Å, for example, about 3 Å to about 90 Å. While not wishing to be bound by theory, it is understood that when the thickness of the electron injection layer is within the range described above, the electron injection layer may have satisfactory electron injection characteristics without a substantial increase in driving voltage.

The second electrode 19 is disposed on the organic layer 15. The second electrode 19 may be a cathode. A material for forming the second electrode 19 may be selected from metal, an alloy, an electrically conductive compound, and a combination thereof, which have a relatively low work function. For example, lithium (Li), magnesium (Mg), aluminum (Al), aluminum-lithium (Al—Li), calcium (Ca), magnesium-indium (Mg—In), or magnesium-silver (Mg—Ag) may be used as a material for forming the second electrode 19. In one or more embodiments, to manufacture a top-emission type light-emitting device, a transmissive electrode formed using ITO or IZO may be used as the second electrode 19.

Hereinbefore, the organic light-emitting device has been described with reference to the FIGURE, but embodiments of the present disclosure are not limited thereto.

Another aspect of the present disclosure provides a diagnostic composition including at least one organometallic compound represented by Formula 1A.

The organometallic compound represented by Formula 1A provides high luminescent efficiency. Accordingly, a diagnostic composition including the organometallic compound may have high diagnostic efficiency.

The diagnostic composition may be used in various applications including a diagnosis kit, a diagnosis reagent, a biosensor, and a biomarker.

The term "$C_1$-$C_{60}$ alkyl group" as used herein refers to a linear or branched saturated aliphatic hydrocarbon monovalent group having 1 to 60 carbon atoms, and non-limiting examples thereof include a methyl group, an ethyl group, a propyl group, an isobutyl group, a sec-butyl group, a tert-butyl group, a pentyl group, an iso-amyl group, and a hexyl group. The term "$C_1$-$C_{60}$ alkylene group" as used herein refers to a divalent group having the same structure as the $C_1$-$C_{60}$ alkyl group.

The term "$C_1$-$C_{60}$ alkoxy group" as used herein refers to a monovalent group represented by —$OA_{101}$ (wherein $A_{101}$ is the $C_1$-$C_{60}$ alkyl group), and non-limiting examples thereof include a methoxy group, an ethoxy group, and an iso-propyloxy (iso-propoxy) group.

The term "$C_2$-$C_{60}$ alkenyl group" as used herein refers to a hydrocarbon group formed by including at least one carbon-carbon double bond in the middle or at the terminus of the $C_2$-$C_{60}$ alkyl group, and examples thereof include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a hydrocarbon group formed by including at least one carbon-carbon triple bond in the middle or at the terminus of the $C_2$-$C_{60}$ alkyl group, and examples thereof include an ethynyl group, and a propynyl group. The term "$C_2$-$C_{60}$ alkynylene group" as used herein refers to a divalent group having the same structure as the $C_2$-$C_{60}$ alkynyl group.

The term "$C_3$-$C_{10}$ cycloalkyl group" as used herein refers to a monovalent saturated hydrocarbon monocyclic group having 3 to 10 carbon atoms, and non-limiting examples thereof include a cyclopropyl group, a cyclobutyl group, a cyclopentyl group, a cyclohexyl group, and a cycloheptyl group. The term "$C_3$-$C_{10}$ cycloalkylene group" as used herein refers to a divalent group having the same structure as the $C_3$-$C_{10}$ cycloalkyl group.

The term "$C_1$-$C_{10}$ heterocycloalkyl group" as used herein refers to a monovalent saturated monocyclic group having at least one heteroatom selected from N, O, P, Si and S as a ring-forming atom and 1 to 10 carbon atoms, and non-limiting examples thereof include a tetrahydrofuranyl group, and a tetrahydrothiophenyl group. The term "$C_1$-$C_{10}$ heterocycloalkylene group" as used herein refers to a divalent group having the same structure as the $C_1$-$C_{10}$ heterocycloalkyl group.

The term "$C_3$-$C_{10}$ cycloalkenyl group" as used herein refers to a monovalent monocyclic group that has 3 to 10 carbon atoms and at least one carbon-carbon double bond in the ring thereof, that is non-aromatic, and non-limiting examples thereof include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent monocyclic group that has at least one heteroatom selected from N, O, P, Si, and S as a ring-forming atom, 1 to 10 carbon atoms, and at least one carbon-carbon double bond in its ring. Examples of the $C_1$-$C_{10}$ heterocycloalkenyl group are a 2,3-dihydrofuranyl group, and a 2,3-dihydrothiophenyl group. The term "$C_1$-$C_{10}$ heterocycloalkenylene group" as used herein refers to a divalent group having the same structure as the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms, and the term "$C_6$-$C_{60}$ arylene group" as used herein refers to a divalent group having a carbocyclic aromatic system having 6 to 60 carbon atoms. Non-limiting examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the rings may be fused to each other.

The term "$C_1$-$C_{60}$ heteroaryl group" as used herein refers to a monovalent group having an aromatic system that has at least one heteroatom selected from N, O, P, Si, and S as a ring-forming atom, and 1 to 60 carbon atoms. The term "$C_1$-$C_{60}$ heteroarylene group" as used herein refers to a divalent group having an aromatic system that has at least one heteroatom selected from N, O, P, Si, and S as a ring-forming atom, and 1 to 60 carbon atoms. Non-limiting examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each include two or more rings, the rings may be fused to each other.

The term "$C_6$-$C_{60}$ aryloxy group" as used herein indicates —$OA_{102}$ (wherein $A_{102}$ is the $C_6$-$C_{60}$ aryl group), the term "$C_6$-$C_{60}$ arylthio group" as used herein indicates —$SA_{103}$ (wherein $A_{103}$ is the $C_6$-$C_{60}$ aryl group), and the term "$C_7$-$C_{60}$ arylalkyl group" as used herein indicates -$A_{104}A_{105}$ (wherein $A_{104}$ is the $C_6$-$C_{59}$ aryl group and $A_{105}$ is the $C_1$-$C_{53}$ alkyl group).

The term "monovalent non-aromatic condensed polycyclic group" as used herein refers to a monovalent group (for example, having 8 to 60 carbon atoms) having two or more rings condensed to each other, only carbon atoms as ring-forming atoms, and no aromaticity in its entire molecular structure. Examples of the monovalent non-aromatic condensed polycyclic group include a fluorenyl group. The term "divalent non-aromatic condensed polycyclic group," as used herein, refers to a divalent group having the same structure as the monovalent non-aromatic condensed polycyclic group.

The term "monovalent non-aromatic condensed heteropolycyclic group" as used herein refers to a monovalent group (for example, having 2 to 60 carbon atoms) having two or more rings condensed to each other, a heteroatom selected from N, O, P, Si, and S, other than carbon atoms, as a ring-forming atom, and no aromaticity in its entire molecular structure. Non-limiting examples of the monovalent non-aromatic condensed heteropolycyclic group include a carbazolyl group. The term "divalent non-aromatic condensed heteropolycyclic group" as used herein refers to a divalent group having the same structure as the monovalent non-aromatic condensed heteropolycyclic group.

The term "$C_5$-$C_{30}$ carbocyclic group" as used herein refers to a saturated or unsaturated cyclic group having, as a ring-forming atom, 5 to 30 carbon atoms only. The $C_5$-$C_{30}$ carbocyclic group may be a monocyclic group or a polycyclic group.

The term "$C_1$-$C_{30}$ heterocyclic group" as used herein refers to a saturated or unsaturated cyclic group having, as a ring-forming atom, at least one heteroatom selected from N, O, Si, P, and S other than 1 to 30 carbon atoms. The $C_1$-$C_{30}$ heterocyclic group may be a monocyclic group or a polycyclic group.

At least one substituent of the substituted $C_5$-$C_{30}$ carbocyclic group, the substituted $C_2$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_7$-$C_{60}$ arylalkyl group, the substituted $C_1$-$C_{60}$ heteroaryl group, the substituted $C_2$-$C_{60}$ heteroaryloxy group, the substituted $C_2$-$C_{60}$ heteroarylthio group, the substituted $C_3$-$C_{60}$ heteroarylalkyl group, the substituted monovalent non-aromatic condensed polycyclic group, and the substituted monovalent non-aromatic condensed heteropolycyclic group may be selected from:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_2$-$C_{60}$ heteroaryloxy group, a $C_2$-$C_{60}$ heteroarylthio group, a $C_3$-$C_{60}$ heteroarylalkyl group, a monovalent non-aromatic condensed polycyclic group, a monovalent non-aromatic condensed heteropolycyclic group, —$N(Q_{11})(Q_{12})$, —$S(Q_{13})(Q_{14})(Q_{15})$, —$B(Q_{16})(Q_{17})$, and —$P(=O)(Q_{18})(Q_{19})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_2$-$C_{60}$ heteroaryloxy group, a $C_2$-$C_{60}$ heteroarylthio group, a $C_3$-$C_{60}$ heteroarylalkyl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_2$-$C_{60}$ heteroaryloxy group, a $C_2$-$C_{60}$ heteroarylthio group, a $C_3$-$C_{60}$ heteroarylalkyl group, a monovalent non-aromatic condensed polycyclic group, and a monovalent non-aromatic condensed heteropolycyclic group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_2$-$C_{60}$ heteroaryloxy group, a $C_2$-$C_{60}$ heteroarylthio group, a $C_3$-$C_{60}$ heteroarylalkyl group, a monovalent non-aromatic condensed polycyclic group, a monovalent non-aromatic condensed heteropolycyclic group, —$N(Q_{21})(Q_{22})$, —$Si(Q_{23})(Q_{24})(Q_{25})$, —$B(Q_{26})(Q_{27})$, and —$P(=O)(Q_{28})(Q_{29})$; and —$N(Q_{31})(Q_{32})$, —$Si(Q_{33})(Q_{34})(Q_{35})$, —$B(Q_{36})(Q_{37})$, and —$P(=O)(Q_{38})(Q_{39})$, and $Q_1$ to $Q_9$, $Q_{11}$ to $Q_{19}$, $Q_{21}$ to $Q_{29}$, and $Q_{31}$ to $Q_{39}$ may each independently be selected from hydrogen, deuterium, —F, —Cl, —Br, —I, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_1$-$C_{60}$ alkyl group substituted with at least one selected from deuterium, a $C_1$-$C_{60}$ alkyl group, and a $C_6$-$C_{60}$ aryl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with at least one selected from deuterium, a $C_1$-$C_{60}$ alkyl group, and a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_2$-$C_{60}$ heteroaryloxy group, a $C_2$-$C_{60}$ heteroarylthio group, a $C_3$-$C_{60}$ heteroarylalkyl group, a monovalent non-aromatic condensed polycyclic group, and a monovalent non-aromatic condensed heteropolycyclic group.

When a group containing a specified number of carbon atoms is substituted with any of the groups listed in the preceding paragraph, the number of carbon atoms in the resulting "substituted" group is defined as the sum of the carbon atoms contained in the original (unsubstituted) group and the carbon atoms (if any) contained in the substituent. For example, when the term "substituted $C_1$-$C_{30}$ alkyl" refers to a $C_1$-$C_{30}$ alkyl group substituted with $C_6$-$C_{30}$ aryl group, the total number of carbon atoms in the resulting aryl substituted alkyl group is $C_7$-$C_{60}$.

Hereinafter, a compound and an organic light-emitting device according to embodiments are described in detail with reference to Synthesis Examples and Examples. However, the organic light-emitting device is not limited thereto. The wording "B was used instead of A" used in describing Synthesis Examples means that the number of molar equivalents of A used was identical to the number of molar equivalents of B used.

EXAMPLES

Synthesis Example 1: Synthesis of Compound 1-1

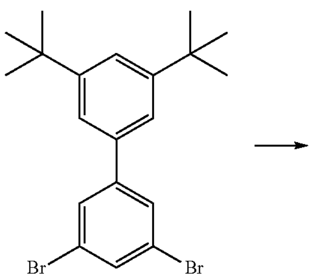

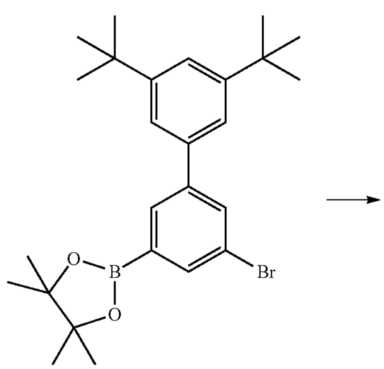

A

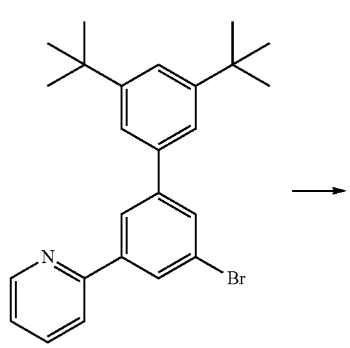

B

-continued

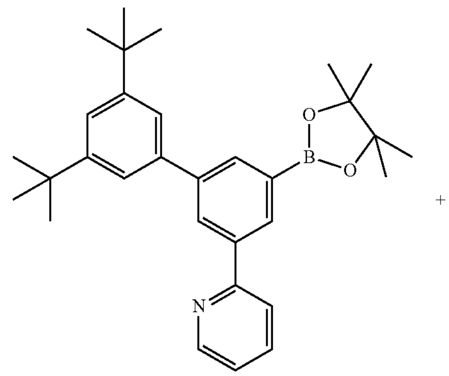

C

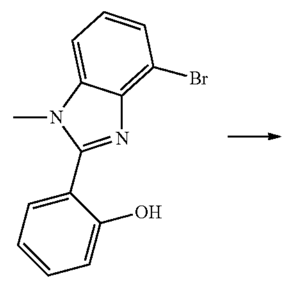

D

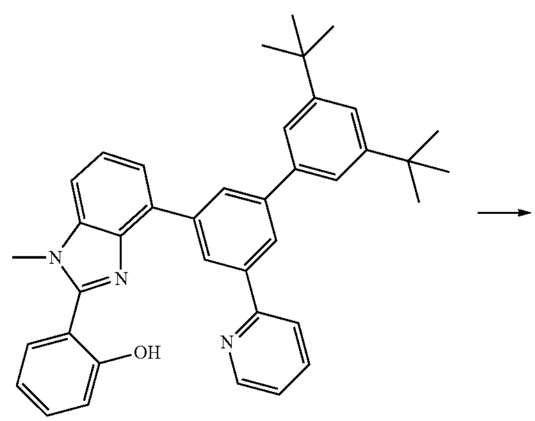

E

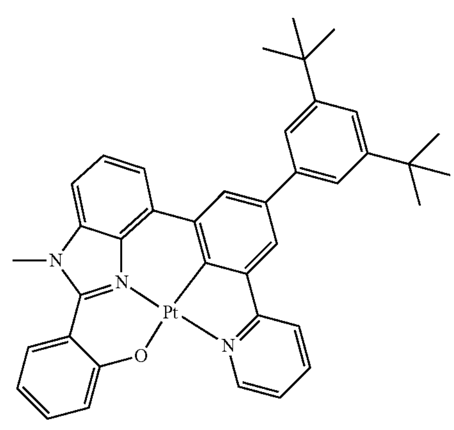

Compound 1-1

Synthesis of Intermediate A (2-(5-bromo-3',5'-di-tert-butyl-[1,1'-biphenyl]-3-yl)-4,4,5,5-tetramethyl-1,3,2-dioxaborolane)

10 grams (g) (0.024 moles, mol) of 3,5-dibromo-3',5'-di-tert-butyl-1,1'-biphenyl and 9.0 g (0.036 mol, 1.5 equivalents, equiv.) of bispinacolato diboron were added to a flask, and 4.6 g (0.048 mol, 2 equiv.) of potassium acetate and 0.96 g (0.05 equiv.) of $PdCl_2$(dppf) were added to the flask. Then, 100 milliliters (ml) of toluene was added thereto, and the resultant mixture was refluxed overnight at a temperature of 100° C. The refluxed mixture thus obtained was cooled to room temperature, and the precipitate was filtered therefrom. The filtrate was washed by using ethyl acetate (EA)/$H_2O$, and purified by column chromatography to obtain 5.6 g (yield: 50%) of Intermediate A. The obtained product was confirmed by Mass Spectrometry and HPLC analysis.

HRMS (MALDI) calcd for $C_{26}H_{36}BBrO_2$: m/z 470.1992, found: 470.1994.

Synthesis of Intermediate B (2-(5-bromo-3',5'-di-tert-butyl-[1,1'-biphenyl]-3-yl)pyridine)

5.6 g (0.014 mol, 1.2 equiv.) of Intermediate A, 1.9 g (0.012 mol, 1 equiv.) of 2-bromopyridine, 0.61 g (0.001 mol, 0.07 equiv.) of tetrakis(triphenylphosphine)palladium(0), and 3.1 g (0.036 mol, 3 equiv.) of potassium carbonate were dissolved in a solvent (25 mL, 0.8 molar, M) in which tetrahydrofuran (THF) and distilled water ($H_2O$) were mixed at a ratio of 3:1, and the mixed solution was refluxed for 12 hours. The refluxed mixture thus obtained was cooled to room temperature, and the precipitate was filtered therefrom. The filtrate was washed by using EA/$H_2O$, and purified by column chromatography (while increasing a volume rate of methylene chloride (MC)/hexane (Hex) to between 25% and 50%) to obtain 4 g (yield: 80%) of Intermediate B. The obtained product was confirmed by Mass Spectrometry and HPLC analysis.

HRMS (MALDI) calcd for $C_{25}H_{28}BrN$: m/z 421.1405, found: 421.1407.

Synthesis of Intermediate C (2-(3',5'-di-tert-butyl-5-(4,4,5,5-tetramethyl-1,3,2-dioxaborolan-2-yl)-[1,1'-biphenyl]-3-yl)pyridine)

4 g (0.009 mol) of Intermediate B (2-(5-bromo-3',5'-di-tert-butyl-[1,1'-biphenyl]-3-yl)pyridine) and 3.6 g (0.014 mol, 1.5 equiv.) of bispinacolato diboron were added to a flask, and 1.9 g (0.019 mol, 2 equiv.) of potassium acetate and 0.39 g (0.05 equiv.) of $PdCl_2$(dppf) were added to the flask. Then, 32 mL of toluene was added thereto, and the resultant mixture was refluxed overnight at a temperature of 100° C. The refluxed mixture thus obtained was cooled to room temperature, and the precipitate was filtered therefrom. The filtrate was washed by using EA/$H_2O$, and purified by column chromatography to obtain 2.4 g (yield: 56%) of Intermediate C. The obtained product was confirmed by Mass Spectrometry and HPLC analysis.

HRMS (MALDI) calcd for $C_{31}H_{40}BNO_2$: m/z 469.3152, found: 469.3155.

Synthesis of Intermediate E (2-(4-(3',5'-di-tert-butyl-5-(pyridin-2-yl)-[1,1'-biphenyl]-3-yl)-1-methyl-1H-benzo[d]imidazol-2-yl)phenol)

2.4 g (0.005 mol, 1.2 equiv.) of Intermediate C, 1.3 g (0.004 mol, 1 equiv.) of Intermediate D (2-(4-bromo-1-methyl-1H-benzo[d]imidazol-2-yl)phenol), 0.35 g (0.001 mol, 0.07 equiv.) of tetrakis(triphenylphosphine)palladium (0), and 1.8 g (0.013 mol, 3 equiv.) of potassium carbonate were dissolved in 20 mL of a solvent in which tetrahydrofuran (THF) and distilled water ($H_2O$) were mixed at a ratio of 3:1, and the mixed solution was refluxed for 12 hours. The refluxed mixture thus obtained was cooled to room temperature, and the precipitate was filtered therefrom. The filtrate was washed by using EA/$H_2O$, and purified by column chromatography (while increasing a volume rate of MC/Hex to between 25% and 50%) to obtain 1.7 g (yield: 73%) of Intermediate E. The obtained product was confirmed by Mass Spectrometry and HPLC analysis.

HRMS (MALDI) calcd for $C_{39}H_{39}N_3O$: m/z 565.3093, found: 565.3096.

Synthesis of Compound 1-1

1.4 g (2.5 mmol) of Intermediate E and 1.23 g (3 mmol, 1.2 equiv.) of $K_2PtCl_4$ were dissolved in 25 mL of a solvent in which 20 mL of AcOH and 5 mL of $H_2O$ were mixed, and the mixed solution was refluxed for 16 hours. The refluxed mixture thus obtained was cooled to room temperature, and the precipitate was filtered therefrom. The precipitate was dissolved again in MC and washed by using $H_2O$. The organic layer was purified by column chromatography (MC 40%, EA 1%, Hex 59%) to obtain 0.7 g (purity: 99% or more) of Compound 1-1. The obtained product was confirmed by Mass Spectrometry and HPLC analysis.

HRMS (MALDI) calcd for $C_{39}H_{37}N_3OPt$: m/z 758.26, found: 758.26.

Synthesis Example 2: Synthesis of Compound 1-28

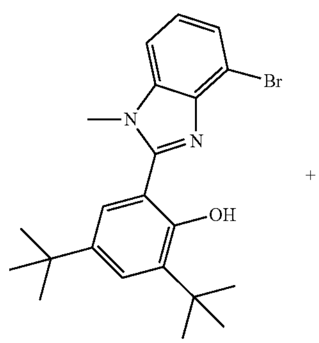

F

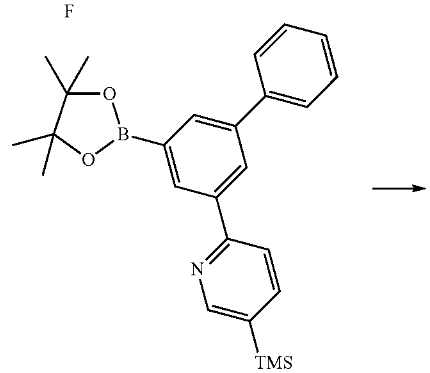

G

-continued

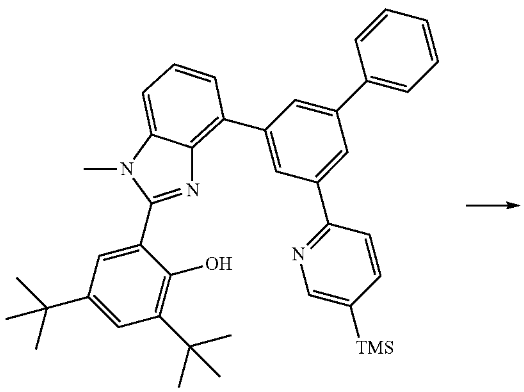

H

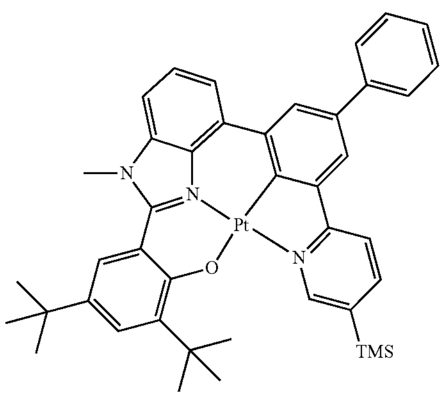

Compound 1-28

Synthesis of Intermediate H

Intermediate H was synthesized in the same manner as Intermediate E in Synthesis Example 1, except that Intermediate F and Intermediate G were used instead of Intermediate D and Intermediate C, respectively.

HRMS (MALDI) calcd for $C_{42}H_{47}N_3OSi$: m/z 637.3488, found: 637.3485.

Synthesis of Compound 1-28

Compound 1-28 (1.5 g, yield: 52%) was synthesized in the same manner as Compound 1-1 in Synthesis Example 1, except that Intermediate H was used instead of Intermediate E.

HRMS (MALDI) calcd for $C_{42}H_{45}N_3OPtSi$: m/z 830.2980, found: 830.2983.

Synthesis Example 3: Synthesis of Compound 1-30

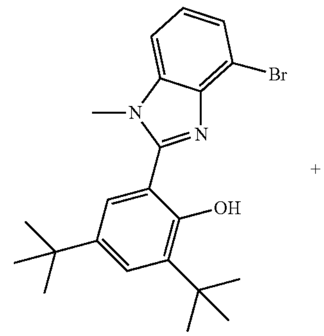

F

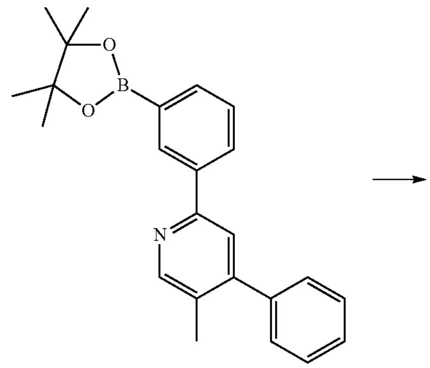

I

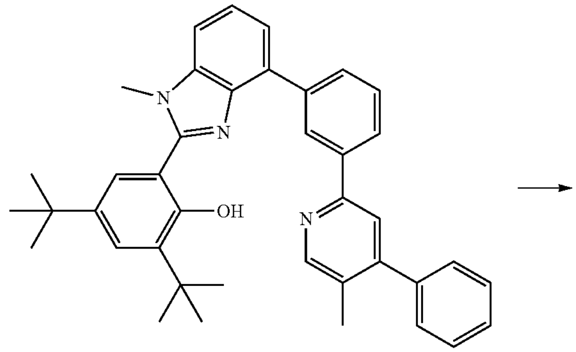

J

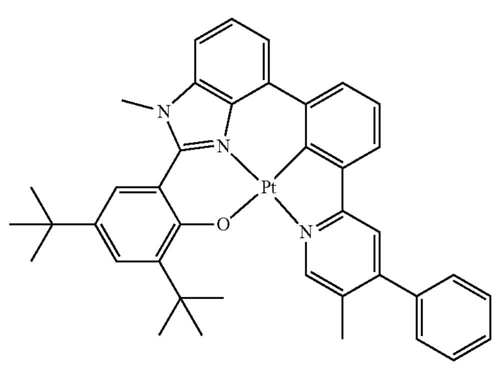

Compound 1-30

Synthesis of Intermediate J

Intermediate J was synthesized in the same manner as Intermediate E in Synthesis Example 1, except that Intermediate F and Intermediate I were used instead of Intermediate D and Intermediate C, respectively.

HRMS (MALDI) calcd for $C_{40}H_{41}N_3O$: m/z 579.3250, found: 579.3252.

Synthesis of Compound 1-30

Compound 1-30 (1.2 g, yield: 56%) was synthesized in the same manner as Compound 1-1 in Synthesis Example 1, except that Intermediate J was used instead of Intermediate E.

HRMS (MALDI) calcd for $C_{40}H_3N_3OPt$: m/z 772.2741, found: 772.2745.

Synthesis Example 4: Synthesis of Compound 1-17

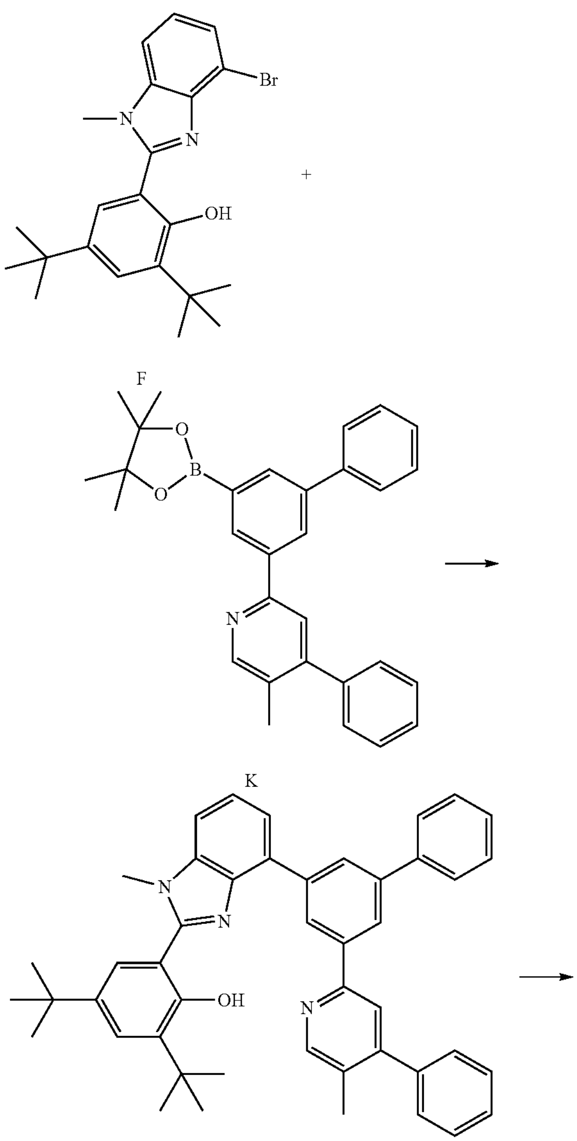

L

-continued

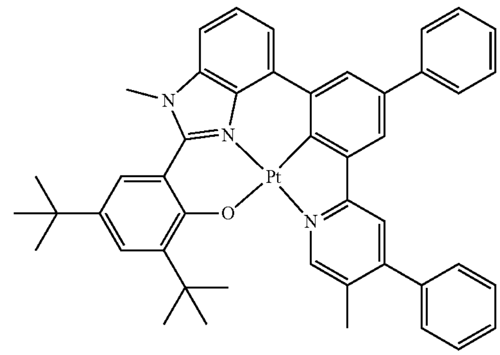

Compound 1-17

Synthesis of Intermediate L

Intermediate L was synthesized in the same manner as Intermediate E in Synthesis Example 1, except that Intermediate F and Intermediate K were used instead of Intermediate D and Intermediate C, respectively.

HRMS (MALDI) calcd for $C_{46}H_{45}N_{30}$: m/z 655.3563, found: 655.3567.

Synthesis of Compound 1-17

Compound 1-17 (1.7 g, yield: 57%) was synthesized in the same manner as Compound 1-1 in Synthesis Example 1, except that Intermediate L was used instead of Intermediate E.

HRMS (MALDI) calcd for $C_{46}H_{43}N_3OPt$: m/z 848.3054, found: 848.3053.

Synthesis Example 5: Synthesis of Compound 1-9

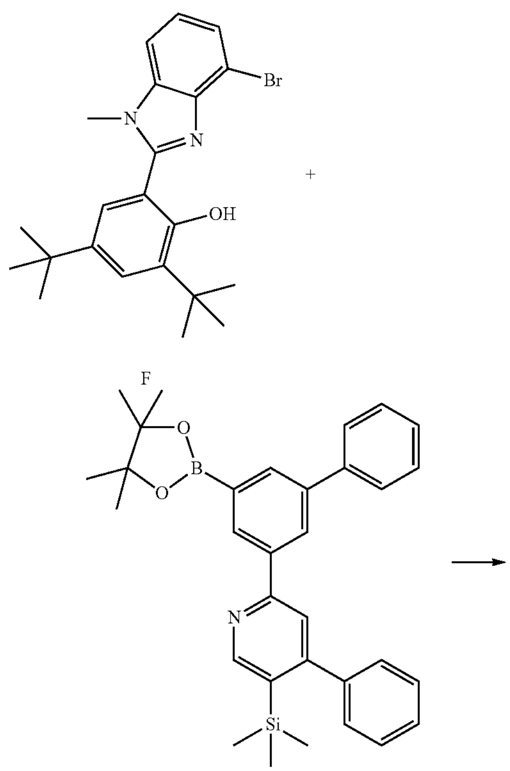

M

-continued

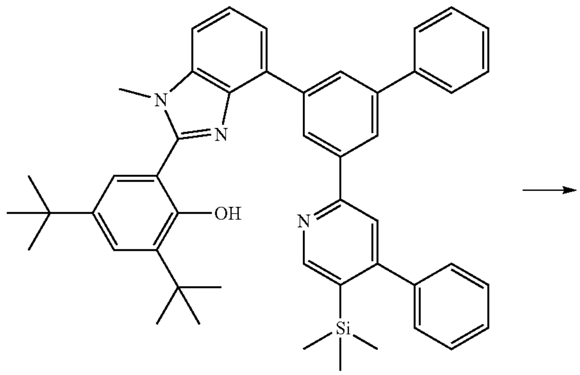

N

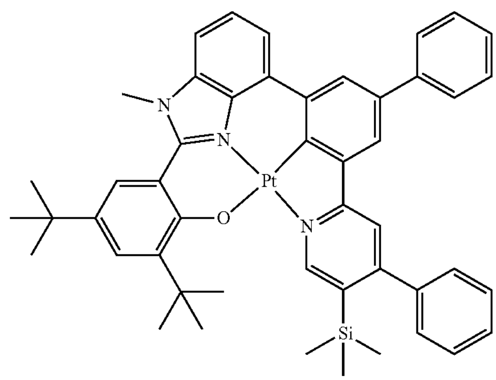

Compound 1-9

Synthesis of Intermediate N

Intermediate N was synthesized in the same manner as Intermediate E in Synthesis Example 1, except that Intermediate F and Intermediate M were used instead of Intermediate D and Intermediate C, respectively.

HRMS (MALDI) calcd $C_{48}H_5N_3OSi$: m/z 713.3801, found: 713.3804.

Synthesis of Compound 1-9

Compound 1-9 (1.2 g, yield: 52%) was synthesized in the same manner as Compound 1-1 in Synthesis Example 1, except that Intermediate N was used instead of Intermediate E.

HRMS (MALDI) calcd for $C_{48}H_4N_3OPtSi$: m/z 906.3293, found: 906.3297.

Synthesis Example 6: Synthesis of Compound 1-12

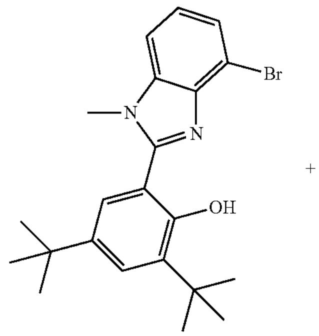

F

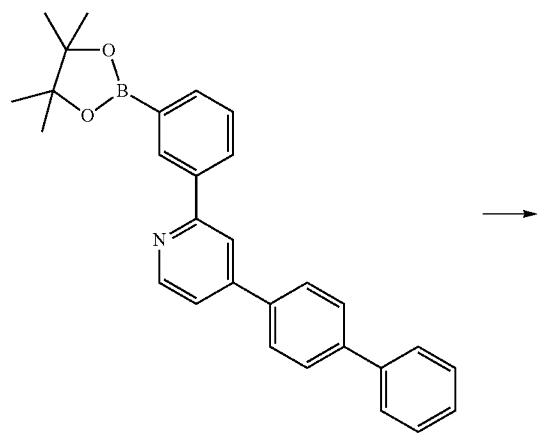

Q

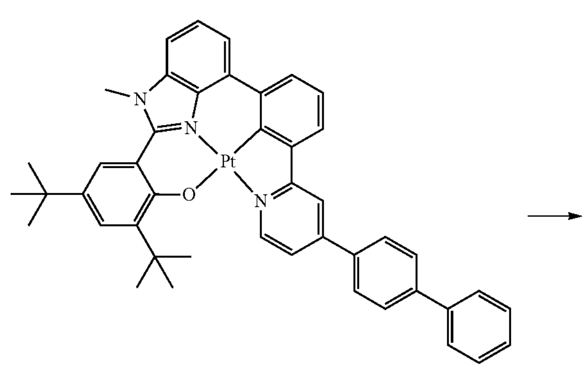

R

-continued

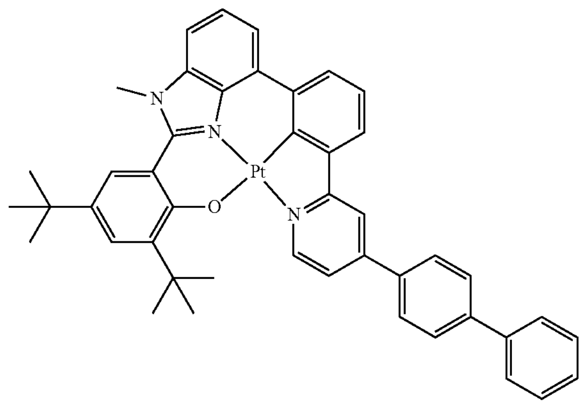

Compound 1-12

Synthesis of Intermediate R

Intermediate R was synthesized in the same manner as Intermediate E in Synthesis Example 1, except that Intermediate F and Intermediate Q were used instead of Intermediate D and Intermediate C, respectively.

HRMS (MALDI) calcd for $C_{45}H_{43}N_{30}$: m/z 641.3406, found: 641.3408.

Synthesis of Compound 1-12

Compound 1-12 (1.0 g, yield: 45%) was synthesized in the same manner as Compound 1-1 in Synthesis Example 1, except that Intermediate R was used instead of Intermediate E.

HRMS (MALDI) calcd for $C_{45}H_{41}N_3OPt$: m/z 834.2897, found: 834.2892.

Synthesis Example 7: Synthesis of Compound 3-417

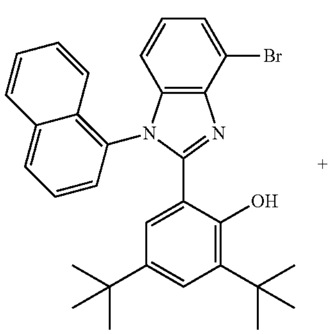

S

-continued

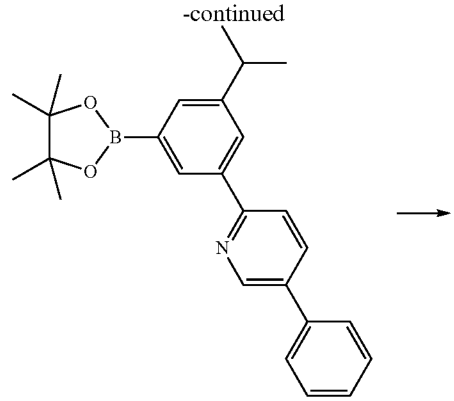

T

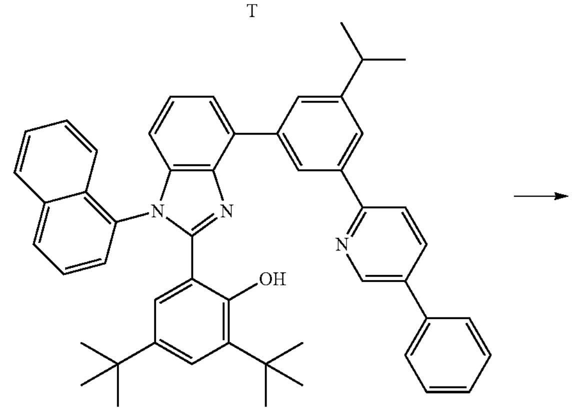

U

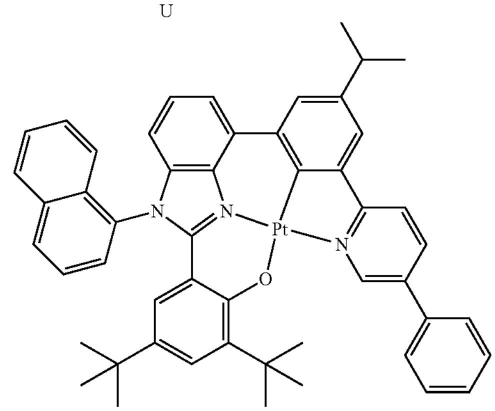

Compound 3-417

Synthesis of Intermediate U

Intermediate U was synthesized in the same manner as Intermediate E in Synthesis Example 1, except that Intermediate S and Intermediate T were used instead of Intermediate D and Intermediate C, respectively.

HRMS (MALDI) calcd for $C_{51}H_{49}N_{30}$: m/z 719.3876, found: 719.3874.

Synthesis of Compound 3-417

Compound 3-417 (1.2 g, yield: 55%) was synthesized in the same manner as Compound 1-1 in Synthesis Example 1, except that Intermediate U was used instead of Intermediate E.

HRMS (MALDI) calcd for $C_{45}H_{41}N_3OPt$: m/z 912.3367, found: 912.3369.

Example 1

An ITO glass substrate on which an ITO electrode (anode) is deposited was cut to a size of 50 mm×50 mm×0.5 mm (mm=millimeter), sonicated with acetone, iso-propyl alcohol, and pure water each for 15 minutes, and cleaned by exposure to ultraviolet (UV) rays and ozone for 30 minutes.

Then, m-MTDATA was deposited on an ITO electrode (anode) of the glass substrate at a deposition rate of 1 Angstroms per second (A/sec) to form a hole injection layer having a thickness of 600 Angstroms (Å), and α-NPD (also referred to as NPB) was deposited on the hole injection layer at a deposition rate of 1 Å/sec to form a hole transport layer having a thickness of 250 Å.

Compound 1-28 (dopant) and CBP (host) were co-deposited on the hole transport layer at a deposition rate of 0.1 Å/sec and 1 Å/sec, respectively, to form an emission layer having a thickness of 400 Å.

BAlq was deposited on the emission layer at a deposition rate of 1 Å/sec to form a hole blocking layer having a thickness of 50 Å, $Alq_3$ was deposited on the hole blocking layer to form an electron transport layer having a thickness of 300 Å, LiF was deposited on the electron transport layer to form an electron injection layer having a thickness of 10 Å, and Al was vacuum-deposited on the electron injection layer to form a second electrode (cathode) having a thickness of 1,200 Å, thereby completing the manufacture of an organic light-emitting device having a structure of ITO/m-MTDATA (600 Å)/α-NPD (250 Å)/CBP+Compound 1-28 (10 wt %) (400 Å)/BAlq (50 Å)/$Alq_3$ (300 Å)/LiF (10 Å)/Al (1,200 Å).

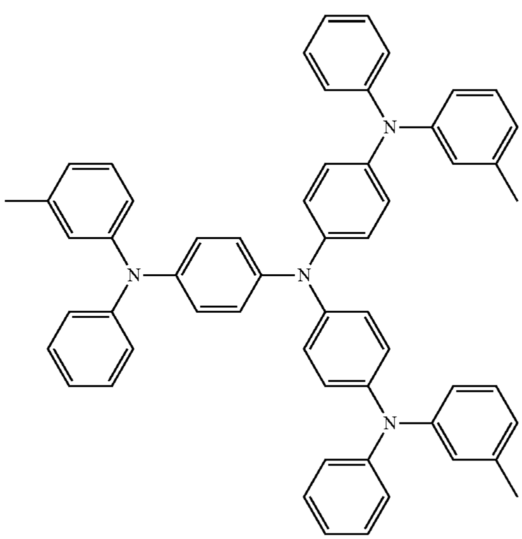

m-MTDATA

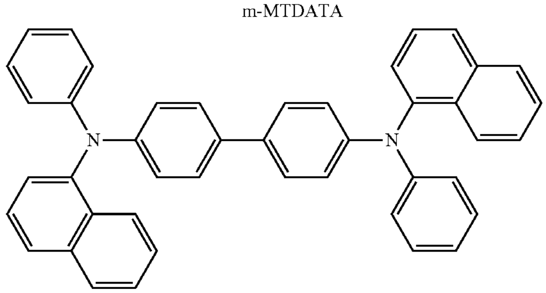

NPB

-continued

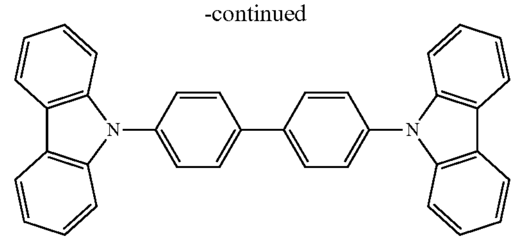

CBP

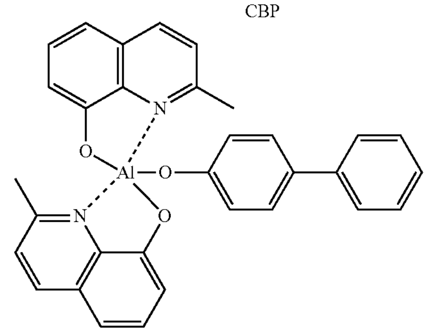

BAlq

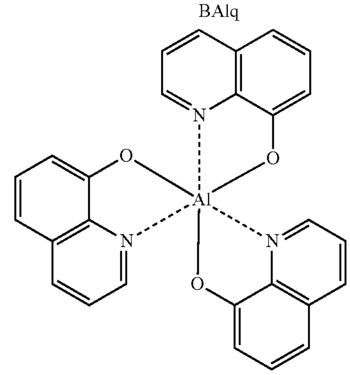

$Alq_3$

Examples 2 to 6 and Comparative Examples 1 to 4

Organic light-emitting devices were manufactured in the same manner as in Example 1, except that Compounds shown in Table 2 were each used instead of Compound 1-28 as a dopant in forming an emission layer.

Evaluation Example 1: Evaluation of Characteristics of Organic Light-Emitting Devices The driving voltage, luminescent efficiency, quantum emission efficiency, roll-off ratio, and lifespan ($T_{95}$) characteristics of the organic light-emitting device manufactured according to Examples 1 to 6 and Comparative Examples 1 to 4 were evaluated, and results thereof are shown in Table 2. Devices used for the evaluation were a current-voltage meter (Keithley 2400) and a luminance meter (Minolta Cs-1000A). The lifespan ($T_{95}$) (at 6,000 nit) indicates an amount of time that lapsed when luminance was 95% of initial luminance (100%) in a relative manner with respect to those of the organic light-emitting device of Example 6. The roll-off ratio was calculated according to Equation 20. The luminescence efficiency are also provided in a relative manner with respect to those of the organic light-emitting device of Example 5.

Roll off={1−(efficiency at 9,000 nit/maximum light-emission efficiency)}×100% Equation 20

TABLE 2

| | Dopant | Driving voltage (V) | Luminescent efficiency (%) (relative value) | Quantum emission efficiency (%) | Roll-off ratio (%) | Lifespan (%) ($T_{95}$) (relative value) |
|---|---|---|---|---|---|---|
| Example 1 | Compound 1-28 | 4.11 | 81% | 84% | 14% | 24% |
| Example 2 | Compound 1-30 | 4.14 | 80% | 89% | 15% | 11% |
| Example 3 | Compound 1-17 | 4.10 | 84% | 87% | 11% | 28% |
| Example 4 | Compound 1-9 | 3.90 | 91% | 91% | 9% | 15% |
| Example 5 | Compound 1-12 | 3.82 | 100% | 100% | 6% | 75% |
| Example 6 | Compound 3-417 | 3.94 | 92% | 94% | 10% | 100% |
| Comparative Example 1 | Compound A | 4.57 | 50% | 69% | 11% | 18% |
| Comparative Example 2 | Compound B | 4.00 | 61% | 56% | 9% | 0% |
| Comparative Example 3 | Compound C | 4.97 | 62% | 61% | 35% | 4% |
| Comparative Example 4 | Compound D | 4.78 | 57% | 60% | 19% | 0% |

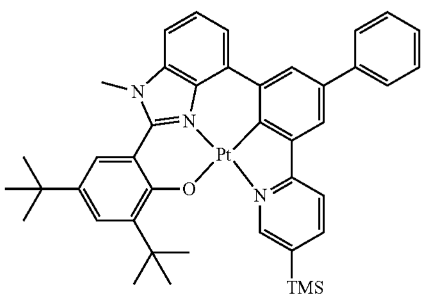

1-28

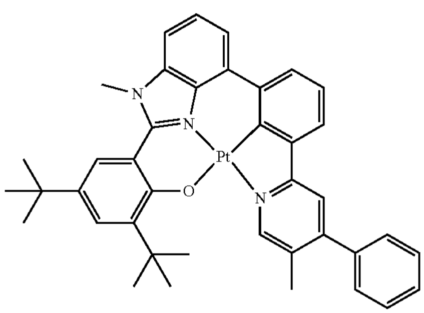

1-30

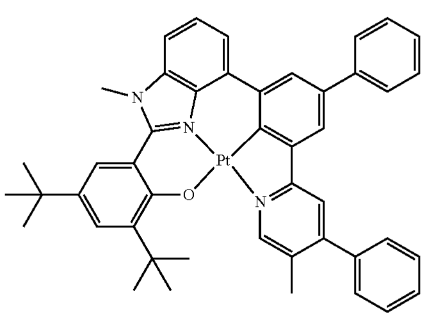

1-17

TABLE 2-continued
| Dopant | Driving voltage (V) | Luminescent efficiency (%) (relative value) | Quantum emission efficiency (%) | Roll-off ratio (%) | Lifespan (%) ($T_{95}$) (relative value) |
|---|---|---|---|---|---|
| 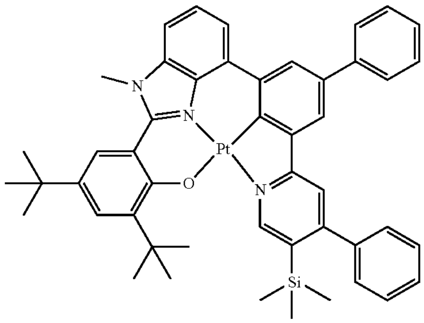 1-9 | | | | | |
| 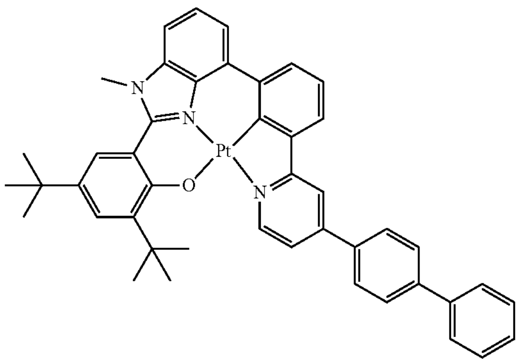 1-12 | | | | | |
| 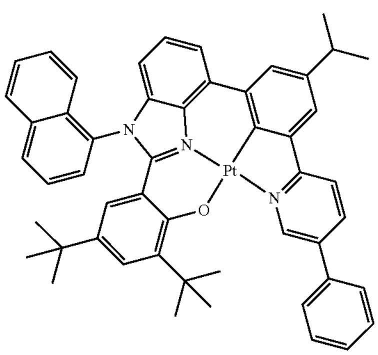 3-417 | | | | | |
| 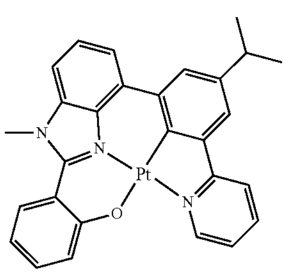 A | | | | | |

TABLE 2-continued

| Dopant | Driving voltage (V) | Luminescent efficiency (%) (relative value) | Quantum emission efficiency (%) | Roll-off ratio (%) | Lifespan (%) ($T_{95}$) (relative value) |
|---|---|---|---|---|---|

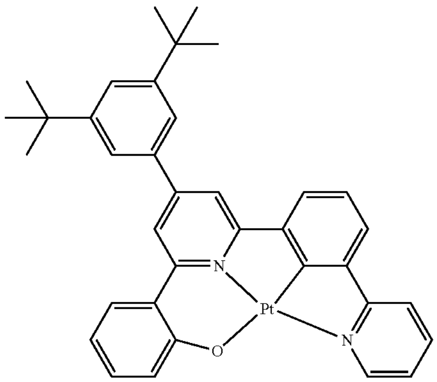

B

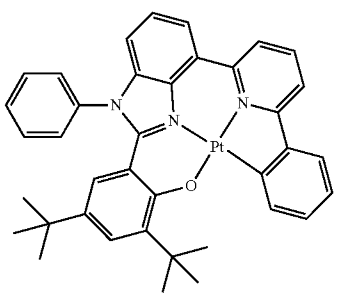

C

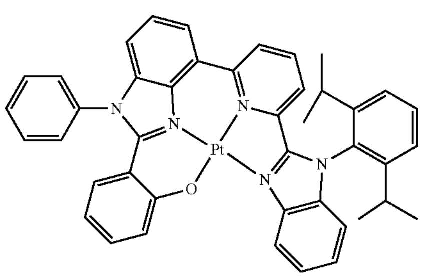

D

Referring to Table 2, it was confirmed that the organic light-emitting devices of Examples 1 to 6 have improved driving voltage, luminescent efficiency, quantum emission efficiency, roll-off ratio, and lifespan characteristics, as compared with those of the organic light-emitting devices of Comparative Examples 1 to 4.

As described above, an organometallic compound according to embodiments of the present disclosure has excellent electrical characteristics and thermal stability, and accordingly, an organic light-emitting device including the organometallic compound may have excellent driving voltage, light-emission efficiency, quantum emission efficiency, roll-off ratio, and lifespan characteristics. In addition, due to excellent phosphorescent luminescence characteristics of the organometallic compound, the organometallic compound may provide a diagnostic composition having high diagnostic efficiency.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope of the present disclosure as defined by the following claims.

What is claimed is:

1. An organometallic compound represented by Formula 1A:

Formula 1A

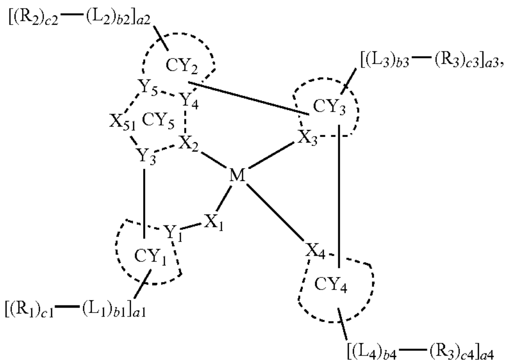

wherein, in Formula 1A,

M is beryllium (Be), magnesium (Mg), aluminum (Al), calcium (Ca), titanium (Ti), manganese (Mn), cobalt (Co), copper (Cu), zinc (Zn), gallium (Ga), germanium (Ge), zirconium (Zr), ruthenium (Ru), rhodium (Rh), palladium (Pd), silver (Ag), rhenium (Re), platinum (Pt), or gold (Au), $X_1$ is O or S, and a bond between $X_1$ and M is a covalent bond, $X_2$ and $X_3$ are each independently C or N, $X_4$ is N, one bond selected from a bond between $X_2$ and M, a bond between $X_3$ and M, and a bond between $X_4$ and M is a covalent bond, and the others thereof are each a coordinate bond, $Y_1$ and $Y_3$ to $Y_5$ are each independently C or N, a bond between $X_2$ and $Y_3$, a bond between $X_2$ and $Y_4$, a bond between $Y_4$ and $Y_5$, a bond between $Y_5$ and $X_{51}$, a bond between $X_{51}$ and $Y_3$ are each a chemical bond, $CY_1$ to $CY_5$ are each independently selected from a $C_5$-$C_{30}$ carbocyclic group and a $C_1$-$C_{30}$ heterocyclic group, wherein $CY_3$ is not a naphthalene group and $CY_4$ is not a benzimidazole group or an isoquinoline group, a cyclometallated ring formed by $CY_5$, $CY_2$, $CY_3$, and M is a 6-membered ring, $X_{51}$ is selected from O, S, N-[$(L_7)_{b7}$-$(R_7)_{c7}$], $C(R_7)(R_8)$, $Si(R_7)(R_8)$, $Ge(R_7)(R_8)$, C(═O), N, $C(R_7)$, $Si(R_7)$, and $Ge(R_7)$, $R_7$ and $R_8$ are optionally linked via a first linking group to form a substituted or unsubstituted $C_5$-$C_{30}$ carbocyclic group or a substituted or unsubstituted $C_1$-$C_{30}$ heterocyclic group, $L_1$ to $L_4$ and $L_7$ are each independently selected from a substituted or unsubstituted $C_5$-$C_{30}$ carbocyclic group and a substituted or unsubstituted $C_1$-$C_{30}$ heterocyclic group, b1 to b4 and b7 are each independently an integer from 0 to 5, $R_1$ to $R_4$, $R_7$, and $R_8$ are each independently selected from hydrogen, deuterium, —F, —Cl, —Br, —I, —$SF_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_2$-$C_{60}$ heteroaryloxy group, a substituted or unsubstituted $C_2$-$C_{60}$ heteroarylthio group, a substituted or unsubstituted $C_3$-$C_{60}$ heteroarylalkyl group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, —$B(Q_6)(Q_7)$, and —P(═O)$(Q_8)(Q_9)$, c1 to c4 are each independently an integer from 1 to 5, c7 is 1, a1 to a4 are each independently 1, 2, 3, 4, or 5, two of a plurality of neighboring groups $R_1$ are optionally linked to form a substituted or unsubstituted $C_5$-$C_{30}$ carbocyclic group or a substituted or unsubstituted $C_1$-$C_{30}$ heterocyclic group, two of a plurality of neighboring groups $R_2$ are optionally linked to form a substituted or unsubstituted $C_5$-$C_{30}$ carbocyclic group or a substituted or unsubstituted $C_1$-$C_{30}$ heterocyclic group, two of a plurality of neighboring groups $R_3$ are optionally linked to form a substituted or unsubstituted $C_5$-$C_{30}$ carbocyclic group or a substituted or unsubstituted $C_1$-$C_{30}$ heterocyclic group, two of a plurality of neighboring groups $R_4$ are optionally linked to form a substituted or unsubstituted $C_5$-$C_{30}$ carbocyclic group or a substituted or unsubstituted $C_1$-$C_{30}$ heterocyclic group, two or more neighboring groups selected from $R_1$ to $R_4$ are optionally linked to form a substituted or unsubstituted $C_5$-$C_{30}$ carbocyclic group or a substituted or unsubstituted $C_1$-$C_{30}$ heterocyclic group, wherein i) at least one selected from $R_1$ to $R_4$ is not hydrogen, ii) at least one selected from $R_1$, $R_2$, and $R_4$ is not hydrogen, iii) at least one selected from $R_1$ to $R_3$ is not hydrogen, or iv) at least one selected from $R_1$ and $R_2$ is not hydrogen, provided that, in cases where i) to viii) apply, at least one selected from $R_1$ to $R_4$ is selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, i) M is Pt, ii) $X_1$ is O, iii) $X_2$ and $X_4$ are each N, $X_3$ is C, a bond between $X_2$ and M and a bond between $X_4$ and M are each a coordinate bond, and a bond between $X_3$ and M is a covalent bond, iv) $Y_1$ to $Y_5$ are each C, v) a bond between $Y_5$ and $X_{51}$ and a bond between $Y_3$ and $X_{51}$ are each a single bond, vi) $CY_1$, $CY_2$, and $CY_3$ are each a benzene group, and $CY_4$ is a pyridine group, vii) $X_{51}$ is O, S, or N-[$(L_7)_{b7}$-$(R_7)_{c7}$], and viii) b7 is 0, c7 is 1, and $R_7$ is a substituted or unsubstituted $C_1$-$C_{60}$ alkyl group, provided that when i) M is Pt, ii) $X_1$ is O, iii) $X_2$ and $X_4$ are each N, $X_3$ is C, a bond between $X_2$ and M and a bond between $X_4$ and M are each a coordinate bond, and a bond between $X_3$ and M is a covalent bond, iv) $Y_1$ to $Y_5$ are each C, v) a bond between $Y_5$ and $X_{51}$ and a bond between $Y_3$ and $X_{51}$ are each a single bond, vi) $C_1$, $CY_2$, and $CY_3$ are each a benzene group, and $CY_4$ is a pyridine group, vii) $X_{51}$ is O, S, or NH, viii) a1, a2, and a4 are each 0, and ix) a3 is 1, b3 is 0, and c3 is 1, then $R_3$ is not tert-butyl;

at least one substituent of the substituted $C_5$-$C_{30}$ carbocyclic group, the substituted $C_1$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_7$-$C_{60}$ arylalkyl group, the substituted $C_1$-$C_{60}$ heteroaryl group, the substituted $C_2$-$C_{60}$ heteroaryloxy group, the substituted $C_2$-$C_{60}$ heteroarylthio group, the substituted $C_3$-$C_{60}$ heteroarylalkyl group, the substituted monovalent non-aromatic condensed polycyclic group, and the substituted monovalent non-aromatic condensed heteropolycyclic group is selected from:

deuterium, —F, —C, —Br, —I, $—CD_3$, $—CD_2H$, $—CDH_2$, $—CF_3$, $—CF_2H$, $—CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —C, —Br, —I, $—CD_3$, $—CD_2H$, $—CDH_2$, $—CF_3$, $—CF_2H$, $—CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_2$-$C_{60}$ heteroaryloxy group, a $C_2$-$C_{60}$ heteroarylthio group, a $C_3$-$C_{60}$ heteroarylalkyl group, a monovalent non-aromatic condensed polycyclic group, a monovalent non-aromatic condensed heteropolycyclic group, $—N(Q_{11})(Q_{12})$, $—S(Q_{13})(Q_{14})(Q_{15})$, $—B(Q_{16})(Q_{17})$, and $—P(=O)(Q_{18})(Q_{19})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_2$-$C_{60}$ heteroaryloxy group, a $C_2$-$C_{60}$ heteroarylthio group, a $C_3$-$C_{60}$ heteroarylalkyl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_2$-$C_{60}$ heteroaryloxy group, a $C_2$-$C_{60}$ heteroarylthio group, a $C_3$-$C_{60}$ heteroarylalkyl group, a monovalent non-aromatic condensed polycyclic group, and a monovalent non-aromatic condensed heteropolycyclic group, each substituted with at least one selected from deuterium, —F, —C, —Br, —I, $—CD_3$, $—CD_2H$, $—CDH_2$, $—CF_3$, $—CF_2H$, $—CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_2$-$C_{60}$ heteroaryloxy group, a $C_2$-$C_{60}$ heteroarylthio group, a $C_3$-$C_{60}$ heteroarylalkyl group, a monovalent non-aromatic condensed polycyclic group, a monovalent non-aromatic condensed heteropolycyclic group, $—N(Q_{21})(Q_{22})$, $—Si(Q_{23})(Q_{24})(Q_{25})$, $—B(Q_{26})(Q_{27})$, and $—P(=O)(Q_{28})(Q_{29})$; and $—N(Q_{31})(Q_{32})$, $—Si(Q_{33})(Q_{34})(Q_{35})$, $—B(Q_{36})(Q_{37})$, and $—P(=O)(Q_{38})(Q_{39})$, and $Q_1$ to $Q_9$, $Q_{11}$ to $Q_{19}$, $Q_{21}$ to $Q_{29}$, and $Q_{31}$ to $Q_{39}$ are each independently selected from hydrogen, deuterium, —F, —Cl, —Br, —I, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_1$-$C_{60}$ alkyl group substituted with at least one selected from deuterium, a $C_1$-$C_{60}$ alkyl group, and a $C_6$-$C_{60}$ aryl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with at least one selected from deuterium, a $C_1$-$C_{60}$ alkyl group, and a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_2$-$C_{60}$ heteroaryloxy group, a $C_2$-$C_{60}$ heteroarylthio group, a $C_3$-$C_{60}$ heteroarylalkyl group, a monovalent non-aromatic condensed polycyclic group, and a monovalent non-aromatic condensed heteropolycyclic group.

2. The organometallic compound of claim 1, wherein $CY_1$ to $CY_4$ are each independently selected from a) a 6-membered ring, b) a condensed ring having two or more 6-membered rings that are condensed to each other, and c) a condensed ring having two or more 6-membered rings and one 5-membered ring that are condensed to each other, wherein the 6-membererd ring is selected from a cyclohexane group, a cyclohexene group, an adamantane group, a norbornane group, a norbornene group, a benzene group, a pyridine group, a pyrimidine group, a pyrazine group, a pyridazine group, and a triazine group, and the 5-membered ring is selected from a cyclopentane group, a cyclopentene group, a cyclopentadiene group, a furan group, a thiophene group, a silole group, a pyrrole group, a pyrazole group, an imidazole group, a triazole group, an oxazole group, an isoxazole group, a thiazole group, an isothiazole group, an oxadiazole group, and a thiadiazole group.

3. The organometallic compound of claim 1, wherein $CY_1$ to $CY_4$ are each independently selected from a benzene group, a naphthalene group, an anthracene group, a phenanthrene group, a triphenylene group, a pyrene group, a chrysene group, a cyclopentadiene group, a 1,2,3,4-tetrahydronaphthalene group, a fluorene group, a carbazole group, a dibenzofuran group, a dibenzothiophene group, a dibenzosilole group, an azafluorene group, an azacarbazole group, an azadibenzofuran group, an azadibenzothiophene group, an azadibenzosilole group, a pyridine group, a pyrimidine group, a pyrazine group, a pyridazine group, a triazine group, a quinoline group, an isoquinoline group, a quinoxaline group, a quinazoline group, a phenanthroline group, a cinnoline group, a phthalazine group, a 5,6,7,8-tetrahydroisoquinoline group, a 5,6,7,8-tetrahydroquinoline group, a 5,6,7,8-tetrahydrophthalazine group, and a 5,6,7,8-tetrahydrocinnoline group.

4. The organometallic compound of claim 1, wherein i) a bond between $Y_3$ and $X_{51}$ and a bond between $Y_5$ and $X_{51}$ are each a single bond, and $X_{51}$ is $C(R_7)(R_8)$, $Si(R_7)(R_8)$, or C(=O), ii) a bond between $Y_3$ and $X_{51}$ and a bond between $Y_5$ and $X_{51}$ are each a single bond, $X_{51}$ is $N\text{-}[(L_7)_{b7}\text{-}(R_7)_{c7}]$, and $R_7$ is selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_2$-$C_{60}$ heteroaryloxy group, a substituted or unsubstituted $C_2$-$C_{60}$ heteroarylthio group, a substituted or unsubstituted $C_3$-$C_{60}$ heteroarylalkyl group, a substituted or unsubstituted monovalent non-aromatic condensed polycyclic group, and a substituted or unsubstituted monovalent non-aromatic condensed heteropolycyclic group, or iii) one bond selected from a bond between $Y_3$ and $X_{51}$ and a bond between $Y_5$ and $X_{51}$ is a single bond while the other bond thereof is a double bond, and $X_{51}$ is N, $C(R_7)$, or $Si(R_7)$.

5. The organometallic compound of claim 1, wherein $X_{51}$ is O, S, or $N\text{-}[(L_7)_{b7}\text{-}(R_7)_{c7}]$, b7 is 0, c7 is 1, $R_7$ is selected from:

a $C_1$-$C_{30}$ alkyl group; and a $C_1$-$C_{30}$ alkyl group substituted with at least one selected from deuterium, —F, —Cl, —Br, —I, $-CD_3$, $-CD_2H$, $-CDH_2$, $-CF_3$, $-CF_2H$, $-CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, $C_1$-$C_{10}$ alkyl group, a $C_1$-$C_{10}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, and a pyrimidinyl group, a1 to a4 are each independently 1, 2, 3, or 4, at least one selected from $R_1$ to $R_4$ are each independently selected from:

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, and an imidazopyrimidinyl group; and a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, and an imidazopyrimidinyl group, each substituted with at least one selected from deuterium, —F, —Cl, —Br, —I, $-CD_3$, $-CD_2H$, $-CDH_2$, $-CF_3$, $-CF_2H$, $-CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, an imidazopyrimidinyl group, and —$Si(Q_{33})(Q_{34})(Q_{35})$, and $Q_{33}$ to $Q_{35}$ are each independently selected from:

—$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, and —$CD_2CDH_2$;

an n-propyl group, an iso-propyl group, an n-butyl group, an isobutyl group, a sec-butyl group, a tert-butyl group, an n-pentyl group, an isopentyl group, a sec-pentyl group, a tert-pentyl group, a phenyl group, and a naphthyl group; and an n-propyl group, an iso-propyl group, an n-butyl group, an isobutyl group, a sec-butyl group, a tert-butyl group, an n-pentyl group, an isopentyl group, a sec-pentyl group, a tert-pentyl group, a phenyl group, and a naphthyl group, each substituted with at least one selected from deuterium, a $C_1$-$C_{10}$ alkyl group, and a phenyl group.

6. The organometallic compound of claim 1, wherein, in Formula 1A, a moiety represented by

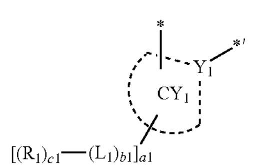

is represented by one selected from Formulae CY1-1 to CY1-16:

Formula CY1-1

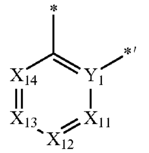

-continued

Formula CY1-2

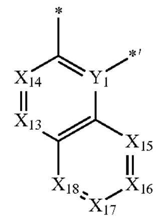

Formula CY1-3

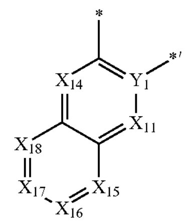

Formula CY1-4

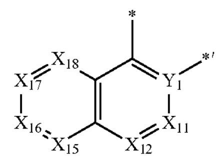

Formula CY1-5

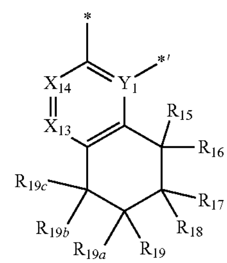

Formula CY1-6

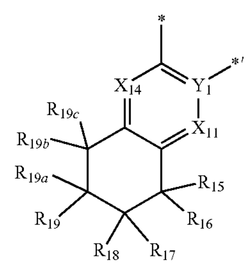

Formula CY1-7

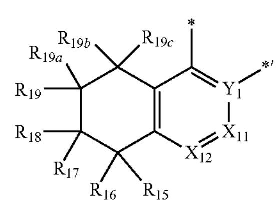

Formula CY1-8

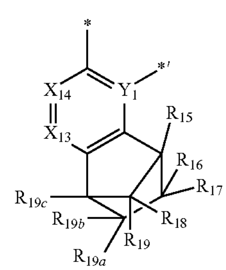

-continued

Formula CY1-9

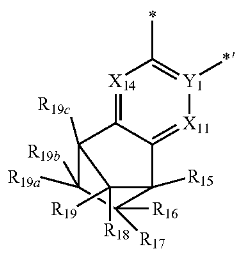

Formula CY1-10

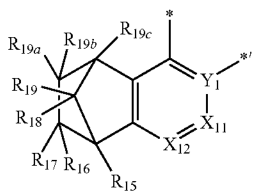

Formula CY1-11

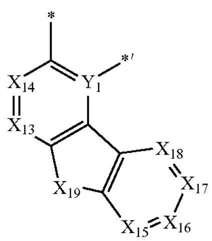

Formula CY1-12

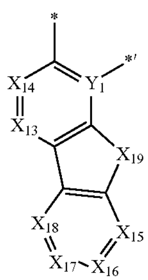

Formula CY1-13

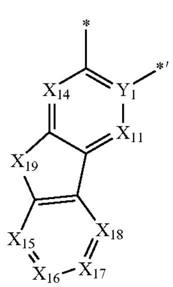

Formula CY1-14

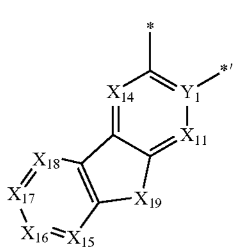

-continued

Formula CY1-15

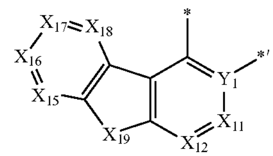

Formula CY1-16

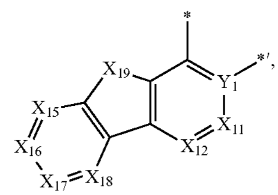

wherein, in Formulae CY1-1 to CY1-16, $Y_1$ is the same as described in claim 1, $X_{11}$ is N or C-[$(L_{11})_{b11}$-$(R_{11})_{c11}$], $X_{12}$ is N or C-[$(L_{12})_{b12}$-$(R_{12})_{c12}$], $X_{13}$ is N or C-[$(L_{13})_{b13}$-$(R_{13})_{c13}$], $X_{14}$ is N or C-[$(L_{14})_{b14}$-$(R_{14})_{c14}$], $X_{15}$ is N or C-[$(L_{15})_{b15}$-$(R_{15})_{c15}$], $X_{16}$ is N or C-[$(L_{16})_{b16}$-$(R_{16})_{c16}$], $X_{17}$ is N or C-[$(L_{17})_{b17}$-$(R_{17})_{c17}$], $X_{18}$ is N or C-[$(L_{18})_{b18}$-$(R_{18})_{c18}$], $X_{19}$ is C$(R_{19a})(R_{19b})$, N-[$(L_{19})_{b19}$-$(R_{19})_{c19}$], O, S, or Si$(R_{19a})(R_{19b})$, $L_{11}$ to $L_{19}$ are each independently the same as described in connection with $L_1$ in claim 1, b 11 to b19 are each independently the same as described in connection with b 1 in claim 1, $R_{11}$ to $R_{19}$ and $R_{19a}$ to $R_{19c}$ are each independently the same as described in connection with $R_1$ in claim 1, c11 to c19 are each independently the same as described in connection with c1 in claim 1,

*' indicates a binding site to M of Formula 1A, and

* indicates a binding site to $CY_5$ of Formula 1A.

7. The organometallic compound of claim 1, wherein, in Formula 1A, a moiety represented by

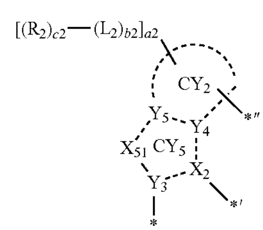

is represented by one selected from Formulae CY2-1 to CY2-4:

Formula CY2-1

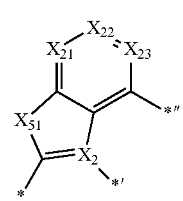

-continued

Formula CY2-2

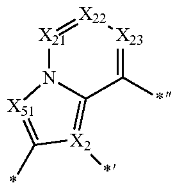

Formula CY2-3

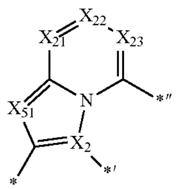

Formula CY2-4

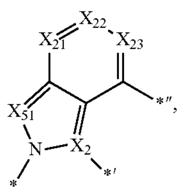

wherein $X_{51}$ in Formula CY2-1 is O, S, N-[$(L_7)_{b7}$-$(R_7)_{c7}$], $C(R_7)(R_8)$, $Si(R_7)(R_8)$, $Ge(R_7)(R_8)$, or C(=O), $X_{51}$ in Formulae CY2-2 to CY2-4 is N, $C(R_7)$, $Si(R_7)$, or $Ge(R_7)$, $L_7$, b7, $R_7$, $R_8$, c7, and c8 are each independently the same as described in claim 1, in Formulae CY2-1 to CY2-4, $X_2$ is the same as described in claim 1, $X_{21}$ is N or C-[$(L_{21})_{b21}$-$(R_{21})_{c21}$], $X_{22}$ is N or C-[$(L_{22})_{b22}$-$(R_{22})_{c22}$], $X_{23}$ is N or C-[$(L_{23})_{b23}$-$(R_{23})_{c23}$], $L_{21}$ to $L_{23}$ are each independently the same as described in connection with $L_2$ in claim 1, b21 to b23 are each independently the same as described in connection with b2 in claim 1, $R_{21}$ to $R_{23}$ are each independently the same as described in connection with $R_2$ in claim 1, c21 to c23 are each independently the same as described in connection with c2 in claim 1,

*' indicates a binding site to M of Formula 1A,

* indicates a binding site to $CY_1$ of Formula 1A, and

*" indicates a binding site to $CY_3$ of Formula 1A.

8. The organometallic compound of claim 1, wherein, in Formula 1A, a moiety represented by

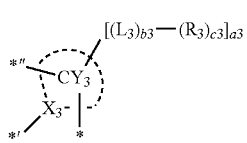

is represented by one selected from Formulae CY3-1 to CY3-11:

Formula CY3-1

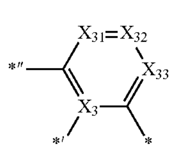

-continued

Formula CY3-2

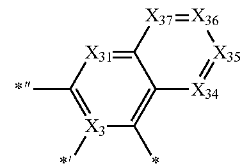

Formula CY3-3

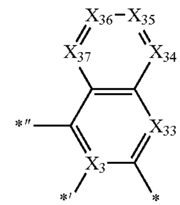

Formula CY3-4

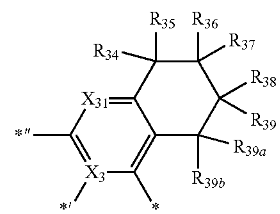

Formula CY3-5

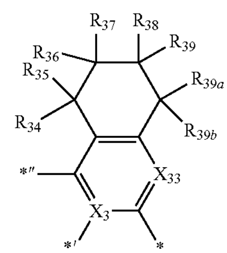

Formula CY3-6

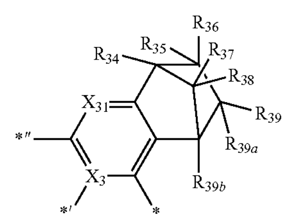

Formula CY3-7

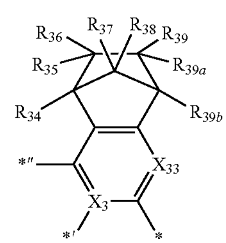

Formula CY3-8

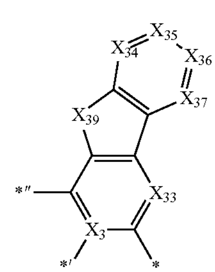

-continued

Formula CY3-9

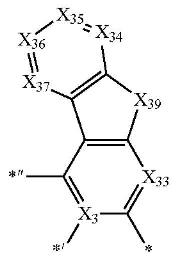

Formula CY3-10

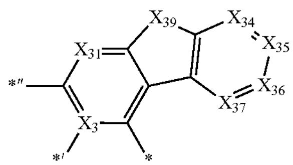

Formula CY3-11

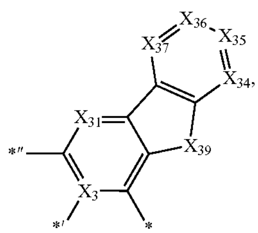

wherein, in Formulae CY3-1 to CY3-11, $X_3$ is the same as described in claim 1, $X_{31}$ is N or C-[$(L_{31})_{b31}$-$(R_{31})_{c31}$], $X_{32}$ is N or C-[$(L_{32})_{b32}$-$(R_{32})_{c32}$], $X_{33}$ is N or C-[$(L_{33})_{b33}$-$(R_{33})_{c33}$], $X_{34}$ is N or C-[$(L_{34})_{b34}$-$(R_{34})_{c34}$], $X_{35}$ is N or C-[$(L_{35})_{b35}$-$(R_{35})_{c35}$], $X_{35}$ is N or C-[$(L_{36})_{b36}$-$(R_{36})_{c36}$], $X_{37}$ is N or C-[$(L_{37})_{b37}$-$(R_{37})_{c37}$], $X_{39}$ is $C(R_{39a})(R_{39b})$, N-[$(L_{39})_{b39}$-$(R_{39})_{c39}$], O, S, or $Si(R_{39a})(R_{39b})$, $L_{31}$ to $L_{37}$ and $L_{39}$ are each independently the same as described in connection with $L_3$ in claim 1, b31 to b37 and b39 are each independently the same as described in connection with b3 in claim 1, $R_{31}$ to $R_{39}$ and $R_{39a}$ to $R_{39b}$ are each independently the same as described in connection with $R_3$ in claim 1, c31 to c37 and c39 are each independently the same as described in connection with c3 in claim 1,

*' indicates a binding site to M of Formula 1A,

* indicates a binding site to $CY_4$ of Formula 1A, and

*" indicates a binding site to $CY_2$ of Formula 1A.

9. The organometallic compound of claim 1, wherein, in Formula 1A, a moiety represented by

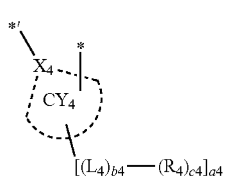

is represented by one selected from Formulae CY4-1 to CY4-16:

Formula CY4-1

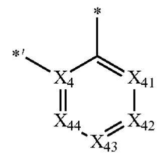

Formula CY4-2

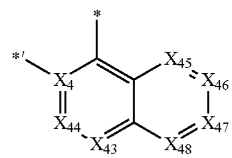

Formula CY4-3

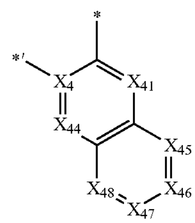

Formula CY4-4

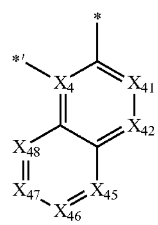

Formula CY4-5

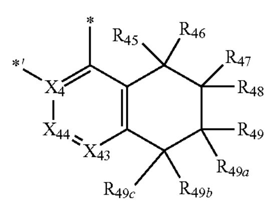

Formula CY4-6

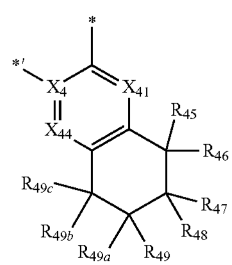

Formula CY4-7

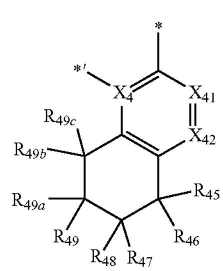

-continued

Formula CY4-8

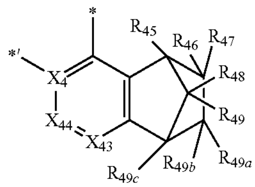

Formula CY4-9

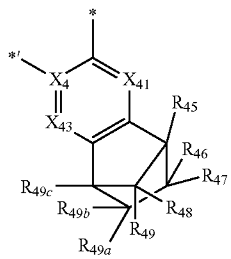

Formula CY4-10

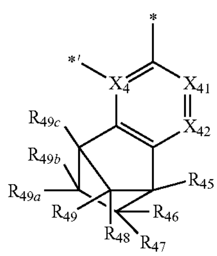

Formula CY4-11

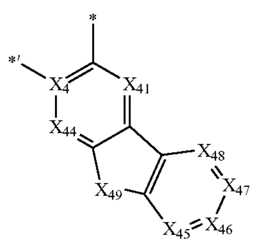

Formula CY4-12

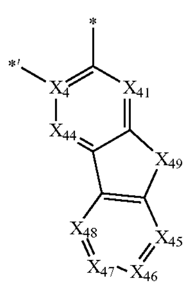

Formula CY4-13

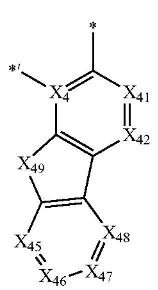

-continued

Formula CY4-14

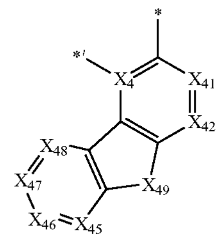

Formula CY4-15

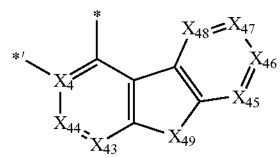

Formula CY4-16

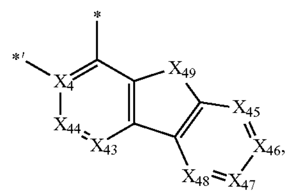

wherein, in Formulae CY4-1 to CY4-16, $X_4$ is the same as described in claim 1, $X_{41}$ is N or C-[$(L_{42})_{b42}$-$(R_{42})_{c42}$], $X_{43}$ is N or C-[$(L_{43})_{b43}$-$(R_{43})_{c43}$], $X_{44}$ is N or C-[$(L_{44})_{b44}$-$(R_{44})_{c44}$], $X_{45}$ is N or C-[$(L_{45})_{b45}$-$(R_{45})_{c45}$], $X_{46}$ is N or C-[$(L_{46})_{b46}$-$(R_{46})_{c46}$], $X_{47}$ is N or C-[$(L_{47})_{b47}$-$(R_{47})_{c47}$], $X_{48}$ is N or C-[$(L_{48})_{b48}$-$(R_{48})_{c48}$], $X_{49}$ is C($R_{49a}$)($R_{49b}$), N-[$(L_{49})_{b49}$-$(R_{49})_{c49}$], O, S, or Si($R_{49a}$)($R_{49b}$), $L_{41}$ to $L_{49}$ are each independently the same as described in connection with $L_4$ in claim 1, b41 to b49 are each independently the same as described in connection with b4 in claim 1, $R_{41}$ to $R_{49}$ and $R_{49a}$ to $R_{49c}$ are each independently the same as described in connection with $R_4$ in claim 1, c41 to c49 are each independently the same as described in connection with c4 in claim 1,

*' indicates a binding site to M of Formula 1A, and

* indicates a binding site to $CY_3$ of Formula 1A.

10. The organometallic compound of claim 1, wherein, in Formula 1A, a moiety represented by

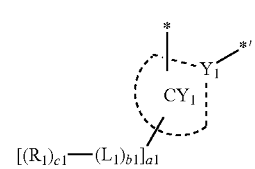

is represented by one selected from Formulae CY1(1) to CY1(8), a moiety represented by

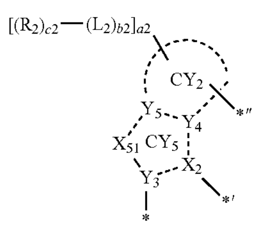

is represented by one selected from Formulae CY2(1) to CY2(4), a moiety represented by

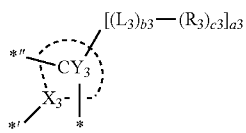

is represented by one selected from Formulae CY3(1) to CY3(24), and a moiety represented by

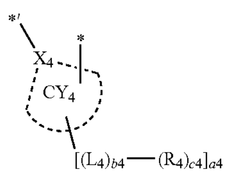

is represented by one selected from Formulae CY4(1) to CY4(67):

Formula CY1(1)

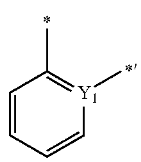

Formula CY1(2)

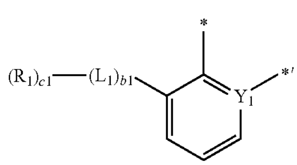

Formula CY1(3)

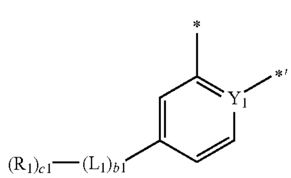

-continued

Formula CY1(4)

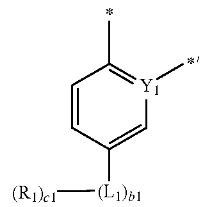

Formula CY1(5)

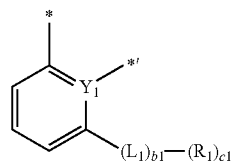

Formula CY1(6)

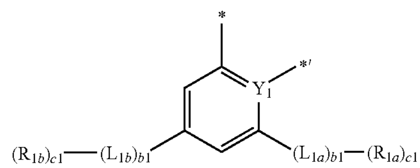

Formula CY1(7)

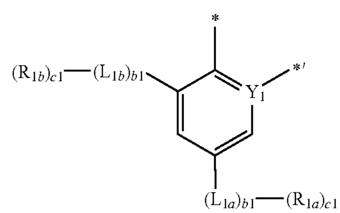

Formula CY1(8)

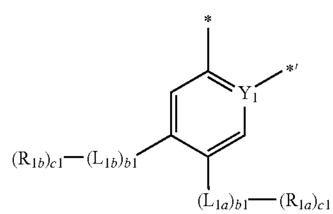

Formula CY2(1)

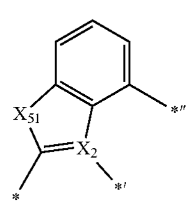

Formula CY2(2)

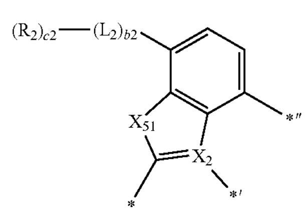

-continued
Formula CY2(3)
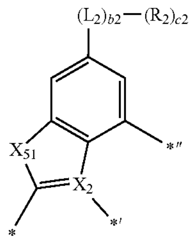
Formula CY2(4)
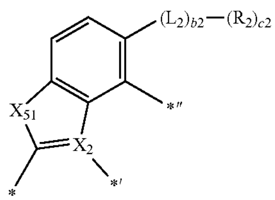
Formula CY3(1)
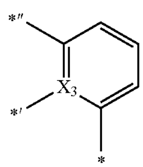
Formula CY3(2)
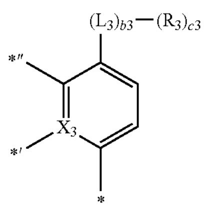
Formula CY3(3)
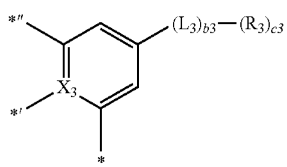
Formula CY3(4)
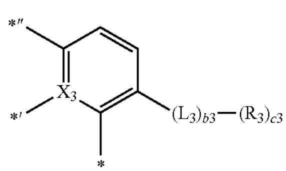
Formula CY3(5)
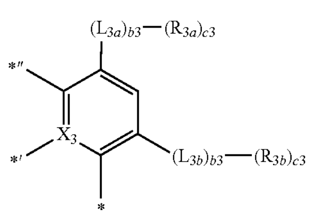
-continued
Formula CY3(6)
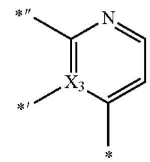
Formula CY3(7)
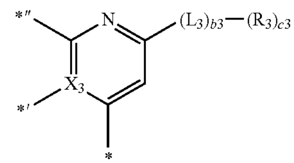
Formula CY3(8)
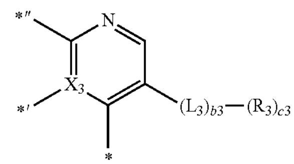
Formula CY3(9)
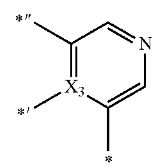
Formula CY3(10)
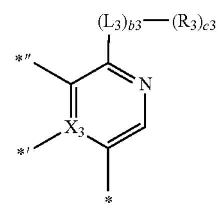
Formula CY3(11)
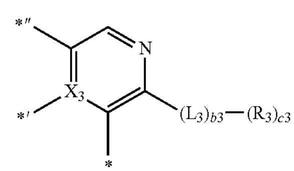
Formula CY3(12)
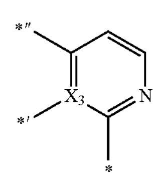
Formula CY3(13)
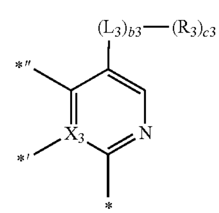

-continued
Formula CY3(14)
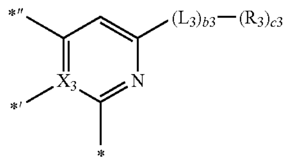
Formula CY3(15)
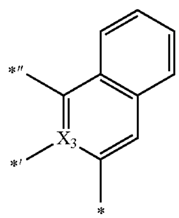
Formula CY3(16)
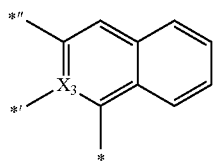
Formula CY3(17)
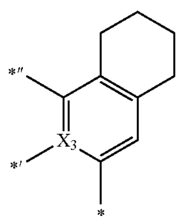
Formula CY3(18)
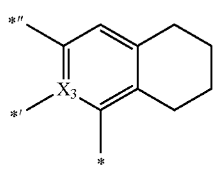
Formula CY3(19)
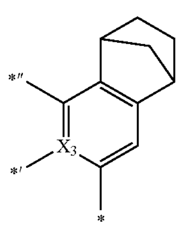
Formula CY3(20)
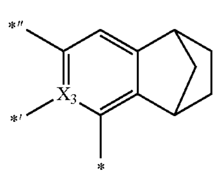
-continued
Formula CY3(21)
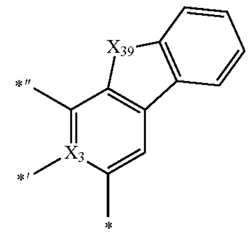
Formula CY3(22)
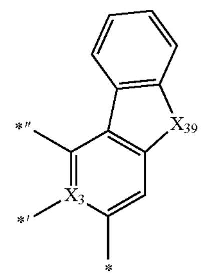
Formula CY3(23)
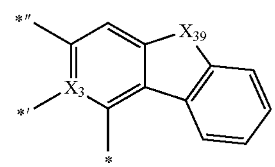
Formula CY3(24)
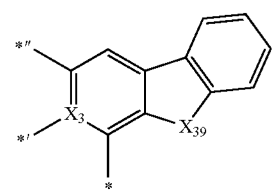
Formula CY4(1)
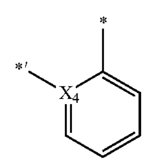
Formula CY4(2)
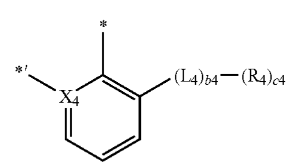
Formula CY4(3)
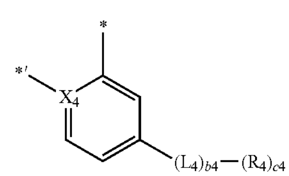

-continued
Formula CY4(4)
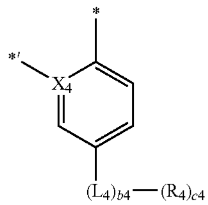
Formula CY4(5)
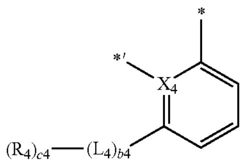
Formula CY4(6)
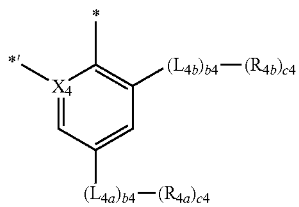
Formula CY4(7)
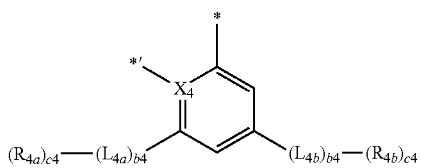
Formula CY4(8)
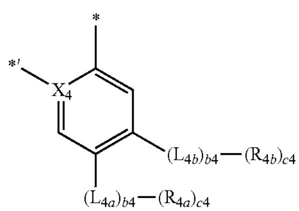
Formula CY4(9)
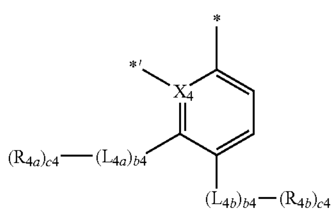
Formula CY4(10)
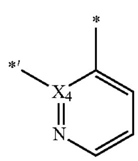
Formula CY4(11)
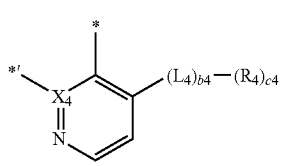
-continued
Formula CY4(12)
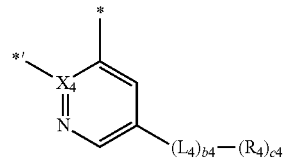
Formula CY4(13)
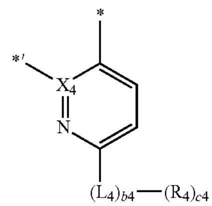
Formula CY4(14)
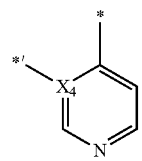
Formula CY4(15)
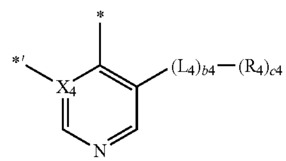
Formula CY4(16)
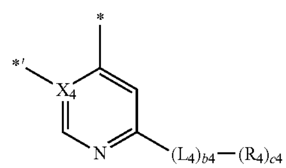
Formula CY4(17)
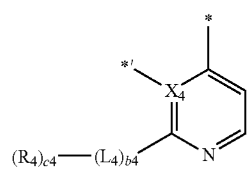
Formula CY4(18)
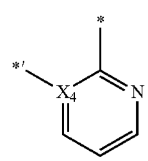
Formula CY4(19)
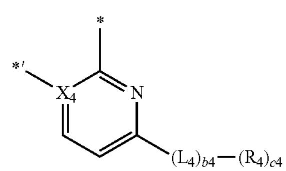
Formula CY4(20)
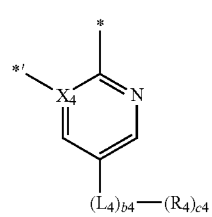

-continued
Formula CY4(21)
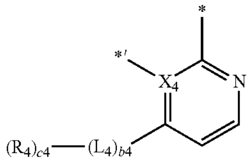
Formula CY4(22)
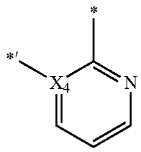
Formula CY4(23)
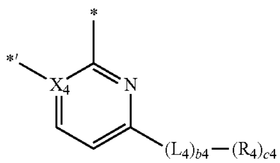
Formula CY4(24)
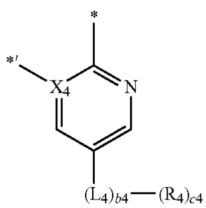
Formula CY4(25)
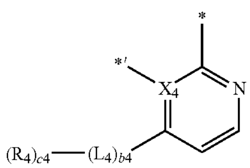
Formula CY4(26)
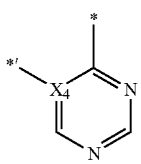
Formula CY4(27)
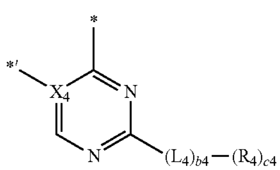
Formula CY4(28)
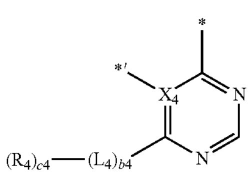
Formula CY4(29)
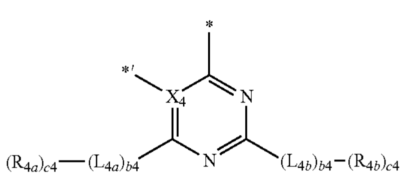
-continued
Formula CY4(30)
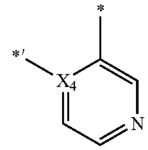
Formula CY4(31)
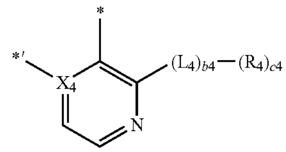
Formula CY4(32)
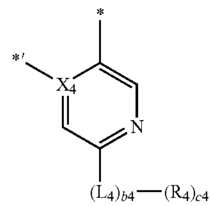
Formula CY4(33)
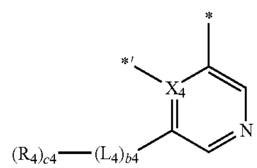
Formula CY4(34)
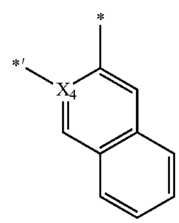
Formula CY4(35)
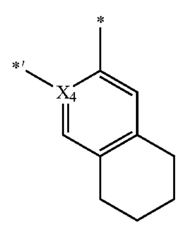
Formula CY4(36)
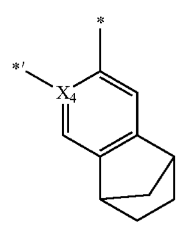
Formula CY4(37)
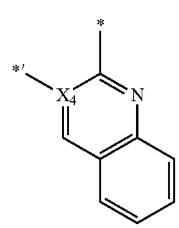

-continued
Formula CY4(38)
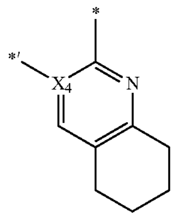
Formula CY4(39)
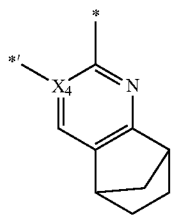
Formula CY4(40)
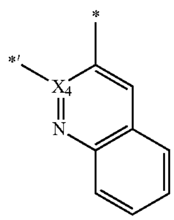
Formula CY4(41)
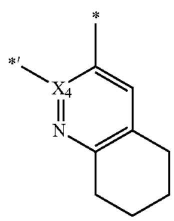
Formula CY4(42)
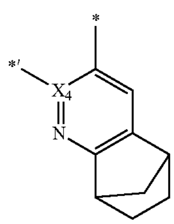
Formula CY4(43)
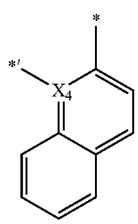
Formula CY4(44)
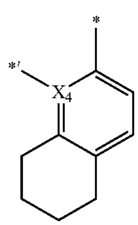
-continued
Formula CY4(45)
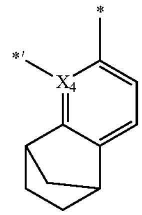
Formula CY4(46)
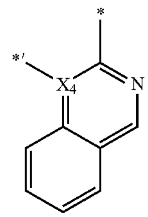
Formula CY4(47)
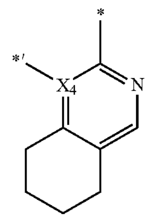
Formula CY4(48)
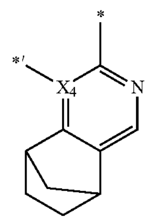
Formula CY4(49)
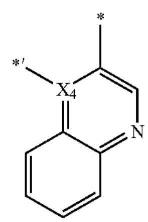
Formula CY4(50)
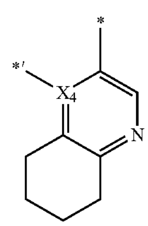
Formula CY4(51)
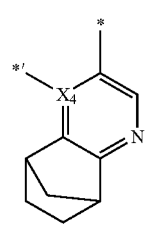

-continued
Formula CY4(52)
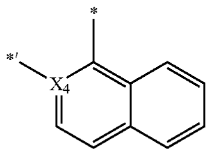
Formula CY4(53)
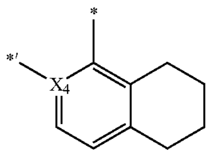
Formula CY4(54)
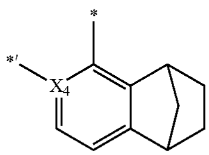
Formula CY4(55)
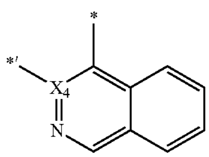
Formula CY4(56)
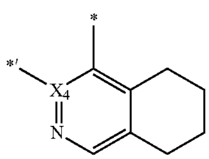
Formula CY4(57)
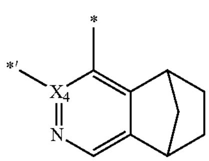
Formula CY4(58)
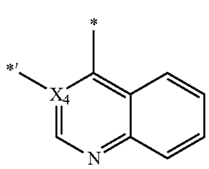
Formula CY4(59)
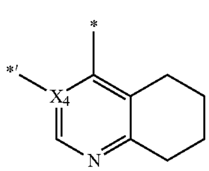
Formula CY4(60)
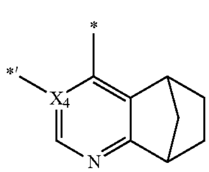
-continued
Formula CY4(61)
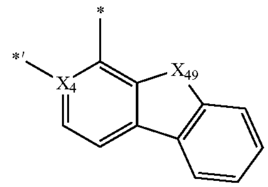
Formula CY4(62)
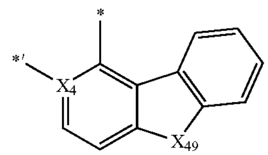
Formula CY4(63)
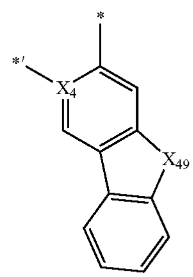
Formula CY4(64)
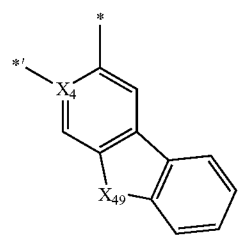
Formula CY4(65)
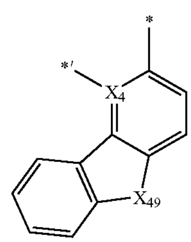
Formula CY4(66)
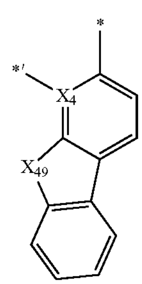

-continued

Formula CY4(67)

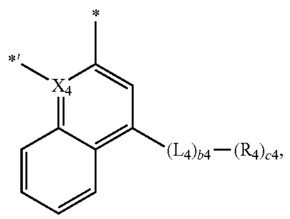

wherein, $X_{51}$ in Formulae CY2(1) to CY2(4) is O, S, N-[$(L_7)_{b7}$-$(R_7)_{c7}$], C($R_7$)($R_8$), Si($R_7$)($R_8$), Ge($R_7$)($R_8$), or C(═O), and $L_7$, b7, $R_7$, $R_8$, c7, and c8 are each independently the same as described in claim 1, in Formulae CY1(1) to CY1(8), CY2(1) to CY2(4), CY3(1) to CY3(24), and CY4(1) to CY4(67), $X_2$ to $X_4$, $Y_1$, $L_1$ to $L_4$, b1 to b4, $R_1$ to $R_4$, and c1 to c4 are each independently the same as described in claim 1, $X_{39}$ is C($R_{39a}$)($R_{39b}$), N-[$(L_{39})_{b39}$-$(R_{39})_{c39}$], O, S, or Si($R_{39a}$)($R_{39b}$), $X_{49}$ is C($R_{49a}$)($R_{49a}$), N-[$(L_{49})_{b49}$-$(R_{49})_{c49}$], O, S, or Si($R_{49a}$)($R_{49b}$), $L_{1a}$ and $L_{1b}$ are each independently the same as described in connection with $L_1$ in claim 1, $R_{1a}$ and $R_{1b}$ are each independently the same as described in connection with $R_1$ in claim 1, $L_{3a}$, $L_{3b}$, and $L_{39}$ are each independently the same as described in connection with $L_3$ in claim 1, $R_{3a}$, $R_{3b}$, $R_{39}$, $R_{39a}$, and $R_{39b}$ are each independently the same as described in connection with $R_3$ in claim 1, b39 and c39 are each independently the same as described in connection with b3 and c3 in claim 1, respectively, $L_{4a}$, $L_{4b}$, and $L_{49}$ are each independently the same as described in connection with $L_4$ in claim 1, $R_{4a}$, $R_{4b}$, $R_{49}$, $R_{49a}$, and $R_{49b}$ are each independently the same as described in connection with $R_4$ in claim 1, b49 and c49 are each independently the same as described in connection with b4 and c4 in claim 1, respectively,

*—$(L_1)_{b1}$-$(R_1)_{c1}$, *—$(L_{1a})_{b1}$-$(R_{1a})_{c1}$, *—$(L_{1b})_{b1}$-$(R_{1b})_{c1}$, *—$(L_2)_{b2}$-$(R_2)_{c2}$, *—$(L_3)_{b3}$- $(R_3)_{c3}$], *—$(L_{3a})_{b3}$-$(R_{3a})_{c3}$, *—$(L_{3b})_{b3}$-$(R_{3b})_{c3}$, *—$(L_4)_{b4}$-$(R_4)_{c4}$, *—$(L_{4a})_{b4}$-$(R_{4a})_{c4}$, and *—$(L_{4b})_{b4}$-$(R_{4b})_{c4}$ are not hydrogen, and * indicates a binding site to a neighboring atom, in Formulae CY1(1) to CY1(8), CY2(1) to CY2(4), CY3(1) to CY3(24), and CY4(1) to CY4(67), *' indicates a binding site to M of Formula 1A, in Formulae CY1(1) to CY1(8), * indicates a binding site to $CY_5$ of Formula 1A, in Formulae CY2(1) to CY2(4), * indicates a binding site to $CY_1$ of Formula 1A, and *" indicates a binding site to $CY_3$ of Formula 1A, in Formulae CY3(1) to CY3(24), *" indicates a binding site to $CY_2$ of Formula 1A, and * indicates a binding site to CY4 of Formula 1A, and in Formulae CY4(1) to CY4(67), * indicates a binding site to $CY_3$ of Formula 1A.

11. The organometallic compound of claim 1, wherein the organometallic compound is represented by Formula 1-1:

Formula 1-1

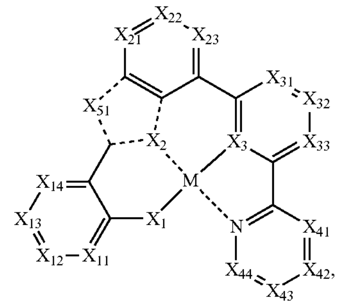

wherein, in Formula 1-1,

M, $X_1$ to $X_3$, and $X_{51}$ are each independently the same as described in claim 1, $X_{11}$ is N or C-[$(L_{11})_{b11}$-$(R_{11})_{c11}$], $X_{12}$ is N or C-[$(L_{12})_{b12}$-$(R_{12})_{c12}$], $X_{13}$ is N or C-[$(L_{13})_{b13}$-$(R_{13})_{c13}$], $X_{14}$ is N or C-[$(L_{14})_{b14}$-$(R_{14})_{c14}$], $L_{11}$ to $L_{14}$, b11 to b14, $R_{11}$ to $R_{14}$ and c11 to c14 are each independently the same as described in connection with $L_1$, b1, $R_1$, and c1 in claim 1, respectively, $X_{21}$ is N or N or C-[$(L_{21})_{b21}$-$(R_{21})_{c21}$], $X_{22}$ is N or C-[$(L_{22})_{b22}$-$(R_{22})_{c22}$], $X_{23}$ is N or C-[$(L_{23})_{b23}$-$(R_{23})_{c23}$], $L_{21}$ to $L_{23}$, b21 to b23, $R_{21}$ to $R_{23}$ and c21 to c23 are each independently the same as described in connection with $L_2$, b2, $R_2$, and c2 in claim 1, respectively, $X_{31}$ is N or C-[$(L_{31})_{b31}$-$(R_{31})_{c31}$], $X_{32}$ is N or C-[$(L_{32})_{b32}$-$(R_{32})_{c32}$], $X_{33}$ is N or C-[$(L_{33})_{b33}$-$(R_{33})_{c33}$], $L_{31}$ to $L_{33}$, b31 to b33, $R_{31}$ to $R_{33}$ and c31 to c33 are each independently the same as described in connection with $L_3$, b3, $R_3$, and c3 in claim 1, $X_{41}$ is N or C-[$(L_{41})_{b41}$-$(R_{41})_{c41}$], $X_{42}$ is N or C-[$(L_{42})_{b42}$-$(R_{42})_{c42}$], $X_{43}$ is N or C-[$(L_{43})_{b43}$-$(R_{43})_{c43}$], $X_{44}$ is N or C-[$(L_{44})_{b44}$-$(R_{44})_{c44}$], $L_{41}$ to $L_{44}$, b41 to b44, $R_{41}$ to $R_{44}$ and c41 to c44 are each independently the same as described in connection with $L_4$, b4, $R_4$, and c4 in claim 1, two selected from $R_{11}$ to $R_{14}$ are optionally linked to form a substituted or unsubstituted $C_5$-$C_{30}$ carbocyclic group or a substituted or unsubstituted $C_1$-$C_{30}$ heterocyclic group, two selected from $R_{21}$ to $R_{23}$ are optionally linked to form a substituted or unsubstituted $C_5$-$C_{30}$ carbocyclic group or a substituted or unsubstituted $C_1$-$C_{30}$ heterocyclic group, two selected from $R_{31}$ to $R_{33}$ are optionally linked to form a substituted or unsubstituted $C_5$-$C_{30}$ carbocyclic group or a substituted or unsubstituted $C_1$-$C_{30}$ heterocyclic group, and two selected from $R_{41}$ to $R_{44}$ are optionally linked to form a substituted or unsubstituted $C_5$-$C_{30}$ carbocyclic group or a substituted or unsubstituted $C_1$-$C_{30}$ heterocyclic group.

12. An organic light-emitting device comprising:

a first electrode;

a second electrode; and an organic layer disposed between the first electrode and the second electrode, wherein the organic layer comprising an emission layer, and wherein the organic layer comprises at least one organometallic compound of claim 1.

13. The organic light-emitting device of claim 12, wherein the first electrode is an anode, the second electrode is a cathode, the organic layer further comprises a hole transport region disposed between the first electrode and the emission layer and an electron transport region disposed between the emission layer and the second electrode, the hole transport region comprises a hole injection layer, a hole transport layer, an electron blocking layer, or any combination thereof, and the electron transport region comprises a hole blocking layer, an electron transport layer, an electron injection layer, or any combination thereof.

14. The organic light-emitting device of claim 12, wherein the emission layer comprises the organometallic compound.

15. The organic light-emitting device of claim 14, wherein the emission layer further comprises a host, and an amount of the host in the emission layer is greater than an amount of the organometallic compound in the emission layer.

16. An organometallic compound represented by Formula 1-1:

Formula 1-1

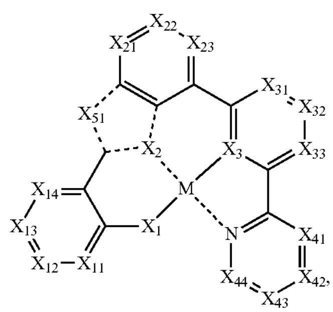

wherein, in Formula 1-1,

M is platinum (Pt), $X_1$ is O, $X_2$ is N, $X_3$ is C, $X_{51}$ is N-[$(L_7)_{b7}$-$(R_7)_{c7}$], $X_{11}$ is C-[$(L_{11})_{b11}$-$(R_{11})_{c11}$], $X_{12}$ is C-[$(L_{12})_{b12}$-$(R_{12})_{c12}$], $X_{13}$ is C-[$(L_{13})_{b13}$-$(R_{13})_{c13}$], $X_{14}$ is C-[$(L_{14})_{b14}$-$(R_{14})_{c14}$], $X_{21}$ is is C-[$(L_{21})_{b21}$-$(R_{21})_{c21}$], $X_{22}$ is C-[$(L_{22})_{b22}$-$(R_{22})_{c22}$], $X_{23}$ is C-[$(L_{23})_{b23}$-$(R_{23})_{c23}$], $X_{31}$ is is C-[$(L_{31})_{b31}$-$(R_{31})_{c31}$], $X_{32}$ is C-[$(L_{32})_{b32}$-$(R_{32})_{c32}$], $X_{33}$ is C-[$(L_{33})_{b33}$-$(R_{33})_{c33}$], $X_{41}$ is is C-[$(L_{41})_{b41}$-$(R_{41})_{c41}$], $X_{42}$ is C-[$(L_{42})_{b42}$-$(R_{42})_{c42}$], $X_{43}$ is C-[$(L_{43})_{b43}$-$(R_{43})_{c43}$], $X_{44}$ is C-[$(L_{44})_{b44}$-$(R_{44})_{c44}$], $L_7$, $L_{11}$ to $L_{14}$, $L_{21}$ to $L_{23}$, $L_{31}$ to $L_{33}$ and $L_{41}$ to $L_{44}$ are each independently selected from a substituted or unsubstituted $C_5$-$C_{30}$ carbocyclic group and a substituted or unsubstituted $C_1$-$C_{30}$ heterocyclic group, b7, b11 to b14, b21 to b23, b31 to b33 and b41 to b44 are each independently an integer from 0 to 5, $R_7$, $R_{11}$ to $R_{14}$, $R_{21}$ to $R_{23}$, $R_{31}$ to $R_{33}$ and $R_{41}$ to $R_{44}$ are each independently selected from hydrogen, deuterium, —F, —Cl, —Br, —I, —$SF_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_2$-$C_{60}$ heteroaryloxy group, a substituted or unsubstituted $C_2$-$C_{60}$ heteroarylthio group, a substituted or unsubstituted $C_3$-$C_{60}$ heteroarylalkyl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —B($Q_6$)($Q_7$), and —(=O)($Q_8$)($Q_9$), c11 to c14, c21 to c23, c31 to c33 and c41 to c44 are each independently an integer from 1 to 5, c7 is 1, two selected from $R_{11}$ to $R_{14}$ are optionally linked to form a substituted or unsubstituted $C_5$-$C_{30}$ carbocyclic group or a substituted or unsubstituted $C_1$-$C_{30}$ heterocyclic group, two selected from $R_{21}$ to $R_{23}$ are optionally linked to form a substituted or unsubstituted $C_5$-$C_{30}$ carbocyclic group or a substituted or unsubstituted $C_1$-$C_{30}$ heterocyclic group, two selected from $R_{31}$ to $R_{33}$ are optionally linked to form a substituted or unsubstituted $C_5$-$C_{30}$ carbocyclic group or a substituted or unsubstituted $C_1$-$C_{30}$ heterocyclic group, and two selected from $R_{41}$ to $R_{44}$ are optionally linked to form a substituted or unsubstituted $C_5$-$C_{30}$ carbocyclic group or a substituted or unsubstituted $C_1$-$C_{30}$ heterocyclic group, provided that, when i) b7 is 0, and ii) $R_7$ is a substituted or unsubstituted $C_1$-$C_{60}$ alkyl group, then one of $R_{11}$ to $R_{14}$, one of $R_{21}$ to $R_{23}$, one of $R_{31}$ to $R_{33}$, one of $R_{41}$ to $R_{44}$, or any combination thereof is selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, provided that when i) $X_{51}$ is NH, ii) $X_{11}$ is CH, X12 is CH, $X_{13}$ is CH, $X_{14}$ is CH, $X_{21}$ is CH, $X_{22}$ is CH, $X_{23}$ is CH, $X_{31}$ is CH, $X_{33}$ is CH, $X_{41}$ is CH, $X_{42}$ is CH, $X_{43}$ is CH, and $X_{44}$ is CH, and iii) b3 is 0, and c3 is 1, then $R_3$ is not tert-butyl; and at least one substituent of the substituted $C_5$-$C_{30}$ carbocyclic group, the substituted $C_1$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_2$-$C_{60}$ alkoxy group, the substituted $C_3$-$C_{20}$ cycloalkyl group, the substituted $C_2$-$C_{20}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_7$-$C_{60}$ arylalkyl group, the substituted $C_1$-$C_{60}$ heteroaryl group, the substituted $C_2$-$C_{60}$ heteroaryloxy group, the substituted $C_2$-$C_{60}$ heteroarylthio group, the substituted $C_3$-$C_{60}$ heteroarylalkyl group, the substituted monovalent non-aromatic condensed polycyclic group, and the substituted monovalent non-aromatic condensed heteropolycyclic group is selected from:

deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_2$-$C_{60}$ heteroaryloxy group, a $C_2$-$C_{60}$ heteroarylthio group, a $C_3$-$C_{60}$ heteroarylalkyl group, a monovalent non-aromatic condensed polycyclic group, a monovalent non-aromatic condensed heteropolycyclic group, $—N(Q_{11})(Q_{12})$, $—Si(Q_{13})(Q_{14})(Q_{15})$, $—B(Q_{16})(Q_{17})$, and $—(=O)(Q_{18})(Q_{19})$;

a $C_3$-$C_{10}$ ycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_2$-$C_{60}$ heteroaryloxy group, a $C_2$-$C_{60}$ heteroarylthio group, a $C_3$-$C_{60}$ heteroarylalkyl group, a monovalent non-aromatic condensed polycyclic group, and a monovalent non-aromatic condensed heteropolycyclic group;

a $C_3$-$C_{60}$ cycloalkyl group, a $C_1$-$C_{60}$ heterocycloalkyl group, a $C_3$-$C_{60}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_2$-$C_{60}$ heteroaryloxy group, a $C_2$-$C_{60}$ heteroarylthio group, a $C_3$-$C_{60}$ heteroarylalkyl group, a monovalent non-aromatic condensed polycyclic group, and a monovalent non-aromatic condensed heteropolycyclic group, each substituted with at least one selected from deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_2$-$C_{60}$ heteroaryloxy group, a $C_2$-$C_{60}$ heteroarylthio group, a $C_3$-$C_{60}$ heteroarylalkyl group, a monovalent non-aromatic condensed polycyclic group, a monovalent non-aromatic condensed heteropolycyclic group, $—N(Q_{21})(Q_{22})$, $—Si(Q_{23})(Q_{24})(Q_{25})$, $—B(Q_{26})(Q_{27})$, and $—(=O)(Q_{28})(Q_{29})$; and $—N(Q_{31})(Q_{32})$, $—Si(Q_{33})(Q_{34})(Q_{35})$, $—B(Q_{36})(Q_{37})$, and $—(=O)(Q_{38})(Q_{39})$, and $Q_1$ to $Q_9$, $Q_{11}$ to $Q_{19}$, $Q_{21}$ to $Q_{29}$, and $Q_{31}$ to $Q_{39}$ are each independently selected from hydrogen, deuterium, —F, —Cl, —Br, —I, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a $C_1$-$C_{60}$ alkyl group substituted with at least one selected from deuterium, a $C_1$-$C_{60}$ alkyl group, and a $C_6$-$C_{60}$ aryl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with at least one selected from deuterium, a $C_1$-$C_{60}$ alkyl group, and a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_2$-$C_{60}$ heteroaryloxy group, a $C_2$-$C_{60}$ heteroarylthio group, a $C_3$-$C_{60}$ heteroarylalkyl group, a monovalent non-aromatic condensed polycyclic group, and a monovalent non-aromatic condensed heteropolycyclic group.

17. The organometallic compound of claim 16, wherein, in Formula 1-1, a moiety represented by

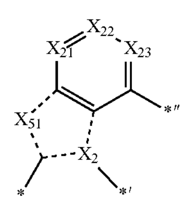

is represented by Formula CY2-1:

CY2-1

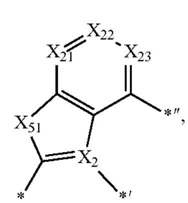

in Formula CY2-1,

*′ indicates a binding site to M of Formula 1-1,

* indicates a binding site to a neighboring atom of Formula 1-1, and

*″ indicates a binding site to a neighboring atom of Formula 1-1.

18. An organic light-emitting device comprising:

a first electrode;

a second electrode; and an organic layer disposed between the first electrode and the second electrode, wherein the organic layer comprising an emission layer, and wherein the organic layer comprises at least one organometallic compound of claim 16.

19. The organic light-emitting device of claim 18, wherein the first electrode is an anode, the second electrode is a cathode, the organic layer further comprises a hole transport region disposed between the first electrode and the emission layer and an electron transport region disposed between the emission layer and the second electrode, the hole transport region comprises a hole injection layer, a hole transport layer, an electron blocking layer, or any combination thereof, and the electron transport region comprises a hole blocking layer, an electron transport layer, an electron injection layer, or any combination thereof.

20. The organic light-emitting device of claim 18, wherein the emission layer comprises the organometallic compound.

21. The organic light-emitting device of claim 20, wherein the emission layer further comprises a host, and an amount of the host in the emission layer is greater than an amount of the organometallic compound in the emission layer.

* * * * *